US012204254B2

(12) United States Patent
Feler et al.

(10) Patent No.: US 12,204,254 B2
(45) Date of Patent: Jan. 21, 2025

(54) MULTI-LAYERED MOIRÉ TARGETS AND METHODS FOR USING THE SAME IN MEASURING MISREGISTRATION OF SEMICONDUCTOR DEVICES

(71) Applicant: KLA CORPORATION, Milpitas, CA (US)

(72) Inventors: Yoel Feler, Haifa (IL); Mark Ghinovker, Yoqneam Ilit (IL)

(73) Assignee: KLA CORPORATION, Milpitas, CA (US)

( * ) Notice: Subject to any disclaimer, the term of this patent is extended or adjusted under 35 U.S.C. 154(b) by 1037 days.

(21) Appl. No.: 16/760,797

(22) PCT Filed: Mar. 27, 2020

(86) PCT No.: PCT/US2020/025416

§ 371 (c)(1),
(2) Date: Apr. 30, 2020

(87) PCT Pub. No.: WO2020/205601

PCT Pub. Date: Oct. 8, 2020

(65) Prior Publication Data

US 2021/0233821 A1 Jul. 29, 2021

Related U.S. Application Data

(60) Provisional application No. 62/872,422, filed on Jul. 10, 2019, provisional application No. 62/829,839, filed on Apr. 5, 2019.

(51) Int. Cl.
*G03F 7/00* (2006.01)

(52) U.S. Cl.
CPC ...... *G03F 7/70683* (2013.01); *G03F 7/70633* (2013.01)

(58) Field of Classification Search
CPC .................. H01L 22/30; H01L 23/544; H10L 2223/54426; G03F 7/70; G03F 7/70483;
(Continued)

(56) References Cited

U.S. PATENT DOCUMENTS 7,046,361 B1 5/2006 Yang et al.
7,061,615 B1 6/2006 Lowe-Webb
(Continued)

FOREIGN PATENT DOCUMENTS

EP 1037117 A2 9/2000
JP 2004363313 A 12/2004
(Continued)

OTHER PUBLICATIONS

EPO, Supplementary European Search Report for EP Application No. 20781915.2, Dec. 23, 2022.
(Continued)

*Primary Examiner* — Christina A Riddle
(74) *Attorney, Agent, or Firm* — Hodgson Russ LLP

(57) ABSTRACT

A multi-layered moir target, useful in the calculation of misregistration between at least first, second and third layers being formed on a semiconductor device wafer, including at least one group of periodic structure stacks, each including a first stack, including a first stack first periodic structure (S1P1) having an S1P1 pitch along a first axis, a second stack, including a second stack first periodic structure (S2P1) having an S2P1 pitch along a second axis and a third stack, including a third stack first periodic structure (S3P1) having an S3P1 pitch along a third axis, the first axis being parallel to an x-axis or a y-axis, and at least one of the stacks including a second periodic structure having a second periodic structure pitch along at least one fourth axis parallel to the first axis and co-axial with one of the axes.

17 Claims, 81 Drawing Sheets

(58) Field of Classification Search
CPC ... G03F 7/705; G03F 7/70605–706851; G03F 7/70633; G03F 7/70683; G03F 9/7073–7084
USPC ...... 355/18, 30, 52–55, 67–77; 356/399–401
See application file for complete search history.

(56) References Cited

U.S. PATENT DOCUMENTS

| | | | |
|---|---|---|---|
| 7,440,105 | B2 | 10/2008 | Adel et al. |
| 11,209,737 | B1 | 12/2021 | Stoschus et al. |
| 2002/0179826 | A1 | 12/2002 | Laberge et al. |
| 2005/0018190 | A1 | 1/2005 | Sezginer et al. |
| 2011/0122496 | A1 | 5/2011 | Van Der Schaar et al. |
| 2012/0176629 | A1 | 7/2012 | Allen et al. |
| 2014/0139815 | A1 | 5/2014 | Amir |
| 2016/0300767 | A1 | 10/2016 | Ko et al. |
| 2017/0307367 | A1 | 10/2017 | Yaegashi et al. |
| 2018/0024054 | A1* | 1/2018 | Moon ................ G03F 7/70683 382/181 |
| 2018/0081193 | A1 | 3/2018 | Levinsk et al. |
| 2018/0188663 | A1 | 7/2018 | Levinski et al. |
| 2019/0101835 | A1 | 4/2019 | Chen |
| 2021/0072650 | A1 | 11/2021 | Feler et al. |

FOREIGN PATENT DOCUMENTS

| | | | |
|---|---|---|---|
| JP | 2017024289 | A | 2/2017 |
| TW | 200937140 | A | 9/2009 |
| TW | 201825433 | A | 7/2018 |
| TW | 201841082 | A | 11/2018 |
| WO | 2011007757 | A1 | 1/2011 |

OTHER PUBLICATIONS

WIPO, ISR for PCT/US2020/025416, Jul. 20, 2020.
TIPO, Office Action issued for TW Application No. 109111551, Feb. 21, 2024.
TIPO, Office Action issued for TW Application No. 109111551, Jul. 10, 2023.

* cited by examiner

MULTI-LAYERED MOIRÉ TARGETS AND METHODS FOR USING THE SAME IN MEASURING MISREGISTRATION OF SEMICONDUCTOR DEVICES

REFERENCE TO RELATED APPLICATIONS

Reference is hereby made to U.S. Provisional Patent Application Ser. No. 62/872,422, filed Jul. 10, 2019 and U.S. Provisional Patent Application Ser. No. 62/829,839, filed Apr. 5, 2019, the disclosures of which are hereby incorporated by reference and priority of which is hereby claimed.

Reference is also made to the following patents and patent applications of the Applicant, which are related to the subject matter of the present application, the disclosures of which are hereby incorporated by reference:

U.S. Pat. No. 7,440,105 entitled CONTINUOUSLY VARYING OFFSET MARK AND METHODS OF DETERMINING OVERLAY;

U.S. Published Patent Application No. 2018/0188663 entitled DEVICE-LIKE METROLOGY TARGETS; and U.S. Provisional Patent Application Ser. No. 62/898,980, filed Sep. 11, 2019 and entitled IMAGING OVERLAY TARGETS INCLUDING MOIRE ELEMENTS AND ROTATIONAL SYMMETRY ARRANGEMENTS.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a multi-layered moiré target useful in the calculation of the misregistration between at least a first layer, a second layer and a third layer, the first layer, second layer and third layer being formed on a semiconductor device wafer, the semiconductor device wafer defining an x-y plane, the multi-layered moiré target including at least one group of periodic structure stacks, each of the at least one group including a first stack of periodic structures, including at least a first stack first periodic structure (S1P1) formed together with at least one of the first layer, the second layer and the third layer, the S1P1 having an S1P1 pitch along a first axis, a second stack of periodic structures, including at least a second stack first periodic structure (S2P1) formed together with at least one of the first layer, the second layer and the third layer, the S2P1 having an S2P1 pitch along a second axis and a third stack of periodic structures, including at least a third stack first periodic structure (S3P1) formed together with at least one of the first layer, the second layer and the third layer, the S3P1 having an S3P1 pitch along a third axis, the first axis being parallel to either an x-axis or a y-axis when the target is imaged in the x-y plane, the second axis and the third axis being parallel to the first axis when the target is imaged in the x-y plane and at least one of the first, second and third stacks including a second periodic structure having a second periodic structure pitch along at least one fourth axis parallel to the first axis and co-axial with one of the first axis, the second axis and the third axis when the target is imaged in the x-y plane.

In accordance with a preferred embodiment of the present invention the first layer defines a first generally planar surface parallel to the x-y plane, the second layer defines a second generally planar surface parallel to the x-y plane, the third layer defines a third generally planar surface parallel to the x-y plane, the first axis lies in a first plane parallel to one of an x-z plane or a y-z plane, the one of an x-z plane or a y-z plane, together with the x-y plane, defining a three-dimensional x-y-z coordinate system, the second axis lies in a second plane parallel to the first plane, the third axis lies in a third plane parallel to the first plane and the at least one fourth axis lies in a respective one of the first plane, the second plane and the third plane and is parallel to a respective one of the first axis, the second axis or the third axis.

Preferably, the first stack of periodic structures includes the S1P1 formed together with the first layer and a first stack second periodic structure (S1P2) formed together with the second layer, the S1P2 having an S1P2 pitch along a first one of the at least one fourth axis being co-axial with the first axis when the target is imaged in the x-y plane, the second stack of periodic structures includes the S2P1 formed together with the second layer and a second stack second periodic structure (S2P2) formed together with the third layer, the S2P2 having an S2P2 pitch along a second one of the at least one fourth axis being co-axial with the second axis when the target is imaged in the x-y plane and the third stack of periodic structures includes the S3P1 formed together with the first layer and a third stack second periodic structure (S3P2) formed together with the third layer, the S3P2 having an S3P2 pitch along a third one of the at least one fourth axis when the target is imaged in the x-y plane.

Preferably, the S2P1 pitch is related to the S1P2 pitch by a second stack multiplicative factor, the S2P2 pitch is related to the S1P1 pitch by the second stack multiplicative factor, the S3P1 pitch is related to the S1P1 pitch by a third stack multiplicative factor and the S3P2 pitch is related to the S1P2 pitch by the third stack multiplicative factor. In accordance with a preferred embodiment of the present invention, the second stack multiplicative factor is equal to one and the third stack multiplicative factor is equal to one.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fourth axis, the second stack of periodic structures includes the S2P1 formed together with the first layer and a second stack second periodic structure (S2P2) formed together with the second layer, the S2P2 having an S2P2 pitch along a second one of the at least one fourth axis and the third stack of periodic structures includes the S3P1 formed together with the second layer and a third stack second periodic structure (S3P2) formed together with the third layer, the S3P2 having an S3P2 pitch along a third one of the at least one fourth axis.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fourth axis, the second stack of periodic structures includes the S2P1 formed together with the first layer and a second stack second periodic structure (S2P2) formed together with the second layer, the S2P2 having an S2P2 pitch along a second one of the at least one fourth axis and the third stack of periodic structures includes the S3P1 formed together with the second layer and a third stack second periodic structure (S3P2) formed together with the first layer, the S3P2 having an S3P2 pitch along a third one of the at least one fourth axis.

Preferably, the S3P1 pitch is related to the S2P2 pitch by a third stack multiplicative factor and the S3P2 pitch is related to the S2P1 pitch by the third stack multiplicative factor. In accordance with a preferred embodiment of the present invention, the third stack multiplicative factor is equal to one. In accordance with a preferred embodiment of the present invention the S1P1 pitch is the same as the S2P2 pitch and the S1P2 pitch is the same as the S2P1 pitch. Alternatively, the S1P1 pitch is the same as the S2P1 pitch, the S1P2 pitch differs from the S1P1 pitch by an additive term, the S2P2 pitch differs from the S1P1 pitch by the additive term, the S3P1 pitch differs from the S1P1 pitch by the additive term and the S3P2 pitch is the same as the S1P1 pitch.

In accordance with a preferred embodiment of the present invention the first stack of periodic structures includes the S1P1 formed together with the second layer, the second stack of periodic structures includes the S2P1 formed together with the first layer and a second stack second periodic structure (S2P2) formed together with the second layer, the S2P2 having an S2P2 pitch along a second one of the at least one fourth axis and the third stack of periodic structures includes the S3P1 formed together with the second layer and a third stack second periodic structure (S3P2) formed together with the third layer, the S3P2 having an S3P2 pitch along a third one of the at least one fourth axis. In accordance with a preferred embodiment of the present invention the S2P1 pitch is the same as the S3P2 pitch and the S2P2 pitch is the same as the S3P1 pitch.

In accordance with a preferred embodiment of the present invention the first stack of periodic structures includes the S1P1 formed together with the second layer, the second stack of periodic structures including the S2P1 formed together with the first layer and the third stack of periodic structures includes the S3P1 formed together with the second layer and a third stack second periodic structure (S3P2) formed together with the third layer, the S3P2 having an S3P2 pitch along the at least one fourth axis.

In accordance with a preferred embodiment of the present invention the first stack of periodic structures includes the S1P1 formed together with the first layer, the second stack of periodic structures including the S2P1 formed together with the first layer and the third stack of periodic structures includes the S3P1 formed together with the first layer and a third stack second periodic structure (S3P2) formed together with the third layer, the S3P2 having an S3P2 pitch along the at least one fourth axis.

In accordance with a preferred embodiment of the present invention the first stack of periodic structures includes the S1P1 formed together with the second layer, the second stack of periodic structures including the S2P1 formed together with the first layer and the third stack of periodic structures includes the S3P1 formed together with the second layer and a third stack second periodic structure (S3P2) formed together with the first layer, the S3P2 having an S3P2 pitch along the at least one fourth axis.

In accordance with a preferred embodiment of the present invention, the first stack of periodic structures includes the S1P1 formed together with the first layer, the second stack of periodic structures includes the S2P1 formed together with the first layer and a second stack second periodic structure (S2P2) formed together with the second layer, the S2P2 having an S2P2 pitch along a first one of the at least one fourth axis and the third stack of periodic structures includes the S3P1 formed together with the second layer and a third stack second periodic structure (S3P2) formed together with the third layer, the S3P2 having an S3P2 pitch along a second one of the at least one fourth axis.

Preferably, the at least one group of periodic structure stacks includes at least one first group of periodic stacks in which the first axis is parallel to the x-axis when the target is imaged in the x-y plane and at least one second group of periodic stacks in which the first axis is parallel to the y-axis when the target is imaged in the x-y plane. Additionally, the at least one first group of periodic stacks and the at least one second group of periodic stacks are identical except for their orientation.

In accordance with a preferred embodiment of the present invention the target is characterized by mirror symmetry. In accordance with a preferred embodiment of the present invention the target is characterized by rotational symmetry.

There is also provided in accordance with another preferred embodiment of the present invention a multi-layered moiré target useful in the calculation of the misregistration between at least a first layer, a second layer, a third layer and a fourth layer, the first layer, second layer, third layer and fourth layer being formed on a semiconductor device wafer, the semiconductor device wafer defining an x-y plane, the multi-layered moiré target including at least one group of periodic structure stacks, each of the at least one group including a first stack of periodic structures, including at least a first stack first periodic structure (S1P1) formed together with at least one of the first layer, the second layer, the third layer and the fourth layer, the S1P1 having an S1P1 pitch along a first axis, a second stack of periodic structures, including at least a second stack first periodic structure (S2P1) formed together with at least one of the first layer, the second layer, the third layer and the fourth layer, the S2P1 having an S2P1 pitch along a second axis, a third stack of periodic structures, including at least a third stack first periodic structure (S3P1) formed together with at least one of the first layer, the second layer, the third layer and the fourth layer, the S3P1 having an S3P1 pitch along a third axis and a fourth stack of periodic structures, including at least a fourth stack first periodic structure (S4P1) formed together with at least one of the first layer, the second layer, the third layer and the fourth layer, the S4P1 having an S4P1 pitch along a fourth axis, the first axis being parallel to either an x-axis or a y-axis when the target is imaged in the x-y plane, the second axis, the third axis and the fourth axis being parallel to the first axis when the target is imaged in the x-y plane, and at least one of the first, second, third and fourth stacks including a second periodic structure having a second periodic structure pitch along at least one fifth axis parallel to the first axis and co-axial with one of the first axis, the second axis, the third axis and the fourth axis when the target is imaged in the x-y plane.

In accordance with a preferred embodiment of the present invention the first layer defines a first generally planar surface parallel to the x-y plane, the second layer defines a second generally planar surface parallel to the x-y plane, the third layer defines a third generally planar surface parallel to the x-y plane, the fourth layer defines a first generally planar surface parallel to the x-y plane, the first axis lies in a first plane parallel to one of an x-z plane or a y-z plane, the one of an x-z plane or a y-z plane, together with the x-y plane, defining a three-dimensional x-y-z coordinate system, the second axis lies in a second plane parallel to the first plane, the third axis lies in a third plane parallel to the first plane, the fourth axis lies in a third plane parallel to the first plane and the at least one fifth axis lies in a respective one of the first plane, the second plane, the third plane and the fourth plane and is parallel to a respective one of the first axis, the second axis, the third axis or the fourth axis.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the first layer and a second stack second periodic structure (S2P2) formed together with the second layer, the S2P2 having an S2P2 pitch along a second one of the at least one fifth axis being co-axial with the second axis when the target is imaged in the x-y plane, the third stack of periodic structures includes the S3P1 formed together with the second layer and a third stack second periodic structure (S3P2) formed together with the third layer, the S3P2 having an S3P2 pitch along a third one of the at least one fifth axis being co-axial with the third axis when the target is imaged in the x-y plane and the fourth stack of periodic structures includes the S4P1 formed together with the third layer and a fourth stack second periodic structure (S4P2) formed together with the fourth layer, the S4P2 having an S4P2 pitch along a fourth one of the at least one fifth axis being co-axial with the fourth axis when the target is imaged in the x-y plane.

In accordance with a preferred embodiment of the present invention the S3P1 pitch is related to the S2P2 pitch by a third stack multiplicative factor, the S3P2 pitch is related to the S2P1 pitch by the third stack multiplicative factor, the S4P1 pitch is related to the S2P1 pitch by a fourth stack multiplicative factor and the S4P2 pitch is related to the S2P2 pitch by the fourth stack multiplicative factor.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer, the third stack of periodic structures includes the S3P1 formed together with the second layer and a third stack second periodic structure (S3P2) formed together with the third layer, the S3P2 having an S3P2 pitch along a second one of the at least one fifth axis being co-axial with the third axis when the target is imaged in the x-y plane and the fourth stack of periodic structures includes the S4P1 formed together with the third layer and a fourth stack second periodic structure (S4P2) formed together with the fourth layer, the S4P2 having an S4P2 pitch along a third one of the at least one fifth axis being co-axial with the fourth axis when the target is imaged in the x-y plane.

Preferably, the S4P1 pitch is related to the S3P2 pitch by a fourth stack multiplicative factor and the S4P2 pitch is related to the S3P1 pitch by the fourth stack multiplicative factor.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer and a second stack second periodic structure (S2P2) formed together with the third layer, the S2P2 having an S2P2 pitch along a second one of the at least one fifth axis being co-axial with the second axis when the target is imaged in the x-y plane, the third stack of periodic structures includes the S3P1 formed together with the first layer and a third stack second periodic structure (S3P2) formed together with the third layer, the S3P2 having an S3P2 pitch along a third one of the at least one fifth axis being co-axial with the third axis when the target is imaged in the x-y plane and the fourth stack of periodic structures includes the S4P1 formed together with the third layer and a fourth stack second periodic structure (S4P2) formed together with the fourth layer, the S4P2 having an S4P2 pitch along a fourth one of the at least one fifth axis being co-axial with the fourth axis when the target is imaged in the x-y plane.

Preferably, the S2P1 pitch is related to the S1P2 pitch by a second stack multiplicative factor, the S2P2 pitch is related to the S1P1 pitch by the second stack multiplicative factor, the S3P1 pitch is related to the S1P1 pitch by a third stack multiplicative factor, the S3P2 pitch is related to the S1P2 pitch by the third stack multiplicative factor, the S4P1 pitch is related to the S1P2 pitch by a fourth stack multiplicative factor and the S4P2 pitch is related to the S1P1 pitch by the fourth stack multiplicative factor.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer, the third stack of periodic structures includes the S3P1 formed together with the third layer and the fourth stack of periodic structures includes the S4P1 formed together with the fourth layer.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer, the third stack of periodic structures includes the S3P1 formed together with the second layer and the fourth stack of periodic structures includes the S4P1 formed together with the fourth layer.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer, the third stack of periodic structures includes the S3P1 formed together with the third layer and the fourth stack of periodic structures includes the S4P1 formed together with the second layer.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fifth axis being co-axial with the first axis when the target is imaged in the x-y plane, the second stack of periodic structures includes the S2P1 formed together with the second layer, the third stack of periodic structures includes the S3P1 formed together with the third layer and the fourth stack of periodic structures includes the S4P1 formed together with the third layer.

In accordance with a preferred embodiment of the present invention the at least one group of periodic structure stacks includes at least one first group of periodic stacks in which the first axis is parallel to the x-axis when the target is imaged in the x-y plane and at least one second group of periodic stacks in which the first axis is parallel to the y-axis when the target is imaged in the x-y plane. Additionally, the at least one first group of periodic stacks and the at least one second group of periodic stacks are identical except for their orientation.

Preferably, the target is characterized by mirror symmetry. In accordance with a preferred embodiment of the present invention the target is characterized by rotational symmetry.

There is further provided in accordance with yet another preferred embodiment of the present invention a multi-layered moiré target useful in the calculation of the misregistration between at least a first layer, a second layer, a third layer and a fourth layer, the first layer, second layer, third layer and fourth layer being formed on a semiconductor device wafer, the semiconductor device wafer defining an x-y plane, the multi-layered moiré target including at least one group of periodic structure stacks, each of the at least one group including a first stack of periodic structures, including at least a first stack first periodic structure (S1P1) formed together with at least one of the first layer, the second layer, the third layer and the fourth layer, the S1P1 having an S1P1 pitch along a first axis, a second stack of periodic structures, including at least a second stack first periodic structure (S2P1) formed together with at least one of the first layer, the second layer, the third layer and the fourth layer, the S2P1 having an S2P1 pitch along a second axis and a third stack of periodic structures, including at least a third stack first periodic structure (S3P1) formed together with at least one of the first layer, the second layer, the third layer and the fourth layer, the S3P1 having an S3P1 pitch along a third axis, the first axis being parallel to either an x-axis or a y-axis when the target is imaged in the x-y plane, the second axis and the third axis being parallel to the first axis when the target is imaged in the x-y plane, and at least one of the first, second and third stacks including a second periodic structure having a second periodic structure pitch along at least one fourth axis parallel to the first axis and co-axial with one of the first axis, the second axis and the third axis when the target is imaged in the x-y plane.

In accordance with a preferred embodiment of the present invention the first stack of periodic structures includes the S1P1 formed together with the first layer and a first stack second periodic structure (S1P2) formed together with the second layer, the S1P2 having an S1P2 pitch along a first one of the at least one fourth axis, the second stack of periodic structures includes the S2P1 formed together with the first layer and a second stack second periodic structure (S2P2) formed together with the third layer, the S2P2 having an S2P2 pitch along a second one of the at least one fourth axis and the third stack of periodic structures includes the S3P1 formed together with the first layer and a third stack second periodic structure (S3P2) formed together with the fourth layer, the S3P2 having an S3P2 pitch along a third one of the at least one fourth axis.

In accordance with a preferred embodiment of the present invention the at least one group of periodic structure stacks includes at least one first group of periodic stacks in which the first axis is parallel to the x-axis when the target is imaged in the x-y plane and at least one second group of periodic stacks in which the first axis is parallel to the y-axis when the target is imaged in the x-y plane. Additionally, the at least one first group of periodic stacks and the at least one second group of periodic stacks are identical except for their orientation.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

It is appreciated that the targets and methods described hereinbelow with reference to FIGS. 1-39 form part of a manufacturing process for semiconductor devices, and the misregistration measured using the targets and methods described hereinbelow with reference to FIGS. 1-39 is used to adjust fabrication processes of the semiconductor devices to more closely align various layers of the semiconductor devices being fabricated.

It is appreciated that the targets described hereinbelow include at least one group of periodic structure stacks, wherein each stack includes one or more periodic structures, each periodic structure having a pitch. It is appreciated that in the embodiments described hereinbelow all of the periodic structures within a single stack have different pitches.

Figure 1:
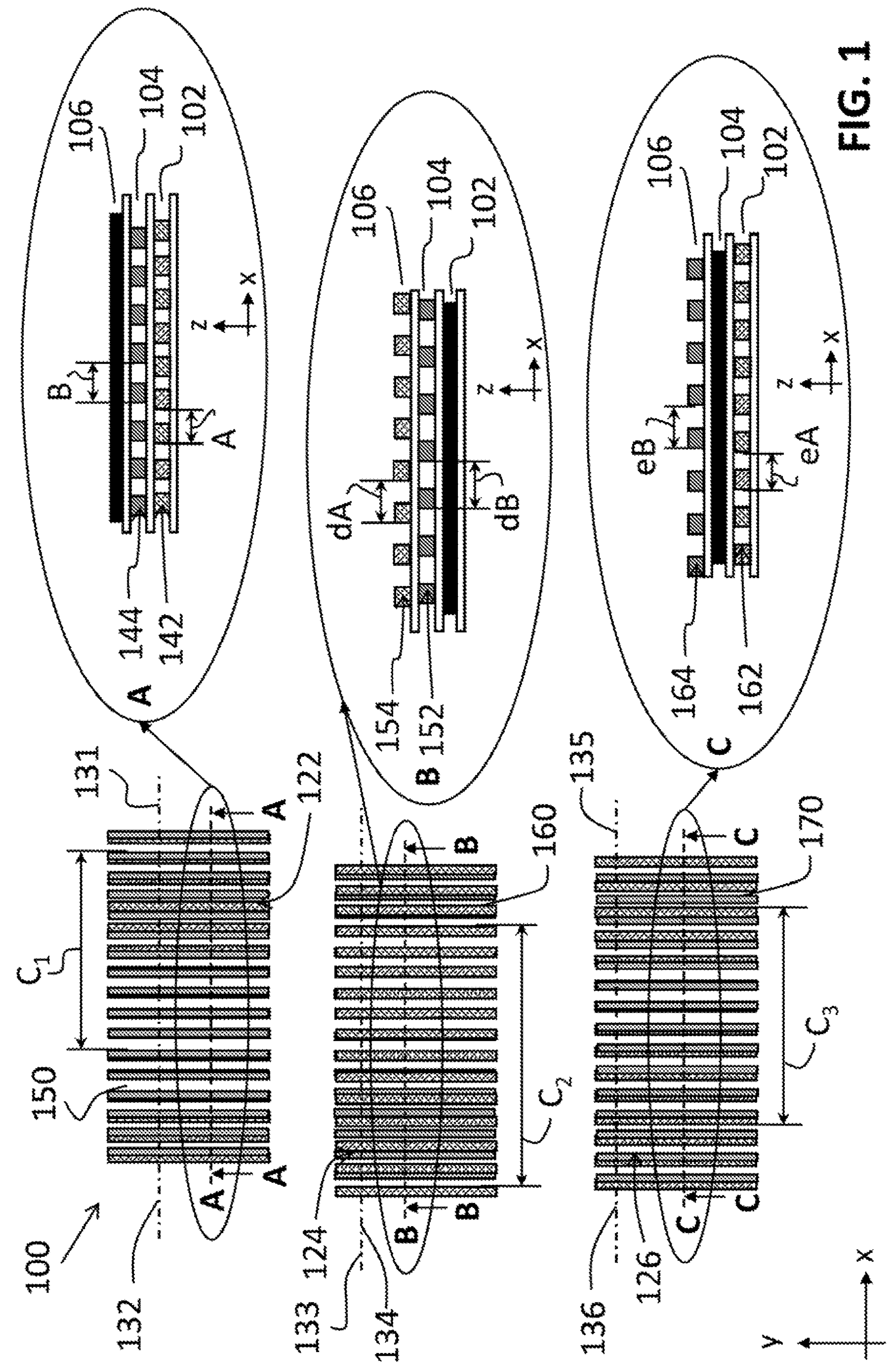
FIG. 1 is a simplified illustration of a first embodiment of a multi-layered moiré target of the present invention.

Reference is now made to FIG. 1, which is a simplified illustration of a first embodiment of a multi-layered moiré target 100 of the present invention. FIG. 1 includes illustrations in three different dimensions, indicated by x-, y- and z-axes, the three dimensions being referred to hereinafter as an x-y plane, an x-z plane and a y-z plane, respectively. It is noted that FIG. 1 generally illustrates the x-y plane, while enlargements A, B and C of FIG. 1 illustrate planes parallel to the x-z plane.

Target 100 is preferably formed on a semiconductor device wafer on which are preferably formed at least a first layer 102, a second layer 104 and a third layer 106. It is appreciated that each of first layer 102, second layer 104 and third layer 106 defines a generally planar surface parallel to the x-y plane. First, second and third layers 102, 104 and 106 may be adjacent layers but need not be. Preferably, any material between first, second and third layers 102, 104 and 106 is at least partially transparent to electromagnetic radiation. In the embodiment illustrated in FIG. 1, first layer 102 lies below second and third layers 104 and 106, and third layer 106 lies above first and second layers 102 and 104. It is appreciated, however, that layers 102, 104 and 106 may be arranged in any suitable order along the z-axis with respect to one another.

It is appreciated that FIG. 1 illustrates one possible layout of target 100, and that in other embodiments of the present invention, target 100 may include additional structures. For example, as described hereinbelow with reference to FIGS. 2A-2D & 34-39, a suitable target may include multiple instances of the structures shown in FIG. 1, and those multiple instances may be arranged in various ways.

Preferably, target 100 includes a first stack 122 of periodic structures, a second stack 124 of periodic structures and a third stack 126 of periodic structures. Each of first stack 122, second stack 124 and third stack 126 includes one or more periodic structures, each periodic structure having a pitch. Preferably, none of first stack 122, second stack 124 and third stack 126 overlap with one another.

It is appreciated that although in FIG. 1, each of the periodic structures of first stack 122, second stack 124 and third stack 126 are shown as being formed of a plurality of lines and spaces, in other embodiments of the invention, the periodic structures of first stack 122, second stack 124 and third stack 126 may be formed of any suitable periodic features. It is further appreciated that the periodic features forming the periodic structures included in first stack 122, second stack 124 and third stack 126 may be formed of sub-structures. The pitches of each of the periodic structures of first stack 122, second stack 124 and third stack 126 are preferably between 10 nm-3000 nm, and more preferably between 200 nm-800 nm.

A first x-z plane 131 intersects first stack 122. A plurality of first axes 132 lie within first x-z plane 131 and are parallel to the x-axis. A second x-z plane 133 intersects second stack 124. A plurality of second axes 134 lie within second x-z plane 133 and are parallel to the x-axis. A third x-z plane 135 intersects third stack 126. A plurality of third axes 136 lie within third x-z plane 135 and are parallel to the x-axis.

As seen particularly in enlargement A, first stack 122 includes a first stack first periodic structure (S1P1) 142 formed together with first layer 102 and having an S1P1 pitch, designated A, along one of first stack axes 132. First stack 122 further includes a first stack second periodic structure (S1P2) 144 formed together with second layer 104 and having an S1P2 pitch, designated B, along another of first stack axes 132.

It is appreciated that S1P1 142 and S1P2 144 at least partially overlie one another, and thus a first stack moiré pattern 150 is visible upon imaging first stack 122. As is known in the art, first stack moiré pattern 150 is characterized by a pitch $C_1$, which is a function of pitches A and B, as shown in equation 1:

$$C_1 = \frac{A \times B}{|A - B|} \quad \text{(Eq. 1)}$$

Preferably, first stack 122 does not include periodic structures formed together with third layer 106 which affect moiré pattern 150. However, first stack 122 may include periodic structures formed together with third layer 106 which do not affect moiré pattern 150, such as periodic structures which are periodic along an axis parallel to the y-axis or periodic structures having a pitch size that does not affect moiré pattern 150.

As seen particularly in enlargement B, second stack 124 includes a second stack first periodic structure (S2P1) 152 formed together with second layer 104 and having an S2P1 pitch, designated dB, along one of second stack axes 134. Preferably, S2P1 pitch dB is related to S1P2 pitch B by a second stack multiplicative factor, designated d. Second stack multiplicative factor d may be any positive number. Second stack 124 further includes a second stack second periodic structure (S2P2) 154 formed together with third layer 106 and having an S2P2 pitch, designated dA, along another of second stack axes 134. Preferably, S2P2 pitch dA is related to S1P1 pitch A by second stack multiplicative factor d. It is appreciated that second stack multiplicative factor d relating S2P2 pitch dA to S1P1 pitch A has the same value as second stack multiplicative factor d relating S2P1 pitch dB to S1P2 pitch B. In an embodiment of the present invention, the value of d is 1 and thus S2P1 pitch dB is identical to S1P2 pitch B and S2P2 pitch dA is identical to S1P1 pitch A.

It is appreciated that S2P1 152 and S2P2 154 at least partially overlie one another, and thus a second stack moiré pattern 160 is visible upon imaging second stack 124. As is known in the art, second stack moiré pattern 160 is characterized by a pitch $C_2$, which is a function of second stack multiplicative factor d, pitch A and pitch B, as shown in equation 2:

$$C_2 = d\left(\frac{A \times B}{|A - B|}\right) \quad \text{(Eq. 2)}$$

Preferably, second stack 124 does not include periodic structures formed together with first layer 102 which affect moiré pattern 160. However, second stack 124 may include periodic structures formed together with first layer 102 which do not affect moiré pattern 160, such as periodic structures which are periodic along an axis parallel to the y-axis or periodic structures having a pitch size that does not affect moiré pattern 160.

As seen particularly in enlargement C, third stack 126 includes a third stack first periodic structure (S3P1) 162 formed together with first layer 102 and having an S3P1 pitch, designated eA, along one of third stack axes 136. Preferably, S3P1 pitch eA is related to S1P1 pitch A by a third stack multiplicative factor, designated e. Third stack multiplicative factor e may be any positive number. Third stack 126 further includes a third stack second periodic structure (S3P2) 164 formed together with third layer 106 and having an S3P2 pitch, designated eB, along another of third stack axes 136. Preferably, S3P2 pitch eB is related to S1P2 pitch B by third stack multiplicative factor e. It is appreciated that third stack multiplicative factor e relating S3P2 pitch eB to S1P2 pitch B has the same value as third stack multiplicative factor e relating S3P1 pitch eA to S1P1 pitch A. In an embodiment of the present invention, the value of e is 1 and thus S3P1 pitch eA is identical to S1P1 pitch A and S3P2 pitch eB is identical to S1P2 pitch B.

It is appreciated that S3P1 162 and S3P2 164 at least partially overlie one another, and thus a third stack moiré pattern 170 is visible upon imaging third stack 126. As is known in the art, third stack moiré pattern 170 is characterized by a pitch $C_3$, which is a function of third stack multiplicative factor e, pitch A and pitch B, as shown in equation 3:

$$C_3 = e\left(\frac{A \times B}{|A - B|}\right) \quad \text{(Eq. 3)}$$

Preferably, third stack 126 does not include periodic structures formed together with second layer 104 which affect moiré pattern 170. However, third stack 126 may include periodic structures formed together with second layer 104 which do not affect moiré pattern 170, such as periodic structures which are periodic along an axis parallel to the y-axis or periodic structures having a pitch size that does not affect moiré pattern 170.

Misregistration between any two of layers 102, 104 and 106 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches A, B, dA, dB, eA and eB need not be optically resolvable by the misregistration metrology tool used to generate an image of target 100. However, it is preferable that each of pitches $C_1$, $C_2$ and $C_3$ is optically resolvable by the misregistration metrology tool used to generate an image of target 100.

Figure 2A:
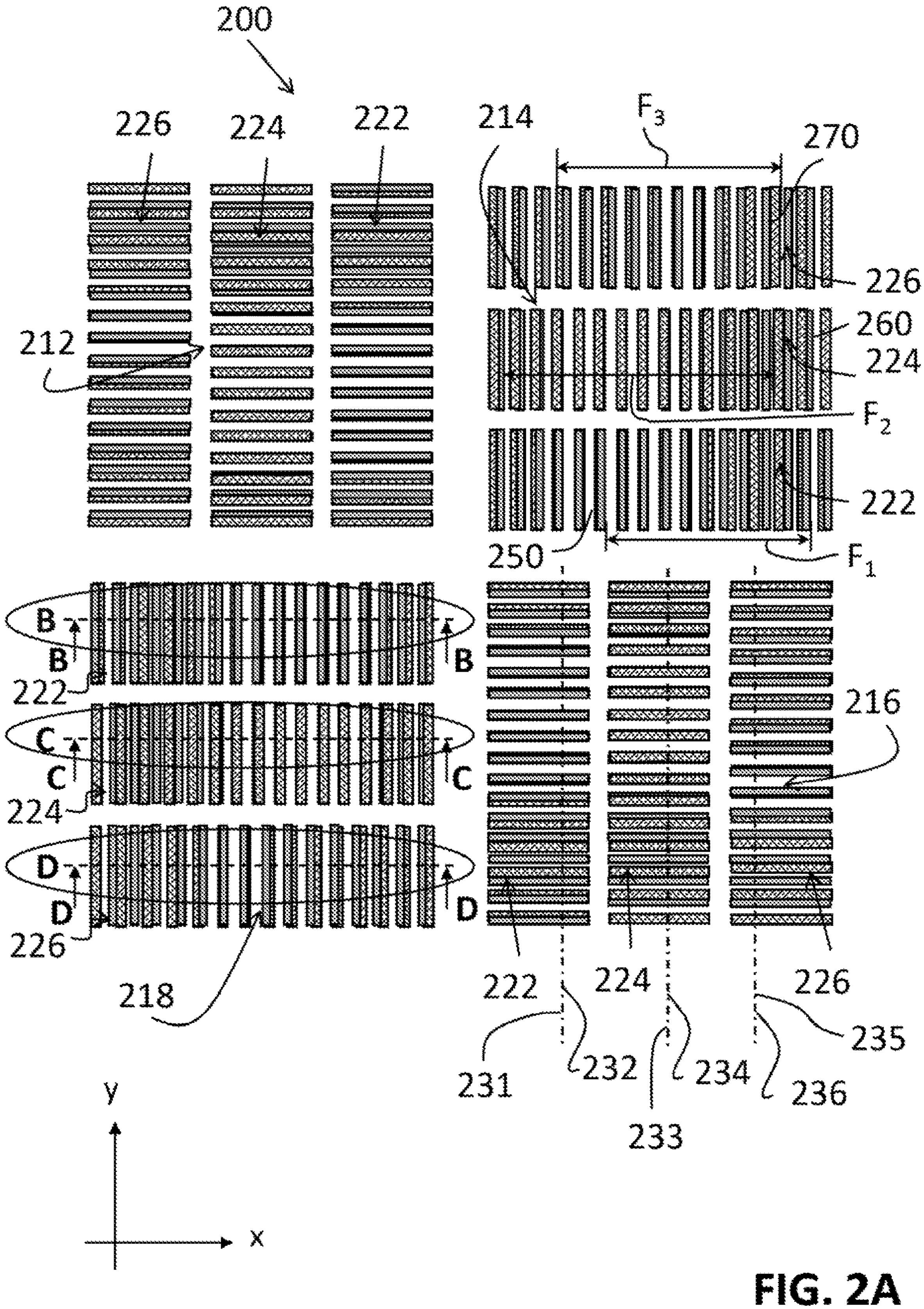
FIGS. 2A, 2B, 2C and 2D are simplified respective top view, first sectional side view, second sectional side view and third sectional side view illustrations of another embodiment of a multi-layered moiré target of the present invention, FIGS. 2B, 2C and 2D being taken along lines B-B, C-C and D-D in FIG. 2A, respectively.
Figure 2B:
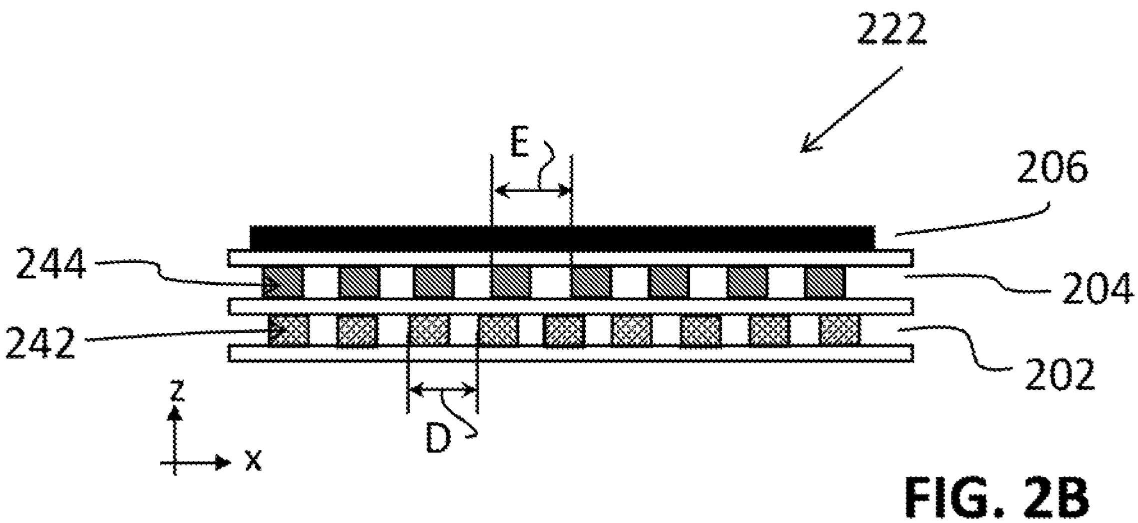
Figure 2C:
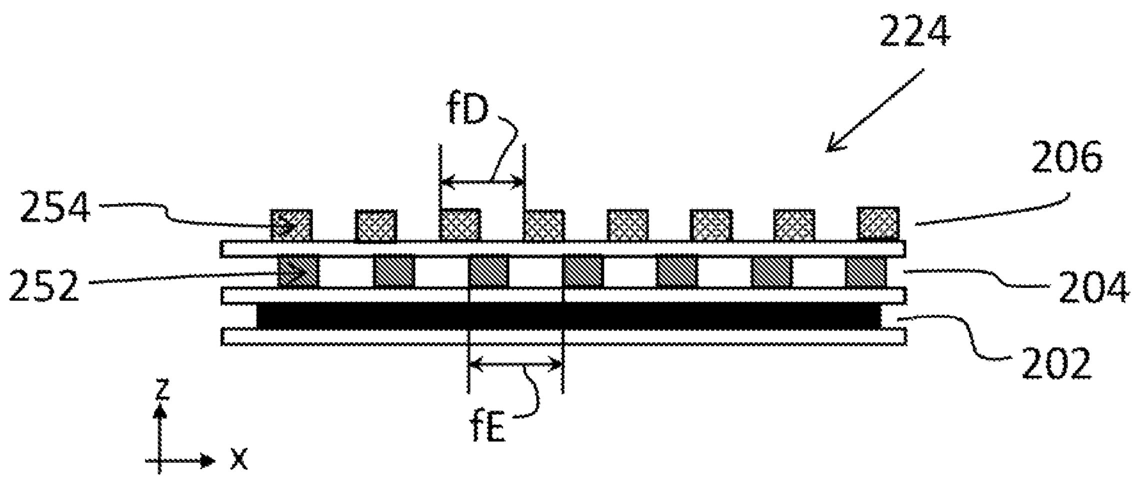
Figure 2D:
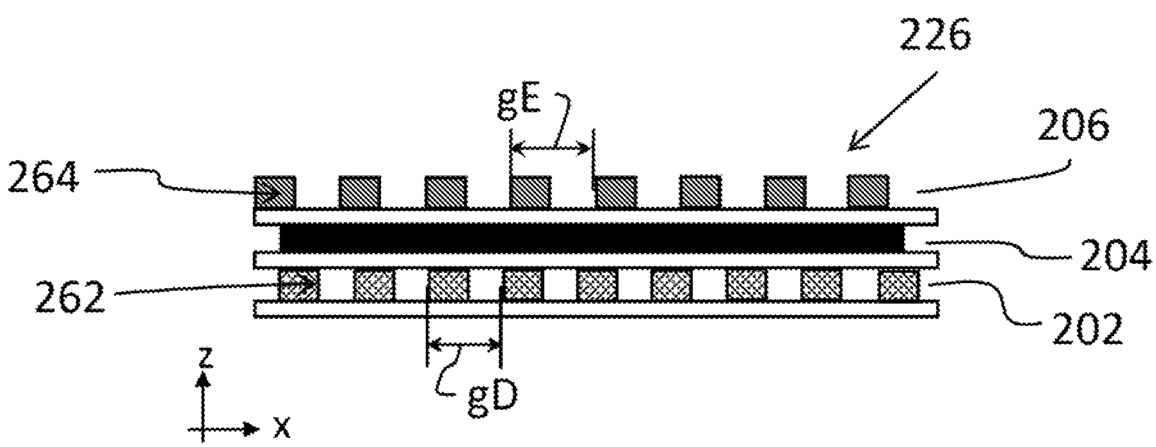

Reference is now made to FIGS. 2A-2D, which are simplified illustrations of another embodiment of a multi-layered moiré target 200 of the present invention. FIGS. 2A-2D include illustrations in three different dimensions, indicated by x-, y- and z-axes, the three dimensions being referred to hereinafter as an x-y plane, an x-z plane and a y-z plane, respectively. It is noted that FIG. 2A generally illustrates the x-y plane, while FIGS. 2B, 2C and 2D illustrate planes parallel to the x-z plane.

It is noted that target 200 is one example of an alternative layout of target 100, described hereinabove with reference to FIG. 1, and that additional layouts are described hereinbelow with reference to FIGS. 34-39. Target 200 is preferably formed on a semiconductor device wafer on which are preferably formed at least a first layer 202, a second layer 204 and a third layer 206. It is appreciated that each of first layer 202, second layer 204 and third layer 206 defines a generally planar surface parallel to the x-y plane. First, second and third layers 202, 204 and 206 may be adjacent layers but need not be. Preferably, any material between first, second and third layers 202, 204 and 206 is at least partially transparent to electromagnetic radiation. In the embodiment illustrated in FIGS. 2A-2D, first layer 202 lies below second and third layers 204 and 206, and third layer 206 lies above first and second layers 202 and 204. It is appreciated, however, that layers 202, 204 and 206 may be arranged in any suitable order along the z-axis with respect to one another.

As seen particularly in FIG. 2A, target 200 includes four target quadrants 212, 214, 216 and 218. In the embodiment shown in FIG. 2A, the rotational orientation in the x-y plane of each of target quadrants 212, 214, 216 and 218 preferably differs from the rotational orientation in the x-y plane of each of the other target quadrants 212, 214, 216 and 218 by an integer multiple of 90°. Additionally, target 200 preferably is characterized by rotational symmetry in either the x-direction or the y-direction or both. In a preferred embodiment of the present invention, target 200 is designed such that when in a state of registration, the entirety of target 200 is characterized by a single point of symmetry in the x-direction and a single point of symmetry in the y-direction. However, even in such an embodiment, when in a state of misregistration, various elements of target 200 will be characterized by unique points of symmetry.

Each of target quadrants 212, 214, 216 and 218 includes a first stack 222 of periodic structures, a second stack 224 of periodic structures and a third stack 226 of periodic structures. Each of first stack 222, second stack 224 and third stack 226 includes one or more periodic structures, each periodic structure having a pitch. Preferably, none of first stack 222, second stack 224 and third stack 226 overlap with one another. In FIGS. 2A-2D, first stack 222 is illustrated as lying closer to the center of target 200 than second stack 224 and third stack 226, and third stack 226 is illustrated as lying closer to the edge of target 200 than first stack 222 and second stack 224. However, first stack 222, second stack 224 and third stack 226 may be arranged in any suitable arrangement relative to the x-y plane with respect to one another.

It is appreciated that although in the embodiment illustrated in FIGS. 2A-2D, each of the periodic structures of first stack 222, second stack 224 and third stack 226 are illustrated as being formed of a plurality of lines and spaces, in other embodiments of the invention, the periodic structures of first stack 222, second stack 224 and third stack 226 may be formed of any suitable periodic features. It is further appreciated that the periodic features forming the periodic structures included in first stack 222, second stack 224 and third stack 226 may be formed of sub-structures. The pitches of each of the periodic structures of first stack 222, second stack 224 and third stack 226 are preferably between 10 nm-3000 nm, and more preferably between 200 nm-800 nm.

As seen in FIG. 2A, in each of quadrants 212, 214, 216 and 218, a first plane 231, intersecting first stack 222 and including a plurality of first axes 232 lying therein, a second plane 233, intersecting second stack 224 and including a plurality of second axes 234 lying therein, and a third plane 235, intersecting third stack 226 and including a plurality of third axes 236 lying therein, are defined. Each of first plane 231, second plane 233 and third plane 235 are either an x-z plane or a y-z plane, and first axes 232, second axes 234 and third axes 236 are parallel to the respective x-axis or y-axis, depending on the orientation of first stack 222, second stack 224 and third stack 226 within each of quadrants 212, 214, 216 and 218. It is appreciated that in each of quadrants 212, 214, 216 and 218, first plane 231, second plane 233 and third plane 235 are all parallel to one another.

As seen particularly in FIG. 2B, first stack 222 includes a first stack first periodic structure (S1P1) 242 formed together with first layer 202 and having an S1P1 pitch, designated D, along one of first stack axes 232. First stack 222 further includes a first stack second periodic structure (S1P2) 244 formed together with second layer 204 and having an S1P2 pitch, designated E, along another of first stack axes 232.

It is appreciated that S1P1 242 and S1P2 244 at least partially overlie one another, and thus a first stack moiré pattern 250 is visible upon imaging first stack 222. As is known in the art, first stack moiré pattern 250 is characterized by a pitch $F_1$, which is a function of pitches D and E, as shown in equation 4:

$$F_1 = \frac{D \times E}{|D - E|} \quad \text{(Eq. 4)}$$

Preferably, first stack 222 does not include periodic structures formed together with third layer 206 which affect moiré pattern 250. However, first stack 222 may include periodic structures formed together with third layer 206 which do not affect moiré pattern 250, such as periodic structures which are periodic in a plane parallel to the x-y plane along an axis that is perpendicular to first stack axes 232 or periodic structures having a pitch size that does not affect moiré pattern 250.

As seen particularly in FIG. 2C, second stack 224 includes a second stack first periodic structure (S2P1) 252 formed together with second layer 204 and having an S2P1 pitch, designated fE, along one of second stack axes 234. Preferably, S2P1 pitch fE is related to S1P2 pitch E by a second stack multiplicative factor, designated f. Second stack multiplicative factor f may be any positive number. Second stack 224 further includes a second stack second periodic structure (S2P2) 254 formed together with third layer 206 and having an S2P2 pitch, designated fD, along another of second stack axes 234. Preferably, S2P2 pitch fD is related to S1P1 pitch D by second stack multiplicative factor f. It is appreciated that second stack multiplicative factor f relating S2P2 pitch fD to S1P1 pitch D has the same value as second stack multiplicative factor f relating S2P1 pitch fE to S1P2 pitch E. In an embodiment of the present invention, the value of f is 1 and thus S2P1 pitch fE is identical to S1P2 pitch E and S2P2 pitch fD is identical to S1P1 pitch D.

It is appreciated that S2P1 252 and S2P2 254 at least partially overlie one another, and thus a second stack moiré pattern 260 is visible upon imaging second stack 224. As is known in the art, second stack moiré pattern 260 is characterized by a pitch $F_2$, which is a function of second stack multiplicative factor f, pitch D and pitch E, as shown in equation 5:

$$F_2 = f\left(\frac{D \times E}{|D - E|}\right) \quad \text{(Eq. 5)}$$

Preferably, second stack 224 does not include periodic structures formed together with first layer 202 which affect moiré pattern 260. However, second stack 224 may include periodic structures formed together with first layer 202 which do not affect moiré pattern 260, such as periodic structures which are periodic in a plane parallel to the x-y plane along an axis that is perpendicular to second stack axes 234 or periodic structures having a pitch size that does not affect moiré pattern 260.

As seen particularly in FIG. 2D, third stack 226 includes a third stack first periodic structure (S3P1) 262 formed together with first layer 202 and having an S3P1 pitch, designated gD, along one of third stack axes 236. Preferably, S3P1 pitch gD is related to S1P1 pitch D by a third stack multiplicative factor, designated g. Third stack multiplicative factor g may be any positive number. Third stack 226 further includes a third stack second periodic structure (S3P2) 264 formed together with third layer 206 and having an S3P2 pitch, designated gE, along another of third stack axes 236. Preferably, S3P2 pitch gE is related to S1P2 pitch E by third stack multiplicative factor g. It is appreciated that third stack multiplicative factor g relating S3P2 pitch gE to S1P2 pitch E has the same value as third stack multiplicative factor g relating S3P1 pitch gD to S1P1 pitch D. In an embodiment of the present invention, the value of g is 1 and thus S3P1 pitch gD is identical to S1P1 pitch D and S3P2 pitch gE is identical to S1P2 pitch E.

It is appreciated that S3P1 262 and S3P2 264 at least partially overlie one another, and thus a third stack moiré pattern 270 is visible upon imaging third stack 226. As is known in the art, third stack moiré pattern 270 is characterized by a pitch $F_3$, which is a function of third stack multiplicative factor g, pitch D and pitch E, as shown in equation 6:

$$F_3 = g\left(\frac{D \times E}{|D - E|}\right) \quad \text{(Eq. 6)}$$

Preferably, third stack 226 does not include periodic structures formed together with second layer 204 which affect moiré pattern 270. However, third stack 226 may include periodic structures formed together with second layer 204 which do not affect moiré pattern 270, such as periodic structures which are periodic in a plane parallel to the x-y plane along an axis that is perpendicular to third stack axes 236 or periodic structures having a pitch size that does not affect moiré pattern 270.

Misregistration between any two of layers 202, 204 and 206 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches D, E, fD, fE, gD and gE need not be optically resolvable by the misregistration metrology tool used to generate an image of target 200. However, it is preferable that each of pitches $F_1$, $F_2$ and $F_3$ is optically resolvable by the misregistration metrology tool used to generate an image of target 200.

Figure 3A:
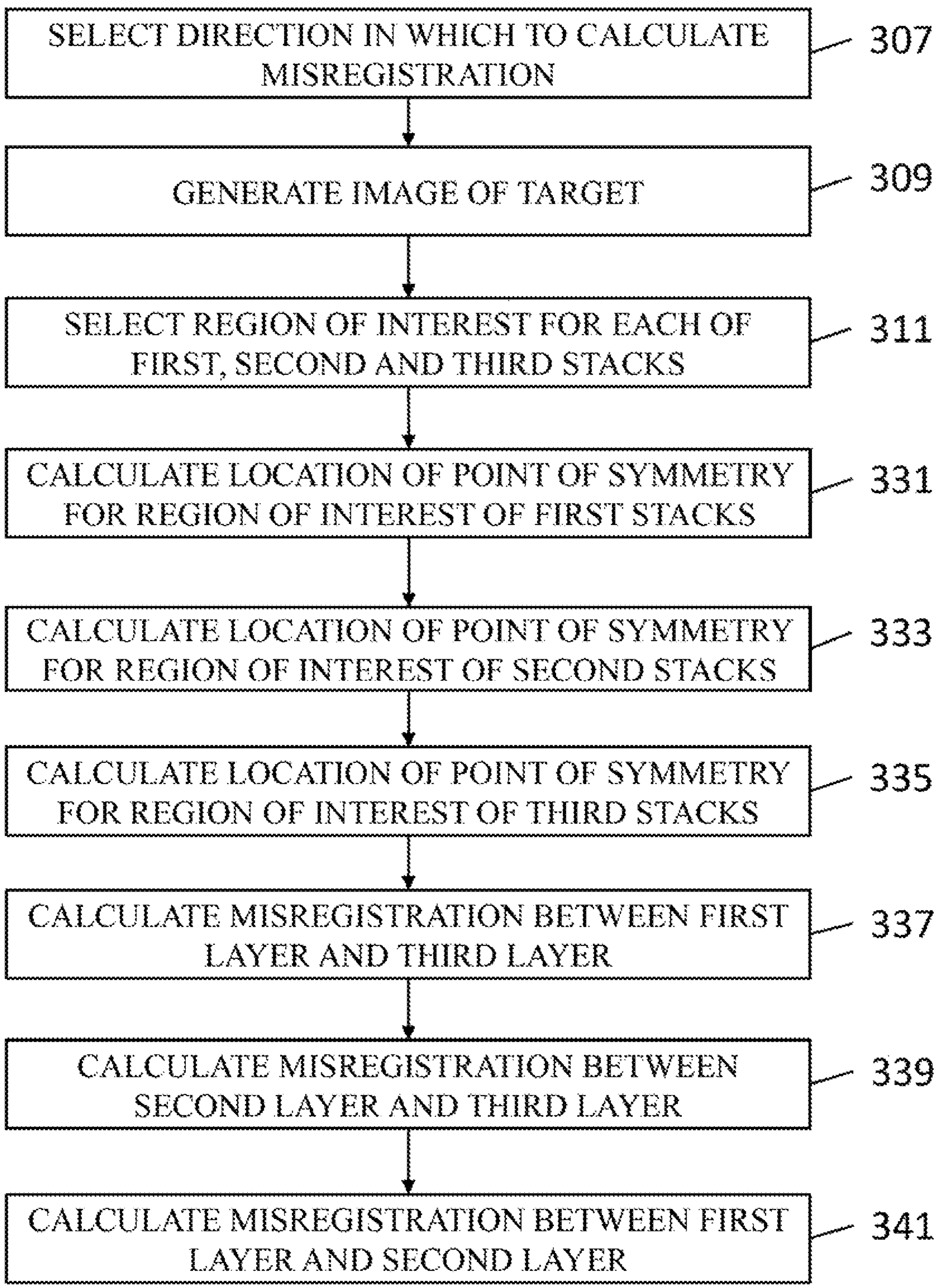
FIG. 3A is a simplified flowchart illustrating a preferred method of calculating misregistration between layers on which the multi-layered moiré target of FIG. 1 or of FIGS. 2A-2D is formed.
Figure 3B:
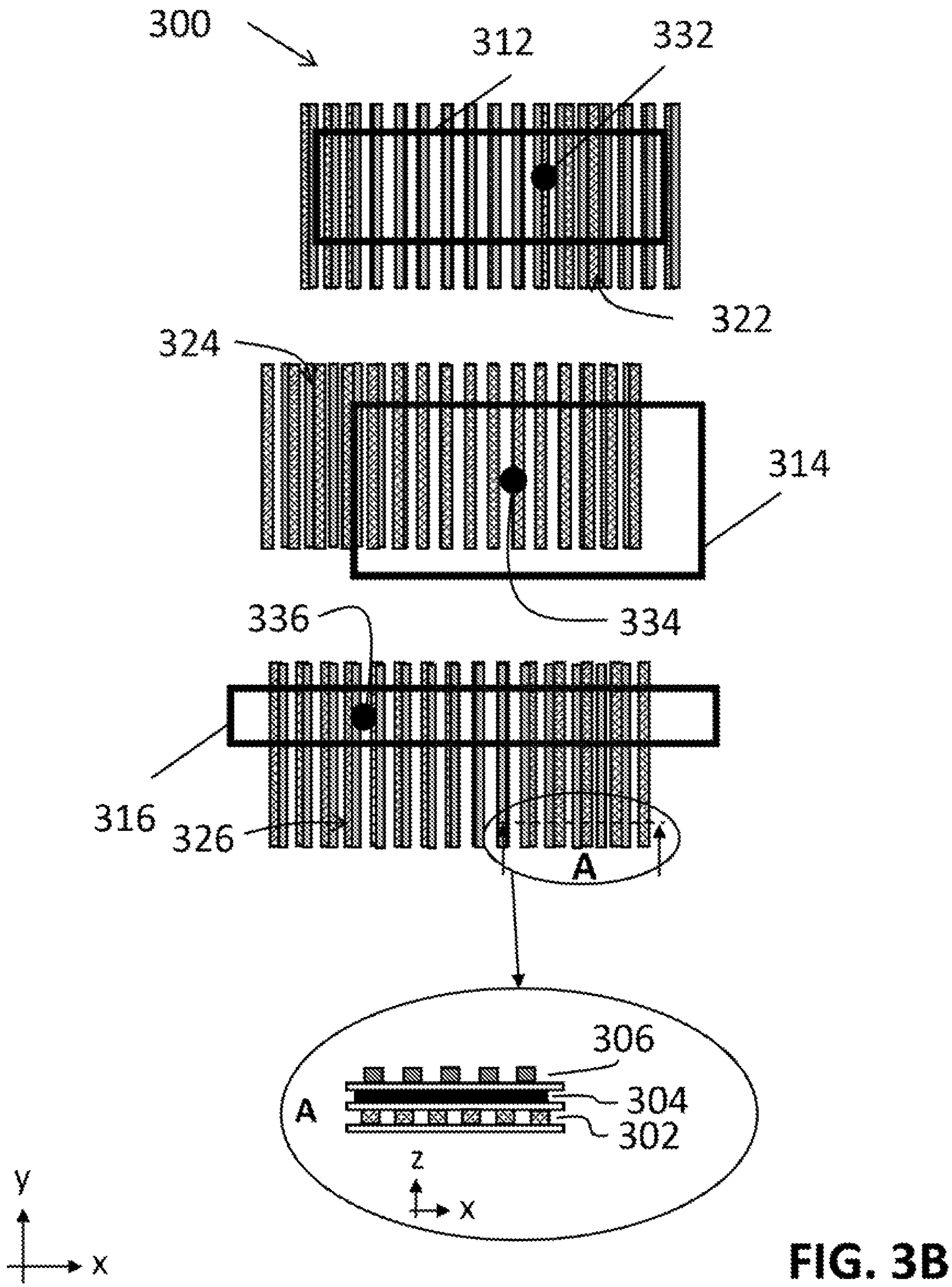
FIGS. 3B and 3C are simplified pictorial illustrations of first and second embodiments of a portion of the method of FIG. 3A, respectively.
Figure 3C:
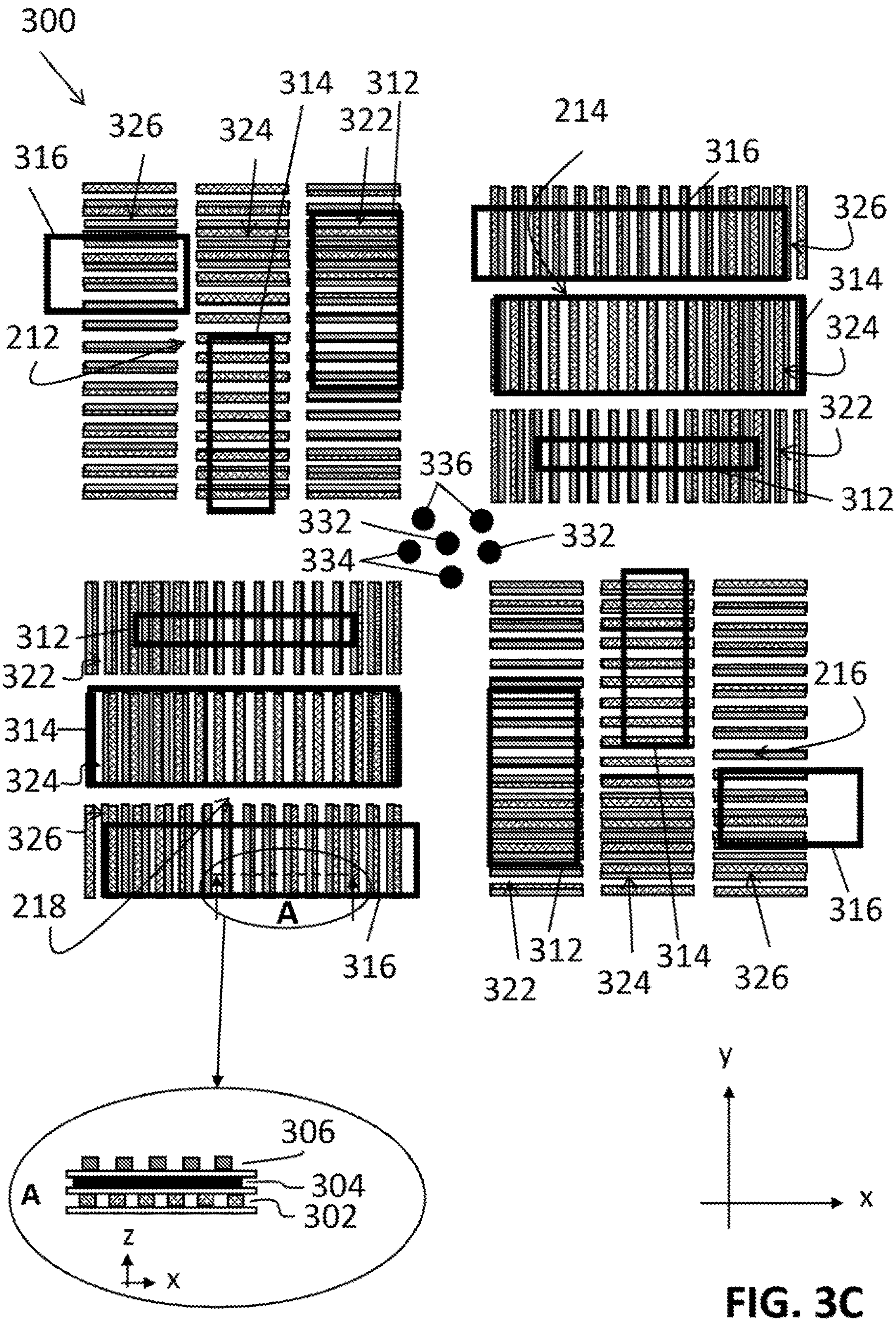

Reference is now made to FIG. 3A, which is a simplified flowchart illustrating a preferred method of calculating misregistration, using a multi-layered moiré target 300, such as a target 100 (FIG. 1) or target 200 (FIGS. 2A-2D), in a direction parallel to either the x or the y direction between a first, a second and a third layer 302, 304 and 306, such as layers 102, 104 and 106 (FIG. 1) or 202, 204 and 206 (FIGS. 2A-2D) of a multilayered semiconductor device wafer formed with target 300. Reference is further made to FIGS. 3B & 3C, which are simplified pictorial illustrations of first and second embodiments of a portion of the method of FIG. 3A, respectively.

While it is appreciated that when utilizing target 200 (FIGS. 2A-2D) the method described with reference to FIGS. 3A-3C may be performed only once to calculate misregistration in either the x or the y direction, typically, the method described in FIGS. 3A-3C will be performed twice, to calculate misregistration in each of the x and y directions. It is also appreciated that when utilizing target 100 (FIG. 1) misregistration may be calculated only in the one direction to which first, second and third stack axes 132, 134 and 136 are parallel.

As seen at a first step 307, a direction in which to measure misregistration is selected. When using target 100 in the method of FIGS. 3A & 3B, the direction in which to measure misregistration is automatically selected to be the direction to which first, second and third stack axes 132, 134 and 136 are parallel. When using target 200 in the method of FIGS. 3A & 3B, the structures of quadrants 214 and 218 are utilized to measure misregistration in a direction parallel to the x-axis, and the structures of quadrants 212 and 216 to measure misregistration in a direction parallel to the y-axis.

Preferably, at a next step 309, an image of target 300 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches A, B, dA, dB, eA, eB, D, E, fD, fE, gD and gE need not be optically resolvable by the misregistration metrology tool used to generate the image of target 300. However, it is preferable that each of pitches $C_1$, $C_2$, $C_3$, $F_1$, $F_2$ and $F_3$ is optically resolvable by the misregistration metrology tool used to generate the image of target 300.

In a next step 311, and as seen in FIGS. 3B & 3C, first, second and third regions of interest 312, 314 and 316 are selected for each of respective first, second and third stacks 322, 324 and 326, such as first, second and third stacks 122, 124 and 126 (FIG. 1) or first, second and third stacks 222, 224 and 226 (FIGS. 2A-2D), in the quadrants selected in step 307. It is appreciated, as seen in the illustrated embodiments of FIGS. 3B & 3C, that while first, second and third regions of interest 312, 314 and 316 preferably lie entirely within each of respective first, second and third stacks 322, 324 and 326, as illustrated for first region of interest 312, which lies completely within first stack 322, first, second and third regions of interest 312, 314 and 316 may extend beyond respective first, second and third stacks 322, 324 and 326, as illustrated for regions of interest 314 and 316, which extend beyond respective second and third stacks 324 and 326. It is further appreciated that regions of interest 312, 314 and 316 shown in FIGS. 3B & 3C are representative regions of interest, and that other suitable regions of interest may be chosen at step 311.

In a next step 331, and as seen in FIGS. 3B & 3C, a location of a point of symmetry 332 between all instances of first region of interest 312 selected in step 311 is calculated. In a next step 333, and as seen in FIGS. 3B & 3C, a location of a point of symmetry 334 between all instances of second region of interest 314 selected in step 311 is calculated. In a next step 335, and as seen in FIGS. 3B & 3C, a location of a point of symmetry 336 between all instances of third region of interest 316 selected in step 311 is calculated.

At a next step 337, a distance in the direction selected at step 307 is calculated between the location of point of symmetry 332 of first region or regions of interest 312 identified at step 331 and the location of point of symmetry 334 of second region or regions of interest 314 identified at step 333. The distance found at step 337 is divided by a gain $G_1$, which for target 100 is a function of pitch A and pitch B, as shown in equation 7a:

$$G_1 = \left(\frac{B}{|A - B|}\right) \quad \text{(Eq. 7a)}$$

and for target 200 is a function of pitch D and pitch E, as shown in equation 7b:

$$G_1 = \left(\frac{E}{|D - E|}\right) \quad \text{(Eq. 7b)}$$

and the result is reported as the misregistration between first and third layers 302 and 306 in the direction selected at step 307. It is appreciated that in addition to the distance calculated at step 337, the method further calculates an adjustment direction, such as right, left, up or down. The adjustment direction is a function of the relative values of pitch A and pitch B or pitch D and pitch E, as well as which of layers 302 and 306 is to be adjusted.

At a next step 339, a distance in the direction selected at step 307 is calculated between the location of point of symmetry 332 of first region or regions of interest 312 identified at step 331 and the location of point of symmetry 336 of third region or regions of interest 316 identified at step 335. The distance found at step 339 is divided by a gain $G_2$, which for target 100 is a function of pitch A and pitch B, as shown in equation 8a:

$$G_2 = \left(\frac{A}{|A-B|}\right) \quad \text{(Eq. 8a)}$$

and for target 200 is a function of pitch D and pitch E, as shown in equation 8b:

$$G_2 = \left(\frac{D}{|D-E|}\right) \quad \text{(Eq. 8b)}$$

and the result is reported as the misregistration between second and third layers 304 and 306 in the direction selected at step 307. It is appreciated that in addition to the distance calculated at step 339, the method further calculates an adjustment direction, such as right, left, up or down. The adjustment direction is a function of the relative values of pitch A and pitch B or pitch D and pitch E, as well as which of layers 304 and 306 is to be adjusted.

At a next step 341, a difference is calculated between the misregistration value reported at step 337 and the misregistration value reported at step 339. The difference calculated at step 341 is reported as the misregistration between first and second layers 302 and 304 in the direction selected at step 307. It is appreciated that in addition to the distance calculated at step 341, the method further calculates an adjustment direction, such as right, left, up or down. The adjustment direction is a function of the relative values of pitch A and pitch B or pitch D and pitch E, as well as which of layers 302 and 304 is to be adjusted.

Figure 4:
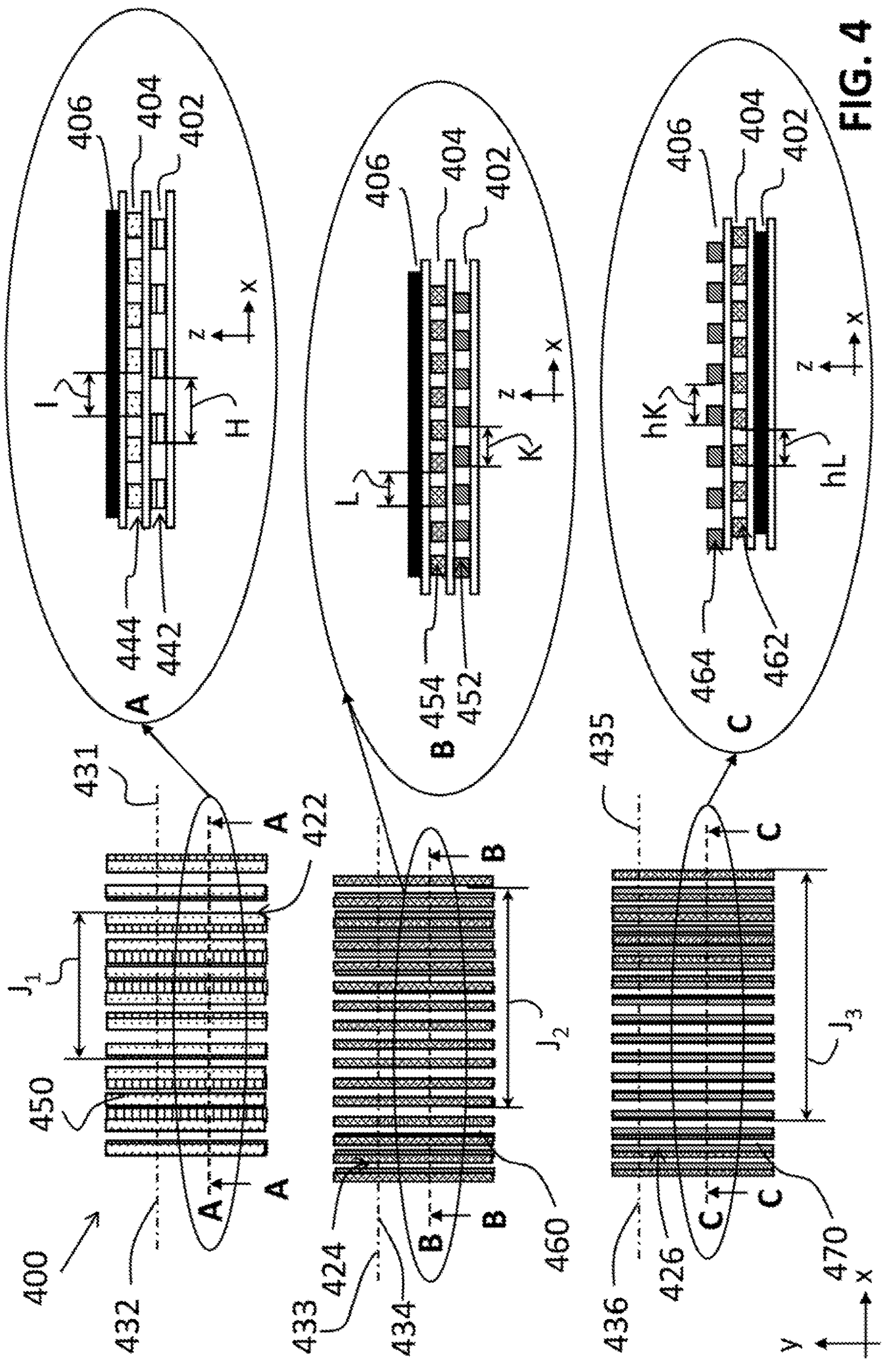
FIG. 4 is a simplified illustration of another embodiment of a multi-layered moiré target of the present invention.

Reference is now made to FIG. 4, which is a simplified illustration of another embodiment of a multi-layered moiré target 400 of the present invention. FIG. 4 includes illustrations in three different dimensions, indicated by x-, y- and z-axes, the three dimensions being referred to hereinafter as an x-y plane, an x-z plane and a y-z plane, respectively. It is noted that FIG. 4 generally illustrates the x-y plane, while enlargements A, B and C of FIG. 4 illustrate planes parallel to the x-z plane.

Target 400 is preferably formed on a semiconductor device wafer on which are preferably formed at least a first layer 402, a second layer 404 and a third layer 406. It is appreciated that each of first layer 402, second layer 404 and third layer 406 defines a generally planar surface parallel to the x-y plane. First, second and third layers 402, 404 and 406 may be adjacent layers but need not be. Preferably, any material between first, second and third layers 402, 404 and 406 is at least partially transparent to electromagnetic radiation. In the embodiment illustrated in FIG. 4, first layer 402 lies below second and third layers 404 and 406, and third layer 406 lies above first and second layers 402 and 404. It is appreciated, however, that layers 402, 404 and 406 may be arranged in any suitable order along the z-axis with respect to one another.

It is appreciated that FIG. 4 illustrates one possible layout of target 400, and that in other embodiments of the present invention, target 400 may include additional structures. For example, as described hereinbelow with reference to FIGS. 5A-5D & 34-39, a suitable target may include multiple instances of the structures shown in FIG. 4, and those multiple instances may be arranged in various ways.

Preferably, target 400 includes a first stack 422 of periodic structures, a second stack 424 of periodic structures and a third stack 426 of periodic structures. Each of first stack 422, second stack 424 and third stack 426 includes one or more periodic structures, each periodic structure having a pitch. Preferably, none of first stack 422, second stack 424 and third stack 426 overlap with one another.

It is appreciated that although in FIG. 4, each of the periodic structures of first stack 422, second stack 424 and third stack 426 are shown as being formed of a plurality of lines and spaces, in other embodiments of the invention, the periodic structures of first stack 422, second stack 424 and third stack 426 may be formed of any suitable periodic features. It is further appreciated that the periodic features forming the periodic structures included in first stack 422, second stack 424 and third stack 426 may be formed of sub-structures. The pitches of each of the periodic structures of first stack 422, second stack 424 and third stack 426 are preferably between 10 nm-3000 nm, and more preferably between 200 nm-800 nm.

A first x-z plane 431 intersects first stack 422. A plurality of first axes 432 lie within first x-z plane 431 and are parallel to the x-axis. A second x-z plane 433 intersects second stack 424. A plurality of second axes 434 lie within second x-z plane 433 and are parallel to the x-axis. A third x-z plane 435 intersects third stack 426. A plurality of third axes 436 lie within third x-z plane 435 and are parallel to the x-axis.

As seen particularly in enlargement A, first stack 422 includes a first stack first periodic structure (S1P1) 442 formed together with first layer 402 and having an S1P1 pitch, designated H, along one of first stack axes 432. First stack 422 further includes a first stack second periodic structure (S1P2) 444 formed together with second layer 404 and having an S1P2 pitch, designated I, along another of first stack axes 432.

It is appreciated that S1P1 442 and S1P2 444 at least partially overlie one another, and thus a first stack moiré pattern 450 is visible upon imaging first stack 422. As is known in the art, first stack moiré pattern 450 is characterized by a pitch $J_1$, which is a function of pitches H and I, as shown in equation 9:

$$J_1 = \frac{H \times I}{|H-I|} \quad \text{(Eq. 9)}$$

Preferably, first stack 422 does not include periodic structures formed together with third layer 406 which affect moiré pattern 450. However, first stack 422 may include periodic structures formed together with third layer 406 which do not affect moiré pattern 450, such as periodic structures which are periodic along an axis parallel to the y-axis or periodic structures having a pitch size that does not affect moiré pattern 450.

As seen in enlargement B, second stack 424 includes a second stack first periodic structure (S2P1) 452 formed together with first layer 402 and having an S2P1 pitch, designated K, along one of second stack axes 434. Second stack 424 further includes a second stack second periodic structure (S2P2) 454 formed together with second layer 404 and having an S2P2 pitch, designated L, along another of second stack axes 434.

It is appreciated that S2P1 452 and S2P2 454 at least partially overlie one another, and thus a second stack moiré pattern 460 is visible upon imaging second stack 424. Second stack moiré pattern 460 is characterized by a pitch $J_2$, which is a function of pitches K and L, as shown in equation 10:

$$J_2 = \frac{K \times L}{|K - L|} \quad \text{(Eq. 10)}$$

Preferably, second stack 424 does not include periodic structures formed together with third layer 406 which affect moiré pattern 460. However, second stack 424 may include periodic structures formed together with third layer 406 which do not affect moiré pattern 460, such as periodic structures which are periodic along an axis parallel to the y-axis or periodic structures having a pitch size that does not affect moiré pattern 460.

As seen particularly in enlargement C, third stack 426 includes a third stack first periodic structure (S3P1) 462 formed together with second layer 404 and having an S3P1 pitch, designated hL, along one of third stack axes 436. Preferably, S3P1 pitch hL is related to S2P2 pitch L by a third stack multiplicative factor, designated h. Third stack multiplicative factor h may be any positive number. Third stack 426 further includes a third stack second periodic structure (S3P2) 464 formed together with third layer 406 and having an S3P2 pitch, designated hK, along another of third stack axes 436. Preferably, S3P2 pitch hK is related to S2P1 pitch K by third stack multiplicative factor h. It is appreciated that third stack multiplicative factor h relating S3P2 pitch hK to S2P1 pitch K has the same value as third stack multiplicative factor h relating S3P1 pitch hL to S2P2 pitch L. In an embodiment of the present invention, the value of h is 1 and thus S3P1 pitch hL is identical to S2P2 pitch L and S3P2 pitch hK is identical to S2P1 pitch K.

It is appreciated that S3P1 462 and S3P2 464 at least partially overlie one another, and thus a third stack moiré pattern 470 is visible upon imaging third stack 426. As is known in the art, third stack moiré pattern 470 is characterized by a pitch $J_3$, which is a function of third stack multiplicative factor h, pitch K and pitch L, as shown in equation 11:

$$J_3 = h\left(\frac{K \times L}{|K - L|}\right) \quad \text{(Eq. 11)}$$

Preferably, third stack 426 does not include periodic structures formed together with first layer 402 which affect moiré pattern 470. However, third stack 426 may include periodic structures formed together with first layer 402 which do not affect moiré pattern 470, such as periodic structures which are periodic along an axis parallel to the y-axis or periodic structures having a pitch size that does not affect moiré pattern 470.

Misregistration between any two of layers 402, 404 and 406 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches I, H, K, L, hK and hL need not be optically resolvable by the misregistration metrology tool used to generate an image of target 400. However, it is preferable that each of pitches $J_1$, $J_2$ and $J_3$ is optically resolvable by the misregistration metrology tool used to generate an image of target 400.

Figure 5A:
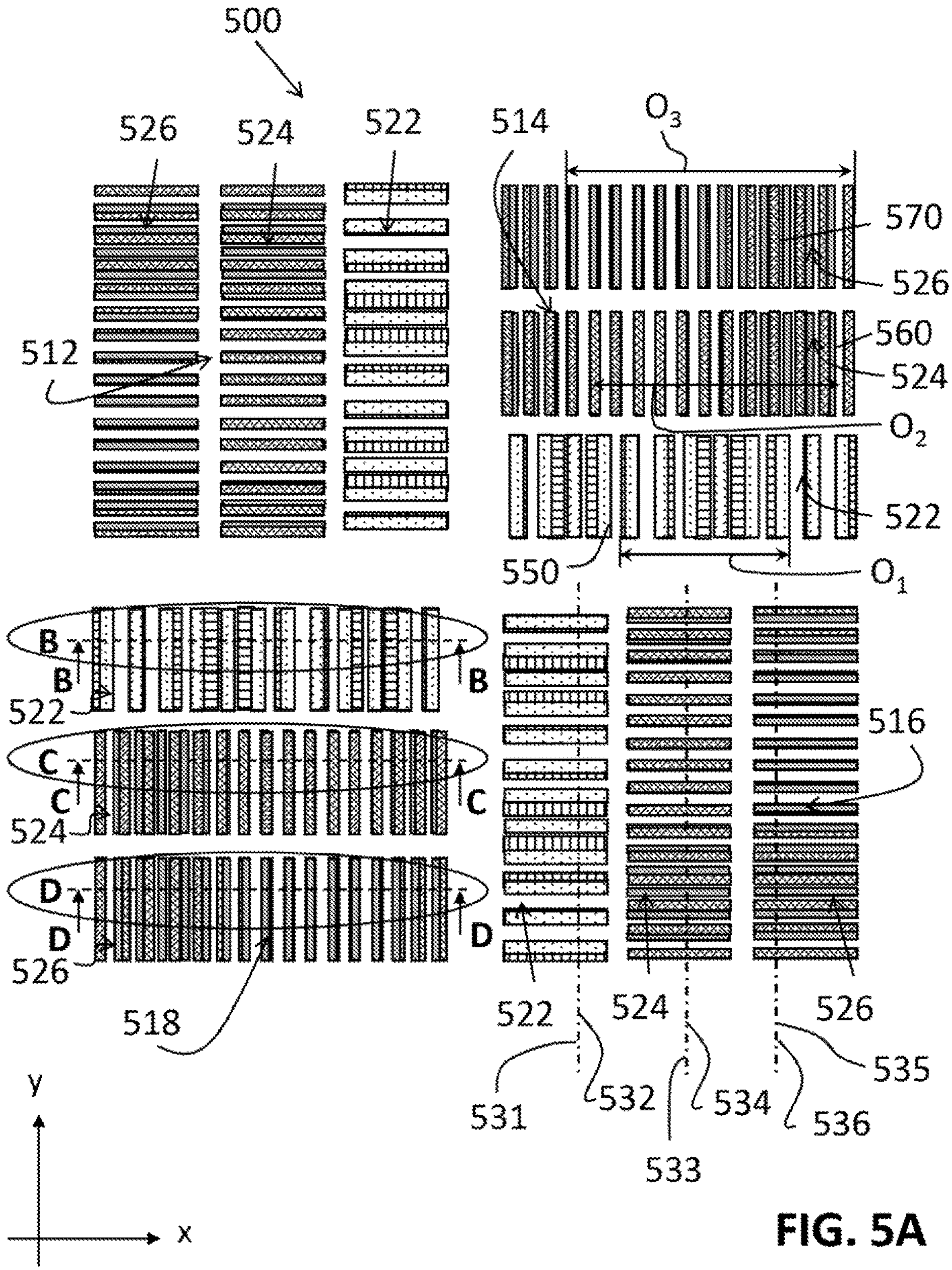
FIGS. 5A, 5B, 5C and 5D are simplified respective top view, first sectional side view, second sectional side view and third sectional side view illustrations of another embodiment of a multi-layered moiré target of the present invention, FIGS. 5B, 5C and 5D being taken along lines B-B, C-C and D-D in FIG. 5A, respectively.
Figure 5B:
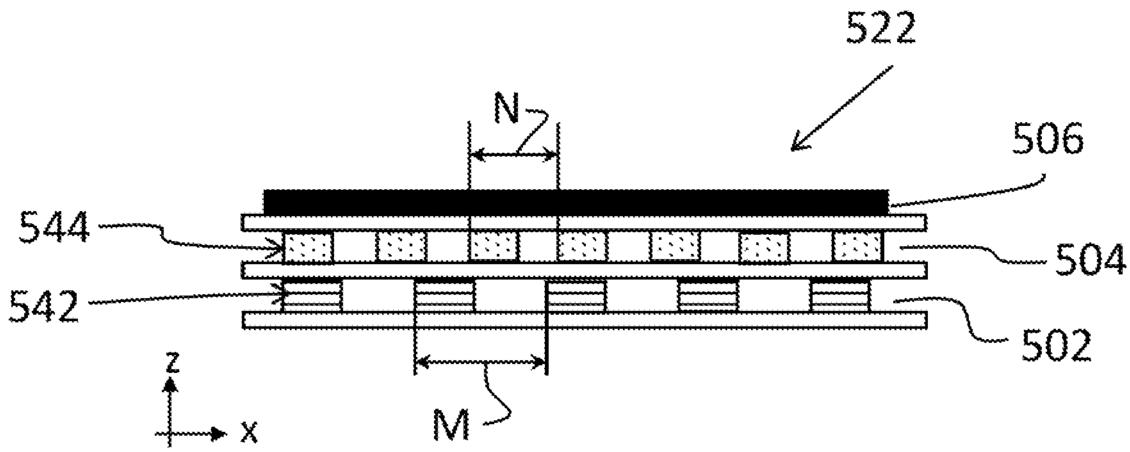
Figure 5C:
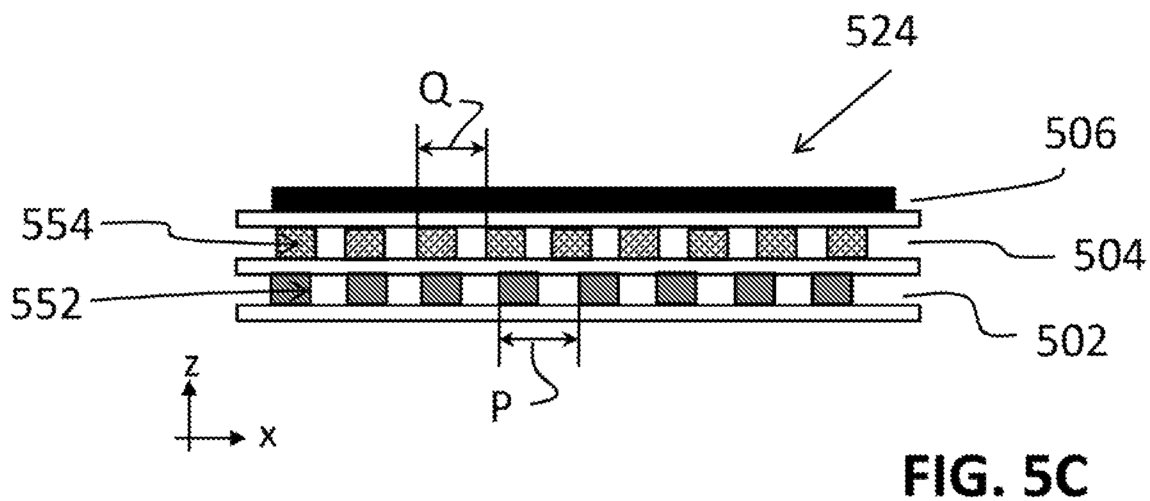
Figure 5D:
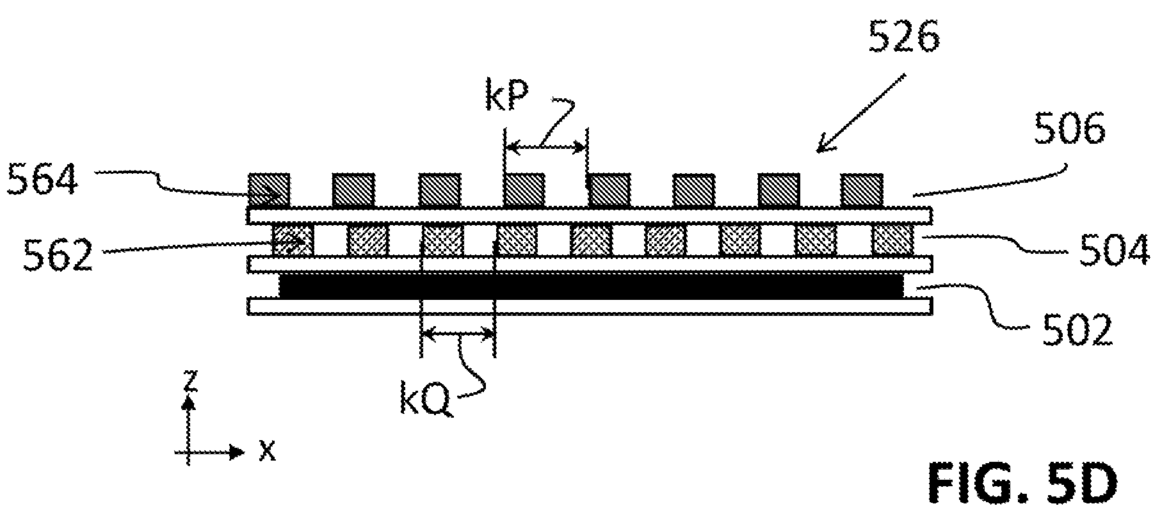

Reference is now made to FIGS. 5A-5D, which are simplified illustrations of another embodiment of a multi-layered moiré target 500 of the present invention. FIGS. 5A-5D include illustrations in three different dimensions, indicated by x-, y- and z-axes, the three dimensions being referred to hereinafter as an x-y plane, an x-z plane and a y-z plane respectively. It is noted that FIG. 5A generally illustrates the x-y plane, while FIGS. 5B, 5C and 5D illustrate planes parallel to the x-z plane.

It is noted that target 500 is one example of an alternative layout of target 400, described hereinabove with reference to FIG. 4, and that additional layouts are described hereinbelow with reference to FIGS. 34-39. Target 500 is preferably formed on a semiconductor device wafer on which are preferably formed at least a first layer 502, a second layer 504 and a third layer 506. It is appreciated that each of first layer 502, second layer 504 and third layer 506 defines a generally planar surface parallel to the x-y plane. First, second and third layers 502, 504 and 506 may be adjacent layers but need not be. Preferably, any material between first, second and third layers 502, 504 and 506 is at least partially transparent to electromagnetic radiation. In the embodiment illustrated in FIGS. 5A-5D, first layer 502 lies below second and third layers 504 and 506, and third layer 506 lies above first and second layers 502 and 504. It is appreciated, however, that layers 502, 504 and 506 may be arranged in any suitable order along the z-axis with respect to one another.

As seen particularly in FIG. 5A, target 500 includes four target quadrants 512, 514, 516 and 518. In the embodiment shown in FIG. 5A, the rotational orientation in the x-y plane of each of target quadrants 512, 514, 516 and 518 preferably differs from the rotational orientation in the x-y plane of each of the other target quadrants 512, 514, 516 and 518 by an integer multiple of 90°. Additionally, target 500 preferably is characterized by rotational symmetry in either the x-direction or the y-direction or both. In a preferred embodiment of the present invention, target 500 is designed such that when in a state of registration, the entirety of target 500 is characterized by a single point of symmetry in the x-direction and a single point of symmetry in the y-direction. However, even in such an embodiment, when in a state of misregistration, various elements of target 500 will be characterized by unique points of symmetry.

Each of target quadrants 512, 514, 516 and 518 includes a first stack 522 of periodic structures, a second stack 524 of periodic structures and a third stack 526 of periodic structures. Each of first stack 522, second stack 524 and third stack 526 includes one or more periodic structures, each periodic structure having a pitch. Preferably, none of first stack 522, second stack 524 and third stack 526 overlap with one another. In FIGS. 5A-5D, first stack 522 is illustrated as lying closer to the center of target 500 than second stack 524 and third stack 526, and third stack 526 is illustrated as lying closer to the edge of target 500 than first stack 522 and second stack 524. However, first stack 522, second stack 524 and third stack 526 may in fact be arranged in any suitable arrangement relative to the x-y plane with respect to one another.

It is appreciated that although in the embodiment illustrated in FIGS. 5A-5D, each of the periodic structures of first stack 522, second stack 524 and third stack 526 are illustrated as being formed of a plurality of lines and spaces, in other embodiments of the invention, the periodic structures of first stack 522, second stack 524 and third stack 526 may be formed of any suitable periodic features. It is further appreciated that the periodic features forming the periodic structures included in first stack 522, second stack 524 and third stack 526 may be formed of sub-structures. The pitches of each of the periodic structures of first stack 522, second stack 524 and third stack 526 are preferably between 10 nm-3000 nm, and more preferably between 200 nm-800 nm.

As seen in FIG. 5A, in each of quadrants 512, 514, 516 and 518, a first plane 531, intersecting first stack 522 and including a plurality of first axes 532 lying therein, a second plane 533, intersecting second stack 524 and including a plurality of second axes 534 lying therein, and a third plane 535, intersecting third stack 526 and including a plurality of third axes 536 lying therein, are defined. Each of first plane 531, second plane 533 and third plane 535 are either an x-z plane or a y-z plane, and first axes 532, second axes 534 and third axes 536 are parallel to the respective x-axis or y-axis, depending on the orientation of first stack 522, second stack 524 and third stack 526 within each of quadrants 512, 514, 516 and 518. It is appreciated that in each of quadrants 512, 514, 516 and 518, first plane 531, second plane 533 and third plane 535 are all parallel to one another.

As seen particularly in FIG. 5B, first stack 522 includes a first stack first periodic structure (S1P1) 542 formed together with first layer 502 and having an S1P1 pitch, designated M, along one of first stack axes 532. First stack 522 further includes a first stack second periodic structure (S1P2) 544 formed together with second layer 504 and having an S1P2 pitch, designated N, along another of first stack axes 532.

It is appreciated that S1P1 542 and S1P2 544 at least partially overlie one another, and thus a first stack moiré pattern 550 is visible upon imaging first stack 522. As is known in the art, first stack moiré pattern 550 is characterized by a pitch $O_1$, which is a function of pitches M and N, as shown in equation 12:

$$O_1 = \frac{M \times N}{|M - N|} \quad \text{(Eq. 12)}$$

Preferably, first stack 522 does not include periodic structures formed together with third layer 506 which affect moiré pattern 550. However, first stack 522 may include periodic structures formed together with third layer 506 which do not affect moiré pattern 550, such as periodic structures which are periodic in a plane parallel to the x-y plane along an axis that is perpendicular to first stack axes 532 or periodic structures having a pitch size that does not affect moiré pattern 550.

As seen particularly in FIG. 5C, second stack 524 includes a second stack first periodic structure (S2P1) 552 formed together with first layer 502 and having an S2P1 pitch, designated P along one of second stack axes 534. Second stack 524 further includes a second stack second periodic structure (S2P2) 554 formed together with second layer 504 and having an S1P2 pitch, designated Q, along another of second stack axes 534.

It is appreciated that S2P1 552 and S2P2 554 at least partially overlie one another, and thus a second stack moiré pattern 560 is visible upon imaging second stack 524. As is known in the art, second stack moiré pattern 560 is characterized by a pitch $O_2$, which is a function of pitches P and Q, as shown in equation 13:

$$O_2 = \frac{P \times Q}{|P - Q|} \quad \text{(Eq. 13)}$$

Preferably, second stack 524 does not include periodic structures formed together with third layer 506 which affect moiré pattern 560. However, second stack 524 may include periodic structures formed together with third layer 506 which do not affect moiré pattern 560, such as periodic structures which are periodic in a plane parallel to the x-y plane along an axis that is perpendicular to second stack axes 534 or periodic structures having a pitch size that does not affect moiré pattern 560.

As seen particularly in FIG. 5D, third stack 526 includes a third stack first periodic structure (S3P1) 562 formed together with second layer 504 and having an S3P1 pitch, designated kQ, along one of third stack axes 536. Preferably, S3P1 pitch kQ is related to S2P2 pitch Q by a third stack multiplicative factor, designated k. Third stack multiplicative factor k may be any positive number. Third stack 526 further includes a third stack second periodic structure (S3P2) 564 formed together with third layer 506 and having an S3P2 pitch, designated kP, along another of third stack axes 536. Preferably, S3P2 pitch kP is related to S2P1 pitch P by third stack multiplicative factor k. It is appreciated that third stack multiplicative factor k relating S3P2 pitch kP to S2P1 pitch P has the same value as third stack multiplicative factor k relating S3P1 pitch kQ to S2P2 pitch Q. In an embodiment of the present invention, the value of k is 1 and thus S3P1 pitch kQ is identical to S2P2 pitch Q and S3P2 pitch kP is identical to S2P1 pitch P.

It is appreciated that S3P1 562 and S3P2 564 at least partially overlie one another, and thus a third stack moiré pattern 570 is visible upon imaging third stack 526. As is known in the art, third stack moiré pattern 570 is characterized by a pitch $O_3$, which is a function of third stack multiplicative factor k, pitch P and pitch Q, as shown in equation 14:

$$O_3 = k\left(\frac{P \times Q}{|P - Q|}\right) \quad \text{(Eq. 14)}$$

Preferably, third stack 526 does not include periodic structures formed together with first layer 502 which affect moiré pattern 570. However, third stack 526 may include periodic structures formed together with first layer 502 which do not affect moiré pattern 570, such as periodic structures which are periodic in a plane parallel to the x-y plane along an axis that is perpendicular to third stack axes 536 or periodic structures having a pitch size that does not affect moiré pattern 570.

Misregistration between any two of layers 502, 504 and 506 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches M, N, P, Q, kP and kQ need not be optically resolvable by the misregistration metrology tool used to generate an image of target 500. However, it is preferable that each of pitches $O_1$, $O_2$ and $O_3$ is optically resolvable by the misregistration metrology tool used to generate an image of target 500.

Figure 6A:
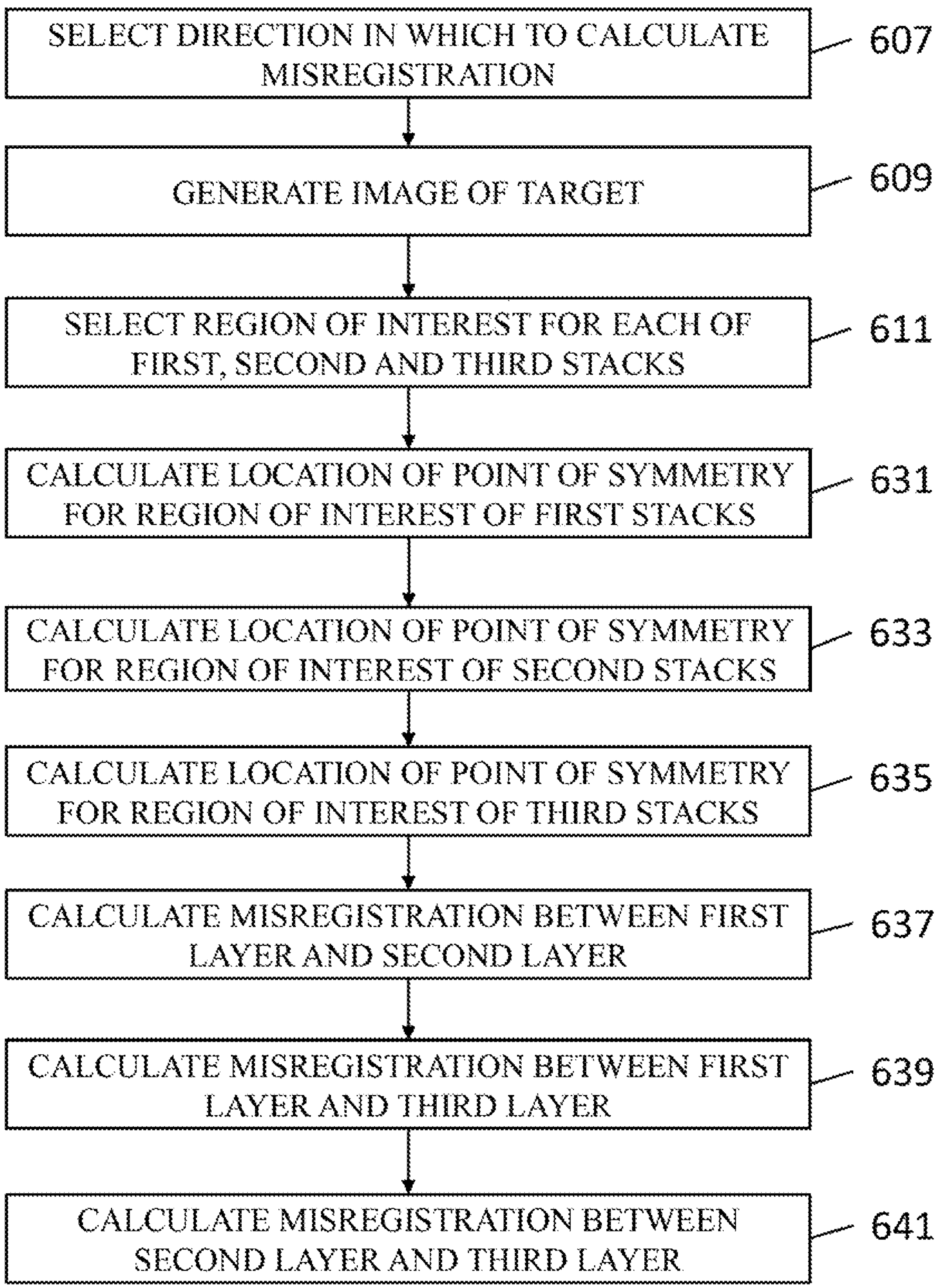
FIG. 6A is a simplified flowchart illustrating a preferred method of calculating misregistration between layers on which the multi-layered moiré target of FIG. 4 or of FIGS. 5A-5D is formed.
Figure 6B:
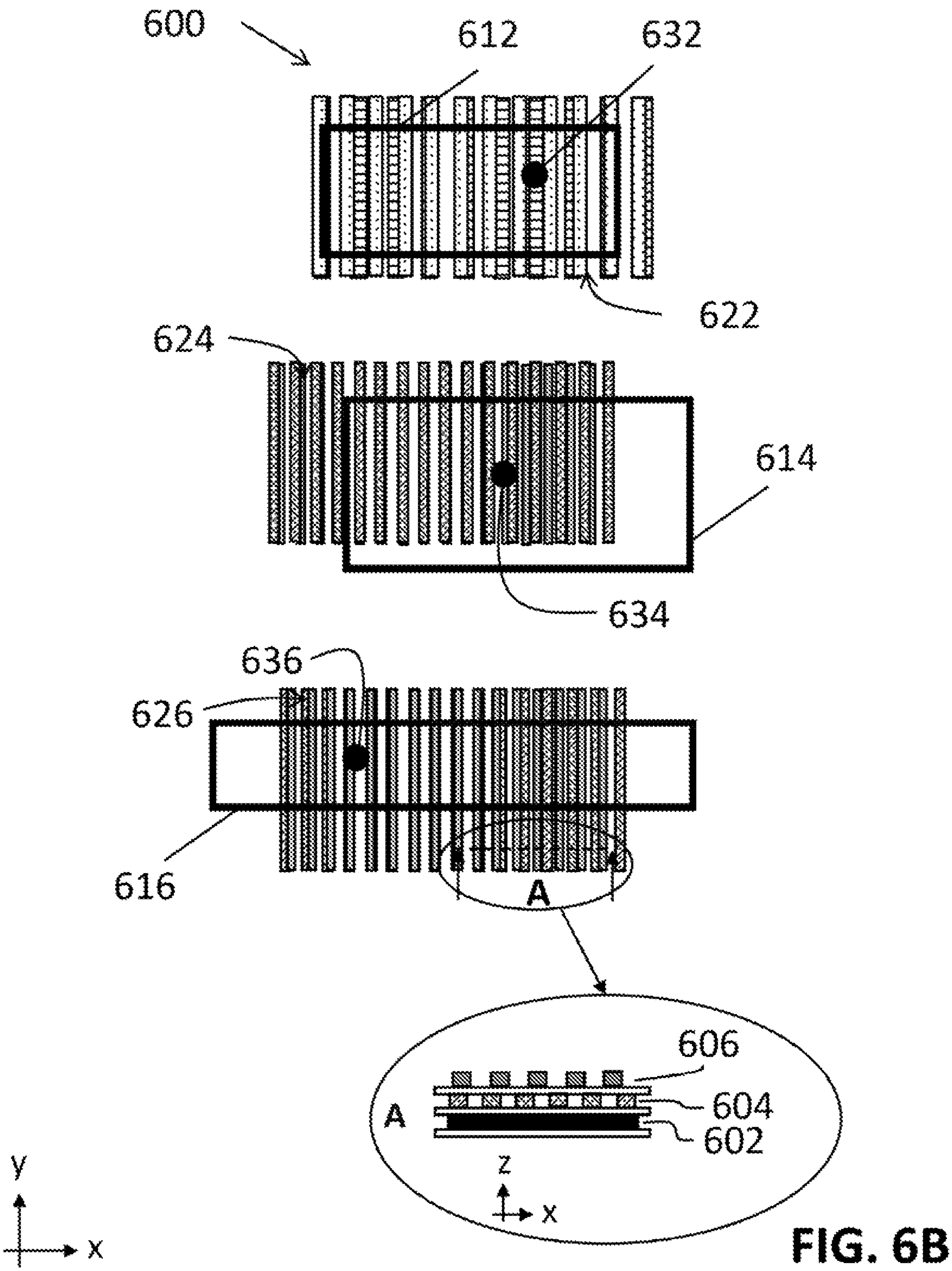
FIGS. 6B and 6C are simplified pictorial illustrations of first and second embodiments of a portion of the method of FIG. 6A, respectively.
Figure 6C:
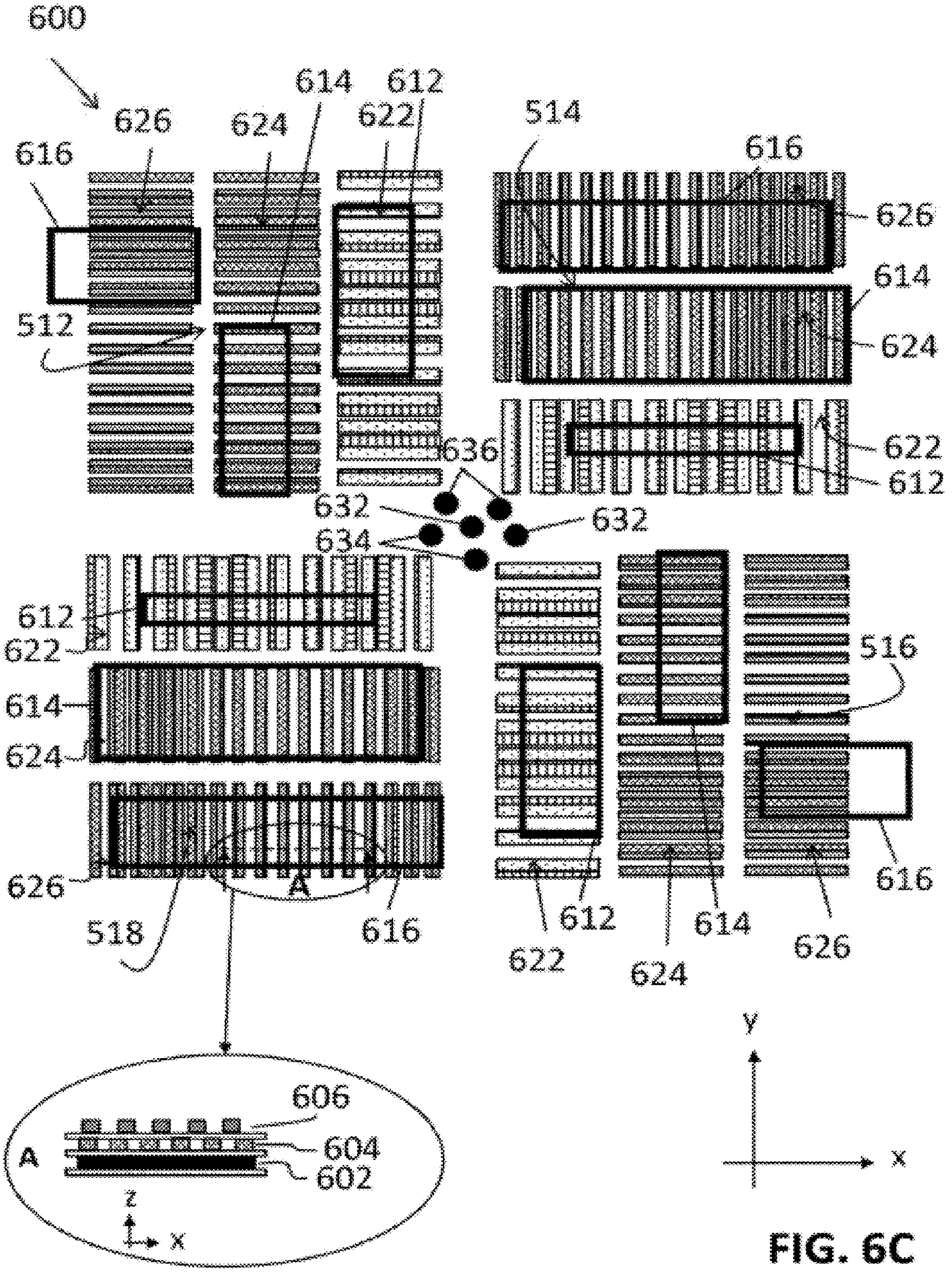

Reference is now made to FIG. 6A, which is a simplified flowchart illustrating a preferred method of calculating misregistration, using a multi-layered moiré target 600, such as a target 400 (FIG. 4) or target 500 (FIGS. 5A-5D), in a direction parallel to either the x or the y direction between a first, a second and a third layer 602, 604 and 606, such as layers 402, 404 and 406 (FIG. 4) or 502, 504 and 506 (FIGS. 5A-5D) of a multilayered semiconductor device wafer formed with target 600. Reference is further made to FIGS. 6B & 6C, which are simplified pictorial illustrations of first and second embodiments of a portion of the method of FIG. 6A, respectively.

While it is appreciated that when utilizing target 500 (FIGS. 5A-5D) the method described with reference to FIGS. 6A-6C may be performed only once to calculate misregistration in either the x or the y direction, typically, the method described in FIGS. 6A-6C will be performed twice, to calculate misregistration in each of the x and y directions. It is also appreciated that when utilizing target 400 (FIG. 4) misregistration may be calculated only in the one direction to which first, second and third stack axes 432, 434 and 436 are parallel.

As seen at a first step 607, a direction in which to measure misregistration is selected. When using target 400 in the method of FIGS. 6A & 6B, the direction in which to measure misregistration is automatically selected to be the direction to which first, second and third stack axes 432, 434 and 436 are parallel. When using target 500 in the method of FIGS. 6A & 6B, the structures of quadrants 514 and 518 are utilized to measure misregistration in a direction parallel to the x-axis, and the structures of quadrants 512 and 516 to measure misregistration in a direction parallel to the y-axis.

Preferably, at a next step 609, an image of target 600 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches I, H, L, K, hK, hL, M, N, P, Q, kP, kQ need not be optically resolvable by the misregistration metrology tool used to generate the image of target 600. However, it is preferable that each of pitches $J_1$, $J_2$, $J_3$, $O_1$, $O_2$ and $O_3$ is optically resolvable by the misregistration metrology tool used to generate the image of target 600.

In a next step 611, and as seen in FIGS. 6B & 6C, first, second and third regions of interest 612, 614 and 616 are selected for each of respective first, second and third stacks 622, 624 and 626, such as first, second and third stacks 422, 424 and 426 (FIG. 4) or first, second and third stacks 522, 524 and 526 (FIGS. 5A-5D), in the quadrants selected in step 607. It is appreciated, as seen in the illustrated embodiments of FIGS. 6B & 6C, that while first, second and third regions of interest 612, 614 and 616 preferably lie entirely within each of respective first, second and third stacks 622, 624 and 626, as illustrated for first region of interest 612, which lies completely within first stack 622, first, second and third regions of interest 612, 614 and 616 may extend beyond respective first, second and third stacks 622, 624 and 626, as illustrated for regions of interest 614 and 616, which extend beyond respective second and third stacks 624 and 626. It is further appreciated that regions of interest 612, 614 and 616 shown in FIGS. 6B & 6C are representative regions of interest, and that other suitable regions of interest may be chosen at step 611.

In a next step 631, and as seen in FIGS. 6B & 6C, a location of a point of symmetry 632 between all instances of first region of interest 612 selected in step 611 is calculated. In a next step 633, and as seen in FIGS. 6B & 6C, a location of a point of symmetry 634 between all instances of second region of interest 614 selected in step 611 is calculated. In a next step 635, and as seen in FIGS. 6B & 6C, a location of a point of symmetry 636 between all instances of third region of interest 616 selected in step 611 is calculated.

At a next step 637, a distance in the direction selected at step 607 is calculated between the location of point of symmetry 632 of first region or regions of interest 612 identified at step 631 and the location of point of symmetry 634 of second region or regions of interest 614 identified at step 633. The distance found at step 637 is divided by a gain $R_1$, which for target 400 is a function of pitches H, I, K and L, as shown in equation 15a:

$$R_1 = \left|\frac{I}{H-I} - \frac{L}{K-L}\right| \quad \text{(Eq. 15a)}$$

and for target 500 is a function of pitches M, N, P and Q, as shown in equation 15b:

$$R_1 = \left|\frac{N}{M-N} - \frac{Q}{P-Q}\right| \quad \text{(Eq. 15b)}$$

and the result is reported as the misregistration between first and second layers 602 and 604 in the direction selected at step 607. It is appreciated that in addition to the distance calculated at step 637, the method further calculates an adjustment direction, such as right, left, up or down. The adjustment direction is a function of the relative values of pitches H and I and pitches K and L or pitches M and N and pitches P and Q, as well as which of layers 602 and 604 is to be adjusted.

At a next step 639, a distance in the direction selected at step 607 is calculated between the location of point of symmetry 634 of second region or regions of interest 614 identified at step 633 and the location of point of symmetry 636 of third region or regions of interest 616 identified at step 635. The distance found at step 639 is divided by a gain $R_2$, which for target 400 is a function of pitch K and pitch L, as shown in equation 16a:

$$R_2 = \left(\frac{L}{|K-L|}\right) \quad \text{(Eq. 16a)}$$

and for target 500 is a function of pitch P and pitch Q, as shown in equation 16b:

$$R_2 = \left(\frac{Q}{|P-Q|}\right) \quad \text{(Eq. 16b)}$$

and the result is reported as the misregistration between first and third layers 602 and 606 in the direction selected at step 607. It is appreciated that in addition to the distance calculated at step 639, the method further calculates an adjustment direction, such as right, left, up or down. The adjustment direction is a function of the relative values of pitches H and I and pitches K and L or pitches M and N and pitches P and Q, as well as which of layers 602 and 606 is to be adjusted.

At a next step 641, a difference is calculated between the misregistration value reported at step 637 and the misregistration value reported at step 639. The difference calculated at step 641 is reported as the misregistration between first and third layers 602 and 606 in the direction selected at step 607. It is appreciated that in addition to the distance calculated at step 641, the method further calculates an adjustment direction, such as right, left, up or down. The adjustment direction is a function of the relative values of pitches H and I and pitches K and L or pitches M and N and pitches P and Q, as well as which of layers 602 and 606 is to be adjusted.

It is appreciated that relevant portions of the method described hereinabove with reference to FIGS. 6A-6C may be performed using only the first two of layers 602, 604 and 606 to be formed, prior to the formation of the third of those layers. As noted hereinabove, layers 602, 604 and 606 may be formed in any suitable order with respect to one another.

Figure 7:
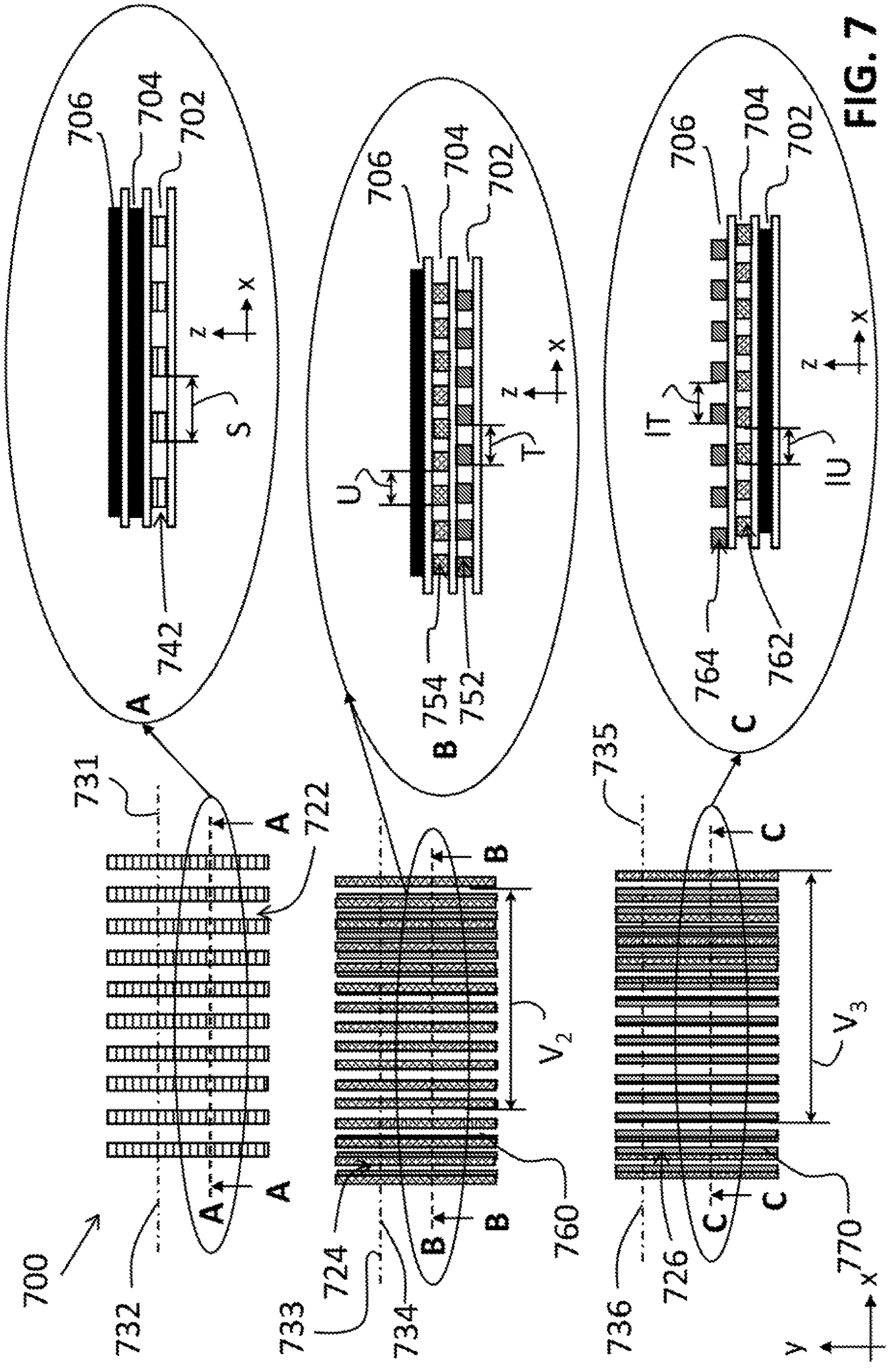
FIG. 7 is a simplified illustration of another embodiment of a multi-layered moiré target of the present invention.

Reference is now made to FIG. 7, which is a simplified illustration of another embodiment of a multi-layered moiré target 700 of the present invention. FIG. 7 includes illustrations in three different dimensions, indicated by x-, y- and z-axes, the three dimensions being referred to hereinafter as an x-y plane, an x-z plane and a y-z plane, respectively. It is noted that FIG. 7 generally illustrates the x-y plane, while enlargements A, B and C of FIG. 7 illustrate planes parallel to the x-z plane.

Target 700 is preferably formed on a semiconductor device wafer on which are preferably formed at least a first layer 702, a second layer 704 and a third layer 706. It is appreciated that each of first layer 702, second layer 704 and third layer 706 defines a generally planar surface parallel to the x-y plane. First, second and third layers 702, 704 and 706 may be adjacent layers but need not be. Preferably, any material between first, second and third layers 702, 704 and 706 is at least partially transparent to electromagnetic radiation. In the embodiment illustrated in FIG. 7, first layer 702 lies below second and third layers 704 and 706, and third layer 706 lies above first and second layers 702 and 704. It is appreciated, however, that layers 702, 704 and 706 may be arranged in any suitable order along the z-axis with respect to one another.

It is appreciated that FIG. 7 illustrates one possible layout of target 700, and that in other embodiments of the present invention, target 700 may include additional structures. For example, as described hereinbelow with reference to FIGS. 8A-8D & 34-39, a suitable target may include multiple instances of the structures shown in FIG. 7, and those multiple instances may be arranged in various ways.

Preferably, target 700 includes a first stack 722 of periodic structures, a second stack 724 of periodic structures and a third stack 726 of periodic structures. Each of first stack 722, second stack 724 and third stack 726 includes one or more periodic structures, each periodic structure having a pitch. Preferably, none of first stack 722, second stack 724 and third stack 726 overlap with one another.

It is appreciated that although in FIG. 7, each of the periodic structures of first stack 722, second stack 724 and third stack 726 are shown as being formed of a plurality of lines and spaces, in other embodiments of the invention, the periodic structures of first stack 722, second stack 724 and third stack 726 may be formed of any suitable periodic features. It is further appreciated that the periodic features forming the periodic structures included in first stack 722, second stack 724 and third stack 726 may be formed of sub-structures. The pitches of each of the periodic structures of first stack 722, second stack 724 and third stack 726 are preferably between 10 nm-3000 nm, and more preferably between 200 nm-800 nm.

A first x-z plane 731 intersects first stack 722. A plurality of first axes 732 lie within first x-z plane 731 and are parallel to the x-axis. A second x-z plane 733 intersects second stack 724. A plurality of second axes 734 lie within second x-z plane 733 and are parallel to the x-axis. A third x-z plane 735 intersects third stack 726. A plurality of third axes 736 lie within third x-z plane 735 and are parallel to the x-axis.

As seen particularly in enlargement A, first stack 722 includes a first stack first periodic structure (S1P1) 742 formed together with first layer 702 and having an S1P1 pitch, designated S, along one of first stack axes 732. Preferably, first stack 722 does not include periodic structures formed together with either of second layer 704 or third layer 706 which would, together with S1P1 742, produce a moiré pattern upon imaging first stack 722. However, first stack 722 may include periodic structures formed together with second layer 704 or third layer 706 which do not produce a moiré pattern upon imaging first stack 722, such as periodic structures which are periodic along an axis parallel to the y-axis or periodic structures having a pitch size that does not produce a moiré pattern upon imaging first stack 722.

As seen particularly in enlargement B, second stack 724 includes a second stack first periodic structure (S2P1) 752 formed together with first layer 702 and having an S2P1 pitch, designated T, along one of second stack axes 734. Second stack 724 further includes a second stack second periodic structure (S2P2) 754 formed together with second layer 704 and having an S2P2 pitch, designated U, along another of second stack axes 734.

It is appreciated that S2P1 752 and S2P2 754 at least partially overlie one another, and thus a second stack moiré pattern 760 is visible upon imaging second stack 724. As is known in the art, second stack moiré pattern 760 is characterized by a pitch $V_2$, which is a function of pitch T and pitch U, as shown in equation 17:

$$V_2 = \frac{T \times U}{|T - U|} \quad \text{(Eq. 17)}$$

Preferably, second stack 724 does not include periodic structures formed together with third layer 706 which affect moiré pattern 760. However, second stack 724 may include periodic structures formed together with third layer 706 which do not affect moiré pattern 760, such as periodic structures which are periodic along an axis parallel to the y-axis or periodic structures having a pitch size that does not affect moiré pattern 760.

As seen particularly in enlargement C, third stack 726 includes a third stack first periodic structure (S3P1) 762 formed together with second layer 704 and having an S3P1 pitch, designated 1U, along one of third stack axes 736. Preferably, S3P1 pitch 1U is related to S2P2 pitch U by a third stack multiplicative factor, designated 1. Third stack multiplicative factor 1 may be any positive number. Third stack 726 further includes a third stack second periodic structure (S3P2) 764 formed together with third layer 706 and having an S3P2 pitch, designated 1T, along another of third stack axes 736. Preferably, S3P2 pitch 1T is related to S1P1 pitch T by third stack multiplicative factor 1. It is appreciated that third stack multiplicative factor 1 relating S3P2 pitch 1T to S2P1 pitch T has the same value as third stack multiplicative factor 1 relating S3P1 pitch 1U to S2P2 pitch U. In an embodiment of the present invention, the value of 1 is 1 and thus S3P1 pitch 1U is identical to S2P2 pitch U and S3P2 pitch 1T is identical to S2P1 pitch T.

It is appreciated that S3P1 762 and S3P2 764 at least partially overlie one another, and thus a third stack moiré pattern 770 is visible upon imaging third stack 726. As is known in the art, third stack moiré pattern 770 is characterized by a pitch $V_3$, which is a function of third stack multiplicative factor 1, pitch U and pitch T, as shown in equation 18:

$$V_3 = l\left(\frac{T \times U}{|T - U|}\right) \quad \text{(Eq. 18)}$$

Preferably, third stack 726 does not include periodic structures formed together with first layer 702 which affect moiré pattern 770. However, third stack 726 may include periodic structures formed together with first layer 702 which do not affect moiré pattern 770, such as periodic structures which are periodic along an axis parallel to the y-axis or periodic structures having a pitch size that does not affect moiré pattern 770.

Misregistration between any two of layers 702, 704 and 706 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches T, U, 1U and 1T need not be optically resolvable by the misregistration metrology tool used to generate an image of target 700. However, it is preferable that each of pitches S, $V_2$ and $V_3$ is optically resolvable by the misregistration metrology tool used to generate an image of target 700.

Figure 8A:
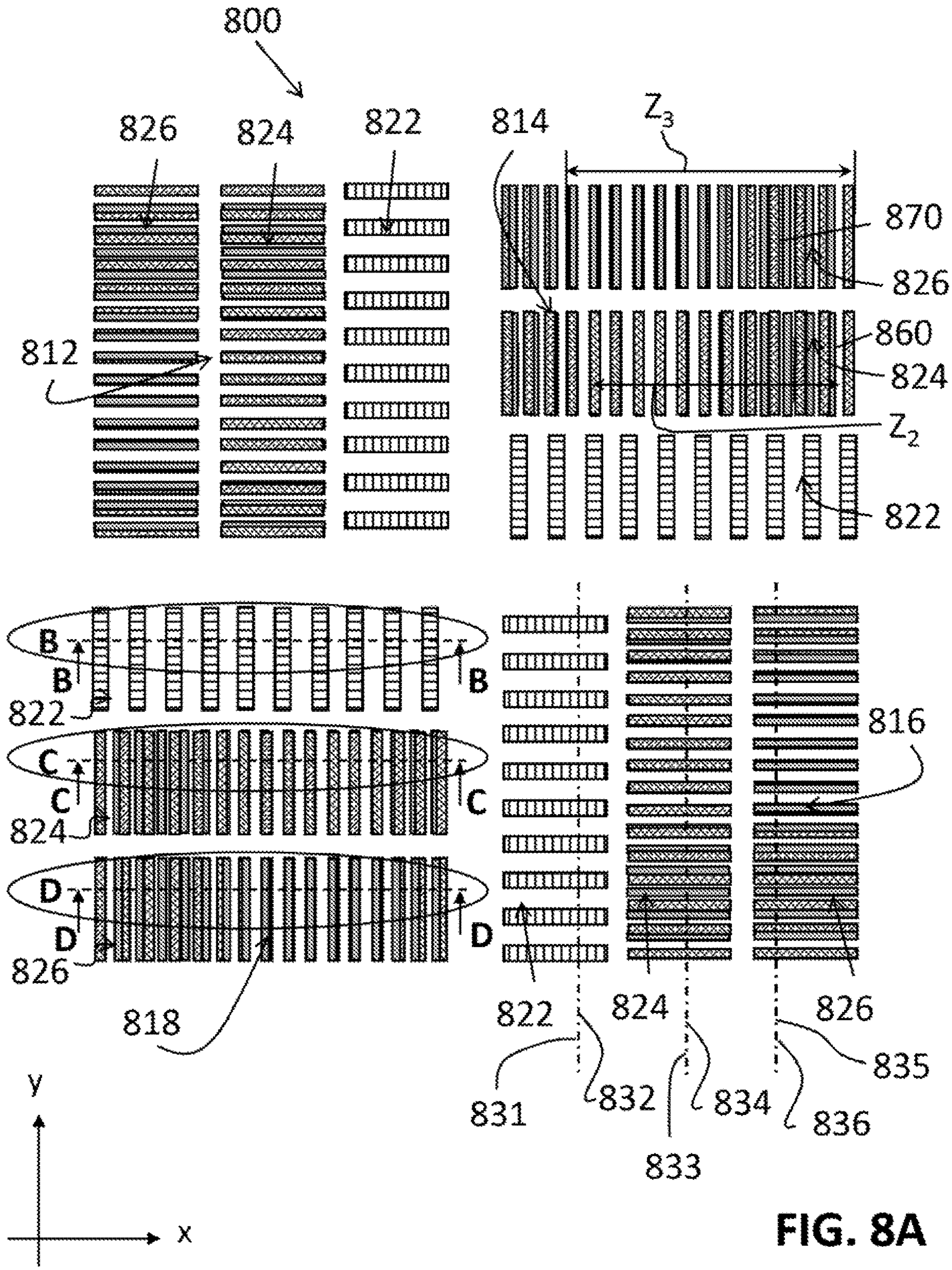
FIGS. 8A, 8B, 8C and 8D are simplified respective top view, first sectional side view, second sectional side view and third sectional side view illustrations of another embodiment of a multi-layered moiré target of the present invention, FIGS. 8B, 8C and 8D being taken along lines B-B, C-C and D-D in FIG. 8A, respectively.
Figure 8B:
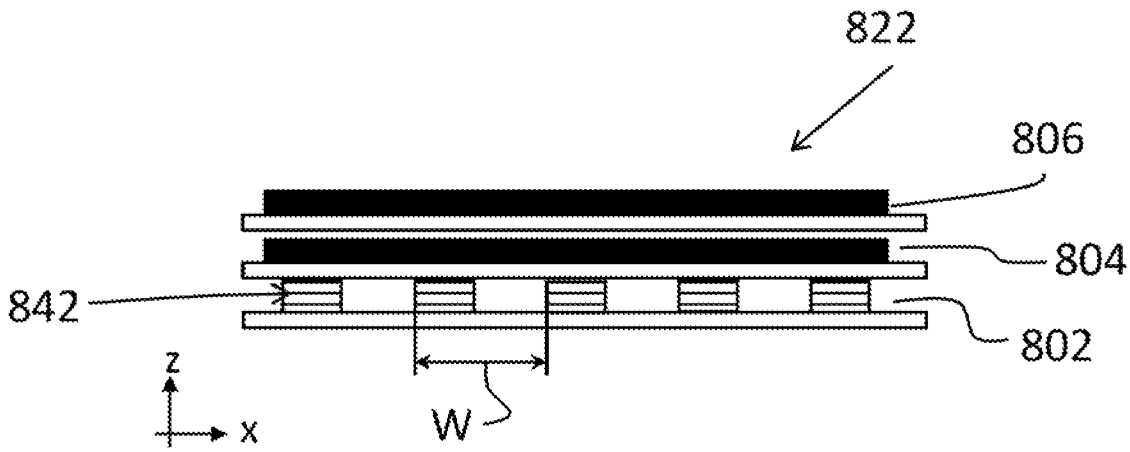
Figure 8C:
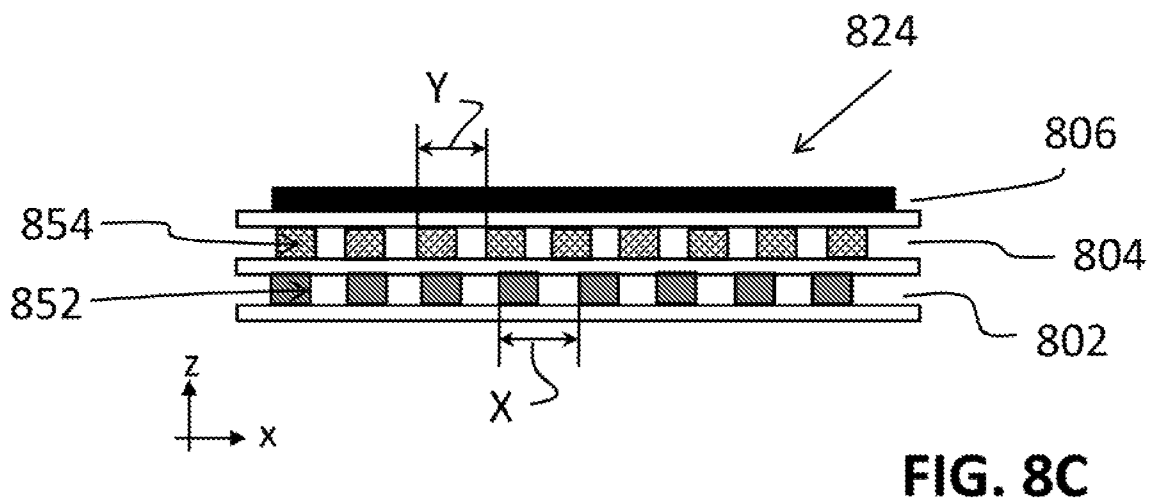
Figure 8D:
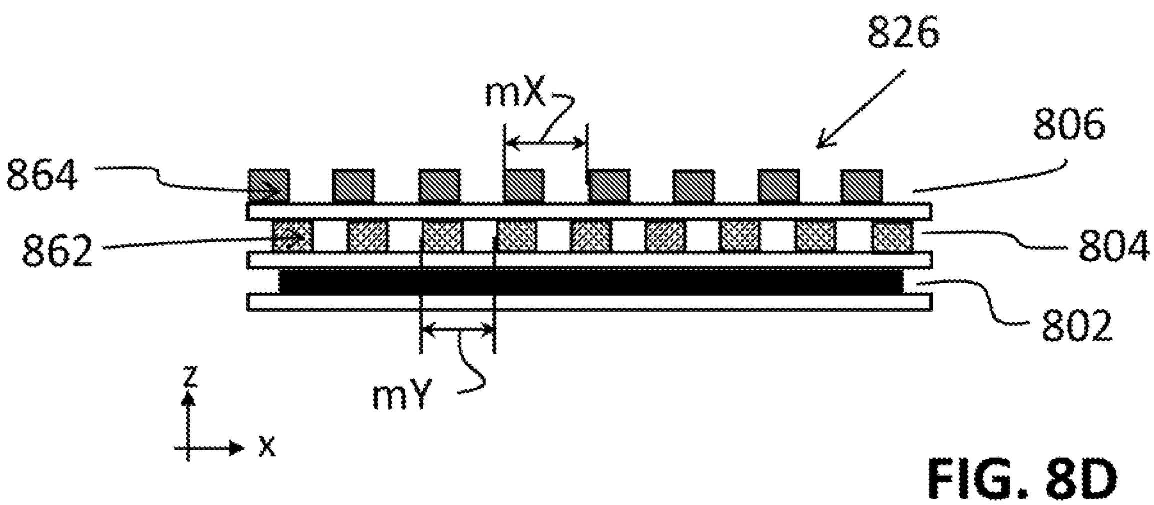

Reference is now made to FIGS. 8A-8D, which are simplified illustrations of another embodiment of a multi-layered moiré target 800 of the present invention. FIGS. 8A-8D include illustrations in three different dimensions, indicated by x-, y- and z-axes, the three dimensions being referred to hereinafter as an x-y plane, an x-z plane and a y-z plane, respectively. It is noted that FIG. 8A generally illustrates the x-y plane, while FIGS. 8B, 8C and 8D illustrate planes parallel to the x-z plane.

It is noted that target 800 is one example of an alternative layout of target 700, described hereinabove with reference to FIG. 7, and that additional layouts are described hereinbelow with reference to FIGS. 34-39. Target 800 is preferably formed on a semiconductor device wafer on which are preferably formed at least a first layer 802, a second layer 804 and a third layer 806. It is appreciated that each of first layer 802, second layer 804 and third layer 806 defines a generally planar surface parallel to the x-y plane. First, second and third layers 802, 804 and 806 may be adjacent layers but need not be. Preferably, any material between first, second and third layers 802, 804 and 806 is at least partially transparent to electromagnetic radiation. In the embodiment illustrated in FIGS. 8A-8D, first layer 802 lies below second and third layers 804 and 806, and third layer 806 lies above first and second layers 802 and 804. It is appreciated, however, that layers 802, 804 and 806 may be arranged in any suitable order along the z-axis with respect to one another.

As seen particularly in FIG. 8A, target 800 includes four target quadrants 812, 814, 816 and 818. In the embodiment shown in FIG. 8A, the rotational orientation in the x-y plane of each of target quadrants 812, 814, 816 and 818 preferably differs from the rotational orientation in the x-y plane of each of the other target quadrants 812, 814, 816 and 818 by an integer multiple of 90°. Additionally, target 800 preferably is characterized by rotational symmetry in either the x-direction or the y-direction or both. In a preferred embodiment of the present invention, target 800 is designed such that when in a state of registration, the entirety of target 800 is characterized by a single point of symmetry in the x-direction and a single point of symmetry in the y-direction. However, even in such an embodiment, when in a state of misregistration, various elements of target 800 will be characterized by unique points of symmetry.

Each of target quadrants 812, 814, 816 and 818 includes a first stack 822 of periodic structures, a second stack 824 of periodic structures and a third stack 826 of periodic structures. Each of first stack 822, second stack 824 and third stack 826 includes one or more periodic structures, each periodic structure having a pitch. Preferably, none of first stack 822, second stack 824 and third stack 826 overlap with one another. In FIGS. 8A-8D, first stack 822 is illustrated as lying closer to the center of target 800 than second stack 824 and third stack 826, and third stack 826 is illustrated as lying closer to the edge of target 800 than first stack 822 and second stack 824. However, first stack 822, second stack 824 and third stack 826 may be arranged in any suitable arrangement relative to the x-y plane with respect to one another.

It is appreciated that although in the embodiment illustrated in FIGS. 8A-8D, each of the periodic structures of first stack 822, second stack 824 and third stack 826 are illustrated as being formed of a plurality of lines and spaces, in other embodiments of the invention, the periodic structures of first stack 822, second stack 824 and third stack 826 may be formed of any suitable periodic features. It is further appreciated that the periodic features forming the periodic structures included in first stack 822, second stack 824 and third stack 826 may be formed of sub-structures. The pitches of each of the periodic structures of first stack 822, second stack 824 and third stack 826 are preferably between 10 nm-3000 nm, and more preferably between 200 nm-800 nm.

As seen in FIG. 8A, in each of quadrants 812, 814, 816 and 818, a first plane 831, intersecting first stack 822 and including a plurality of first axes 832 lying therein, a second plane 833, intersecting second stack 824 and including a plurality of second axes 834 lying therein, and a third plane 835, intersecting third stack 826 and including a plurality of third axes 836 lying therein, are defined. Each of first plane 831, second plane 833 and third plane 835 are either an x-z plane or a y-z plane, and first axes 832, second axes 834 and third axes 836 are parallel to the respective x-axis or y-axis, depending on the orientation of first stack 822, second stack 824 and third stack 826 within each of quadrants 812, 814, 816 and 818. It is appreciated that in each of quadrants 812, 814, 816 and 818, first plane 831, second plane 833 and third plane 835 are all parallel to one another.

As seen particularly in FIG. 8B, first stack 822 includes a first stack first periodic structure (S1P1) 842 formed together with first layer 802 and having an S1P1 pitch, designated W, along one of first stack axes 832. Preferably, first stack 822 does not include periodic structures formed together with either of second layer 804 or third layer 806 which would, together with S1P1 842, produce a moiré pattern upon imaging first stack 822. However, first stack 822 may include periodic structures formed together with second layer 804 or third layer 806 which do not produce a moiré pattern upon imaging first stack 822, such as periodic structures which are periodic in a plane parallel to the x-y plane along an axis that is perpendicular to first stack axes 822 or periodic structures having a pitch size that does not produce a moiré pattern upon imaging first stack 822.

As seen particularly in FIG. 8C, second stack 824 includes a second stack first periodic structure (S2P1) 852 formed together with first layer 802 and having an S2P1 pitch, designated X, along one of second stack axes 834. Second stack 824 further includes a second stack second periodic structure (S2P2) 854 formed together with second layer 804 and having an S2P2 pitch, designated Y, along another of second stack axes 834.

It is appreciated that S2P1 852 and S2P2 854 at least partially overlie one another, and thus a second stack moiré pattern 860 is visible upon imaging second stack 824. As is known in the art, second stack moiré pattern 860 is characterized by a pitch $Z_2$, which is a function of pitch X and pitch Y, as shown in equation 19:

$$Z_2 = \frac{X \times Y}{|X - Y|} \quad \text{(Eq. 19)}$$

Preferably, second stack 824 does not include periodic structures formed together with third layer 806 which affect moiré pattern 860. However, second stack 824 may include periodic structures formed together with third layer 806 which do not affect moiré pattern 860, such as periodic structures which are periodic in a plane parallel to the x-y plane along an axis that is perpendicular to second stack axes 834 or periodic structures having a pitch size that does not affect moiré pattern 860.

As seen particularly in FIG. 8D, third stack 826 includes a third stack first periodic structure (S3P1) 862 formed together with second layer 804 and having an S3P1 pitch, designated mY, along one of third stack axes 836. Preferably, S3P1 pitch mY is related to S2P2 pitch Y by a third stack multiplicative factor, designated m. Third stack multiplicative factor m may be any positive number. Third stack 826 further includes a third stack second periodic structure (S3P2) 864 formed together with third layer 806 and having an S3P2 pitch, designated mX, along another of third stack axes 836. Preferably, S3P2 pitch mX is related to S2P1 pitch X by third stack multiplicative factor m. It is appreciated that third stack multiplicative factor m relating S3P2 pitch mX to S2P1 pitch X has the same value as third stack multiplicative factor m relating S3P1 pitch mY to S2P2 pitch Y. In an embodiment of the present invention, the value of m is 1 and thus S3P1 pitch mY is identical to S2P2 pitch Y and S3P2 pitch mX is identical to S2P1 pitch X.

It is appreciated that S3P1 862 and S3P2 864 at least partially overlie one another, and thus a third stack moiré pattern 870 is visible upon imaging third stack 826. As is known in the art, third stack moiré pattern 870 is characterized by a pitch $Z_3$, which is a function of third stack multiplicative factor m, pitch Y and pitch X, as shown in equation 20:

$$Z_3 = m\left(\frac{X \times Y}{|X - Y|}\right) \quad \text{(Eq. 20)}$$

Preferably, third stack 826 does not include periodic structures formed together with first layer 802 which affect moiré pattern 870. However, third stack 826 may include periodic structures formed together with first layer 802 which do not affect moiré pattern 870, such as periodic structures which are periodic in a plane parallel to the x-y plane along an axis that is perpendicular to third stack axes 836 or periodic structures having a pitch size that does not affect moiré pattern 870.

Misregistration between any two of layers 802, 804 and 806 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches X, Y, mY and mX need not be optically resolvable by the misregistration metrology tool used to generate an image of target 800. However, it is preferable that each of pitches W, $Z_2$ and $Z_3$ is optically resolvable by the misregistration metrology tool used to generate an image of target 800.

Figure 9A:
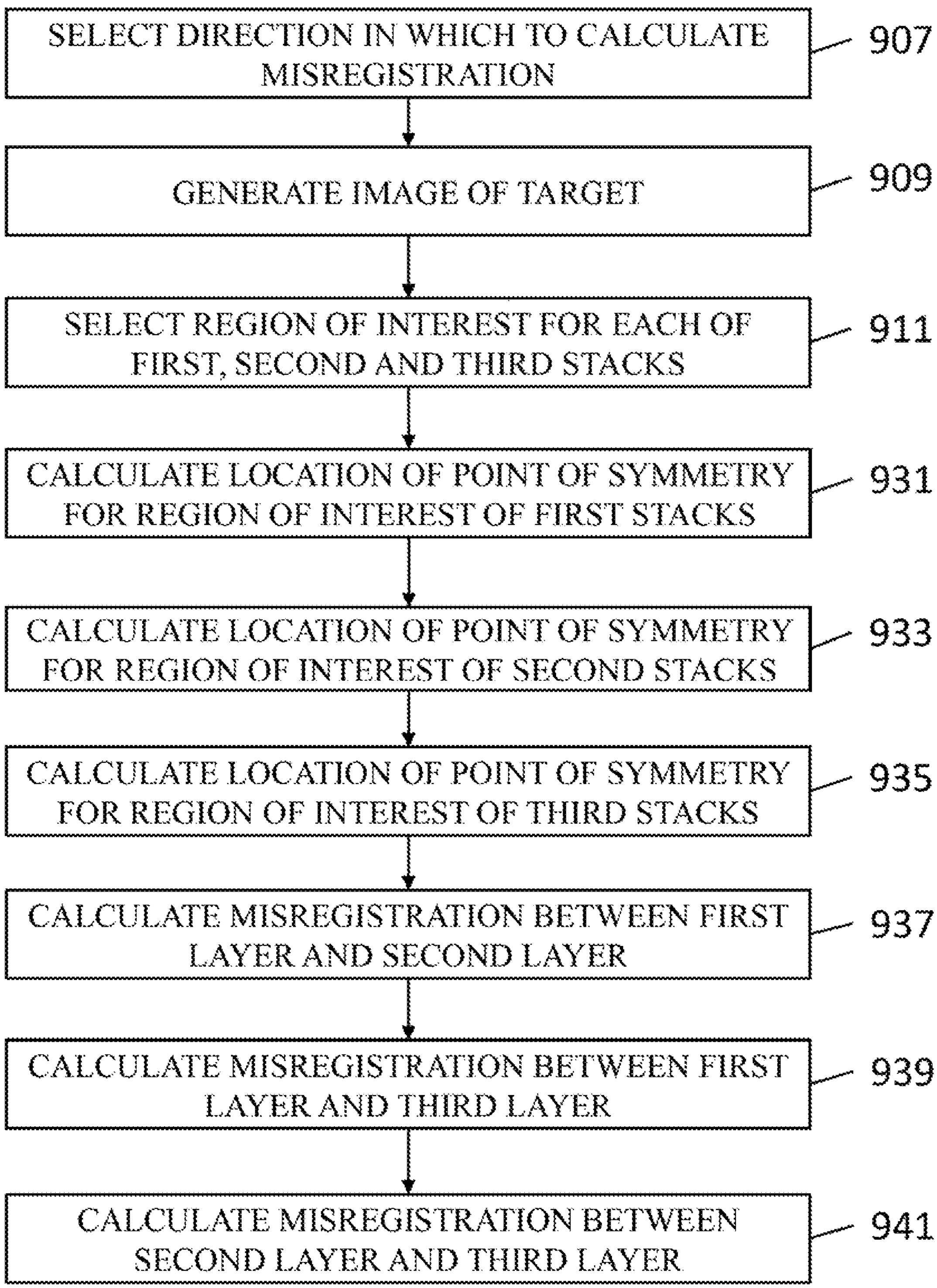
FIG. 9A is a simplified flowchart illustrating a preferred method of calculating misregistration between layers on which the multi-layered moiré target of FIG. 7 or of FIGS. 8A-8D is formed.
Figure 9B:
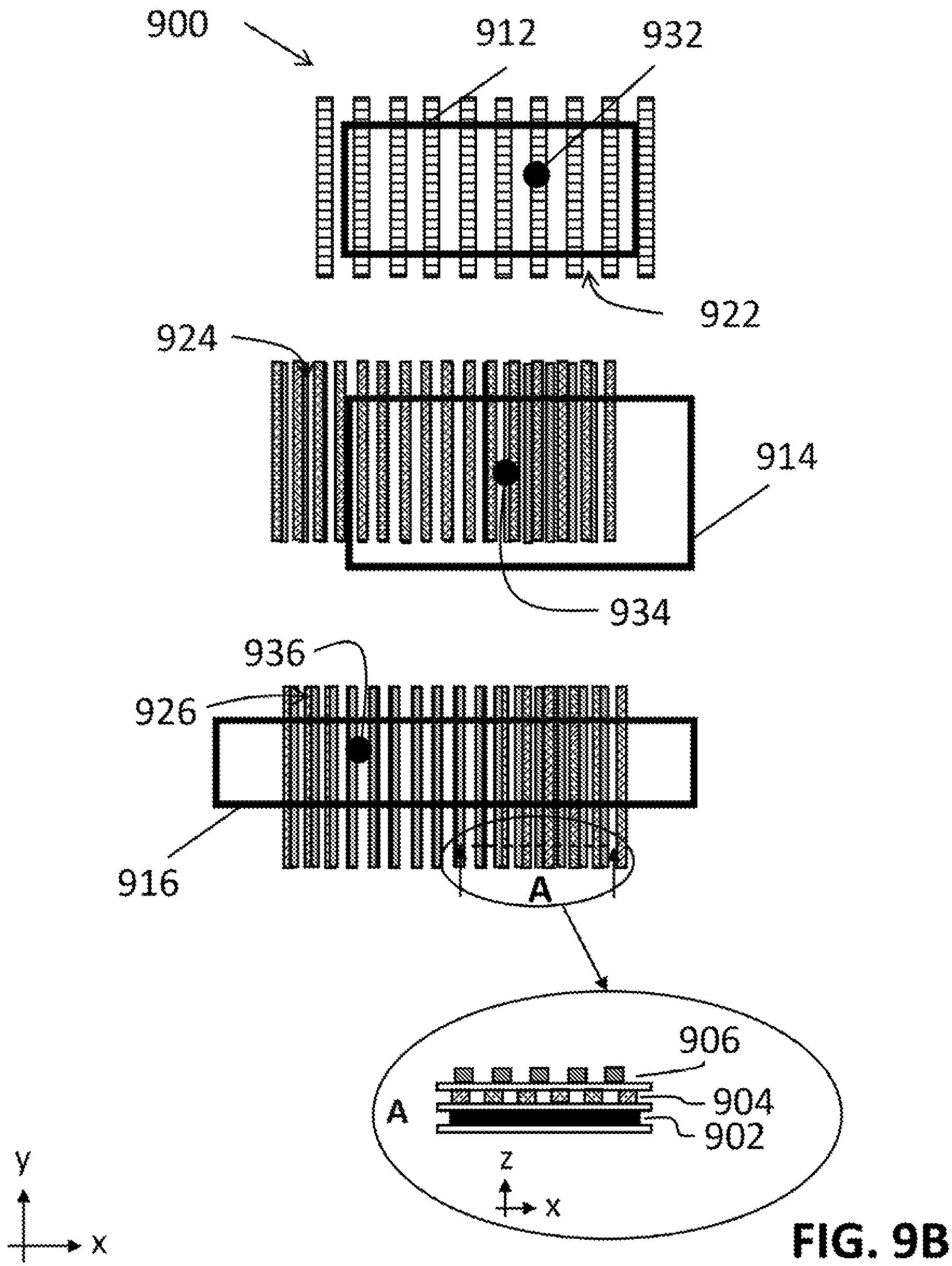
FIGS. 9B and 9C are simplified pictorial illustrations of first and second embodiments of a portion of the method of FIG. 9A, respectively.
Figure 9C:
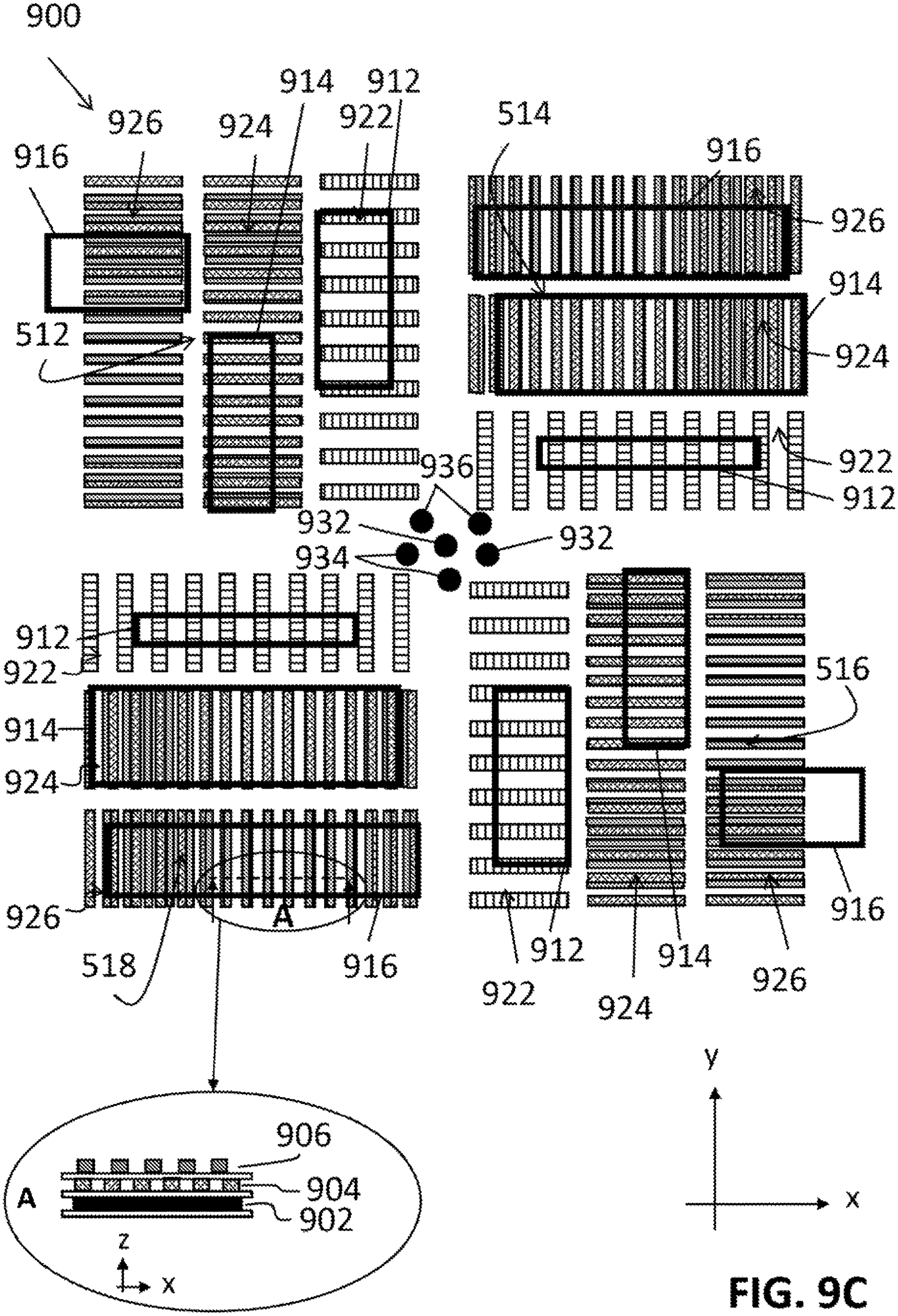

Reference is now made to FIG. 9A, which is a simplified flowchart illustrating a preferred method of calculating misregistration, using a multi-layered moiré target 900, such as a target 700 (FIG. 7) or target 800 (FIGS. 8A-8D), in a direction parallel to either the x or the y direction between a first, a second and a third layer 902, 904 and 906, such as layers 702, 704 and 706 (FIG. 7) or 802, 804 and 806 (FIGS. 8A-8D) of a multilayered semiconductor device wafer formed with target 900. Reference is further made to FIGS. 9B & 9C, which are simplified pictorial illustrations of first and second embodiments of a portion of the method of FIG. 9A, respectively.

While it is appreciated that when utilizing target 800 (FIGS. 8A-8D) the method described with reference to FIGS. 9A-9C may be performed only once to calculate misregistration in either the x or the y direction, typically, the method described in FIGS. 9A-9C will be performed twice, to calculate misregistration in each of the x and y directions. It is also appreciated that when utilizing target 700 (FIG. 7) misregistration may be calculated only in the one direction to which first, second and third stack axes 732, 734 and 736 are parallel.

As seen at a first step 907, a direction in which to measure misregistration is selected. When using target 700 in the method of FIGS. 9A & 9B, the direction in which to measure misregistration is automatically selected to be the direction to which first, second and third stack axes 732, 734 and 736 are parallel. When using target 800 in the method of FIGS. 9A & 9B, the structures of quadrants 814 and 818 are utilized to measure misregistration in a direction parallel to the x-axis, and the structures of quadrants 812 and 816 to measure misregistration in a direction parallel to the y-axis.

Preferably, at a next step 909, an image of target 900 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches T, U, 1U, 1T, X, Y, mY and mX need not be optically resolvable by the misregistration metrology tool used to generate the image of target 900. However, it is preferable that each of pitches S, W, $V_2$, $V_3$, $Z_2$ and $Z_3$ is optically resolvable by the misregistration metrology tool used to generate the image of target 900.

In a next step 911, and as seen in FIGS. 9B & 9C, first, second and third regions of interest 912, 914 and 916 are selected for each of respective first, second and third stacks 922, 924 and 926, such as first, second and third stacks 722, 724 and 726 (FIG. 7) or first, second and third stacks 822, 824 and 826 (FIGS. 8A-8D), in the quadrants selected in step 907. It is appreciated, as seen in the illustrated embodiments of FIGS. 9B & 9C, that while first, second and third regions of interest 912, 914 and 916 preferably lie entirely within each of respective first, second and third stacks 922, 924 and 926, as illustrated for first region of interest 912, which lies completely within first stack 922, first, second and third regions of interest 912, 914 and 916 may extend beyond respective first, second and third stacks 922, 924 and 926, as illustrated for regions of interest 914 and 916, which extend beyond respective second and third stacks 924 and 926. It is further appreciated that regions of interest 912, 914 and 916 shown in FIGS. 9B & 9C are representative regions of interest, and that other suitable regions of interest may be chosen at step 911.

In a next step 931, and as seen in FIGS. 9B & 9C, a location of a point of symmetry 932 between all instances of first region of interest 912 selected in step 911 is calculated. In a next step 933, and as seen in FIGS. 9B & 9C, a location of a point of symmetry 934 between all instances of second region of interest 914 selected in step 911 is calculated. In a next step 935, and as seen in FIGS. 9B & 9C, a location of a point of symmetry 936 between all instances of third region of interest 916 selected in step 911 is calculated.

At a next step 937, a distance in the direction selected at step 907 is calculated between the location of point of symmetry 932 of first region or regions of interest 912 identified at step 931 and the location of point of symmetry 934 of second region or regions of interest 914 identified at step 933. The distance found at step 937 is divided by a gain $\alpha_1$, which for target 700 is a function of pitch T and pitch U, as shown in equation 21a:

$$\alpha_1 = \left(\frac{T}{|T-U|}\right) \quad \text{(Eq. 21a)}$$

and for target 800 is a function of pitch X and pitch Y, as shown in equation 21b:

$$\alpha_1 = \left(\frac{X}{|X-Y|}\right) \quad \text{(Eq. 21b)}$$

and the result is reported as the misregistration between first and second layers 902 and 904 in the direction selected at step 907. It is appreciated that in addition to the distance calculated at step 937, the method further calculates an adjustment direction, such as right, left, up or down. The adjustment direction is a function of the relative values of pitches T and U or pitches X and Y, as well as which of layers 902 and 904 is to be adjusted.

At a next step 939, a distance in the direction selected at step 907 is calculated between the location of point of symmetry 934 of second region or regions of interest 914 identified at step 933 and the location of point of symmetry 936 of third region or regions of interest 916 identified at step 935. The distance found at step 939 is divided by a gain $\alpha_2$, which for target 700 is a function of pitch T and pitch U, as shown in equation 22a:

$$\alpha_2 = \left(\frac{U}{|T-U|}\right) \quad \text{(Eq. 22a)}$$

and for target 800 is a function of pitch X and pitch Y, as shown in equation 22b:

$$\alpha_2 = \left(\frac{Y}{|X-Y|}\right) \quad \text{(Eq. 22b)}$$

and the result is reported as the misregistration between first and third layers 902 and 906 in the direction selected at step 907. It is appreciated that in addition to the distance calculated at step 939, the method further calculates an adjustment direction, such as right, left, up or down. The adjustment direction is a function of the relative values of pitches T and U or pitches X and Y, as well as which of layers 902 and 906 is to be adjusted.

At a next step 941, a difference is calculated between the misregistration value reported at step 937 and the misregistration value reported at step 939. The difference calculated at step 941 is reported as the misregistration between second and third layers 904 and 906 in the direction selected at step 907. It is appreciated that in addition to the distance calculated at step 941, the method further calculates an adjustment direction, such as right, left, up or down. The adjustment direction is a function of the relative values of pitches T and U or pitches X and Y, as well as which of layers 904 and 906 is to be adjusted.

It is appreciated that in an embodiment of the present invention, relevant portions of the method described hereinabove with reference to FIGS. 9A-9C may be performed using only the first two of layers 902, 904 and 906 to be formed, prior to the formation of the third of those layers. As noted hereinabove, layers 902, 904 and 906 may be formed in any suitable order with respect to one another.

Figure 10:
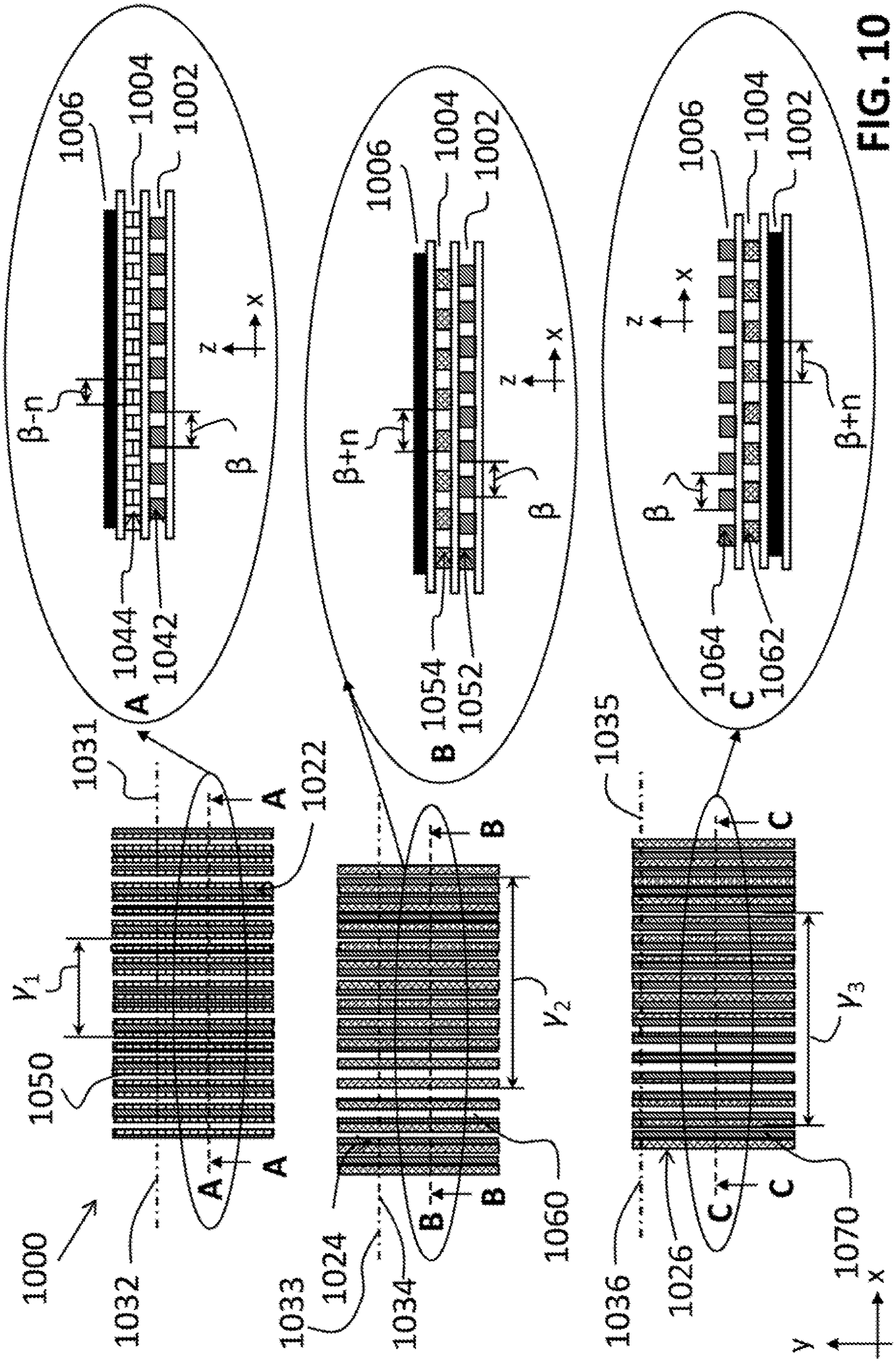
FIG. 10 is a simplified illustration of another embodiment of a multi-layered moiré target of the present invention.

Reference is now made to FIG. 10, which is a simplified illustration of another embodiment of a multi-layered moiré target 1000 of the present invention. FIG. 10 includes illustrations in three different dimensions, indicated by x-, y- and z-axes, the three dimensions being referred to hereinafter as an x-y plane, an x-z plane and a y-z plane, respectively. It is noted that FIG. 10 generally illustrates the x-y plane, while enlargements A, B and C of FIG. 10 illustrate planes parallel to the x-z plane.

Target 1000 is preferably formed on a semiconductor device wafer on which are preferably formed at least a first layer 1002, a second layer 1004 and a third layer 1006. It is appreciated that each of first layer 1002, second layer 1004 and third layer 1006 defines a generally planar surface parallel to the x-y plane. First, second and third layers 1002, 1004 and 1006 may be adjacent layers but need not be. Preferably, any material between first, second and third layers 1002, 1004 and 1006 is at least partially transparent to electromagnetic radiation. In the embodiment illustrated in FIG. 10, first layer 1002 lies below second and third layers 1004 and 1006, and third layer 1006 lies above first and second layers 1002 and 1004. It is appreciated, however, that layers 1002, 1004 and 1006 may be arranged in any suitable order along the z-axis with respect to one another.

Additionally, in an embodiment of the present invention, structures shown as being formed together with first and third layers 1002 and 1006 may be all be formed together with layer 1002. In such an embodiment, no portion of target 1000 is formed together with layer 1006. Such an embodiment is particularly useful for calibration, as described hereinbelow with reference to FIGS. 12A-12C.

It is appreciated that FIG. 10 illustrates one possible layout of target 1000, and that in other embodiments of the present invention, target 1000 may include additional structures. For example, as described hereinbelow with reference to FIGS. 11A-11D & 34-39, a suitable target may include multiple instances of the structures shown in FIG. 10, and those multiple instances may be arranged in various ways.

Preferably, target 1000 includes a first stack 1022 of periodic structures, a second stack 1024 of periodic structures and a third stack 1026 of periodic structures. Each of first stack 1022, second stack 1024 and third stack 1026 includes one or more periodic structures, each periodic structure having a pitch. Preferably, none of first stack 1022, second stack 1024 and third stack 1026 overlap with one another.

It is appreciated that although in FIG. 10, each of the periodic structures of first stack 1022, second stack 1024 and third stack 1026 are shown as being formed of a plurality of lines and spaces, in other embodiments of the invention, the periodic structures of first stack 1022, second stack 1024 and third stack 1026 may be formed of any suitable periodic features. It is further appreciated that the periodic features forming the periodic structures included in first stack 1022, second stack 1024 and third stack 1026 may be formed of sub-structures. The pitches of each of the periodic structures of first stack 1022, second stack 1024 and third stack 1026 are preferably between 10 nm-3000 nm, and more preferably between 200 nm-800 nm.

A first x-z plane 1031 intersects first stack 1022. A plurality of first axes 1032 lie within first x-z plane 1031 and are parallel to the x-axis. A second x-z plane 1033 intersects second stack 1024. A plurality of second axes 1034 lie within second x-z plane 1033 and are parallel to the x-axis. A third x-z plane 1035 intersects third stack 1026. A plurality of third axes 1036 lie within third x-z plane 1035 and are parallel to the x-axis.

As seen particularly in enlargement A, first stack 1022 includes a first stack first periodic structure (S1P1) 1042 formed together with first layer 1002 and having an S1P1 pitch, designated β, along one of first stack axes 1032. First stack 1022 further includes a first stack second periodic structure (S1P2) 1044 formed together with second layer 1004 and having an S1P2 pitch, designated β−n, along another of first stack axes 1032. Preferably, S1P2 pitch β−n differs from S1P1 pitch β by a first stack additive term, designated n. First stack additive term n may have any non-zero value.

It is appreciated that S1P1 1042 and S1P2 1044 at least partially overlie one another, and thus a first stack moiré pattern 1050 is visible upon imaging first stack 1022. As is known in the art, first stack moiré pattern 1050 is characterized by a pitch $\gamma_1$, which is a function of additive term n, pitch β and pitch β−n, as shown in equation 23:

$$\gamma_1 = \left|\frac{\beta \times (\beta - n)}{n}\right| \tag{Eq. 23}$$

Preferably, first stack 1022 does not include periodic structures formed together with third layer 1006 which affect moiré pattern 1050. However, first stack 1022 may include periodic structures formed together with third layer 1006 which do not affect moiré pattern 1050, such as periodic structures which are periodic along an axis parallel to the y-axis or periodic structures having a pitch size that does not affect moiré pattern 1050.

As seen particularly in enlargement B, second stack 1024 includes a second stack first periodic structure (S2P1) 1052 formed together with first layer 1002 and having an S2P1 pitch, designated β, along one of second stack axes 1034. It is appreciated that S2P1 pitch β has the same value as S1P1 pitch β. Second stack 1024 further includes a second stack second periodic structure (S2P2) 1054 formed together with second layer 1004 and having an S2P2 pitch, designated β+n, along another of second stack axes 1034. Preferably, S2P2 pitch β+n differs from S2P1 pitch β by a second stack additive term, designated n. It is appreciated that second stack additive term n has the same value as first stack additive term n.

It is appreciated that S2P1 1052 and S2P2 1054 at least partially overlie one another, and thus a second stack moiré pattern 1060 is visible upon imaging second stack 1024. As is known in the art, second stack moiré pattern 1060 is characterized by a pitch $\gamma_2$, which is a function of additive term n, pitch β and pitch β+n, as shown in equation 24:

$$\gamma_2 = \left|\frac{\beta \times (\beta + n)}{n}\right| \tag{Eq. 24}$$

Preferably, second stack 1024 does not include periodic structures formed together with third layer 1006 which affect moiré pattern 1060. However, second stack 1024 may include periodic structures formed together with third layer 1006 which do not affect moiré pattern 1060, such as periodic structures which are periodic along an axis parallel to the y-axis or periodic structures having a pitch size that does not affect moiré pattern 1060.

As seen particularly in enlargement C, third stack 1026 includes a third stack first periodic structure (S3P1) 1062 formed together with second layer 1004 and having an S3P1 pitch, designated β+n, along one of third stack axes 1036. It is appreciated that S3P1 pitch 3+n has the same value as S2P2 pitch 3+n. Third stack 1026 further includes a third stack second periodic structure (S3P2) 1064 formed together with third layer 1006 and having an S3P2 pitch, designated β, along another of third stack axes 1036. It is appreciated that S3P2 pitch β has the same value as S1P1 pitch β.

It is appreciated that S3P1 1062 and S3P2 1064 at least partially overlie one another, and thus a third stack moiré pattern 1070 is visible upon imaging third stack 1026. As is known in the art, third stack moiré pattern 1070 is characterized by a pitch 73, which is a function of additive term n, pitch β and pitch β+n, as shown in equation 25:

$$\gamma_3 = \left|\frac{\beta \times (\beta + n)}{n}\right| \tag{Eq. 25}$$

Preferably, third stack 1026 does not include periodic structures formed together with first layer 1002 which affect moiré pattern 1070. However, third stack 1026 may include periodic structures formed together with first layer 1002 which do not affect moiré pattern 1070, such as periodic structures which are periodic along an axis parallel to the y-axis or periodic structures having a pitch size that does not affect moiré pattern 1070

Misregistration between any two of layers 1002, 1004 and 1006 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches β, β−n and β+n need not be optically resolvable by the misregistration metrology tool used to generate an image of target 1000. However, it is preferable that each of pitches $\gamma_1$, $\gamma_2$ and $\gamma_3$ is optically resolvable by the misregistration metrology tool used to generate an image of target 1000.

Figure 11A:
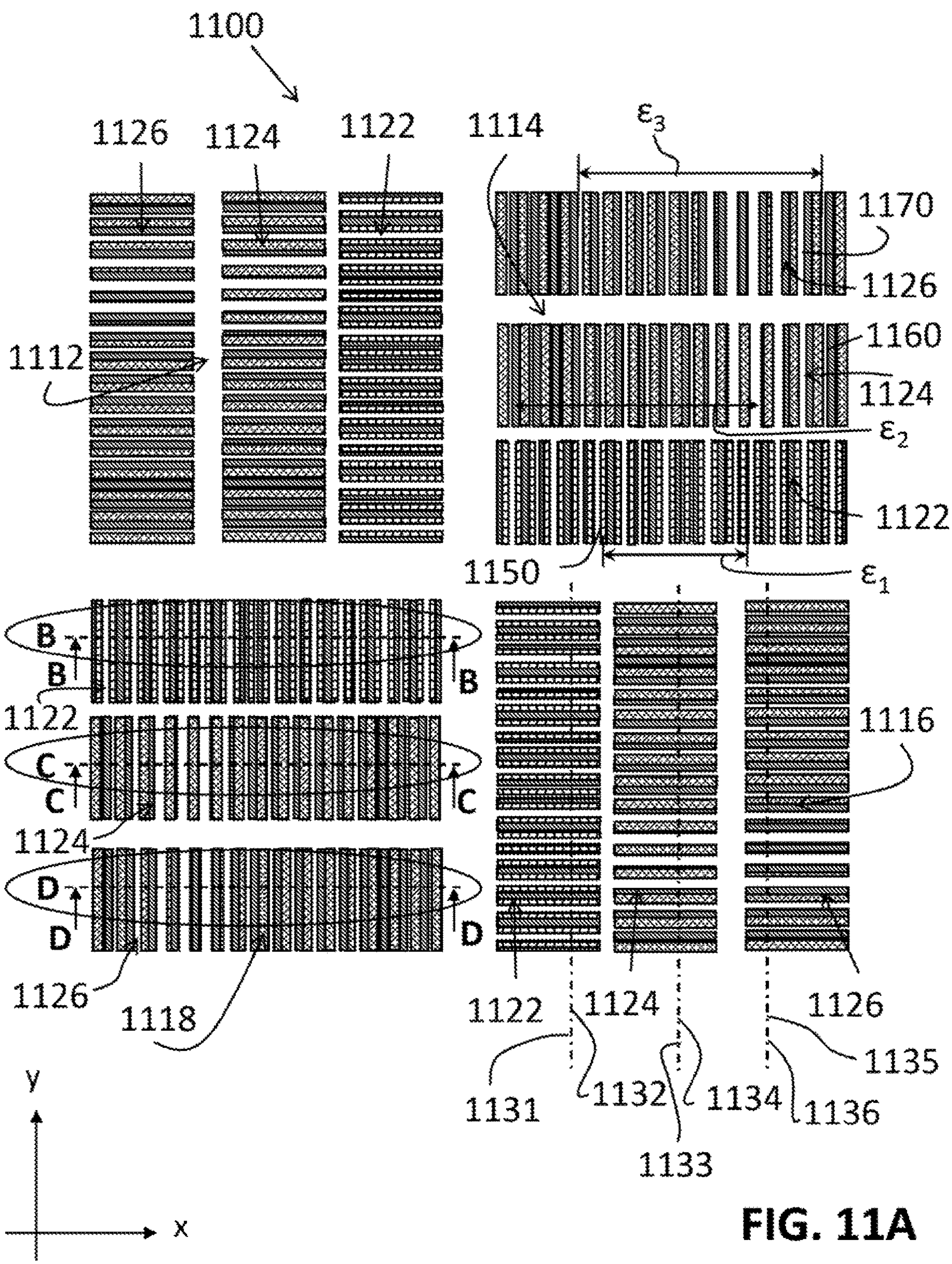
FIGS. 11A, 11B, 11C and 11D are simplified respective top view, first sectional side view, second sectional side view and third sectional side view illustrations of another embodiment of a multi-layered moiré target of the present invention, FIGS. 11B, 11C and 11D being taken along lines B-B, C-C and D-D in FIG. 11A, respectively.
Figure 11B:
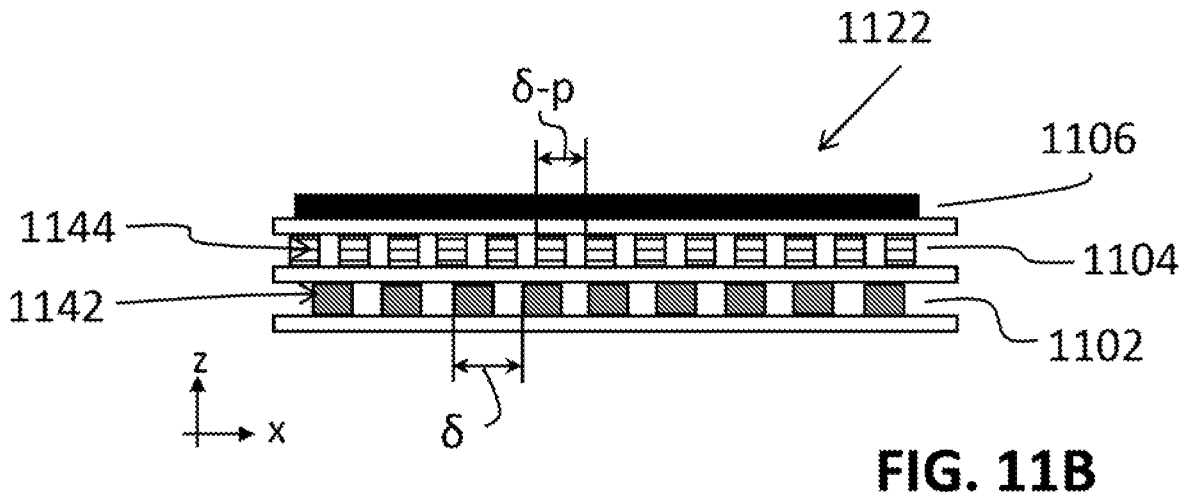
Figure 11C:
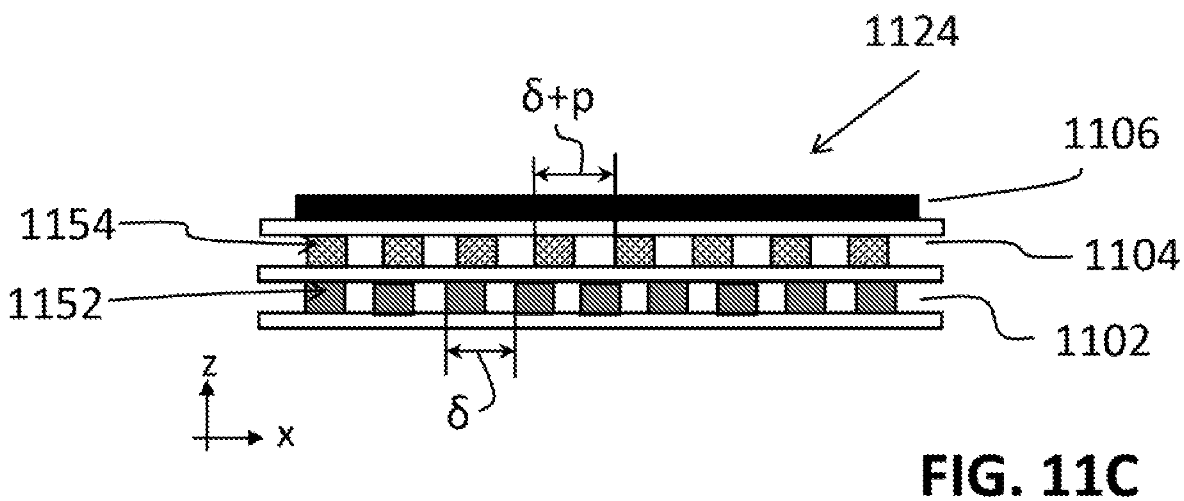
Figure 11D:
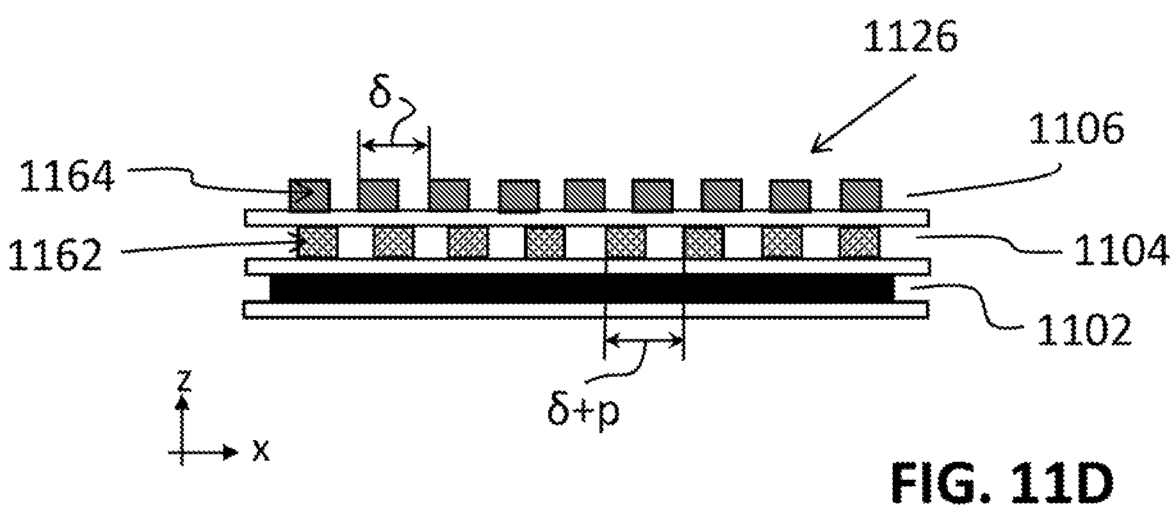

Reference is now made to FIGS. 11A-11D, which are simplified illustrations of another embodiment of a multi-layered moiré target 1100 of the present invention. FIGS. 11A-11D include illustrations in three different dimensions, indicated by x-, y- and z-axes, the three dimensions being referred to hereinafter as an x-y plane, an x-z plane and a y-z plane, respectively. It is noted that FIG. 11A generally illustrates the x-y plane, while FIGS. 11B, 11C and 11D illustrate planes parallel to the x-z plane.

It is noted that target 1100 is one example of an alternative layout of target 1000, described hereinabove with reference to FIG. 10, and that additional layouts are described hereinbelow with reference to FIGS. 34-39. Target 1100 is preferably formed on a semiconductor device wafer on which are preferably formed at least a first layer 1102, a second layer 1104 and a third layer 1106. It is appreciated that each of first layer 1102, second layer 1104 and third layer 1106 defines a generally planar surface parallel to the x-y plane. First, second and third layers 1102, 1104 and 1106 may be adjacent layers but need not be. Preferably, any material between first, second and third layers 1102, 1104 and 1106 is at least partially transparent to electromagnetic radiation. In the embodiment illustrated in FIGS. 11A-11D, first layer 1102 lies below second and third layers 1104 and 1106, and third layer 1106 lies above first and second layers 1102 and 1104. It is appreciated, however, that layers 1102, 1104 and 1106 may be arranged in any suitable order along the z-axis with respect to one another.

Additionally, in an embodiment of the present invention, structures shown as being formed together with first and third layers 1102 and 1106 may all be formed together with layer 1102. In such an embodiment, no portion of target 1100 is formed together with layer 1106. Such an embodiment is particularly useful for calibration, as described hereinbelow with reference to FIGS. 12A-12C.

As seen particularly in FIG. 11A, target 1100 includes four target quadrants 1112, 1114, 1116 and 1118. In the embodiment shown in FIG. 11A, the rotational orientation in the x-y plane of each of target quadrants 1112, 1114, 1116 and 1118 preferably differs from the rotational orientation in the x-y plane of each of the other target quadrants 1112, 1114, 1116 and 1118 by an integer multiple of 90°. Additionally, target 1100 preferably is characterized by rotational symmetry in either the x-direction or the y-direction or both. In a preferred embodiment of the present invention, target 1100 is designed such that when in a state of registration, the entirety of target 1100 is characterized by a single point of symmetry in the x-direction and a single point of symmetry in the y-direction. However, even in such an embodiment, when in a state of misregistration, various elements of target 1100 will be characterized by unique points of symmetry.

Each of target quadrants 1112, 1114, 1116 and 1118 includes a first stack 1122 of periodic structures, a second stack 1124 of periodic structures and a third stack 1126 of periodic structures. Each of first stack 1122, second stack 1124 and third stack 1126 includes one or more periodic structures, each periodic structure having a pitch. Preferably, none of first stack 1122, second stack 1124 and third stack 1126 overlap with one another. In FIGS. 11A-11D, first stack 1122 is illustrated as lying closer to the center of target 1100 than second stack 1124 and third stack 1126, and third stack 1126 is illustrated as lying closer to the edge of target 1100 than first stack 1122 and second stack 1124. However, first stack 1122, second stack 1124 and third stack 1126 may be arranged in any suitable arrangement relative to the x-y plane with respect to one another.

It is appreciated that although in the embodiment illustrated in FIGS. 11A-11D, each of the periodic structures of first stack 1122, second stack 1124 and third stack 1126 are illustrated as being formed of a plurality of lines and spaces, in other embodiments of the invention, the periodic structures of first stack 1122, second stack 1124 and third stack 1126 may be formed of any suitable periodic features. It is further appreciated that the periodic features forming the periodic structures included in first stack 1122, second stack 1124 and third stack 1126 may be formed of sub-structures. The pitches of each of the periodic structures of first stack 1122, second stack 1124 and third stack 1126 are preferably between 10 nm-3000 nm, and more preferably between 200 nm-800 nm.

As seen in FIG. 11A, in each of quadrants 1112, 1114, 1116 and 1118, a first plane 1131, intersecting first stack 1122 and including a plurality of first axes 1132 lying therein, a second plane 1133, intersecting second stack 1124 and including a plurality of second axes 1134 lying therein, and a third plane 1135, intersecting third stack 1126 and including a plurality of third axes 1136 lying therein, are defined. Each of first plane 1131, second plane 1133 and third plane 1135 are either an x-z plane or a y-z plane, and first axes 1132, second axes 1134 and third axes 1136 are parallel to the respective x-axis or y-axis, depending on the orientation of first stack 1122, second stack 1124 and third stack 1126 within each of quadrants 1112, 1114, 1116 and 1118. It is appreciated that in each of quadrants 1112, 1114, 1116 and 1118, first plane 1131, second plane 1133 and third plane 1135 are all parallel to one another.

As seen particularly in FIG. 11B, first stack 1122 includes a first stack first periodic structure (S1P1) 1142 formed together with first layer 1102 and having an S1P1 pitch, designated δ, along one of first stack axes 1132. First stack 1122 further includes a first stack second periodic structure (S1P2) 1144 formed together with second layer 1104 and having an S1P2 pitch, designated δ–p, along another of first stack axes 1132. Preferably, S1P2 pitch δ–p differs from S1P1 pitch δ by a first stack additive term, designated β. First stack additive term p may have any non-zero value.

It is appreciated that S1P1 1142 and S1P2 1144 at least partially overlie one another, and thus a first stack moiré pattern 1150 is visible upon imaging first stack 1122. As is known in the art, first stack moiré pattern 1150 is characterized by a pitch $\varepsilon_1$, which is a function of additive term p, pitch δ and pitch δ–p, as shown in equation 26:

$$\varepsilon_1 = \left| \frac{\delta \times (\delta - p)}{p} \right| \qquad \text{(Eq. 26)}$$

Preferably, first stack 1122 does not include periodic structures formed together with third layer 1106 which affect moiré pattern 1150. However, first stack 1122 may include periodic structures formed together with third layer 1106 which do not affect moiré pattern 1150, such as periodic structures which are periodic in a plane parallel to the x-y plane along an axis that is perpendicular to first stack axes 1132 or periodic structures having a pitch size that does not affect moiré pattern 1150.

As seen particularly in FIG. 11C, second stack 1124 includes a second stack first periodic structure (S2P1) 1152 formed together with first layer 1102 and having an S2P1 pitch, designated δ, along one of second stack axes 1134. It is appreciated that S2P1 pitch δ has the same value as S1P1 pitch δ. Second stack 1124 further includes a second stack second periodic structure (S2P2) 1154 formed together with second layer 1104 and having an S2P2 pitch, designated δ+p, along another of second stack axes 1134. Preferably, S2P2 pitch δ+p differs from S2P1 pitch δ by a second stack additive term, designated β. It is appreciated that second stack additive term p has the same value as first stack additive term p.

It is appreciated that S2P1 1152 and S2P2 1154 at least partially overlie one another, and thus a second stack moiré pattern 1160 is visible upon imaging second stack 1124. As is known in the art, second stack moiré pattern 1160 is characterized by a pitch δ2, which is a function of additive term p, pitch δ and pitch δ+p, as shown in equation 27:

$$\varepsilon_2 = \left|\frac{\delta \times (\delta + p)}{p}\right| \qquad \text{(Eq. 27)}$$

Preferably, second stack 1124 does not include periodic structures formed together with third layer 1106 which affect moiré pattern 1160. However, second stack 1124 may include periodic structures formed together with third layer 1106 which do not affect moiré pattern 1160, such as periodic structures which are periodic in a plane parallel to the x-y plane along an axis that is perpendicular to second stack axes 1134 or periodic structures having a pitch size that does not affect moiré pattern 1160.

As seen particularly in FIG. 11D, third stack 1126 includes a third stack first periodic structure (S3P1) 1162 formed together with second layer 1104 and having an S3P1 pitch, designated δ+p, along one of third stack axes 1136. It is appreciated that S3P1 pitch δ+p has the same value as S2P2 pitch δ+p. Third stack 1126 further includes a third stack second periodic structure (S3P2) 1164 formed together with third layer 1106 and having an S3P2 pitch, designated δ, along another of third stack axes 1136. It is appreciated that S3P2 pitch δ has the same value as S1P1 pitch δ.

It is appreciated that S3P1 1162 and S3P2 1164 at least partially overlie one another, and thus a third stack moiré pattern 1170 is visible upon imaging third stack 1126. As is known in the art, third stack moiré pattern 1170 is characterized by a pitch $\varepsilon_3$, which is a function of additive term p, pitch δ and pitch δ+p, as shown in equation 28:

$$\varepsilon_3 = \left|\frac{\delta \times (\delta + p)}{p}\right| \qquad \text{(Eq. 28)}$$

Preferably, third stack 1126 does not include periodic structures formed together with first layer 1102 which affect moiré pattern 1170. However, third stack 1126 may include periodic structures formed together with first layer 1102 which do not affect moiré pattern 1170, such as periodic structures which are periodic in a plane parallel to the x-y plane along an axis that is perpendicular to third stack axes 1136 or periodic structures having a pitch size that does not affect moiré pattern 1170.

Misregistration between any two of layers 1102, 1104 and 1106 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches δ, δ−p and δ+p need not be optically resolvable by the misregistration metrology tool used to generate an image of target 1100. However, it is preferable that each of pitches $\varepsilon_1$, $\varepsilon_2$ and $\varepsilon_3$ is optically resolvable by the misregistration metrology tool used to generate an image of target 1100.

Figure 12A:
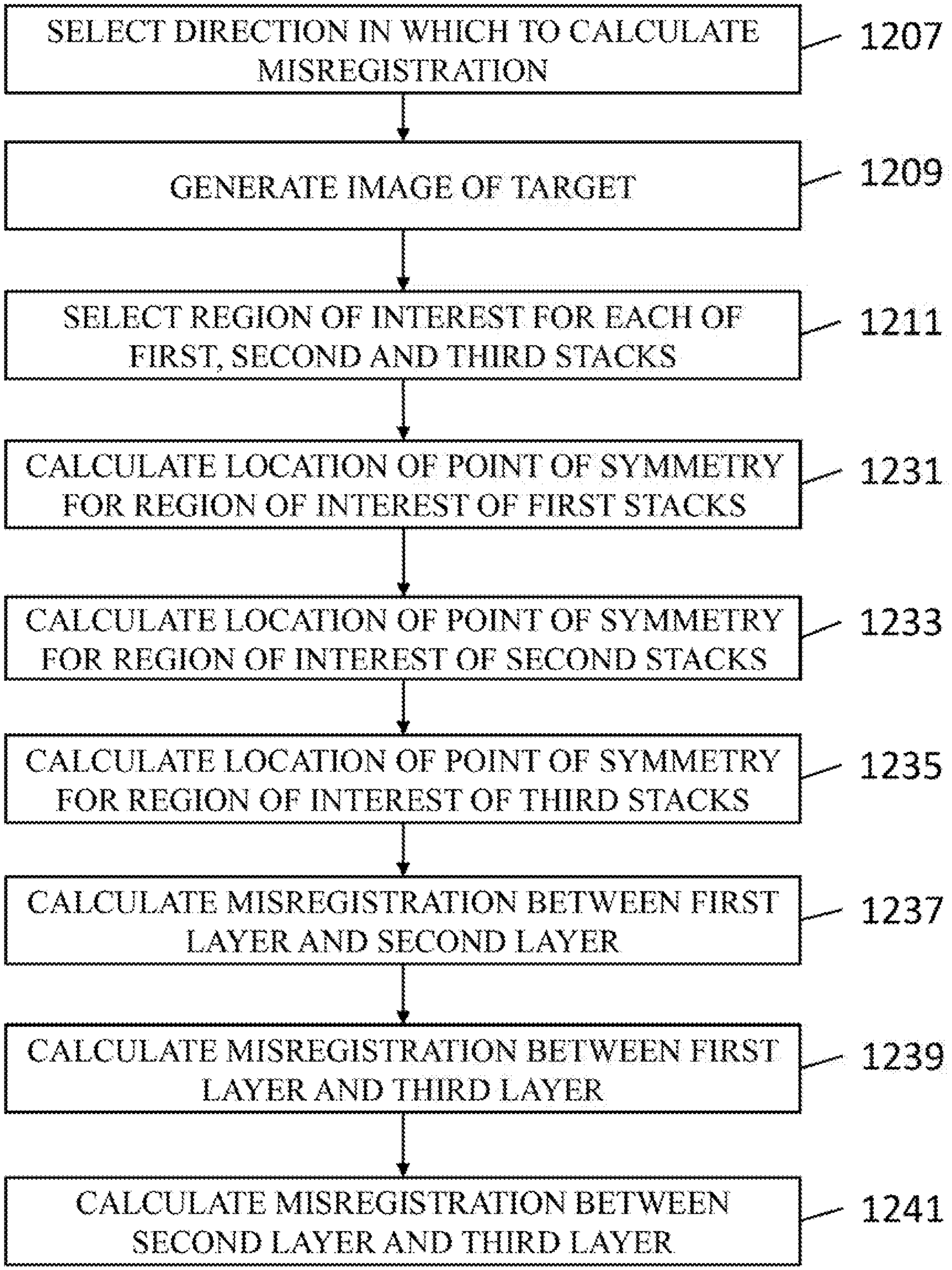
FIG. 12A is a simplified flowchart illustrating a preferred method of calculating misregistration between layers on which the multi-layered moiré target of FIG. 10 or of FIGS. 11A-111D is formed.
Figure 12B:
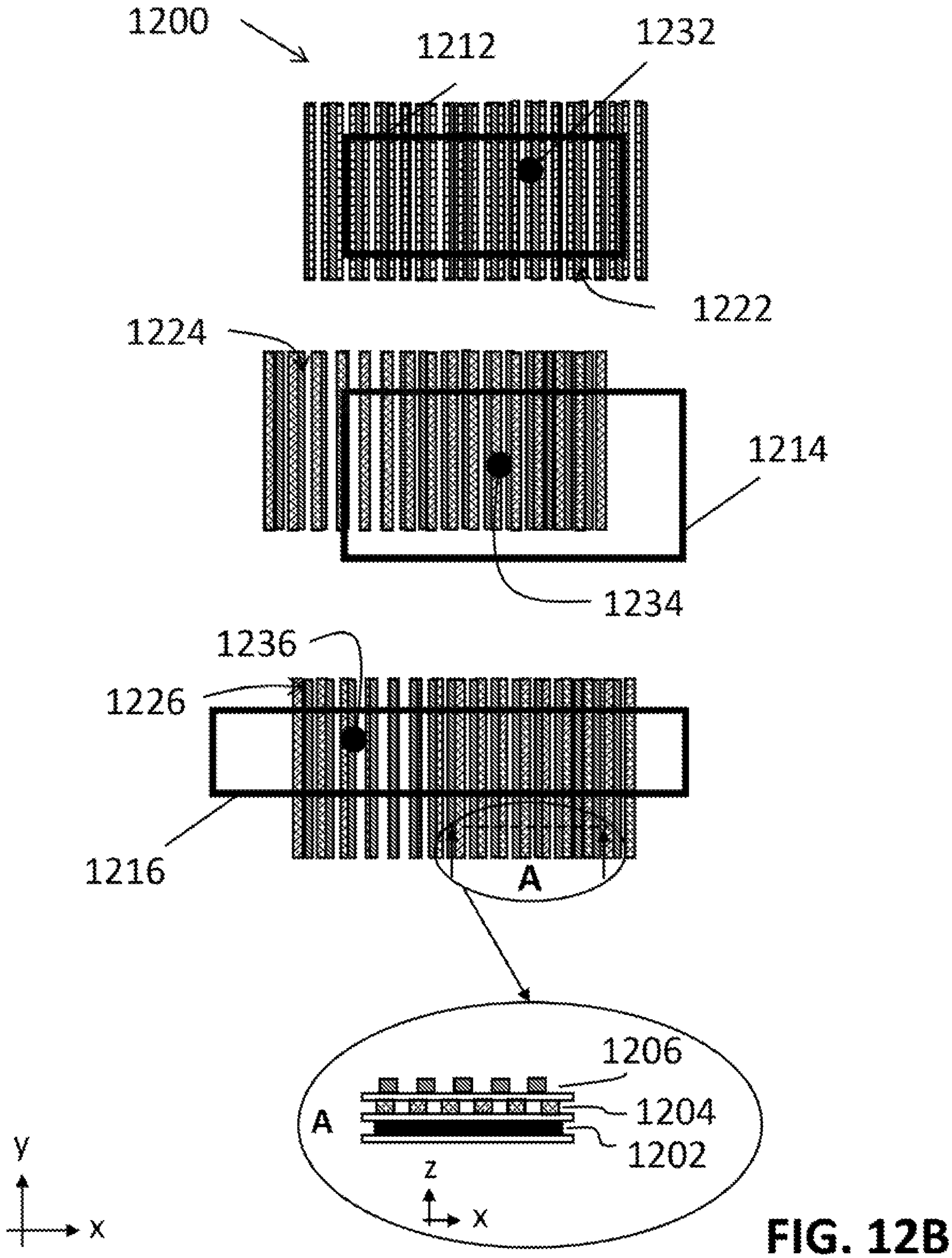
FIGS. 12B and 12C are simplified pictorial illustrations of first and second embodiments of a portion of the method of FIG. 12A, respectively.
Figure 12C:
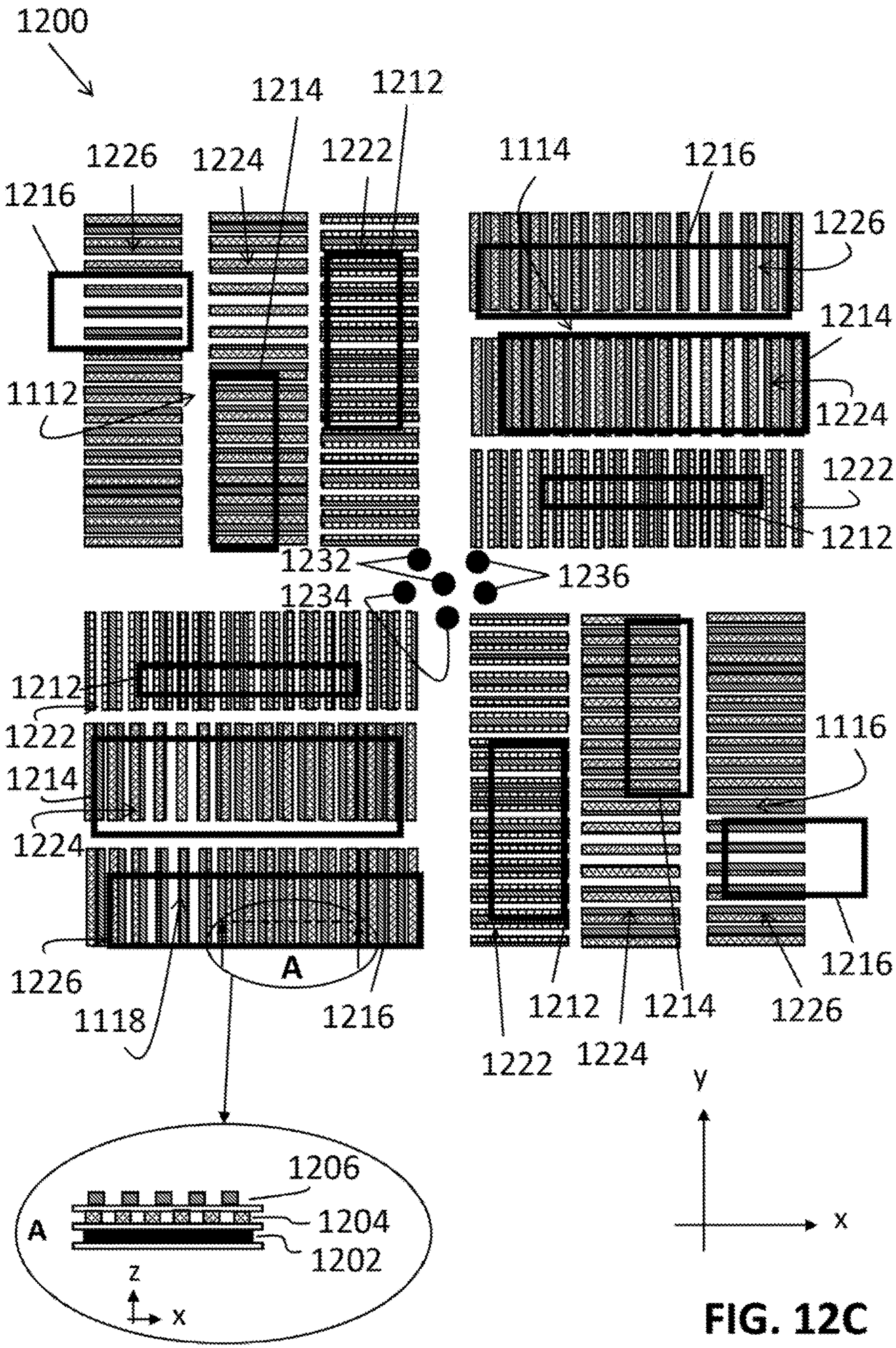

Reference is now made to FIG. 12A, which is a simplified flowchart illustrating a preferred method of calculating misregistration, using a multi-layered moiré target 1200, such as a target 1000 (FIG. 10) or target 1100 (FIGS. 11A-11D), in a direction parallel to either the x or the y direction between a first, a second and a third layer 1202, 1204 and 1206, such as layers 1002, 1004 and 1006 (FIG. 10) or 1102, 1104 and 1106 (FIGS. 11A-11D) of a multi-layered semiconductor device wafer formed with target 1200. Reference is further made to FIGS. 12B & 12C, which are simplified pictorial illustrations of first and second embodiments of a portion of the method of FIG. 12A, respectively.

While it is appreciated that when utilizing target 1100 (FIGS. 11A-11D) the method described with reference to FIGS. 12A-12C may be performed only once to calculate misregistration in either the x or the y direction, typically, the method described in FIGS. 12A-12C will be performed twice, to calculate misregistration in each of the x and y directions. It is also appreciated that when utilizing target 1000 (FIG. 10) misregistration may be calculated only in the one direction to which first, second and third stack axes 1032, 1034 and 1036 are parallel.

As seen at a first step 1207, a direction in which to measure misregistration is selected. When using target 1000 in the method of FIGS. 12A & 12B, the direction in which to measure misregistration is automatically selected to be the direction to which first, second and third stack axes 1032, 1034 and 1036 are parallel. When using target 1100 in the method of FIGS. 12A & 12B, the structures of quadrants 1114 and 1118 are utilized to measure misregistration in a direction parallel to the x-axis, and the structures of quadrants 1112 and 1116 to measure misregistration in a direction parallel to the y-axis.

Preferably, at a next step 1209, an image of target 1200 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches β, β−n, β+n, δ, δ−p and δ+p need not be optically resolvable by the misregistration metrology tool used to generate the image of target 1200. However, it is preferable that each of pitches $\gamma_1$, $\gamma_2$, $\gamma_3$, $\varepsilon_1$, $\varepsilon_2$ and $\varepsilon_3$ is optically resolvable by the misregistration metrology tool used to generate the image of target 1200.

In a next step 1211, and as seen in FIGS. 12B & 12C, first, second and third regions of interest 1212, 1214 and 1216 are selected for each of respective first, second and third stacks 1222, 1224 and 1226, such as first, second and third stacks 1022, 1024 and 1026 (FIG. 10) or first, second and third stacks 1122, 1124 and 1126 (FIGS. 11A-11D), in the quadrants selected in step 1207. It is appreciated, as seen in the illustrated embodiments of FIGS. 12B & 12C, that while first, second and third regions of interest 1212, 1214 and 1216 preferably lie entirely within each of respective first, second and third stacks 1222, 1224 and 1226, as illustrated for first region of interest 1212, which lies completely within first stack 1222, first, second and third regions of interest 1212, 1214 and 1216 may extend beyond respective first, second and third stacks 1222, 1224 and 1226, as illustrated for regions of interest 1214 and 1216, which extend beyond respective second and third stacks 1224 and 1226. It is further appreciated that regions of interest 1212, 1214 and 1216 shown in FIGS. 12B & 12C are representative regions of interest, and that other suitable regions of interest may be chosen at step 1211.

In a next step 1231, and as seen in FIGS. 12B & 12C, a location of a point of symmetry 1232 between all instances of first region of interest 1212 selected in step 1211 is calculated. In a next step 1233, and as seen in FIGS. 12B & 12C, a location of a point of symmetry 1234 between all instances of second region of interest 1214 selected in step 1211 is calculated. In a next step 1235, and as seen in FIGS. 12B & 12C, a location of a point of symmetry 1236 between all instances of third region of interest 1216 selected in step 1211 is calculated.

At a next step 1237, a distance in the direction selected at step 1207 is calculated between the location of point of symmetry 1232 of first region or regions of interest 1212 identified at step 1231 and the location of point of symmetry 1234 of second region or regions of interest 1214 identified at step 1233. The distance found at step 1237 is divided by a gain $\zeta_1$, which for target 1000 is a function of pitch β and additive term n, as shown in equation 29a:

$$\zeta_1 = \left|\frac{2\times\beta}{n}\right| \quad \text{(Eq. 29a)}$$

and for target 1100 is a function of pitch δ and additive term p, as shown in equation 29b:

$$\zeta_1 = \left|\frac{2\times\delta}{p}\right| \quad \text{(Eq. 29b)}$$

and the result is reported as the misregistration between first and second layers 1202 and 1204 in the direction selected at step 1207. It is appreciated that in addition to the distance calculated at step 1237, the method further calculates an adjustment direction, such as right, left, up or down. The adjustment direction is a function of the values of pitch β and additive term n or pitch δ and additive term p, as well as which of layers 1202 and 1204 is to be adjusted.

At a next step 1239, a distance in the direction selected at step 1207 is calculated between the location of point of symmetry 1234 of second region or regions of interest 1214 identified at step 1233 and the location of point of symmetry 1236 of third region or regions of interest 1216 identified at step 1235. The distance found at step 1239 is divided by a gain $\zeta_2$, which for target 1000 is a function of pitch β and additive term n, as shown in equation 30a:

$$\zeta_2 = \left|1+\frac{\beta}{n}\right| \quad \text{(Eq. 30a)}$$

and for target 1100 is a function pitch δ and additive term p, as shown in equation 30b:

$$\zeta_2 = \left|1+\frac{\delta}{p}\right| \quad \text{(Eq. 30b)}$$

and the result is reported as the misregistration between first and third layers 1202 and 1206 in the direction selected at step 1207. It is appreciated that in addition to the distance calculated at step 1239, the method further calculates an adjustment direction, such as right, left, up or down. The adjustment direction is a function of the values of pitch β and additive term n or pitch δ and additive term p, as well as which of layers 1202 and 1206 is to be adjusted.

At a next step 1241, a difference is calculated between the misregistration value reported at step 1237 and the misregistration value reported at step 1239. The difference calculated at step 1241 is reported as the misregistration between second and third layers 1204 and 1206 in the direction selected at step 1207. It is appreciated that in addition to the distance calculated at step 1241, the method further calculates an adjustment direction, such as right, left, up or down. The adjustment direction is a function of the values of pitch β and additive term n or pitch δ and additive term p, as well as which of layers 1204 and 1206 is to be adjusted.

Preferably, in the embodiment described hereinabove wherein structures shown as being formed together with first and third layers 1202 and 1206 are all formed together with layer 1202, the method described hereinabove with reference to FIGS. 12A-12C proceeds to calculate and report a difference between the misregistration value reported at step 1237 and the misregistration value reported at step 1241. The difference between the misregistration values reported at steps 1237 and 1241 is useful in the calibration of the misregistration metrology tool used in the method of FIGS. 12A-12C.

It is appreciated that in an embodiment of the present invention, relevant portions of the method described hereinabove with reference to FIGS. 12A-12C may be performed using only layers 1202 and 1204, prior to the formation of layer 1206.

Figure 13:
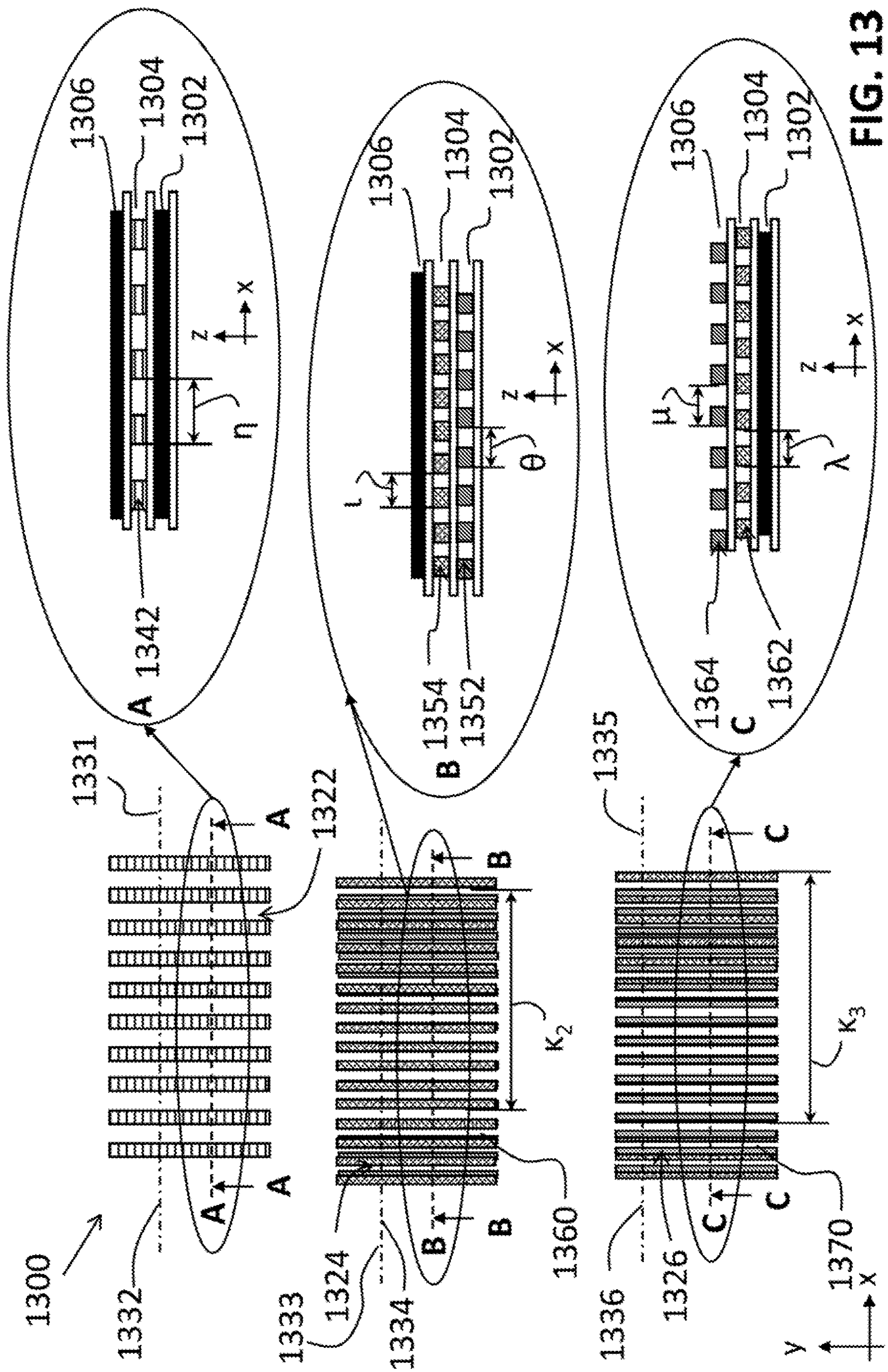
FIG. 13 is a simplified illustration of another embodiment of a multi-layered moiré target of the present invention.

Reference is now made to FIG. 13, which is a simplified illustration of another embodiment of a multi-layered moiré target 1300 of the present invention. FIG. 13 includes illustrations in three different dimensions, indicated by x-, y- and z-axes, the three dimensions being referred to hereinafter as an x-y plane, an x-z plane and a y-z plane, respectively. It is noted that FIG. 13 generally illustrates the x-y plane, while enlargements A, B and C of FIG. 13 illustrate planes parallel to the x-z plane.

Target 1300 is preferably formed on a semiconductor device wafer on which are preferably formed at least a first layer 1302, a second layer 1304 and a third layer 1306. It is appreciated that each of first layer 1302, second layer 1304 and third layer 1306 defines a generally planar surface parallel to the x-y plane. First, second and third layers 1302, 1304 and 1306 may be adjacent layers but need not be. Preferably, any material between first, second and third layers 1302, 1304 and 1306 is at least partially transparent to electromagnetic radiation. In the embodiment illustrated in FIG. 13, first layer 1302 lies below second and third layers 1304 and 1306, and third layer 1306 lies above first and second layers 1302 and 1304. It is appreciated, however, that layers 1302, 1304 and 1306 may be arranged in any suitable order along the z-axis with respect to one another.

Additionally, in an embodiment of the present invention, structures shown as being formed together with first and third layers 1302 and 1306 may all be formed together with layer 1302. In such an embodiment, no portion of target 1300 is formed together with layer 1306. Such an embodiment is particularly useful for calibration, as described hereinbelow with reference to FIGS. 15A-15C.

It is appreciated that FIG. 13 illustrates one possible layout of target 1300, and that in other embodiments of the present invention, target 1300 may include additional structures. For example, as described hereinbelow with reference to FIGS. 14A-14D & 34-39, a suitable target may include multiple instances of the structures shown in FIG. 13, and those multiple instances may be arranged in various ways.

Preferably, target 1300 includes a first stack 1322 of periodic structures, a second stack 1324 of periodic structures and a third stack 1326 of periodic structures. Each of first stack 1322, second stack 1324 and third stack 1326 includes one or more periodic structures, each periodic structure having a pitch. Preferably, none of first stack 1322, second stack 1324 and third stack 1326 overlap with one another.

It is appreciated that although in FIG. 13, each of the periodic structures of first stack 1322, second stack 1324 and third stack 1326 are shown as being formed of a plurality of lines and spaces, in other embodiments of the invention, the periodic structures of first stack 1322, second stack 1324 and third stack 1326 may be formed of any suitable periodic features. It is further appreciated that the periodic features forming the periodic structures included in first stack 1322, second stack 1324 and third stack 1326 may be formed of sub-structures. The pitches of each of the periodic structures of first stack 1322, second stack 1324 and third stack 1326 are preferably between 10 nm-3000 nm, and more preferably between 200 nm-800 nm.

A first x-z plane 1331 intersects first stack 1322. A plurality of first axes 1332 lie within first x-z plane 1331 and are parallel to the x-axis. A second x-z plane 1333 intersects second stack 1324. A plurality of second axes 1334 lie within second x-z plane 1333 and are parallel to the x-axis. A third x-z plane 1335 intersects third stack 1326. A plurality of third axes 1336 lie within third x-z plane 1335 and are parallel to the x-axis.

As seen particularly in enlargement A, first stack 1322 includes a first stack first periodic structure (S1P1) 1342 formed together with second layer 1304 and having an S1P1 pitch, designated $\eta$, along one of first stack axes 1332. Preferably, first stack 1322 does not include periodic structures formed together with either of first layer 1302 or third layer 1306 which would, together with S1P1 1342, produce a moiré pattern upon imaging first stack 1322. However, first stack 1322 may include periodic structures formed together with first layer 1302 or third layer 1306 which do not produce a moiré pattern upon imaging first stack 1322, such as periodic structures which are periodic along an axis parallel to the y-axis or periodic structures having a pitch size that does not produce a moiré pattern upon imaging first stack 1322.

As seen particularly in enlargement B, second stack 1324 includes a second stack first periodic structure (S2P1) 1352 formed together with first layer 1302 and having an S2P1 pitch, designated $\theta$, along one of second stack axes 1334. Second stack 1324 further includes a second stack second periodic structure (S2P2) 1354 formed together with second layer 1304 and having an S2P2 pitch, designated $\iota$, along another of second stack axes 1334.

It is appreciated that S2P1 1352 and S2P2 1354 at least partially overlie one another, and thus a second stack moiré pattern 1360 is visible upon imaging second stack 1324. As is known in the art, second stack moiré pattern 1360 is characterized by a pitch $\kappa_2$, which is a function of pitch $\theta$ and pitch $\iota$, as shown in equation 31:

$$\kappa_2 = \frac{\theta \times \iota}{|\theta - \iota|} \quad \text{(Eq. 31)}$$

Preferably, second stack 1324 does not include periodic structures formed together with third layer 1306 which affect moiré pattern 1360. However, second stack 1324 may include periodic structures formed together with third layer 1306 which do not affect moiré pattern 1360, such as periodic structures which are periodic along an axis parallel to the y-axis or periodic structures having a pitch size that does not affect moiré pattern 1360.

As seen particularly in enlargement C, third stack 1326 includes a third stack first periodic structure (S3P1) 1362 formed together with second layer 1304 and having an S3P1 pitch, designated $\lambda$, along one of third stack axes 1336. Third stack 1326 further includes a third stack second periodic structure (S3P2) 1364 formed together with third layer 1306 and having an S3P2 pitch, designated, along another of third stack axes 1336. In an embodiment of the present invention, the values of S3P1 pitch k and S2P2 pitch t are identical and the values of S3P2 pitch $\mu$ and S2P1 pitch $\theta$ are identical.

It is appreciated that S3P1 1362 and S3P2 1364 at least partially overlie one another, and thus a third stack moiré pattern 1370 is visible upon imaging third stack 1326. As is known in the art, third stack moiré pattern 1370 is characterized by a pitch $\kappa_3$, which is a function of pitch $\lambda$ and pitch $\mu$, as shown in equation 32:

$$\kappa_3 = \frac{\lambda \times \mu}{|\lambda - \mu|} \quad \text{(Eq. 32)}$$

Preferably, third stack 1326 does not include periodic structures formed together with first layer 1302 which affect moiré pattern 1370. However, third stack 1326 may include periodic structures formed together with first layer 1302 which do not affect moiré pattern 1370, such as periodic structures which are periodic along an axis parallel to the y-axis or periodic structures having a pitch size that does not affect moiré pattern 1370

Misregistration between any two of layers 1302, 1304 and 1306 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches $\theta$, $\iota$, $\lambda$ and $\mu$ need not be optically resolvable by the misregistration metrology tool used to generate an image of target 1300. However, it is preferable that each of pitches $\eta$, $\kappa_2$ and $\kappa_3$ is optically resolvable by the misregistration metrology tool used to generate an image of target 1300.

Figure 14A:
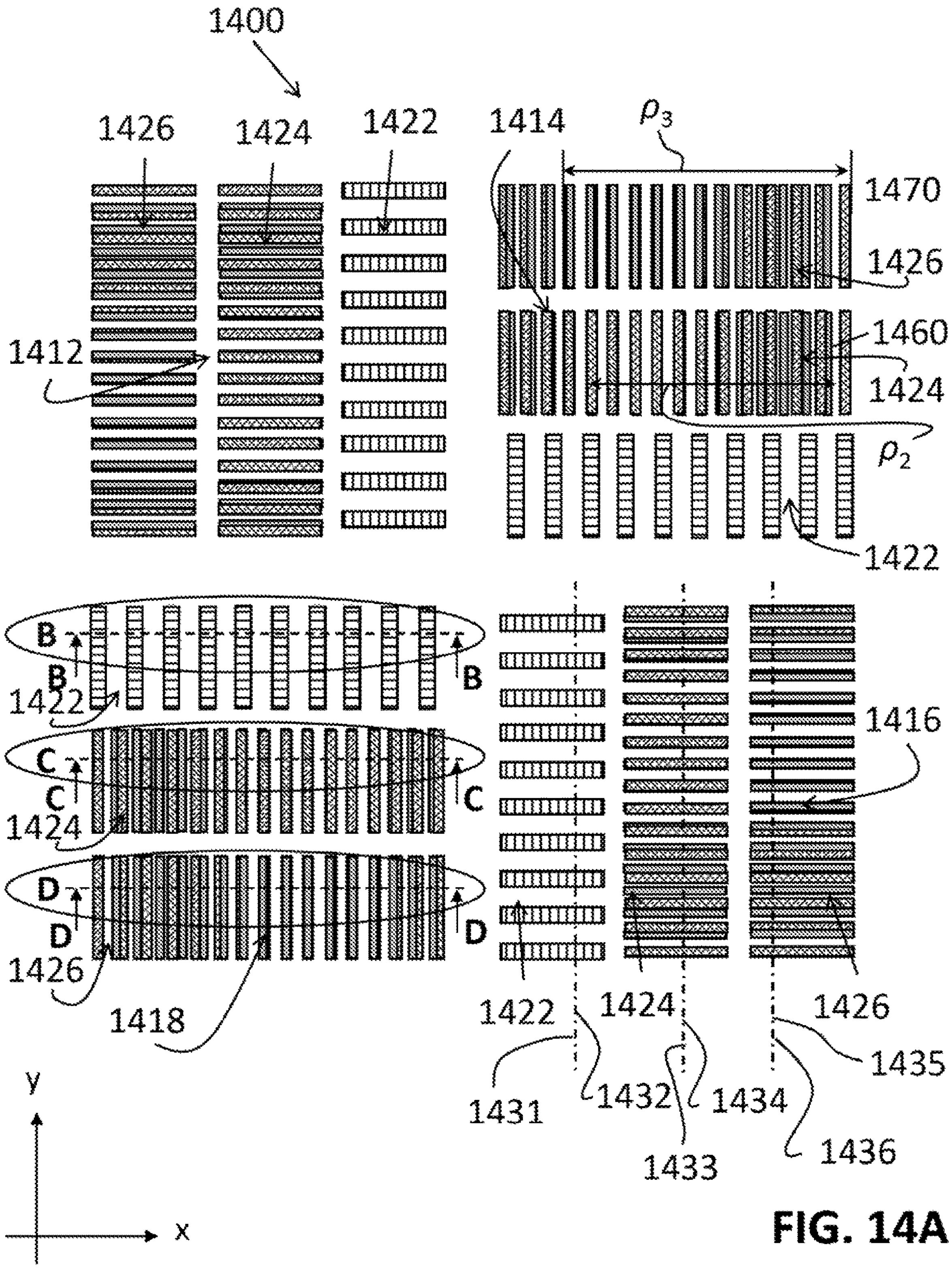
FIGS. 14A, 14B, 14C and 14D are simplified respective top view, first sectional side view, second sectional side view and third sectional side view illustrations of another embodiment of a multi-layered moiré target of the present invention, FIGS. 14B, 14C and 14D being taken along lines B-B, C-C and D-D in FIG. 14A, respectively.
Figure 14B:
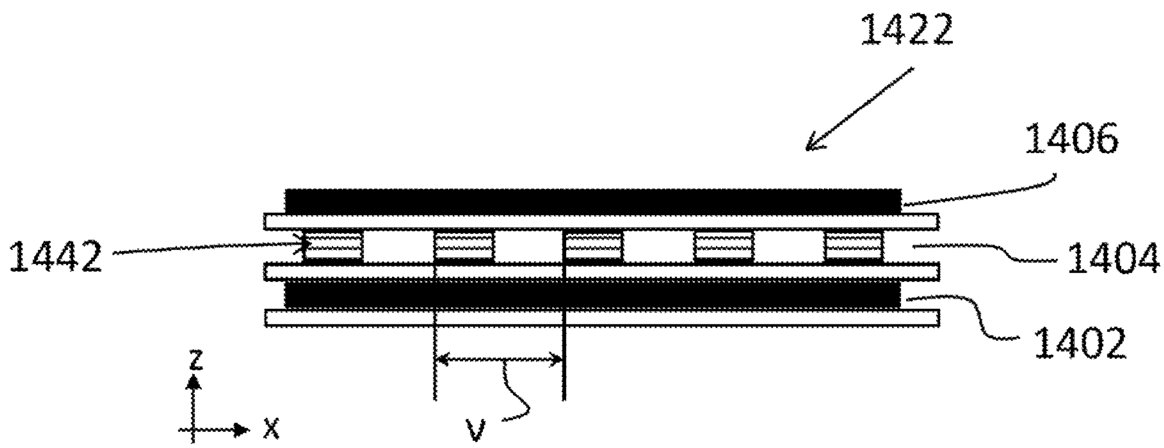
Figure 14C:
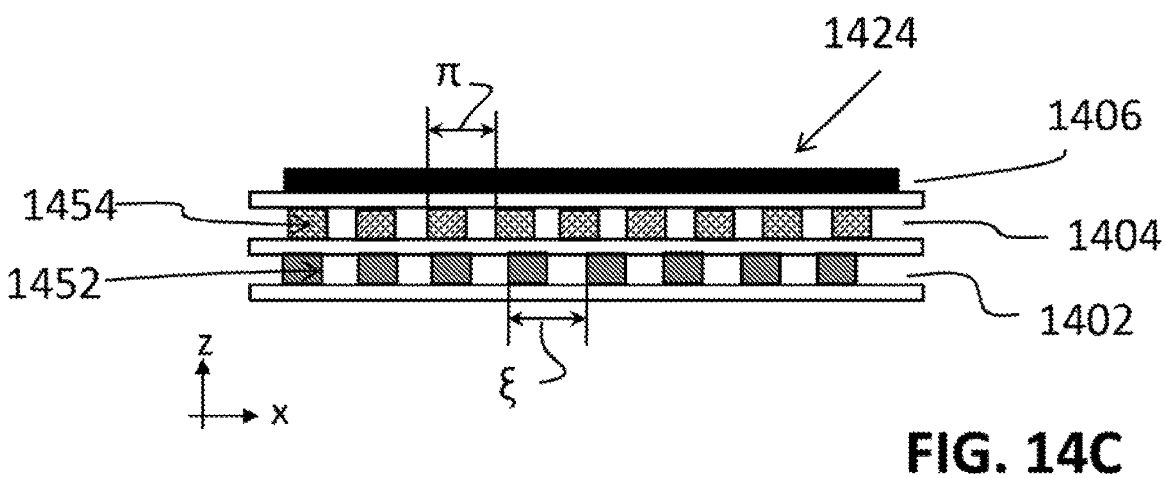
Figure 14D:
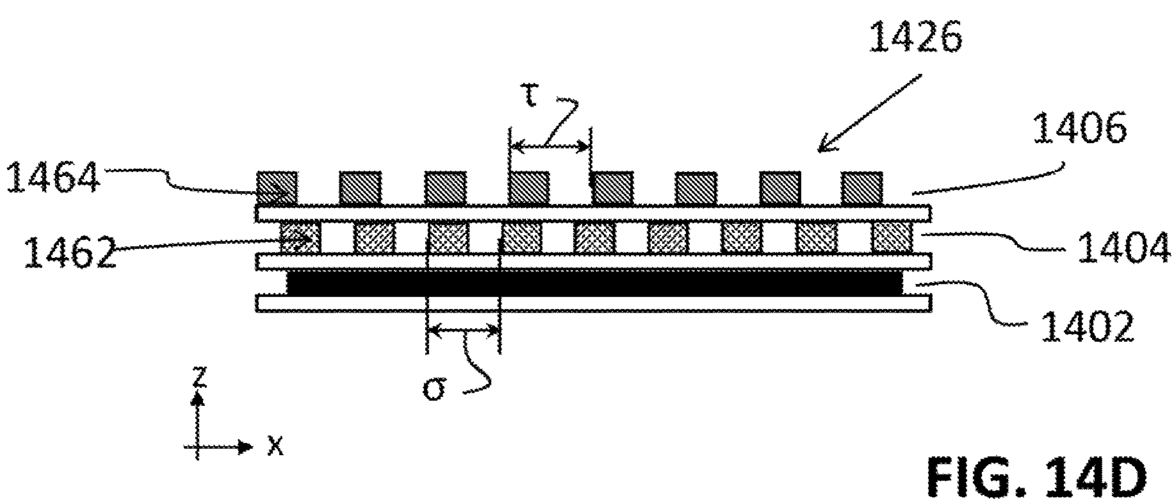

Reference is now made to FIGS. 14A-14D, which are simplified illustrations of another embodiment of a multilayered moiré target 1400 of the present invention. FIGS. 14A-14D include illustrations in three different dimensions, indicated by x-, y- and z-axes, the three dimensions being referred to hereinafter as an x-y plane, an x-z plane and a y-z plane, respectively. It is noted that FIG. 14A generally illustrates the x-y plane, while FIGS. 14B, 14C and 14D illustrate planes parallel to the x-z plane.

It is noted that target 1400 is one example of an alternative layout of target 1300, described hereinabove with reference to FIG. 13, and that additional layouts are described hereinbelow with reference to FIGS. 34-39. Target 1400 is preferably formed on a semiconductor device wafer on which are preferably formed at least a first layer 1402, a second layer 1404 and a third layer 1406. It is appreciated that each of first layer 1402, second layer 1404 and third layer 1406 defines a generally planar surface parallel to the x-y plane. First, second and third layers 1402, 1404 and 1406 may be adjacent layers but need not be. Preferably, any material between first, second and third layers 1402, 1404 and 1406 is at least partially transparent to electromagnetic radiation. In the embodiment illustrated in FIGS. 14A-14D, first layer 1402 lies below second and third layers 1404 and 1406, and third layer 1406 lies above first and second layers 1402 and 1404. It is appreciated, however, that layers 1402, 1404 and 1406 may be arranged in any suitable order along the z-axis with respect to one another.

Additionally, in an embodiment of the present invention, structures shown as being formed together with first and third layers 1402 and 1406 may all be formed together with layer 1402. In such an embodiment, no portion of target 1400 is formed together with layer 1406. Such an embodiment is particularly useful for calibration, as described hereinbelow with reference to FIGS. 15A-15C.

As seen particularly in FIG. 14A, target 1400 includes four target quadrants 1412, 1414, 1416 and 1418. In the embodiment shown in FIG. 14A, the rotational orientation in the x-y plane of each of target quadrants 1412, 1414, 1416 and 1418 preferably differs from the rotational orientation in the x-y plane of each of the other target quadrants 1412, 1414, 1416 and 1418 by an integer multiple of 90°. Additionally, target 1400 preferably is characterized by rotational symmetry in either the x-direction or the y-direction or both. In a preferred embodiment of the present invention, target 1400 is designed such that when in a state of registration, the entirety of target 1400 is characterized by a single point of symmetry in the x-direction and a single point of symmetry in the y-direction. However, even in such an embodiment, when in a state of misregistration, various elements of target 1400 will be characterized by unique points of symmetry.

Each of target quadrants 1412, 1414, 1416 and 1418 includes a first stack 1422 of periodic structures, a second stack 1424 of periodic structures and a third stack 1426 of periodic structures. Each of first stack 1422, second stack 1424 and third stack 1426 includes one or more periodic structures, each periodic structure having a pitch. Preferably, none of first stack 1422, second stack 1424 and third stack 1426 overlap with one another. In FIGS. 14A-14D, first stack 1422 is illustrated as lying closer to the center of target 1400 than second stack 1424 and third stack 1426, and third stack 1426 is illustrated as lying closer to the edge of target 1400 than first stack 1422 and second stack 1424. However, first stack 1422, second stack 1424 and third stack 1426 may be arranged in any suitable arrangement relative to the x-y plane with respect to one another.

It is appreciated that although in the embodiment illustrated in FIGS. 14A-14D, each of the periodic structures of first stack 1422, second stack 1424 and third stack 1426 are illustrated as being formed of a plurality of lines and spaces, in other embodiments of the invention, the periodic structures of first stack 1422, second stack 1424 and third stack 1426 may be formed of any suitable periodic features. It is further appreciated that the periodic features forming the periodic structures included in first stack 1422, second stack 1424 and third stack 1426 may be formed of sub-structures. The pitches of each of the periodic structures of first stack 1422, second stack 1424 and third stack 1426 are preferably between 10 nm-3000 nm, and more preferably between 200 nm-800 nm.

As seen in FIG. 14A, in each of quadrants 1412, 1414, 1416 and 1418, a first plane 1431, intersecting first stack 1422 and including a plurality of first axes 1432 lying therein, a second plane 1433, intersecting second stack 1424 and including a plurality of second axes 1434 lying therein, and a third plane 1435, intersecting third stack 1426 and including a plurality of third axes 1436 lying therein, are defined. Each of first plane 1431, second plane 1433 and third plane 1435 are either an x-z plane or a y-z plane, and first axes 1432, second axes 1434 and third axes 1436 are parallel to the respective x-axis or y-axis, depending on the orientation of first stack 1422, second stack 1424 and third stack 1426 within each of quadrants 1412, 1414, 1416 and 1418. It is appreciated that in each of quadrants 1412, 1414, 1416 and 1418, first plane 1431, second plane 1433 and third plane 1435 are all parallel to one another.

As seen particularly in FIG. 14B, first stack 1422 includes a first stack first periodic structure (S1P1) 1442 formed together with second layer 1404 and having an S1P1 pitch, designated v, along one of first stack axes 1432. Preferably, first stack 1422 does not include periodic structures formed together with either of first layer 1402 or third layer 1406 which would, together with S1P1 1442, produce a moiré pattern upon imaging first stack 1422. However, first stack 1422 may include periodic structures formed together with first layer 1402 or third layer 1406 which do not produce a moiré pattern upon imaging first stack 1422, such as periodic structures which are periodic in a plane parallel to the x-y plane along an axis that is perpendicular to first stack axes 1432 or periodic structures having a pitch size that does not produce a moiré pattern upon imaging first stack 1422.

As seen particularly in FIG. 14C, second stack 1424 includes a second stack first periodic structure (S2P1) 1452 formed together with first layer 1402 and having an S2P1 pitch, designated ξ, along one of second stack axes 1434. Second stack 1424 further includes a second stack second periodic structure (S2P2) 1454 formed together with second layer 1404 and having an S2P2 pitch, designated π, along another of second stack axes 1434.

It is appreciated that S2P1 1452 and S2P2 1454 at least partially overlie one another, and thus a second stack moiré pattern 1460 is visible upon imaging second stack 1424. As is known in the art, second stack moiré pattern 1460 is characterized by a pitch $\rho_2$, which is a function of pitch ξ and pitch π, as shown in equation 33:

$$\rho_2 = \frac{\xi \times \pi}{|\xi - \pi|} \quad \text{(Eq. 33)}$$

Preferably, second stack 1424 does not include periodic structures formed together with third layer 1406 which affect moiré pattern 1460. However, second stack 1424 may include periodic structures formed together with third layer 1406 which do not affect moiré pattern 1460, such as periodic structures which are periodic in a plane parallel to the x-y plane along an axis that is perpendicular to second stack axes 1434 or periodic structures having a pitch size that does not affect moiré pattern 1460.

As seen particularly in FIG. 14D, third stack 1426 includes a third stack first periodic structure (S3P1) 1462 formed together with second layer 1404 and having an S3P1 pitch, designated σ, along one of third stack axes 1436. Third stack 1426 further includes a third stack second periodic structure (S3P2) 1464 formed together with third layer 1406 and having an S3P2 pitch, designated r, along another of third stack axes 1436. In an embodiment of the present invention, the values of S3P1 pitch σ and S2P2 pitch π are identical and the values of S3P2 pitch τ and S2P1 pitch ξ are identical.

It is appreciated that S3P1 1462 and S3P2 1464 at least partially overlie one another, and thus a third stack moiré pattern 1470 is visible upon imaging third stack 1426. As is known in the art, third stack moiré pattern 1470 is characterized by a pitch $\rho_3$, which is a function of pitch $\sigma$ and pitch $\tau$, as shown in equation 34:

$$\rho_3 = \frac{\sigma \times \tau}{|\sigma - \tau|} \quad \text{(Eq. 34)}$$

Preferably, third stack 1426 does not include periodic structures formed together with first layer 1402 which affect moiré pattern 1470. However, third stack 1426 may include periodic structures formed together with first layer 1402 which do not affect moiré pattern 1470, such as periodic structures which are periodic in a plane parallel to the x-y plane along an axis that is perpendicular to third stack axes 1436 or periodic structures having a pitch size that does not affect moiré pattern 1470.

Misregistration between any two of layers 1402, 1404 and 1406 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches $\xi$, $\pi$, $\sigma$ and $\tau$ need not be optically resolvable by the misregistration metrology tool used to generate an image of target 1400. However, it is preferable that each of pitches $\nu$, $\rho_2$ and $\rho_3$ is optically resolvable by the misregistration metrology tool used to generate an image of target 1400.

Figure 15A:
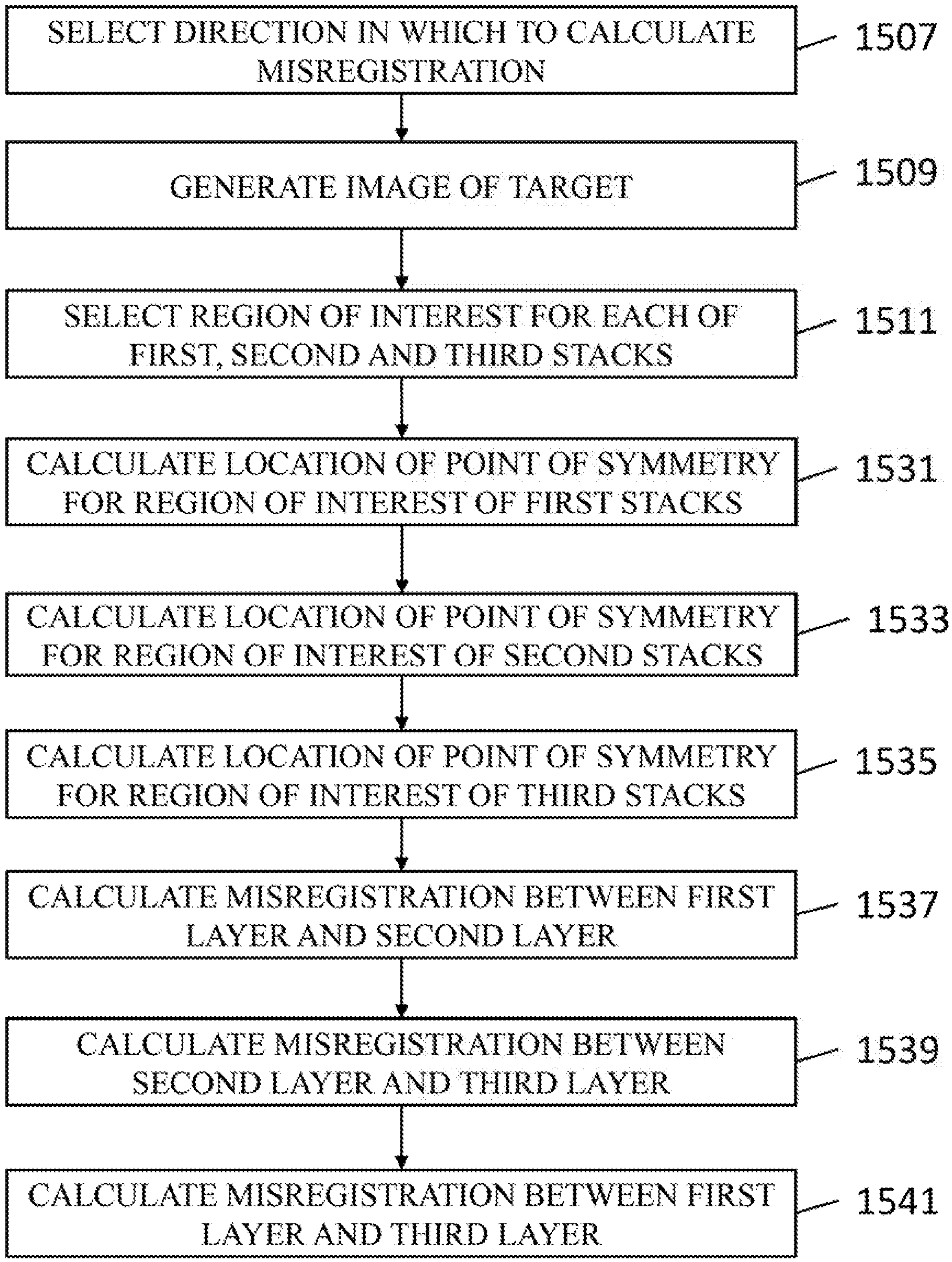
FIG. 15A is a simplified flowchart illustrating a preferred method of calculating misregistration between layers on which the multi-layered moiré target of FIG. 13 or of FIGS. 14A-14D is formed.
Figure 15B:
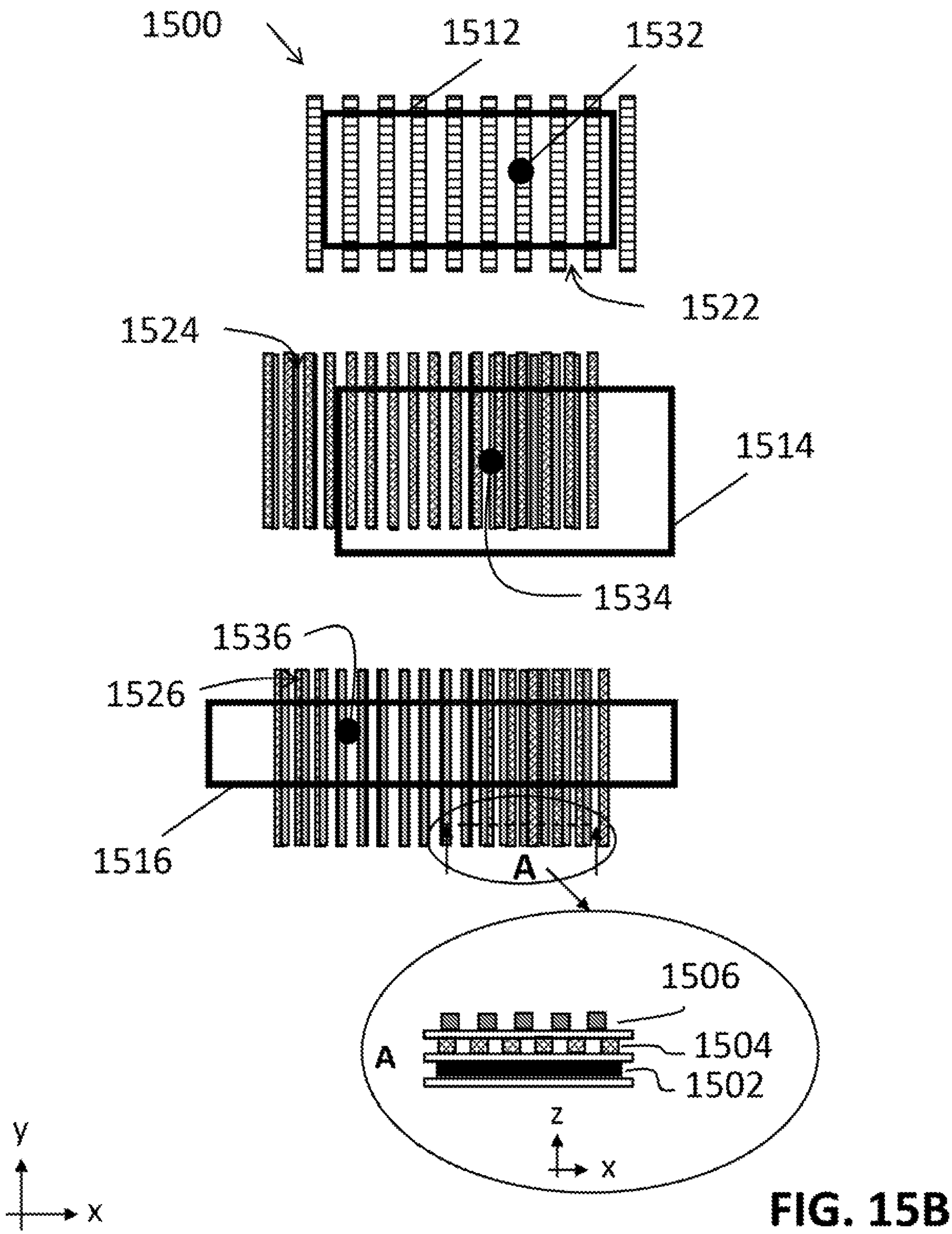
FIGS. 15B and 15C are simplified pictorial illustrations of first and second embodiments of a portion of the method of FIG. 15A, respectively.
Figure 15C:
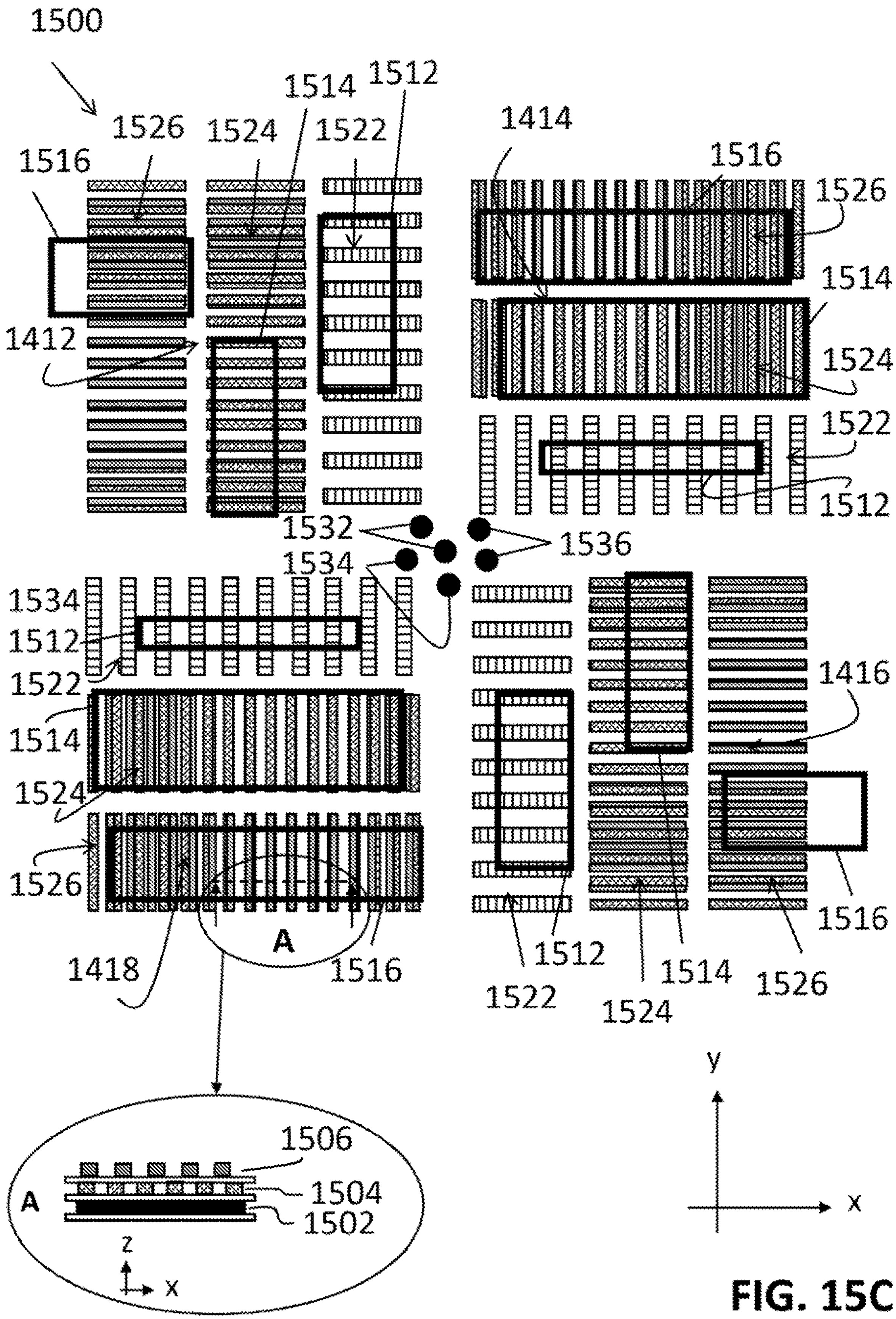

Reference is now made to FIG. 15A, which is a simplified flowchart illustrating a preferred method of calculating misregistration, using a multi-layered moiré target 1500, such as a target 1300 (FIG. 13) or target 1400 (FIGS. 14A-14D), in a direction parallel to either the x or the y direction between a first, a second and a third layer 1502, 1504 and 1506, such as layers 1302, 1304 and 1306 (FIG. 13) or 1402, 1404 and 1406 (FIGS. 14A-14D) of a multi-layered semiconductor device wafer formed with target 1500. Reference is further made to FIGS. 15B & 15C, which are simplified pictorial illustrations of first and second embodiments of a portion of the method of FIG. 15A, respectively.

While it is appreciated that when utilizing target 1400 (FIGS. 14A-14D) the method described with reference to FIGS. 15A-15C may be performed only once to calculate misregistration in either the x or the y direction, typically, the method described in FIGS. 15A-15C will be performed twice, to calculate misregistration in each of the x and y directions. It is also appreciated that when utilizing target 1300 (FIG. 13) misregistration may be calculated only in the one direction to which first, second and third stack axes 1332, 1334 and 1336 are parallel.

As seen at a first step 1507, a direction in which to measure misregistration is selected. When using target 1300 in the method of FIGS. 15A & 15B, the direction in which to measure misregistration is automatically selected to be the direction to which first, second and third stack axes 1332, 1334 and 1336 are parallel. When using target 1400 in the method of FIGS. 15A & 15B, the structures of quadrants 1414 and 1418 are utilized to measure misregistration in a direction parallel to the x-axis, and the structures of quadrants 1412 and 1416 to measure misregistration in a direction parallel to the y-axis.

Preferably, at a next step 1509, an image of target 1500 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches $\theta$, $\iota$, $\lambda$, $\mu$, $\xi$, $\pi$, $\sigma$ and $\tau$ need not be optically resolvable by the misregistration metrology tool used to generate the image of target 1500. However, it is preferable that each of pitches $\eta$, $\nu$, $\kappa_2$, $\kappa_3$, $\rho_2$ and $\rho_3$ is optically resolvable by the misregistration metrology tool used to generate the image of target 1500.

In a next step 1511, and as seen in FIGS. 15B & 15C, first, second and third regions of interest 1512, 1514 and 1516 are selected for each of respective first, second and third stacks 1522, 1524 and 1526, such as first, second and third stacks 1322, 1324 and 1326 (FIG. 13) or first, second and third stacks 1422, 1424 and 1426 (FIGS. 14A-14D), in the quadrants selected in step 1507. It is appreciated, as seen in the illustrated embodiments of FIGS. 15B & 15C, that while first, second and third regions of interest 1512, 1514 and 1516 preferably lie entirely within each of respective first, second and third stacks 1522, 1524 and 1526, as illustrated for first region of interest 1512, which lies completely within first stack 1522, first, second and third regions of interest 1512, 1514 and 1516 may extend beyond respective first, second and third stacks 1522, 1524 and 1526, as illustrated for regions of interest 1514 and 1516, which extend beyond respective second and third stacks 1524 and 1526. It is further appreciated that regions of interest 1512, 1514 and 1516 shown in FIGS. 15B & 15C are representative regions of interest, and that other suitable regions of interest may be chosen at step 1511.

In a next step 1531, and as seen in FIGS. 15B & 15C, a location of a point of symmetry 1532 between all instances of first region of interest 1512 selected in step 1511 is calculated. In a next step 1533, and as seen in FIGS. 15B & 15C, a location of a point of symmetry 1534 between all instances of second region of interest 1514 selected in step 1511 is calculated. In a next step 1535, and as seen in FIGS. 15B & 15C, a location of a point of symmetry 1536 between all instances of third region of interest 1516 selected in step 1511 is calculated.

At a next step 1537, a distance in the direction selected at step 1507 is calculated between the location of point of symmetry 1532 of first region or regions of interest 1512 identified at step 1531 and the location of point of symmetry 1534 of second region or regions of interest 1514 identified at step 1533. The distance found at step 1537 is divided by a gain $\upsilon_1$, which for target 1300 is a function of pitch $\theta$ and pitch $\iota$, as shown in equation 35a:

$$\upsilon_1 = \left(\frac{\iota}{|\theta - \iota|}\right) \quad \text{(Eq. 35a)}$$

and for target 1400 is a function of pitch $\pi$ and pitch $\xi$, as shown in equation 35b:

$$\upsilon_1 = \left(\frac{\pi}{|\pi - \xi|}\right) \quad \text{(Eq. 35b)}$$

and the result is reported as the misregistration between first and second layers 1502 and 1504 in the direction selected at step 1507. It is appreciated that in addition to the distance calculated at step 1537, the method further calculates an adjustment direction, such as right, left, up or down. The adjustment direction is a function of the relative values of pitch θ and pitch ι or pitch π and pitch ξ, as well as which of layers 1502 and 1504 is to be adjusted.

At a next step 1539, a distance in the direction selected at step 1507 is calculated between the location of point of symmetry 1532 of first region or regions of interest 1512 identified at step 1531 and the location of point of symmetry 1536 of third region or regions of interest 1516 identified at step 1535. The distance found at step 1539 is divided by a gain υ2, which for target 1300 is a function of pitch λ and pitch ξ, as shown in equation 36a:

$$\upsilon_2 = \left(\frac{\lambda}{|\lambda - \mu|}\right) \quad \text{(Eq. 36a)}$$

and for target 1400 is a function of pitch σ and pitch τ, as shown in equation 36b:

$$\upsilon_2 = \left(\frac{\sigma}{|\sigma - \tau|}\right) \quad \text{(Eq. 36b)}$$

and the result is reported as the misregistration between second and third layers 1504 and 1506 in the direction selected at step 1507. It is appreciated that in addition to the distance calculated at step 1539, the method further calculates an adjustment direction, such as right, left, up or down. The adjustment direction is a function of the relative values of pitch θ and pitch ι or pitch π and pitch ξ, as well as which of layers 1504 and 1506 is to be adjusted.

At a next step 1541, a misregistration value between first and third layers 1502 and 1506 is calculated. In the embodiment described hereinabove wherein S3P1 pitch does not have the same value as S2P2 pitch and S3P2 pitch does not have the same value as S2P1 pitch, at step 1541 a difference is calculated between the misregistration value reported at step 1537 and the misregistration value reported at step 1539. The difference calculated at step 1541 is reported as the misregistration between first and third layers 1502 and 1506 in the direction selected at step 1507. It is appreciated that in addition to the distance calculated at step 1541, the method further calculates an adjustment direction, such as right, left, up or down. The adjustment direction is a function of the relative values of pitch θ and pitch ι or pitch π and pitch ξ, as well as which of layers 1502 and 1506 is to be adjusted.

In the embodiment described hereinabove wherein S3P1 pitch has the same value as S2P2 pitch and S3P2 pitch has the same value as S2P1 pitch, at step 1541 a distance in the direction selected at step 1507 is calculated between the location of point of symmetry 1534 of second region or regions of interest 1514 identified at step 1533 and the location of point of symmetry 1536 of third region or regions of interest 1516 identified at step 1535. The distance found at step 1541 is divided by a gain $\upsilon_3$, which for target 1300 is a function of pitch θ and pitch ι, as shown in equation 37a:

$$\upsilon_3 = \left(\frac{\iota}{|\theta - \iota|}\right) \quad \text{(Eq. 37a)}$$

and for target 1400 is a function of pitch π and pitch ξ, as shown in equation 37b:

$$\upsilon_3 = \left(\frac{\pi}{|\pi - \xi|}\right) \quad \text{(Eq. 37b)}$$

and the result is reported as the misregistration between first and third layers 1502 and 1506 in the direction selected at step 1507. It is appreciated that in addition to the distance calculated at step 1541, the method further calculates an adjustment direction, such as right, left, up or down. The adjustment direction is a function of the relative values of pitch θ and pitch ι or pitch π and pitch ξ, as well as which of layers 1502 and 1506 is to be adjusted.

Preferably, in the embodiment described hereinabove wherein structures shown as being formed together with first and third layers 1502 and 1506 are all formed together with layer 1502, the method described hereinabove with reference to FIGS. 15A-15C proceeds to calculate and report a difference between the misregistration value reported at step 1537 to the misregistration value reported at step 1539. The difference between the misregistration values reported at steps 1537 and 1539 is useful in the calibration of the misregistration metrology tool used in the method of FIGS. 15A-15C.

It is appreciated that in an embodiment of the present invention, relevant portions of the method described hereinabove with reference to FIGS. 15A-15C may be performed using only layers 1502 and 1504, prior to the formation of layer 1506. Similarly, in an embodiment of the present invention wherein layer 1506 lies below layer 1502, relevant portions of the method described hereinabove with reference to FIGS. 15A-15C may be performed using only layers 1504 and 1506, prior to the formation of layer 1502.

Figure 16:
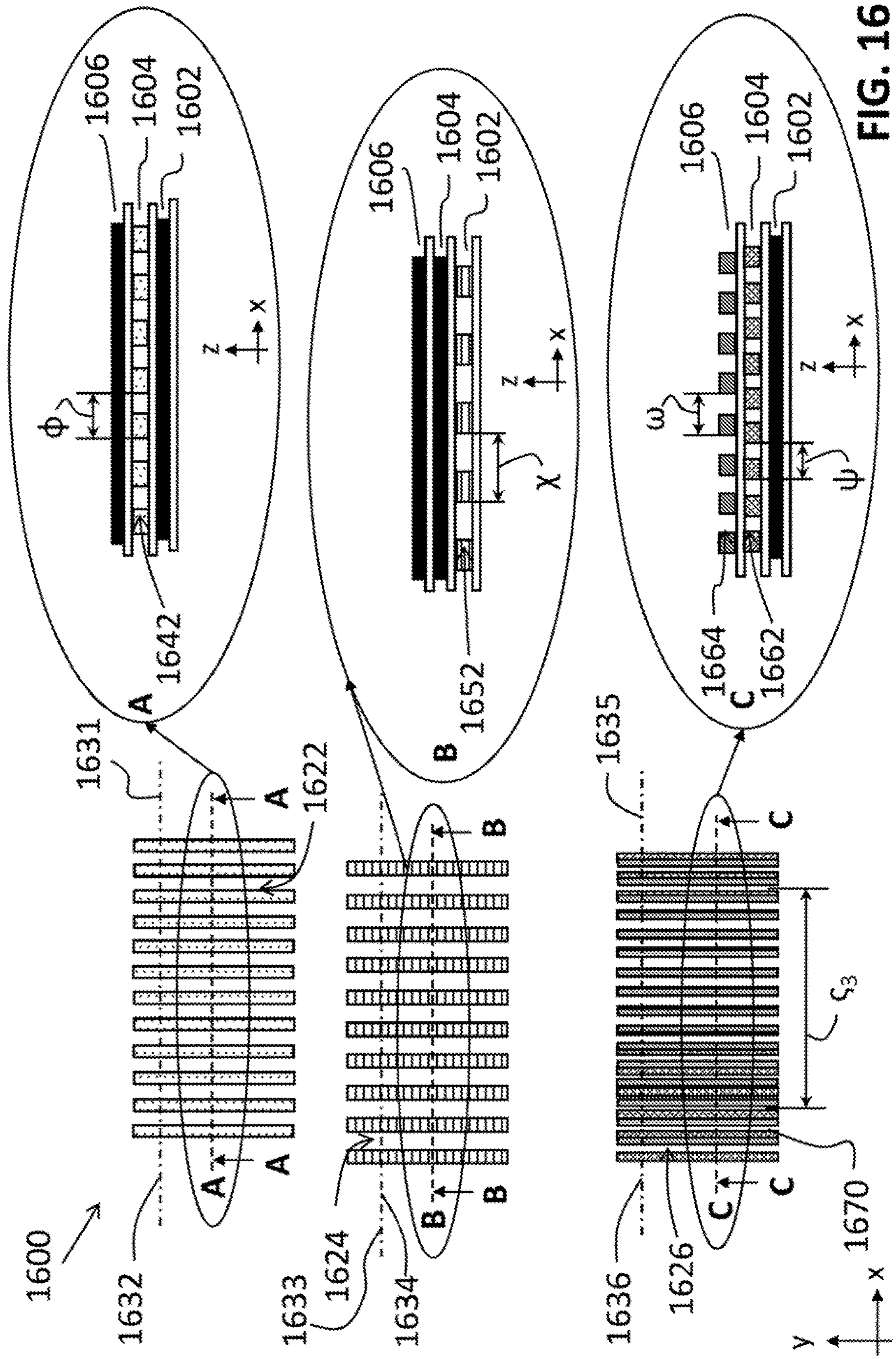
FIG. 16 is a simplified illustration of another embodiment of a multi-layered moiré target of the present invention.

Reference is now made to FIG. 16, which is a simplified illustration of another embodiment of a multi-layered moiré target 1600 of the present invention. FIG. 16 includes illustrations in three different dimensions, indicated by x-, y- and z-axes, the three dimensions being referred to hereinafter as an x-y plane, an x-z plane and a y-z plane, respectively. It is noted that FIG. 16 generally illustrates the x-y plane, while enlargements A, B and C of FIG. 16 illustrate planes parallel to the x-z plane.

Target 1600 is preferably formed on a semiconductor device wafer on which are preferably formed at least a first layer 1602, a second layer 1604 and a third layer 1606. It is appreciated that each of first layer 1602, second layer 1604 and third layer 1606 defines a generally planar surface parallel to the x-y plane. First, second and third layers 1602, 1604 and 1606 may be adjacent layers but need not be. Preferably, any material between first, second and third layers 1602, 1604 and 1606 is at least partially transparent to electromagnetic radiation. In the embodiment illustrated in FIG. 16, first layer 1602 lies below second and third layers 1604 and 1606, and third layer 1606 lies above first and second layers 1602 and 1604. It is appreciated, however, that layers 1602, 1604 and 1606 may be arranged in any suitable order along the z-axis with respect to one another.

Additionally, in an embodiment of the present invention, structures shown as being formed together with first and second layers 1602 and 1604 may all be formed together with layer 1602. In such an embodiment, no portion of target 1600 is formed together with layer 1604. Such an embodiment is particularly useful for calibration, as described hereinbelow with reference to FIGS. 18A-18C. Additionally, in another embodiment of the present invention, structures shown as being formed together with first and third layers 1602 and 1606 may all be formed together with layer 1602.

In such an embodiment, no portion of target 1600 is formed together with layer 1606. Such an embodiment is particularly useful for calibration, as described hereinbelow with reference to FIGS. 18A-18C.

It is appreciated that FIG. 16 illustrates one possible layout of target 1600, and that in other embodiments of the present invention, target 1600 may include additional structures. For example, as described hereinbelow with reference to FIGS. 17A-17D & 34-39, a suitable target may include multiple instances of the structures shown in FIG. 16, and those multiple instances may be arranged in various ways.

Preferably, target 1600 includes a first stack 1622 of periodic structures, a second stack 1624 of periodic structures and a third stack 1626 of periodic structures. Each of first stack 1622, second stack 1624 and third stack 1626 includes one or more periodic structures each periodic structure having a pitch. Preferably, none of first stack 1622, second stack 1624 and third stack 1626 overlap with one another.

It is appreciated that although in FIG. 16, each of the periodic structures of first stack 1622, second stack 1624 and third stack 1626 are shown as being formed of a plurality of lines and spaces, in other embodiments of the invention, the periodic structures of first stack 1622, second stack 1624 and third stack 1626 may be formed of any suitable periodic features. It is further appreciated that the periodic features forming the periodic structures included in first stack 1622, second stack 1624 and third stack 1626 may be formed of sub-structures. The pitches of each of the periodic structures of first stack 1622, second stack 1624 and third stack 1626 are preferably between 10 nm-3000 nm, and more preferably between 200 nm-800 nm.

A first x-z plane 1631 intersects first stack 1622. A plurality of first axes 1632 lie within first x-z plane 1631 and are parallel to the x-axis. A second x-z plane 1633 intersects second stack 1624. A plurality of second axes 1634 lie within second x-z plane 1633 and are parallel to the x-axis. A third x-z plane 1635 intersects third stack 1626. A plurality of third axes 1636 lie within third x-z plane 1635 and are parallel to the x-axis.

As seen particularly in enlargement A, first stack 1622 includes a first stack first periodic structure (S1P1) 1642 formed together with second layer 1604 and having an S1P1 pitch, designated φ, along one of first stack axes 1632. Preferably, first stack 1622 does not include periodic structures formed together with either of first layer 1602 or third layer 1606 which would, together with S1P1 1642, produce a moiré pattern upon imaging first stack 1622. However, first stack 1622 may include periodic structures formed together with first layer 1602 or third layer 1606 which do not produce a moiré pattern upon imaging first stack 1622, such as periodic structures which are periodic along an axis parallel to the y-axis or periodic structures having a pitch size that does not produce a moiré pattern upon imaging first stack 1622.

As seen particularly in enlargement B, second stack 1624 includes a second stack first periodic structure (S2P1) 1652 formed together with first layer 1602 and having an S2P1 pitch, designated χ, along one of second stack axes 1634. Preferably, second stack 1624 does not include periodic structures formed together with either of second layer 1604 or third layer 1606 which would, together with S2P1 1652, produce a moiré pattern upon imaging second stack 1624. However, second stack 1624 may include periodic structures formed together with second layer 1604 or third layer 1606 which do not produce a moiré pattern upon imaging second stack 1624, such as periodic structures which are periodic along an axis parallel to the y-axis or periodic structures having a pitch size that does not produce a moiré pattern upon imaging second stack 1624.

As seen particularly in enlargement C, third stack 1626 includes a third stack first periodic structure (S3P1) 1662 formed together with second layer 1604 and having an S3P1 pitch, designated ψ, along one of third stack axes 1636. Third stack 1626 further includes a third stack second periodic structure (S3P2) 1664 formed together with third layer 1606 and having an S3P2 pitch, designated ω, along another of third stack axes 1636.

It is appreciated that S3P1 1662 and S3P2 1664 at least partially overlie one another, and thus a third stack moiré pattern 1670 is visible upon imaging third stack 1626. As is known in the art, third stack moiré pattern 1670 is characterized by a pitch $\varsigma_3$, which is a function of pitch ψ and pitch ω, as shown in equation 38:

$$\varsigma_3 = \frac{\psi \times \omega}{|\psi - \omega|} \quad \text{(Eq. 38)}$$

Preferably, third stack 1626 does not include periodic structures formed together with first layer 1602 which affect moiré pattern 1670. However, third stack 1626 may include periodic structures formed together with first layer 1602 which do not affect moiré pattern 1670, such as periodic structures which are periodic along an axis parallel to the y-axis or periodic structures having a pitch size that does not affect moiré pattern 1670.

Misregistration between any two of layers 1602, 1604 and 1606 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches ψ and ω need not be optically resolvable by the misregistration metrology tool used to generate an image of target 1600. However, it is preferable that each of pitches φ, χ and $\varsigma_3$ is optically resolvable by the misregistration metrology tool used to generate an image of target 1600.

Figure 17A:
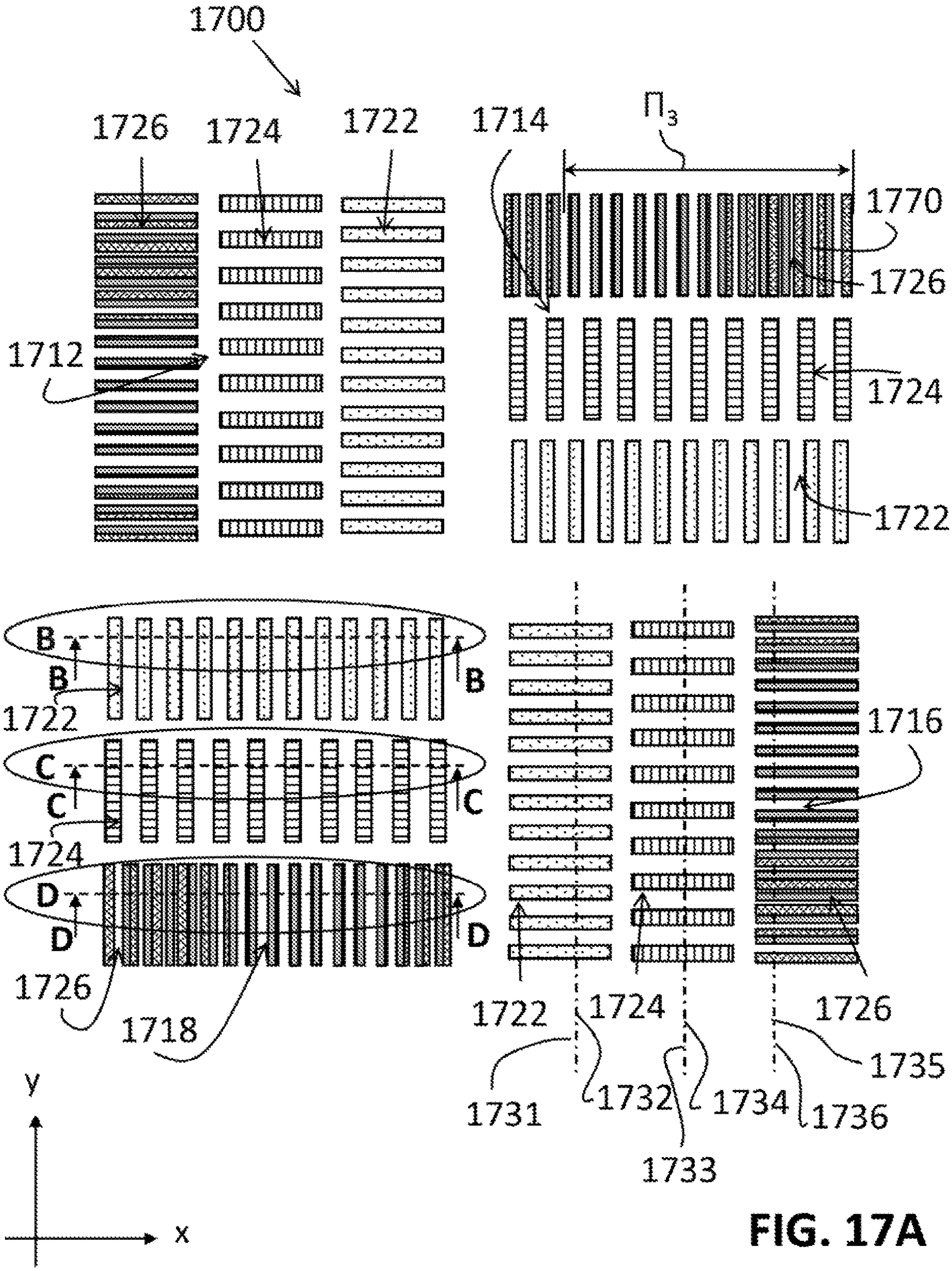
FIGS. 17A, 17B, 17C and 17D are simplified respective top view, first sectional side view, second sectional side view and third sectional side view illustrations of another embodiment of a multi-layered moiré target of the present invention, FIGS. 17B, 17C and 17D being taken along lines B-B, C-C and D-D in FIG. 17A, respectively.
Figure 17B:
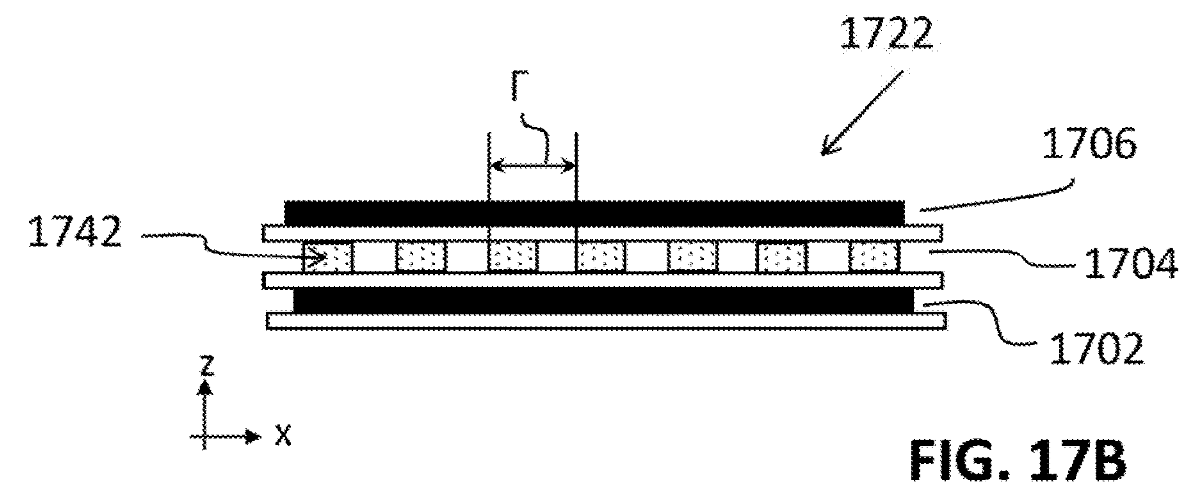
Figure 17C:
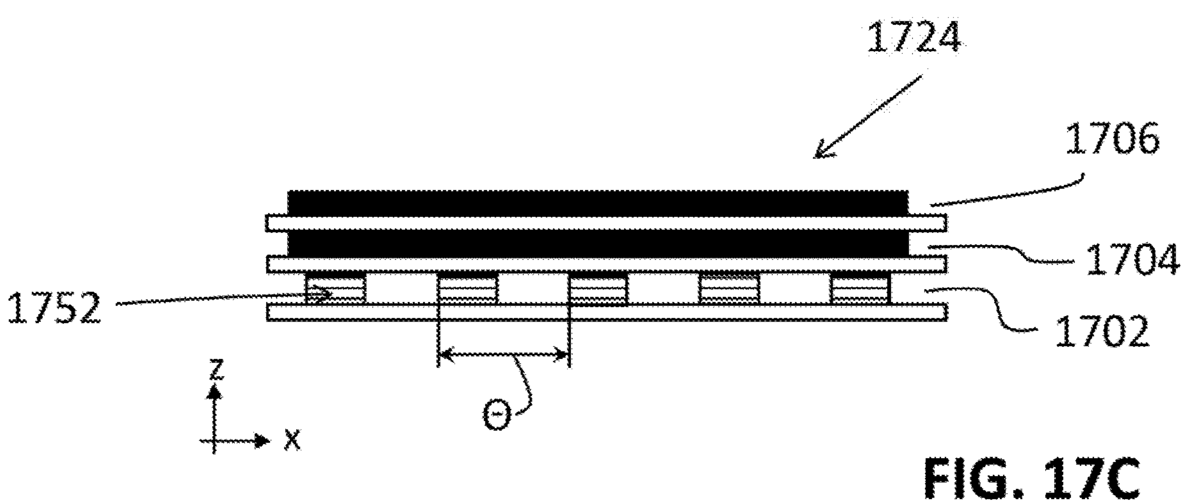
Figure 17D:
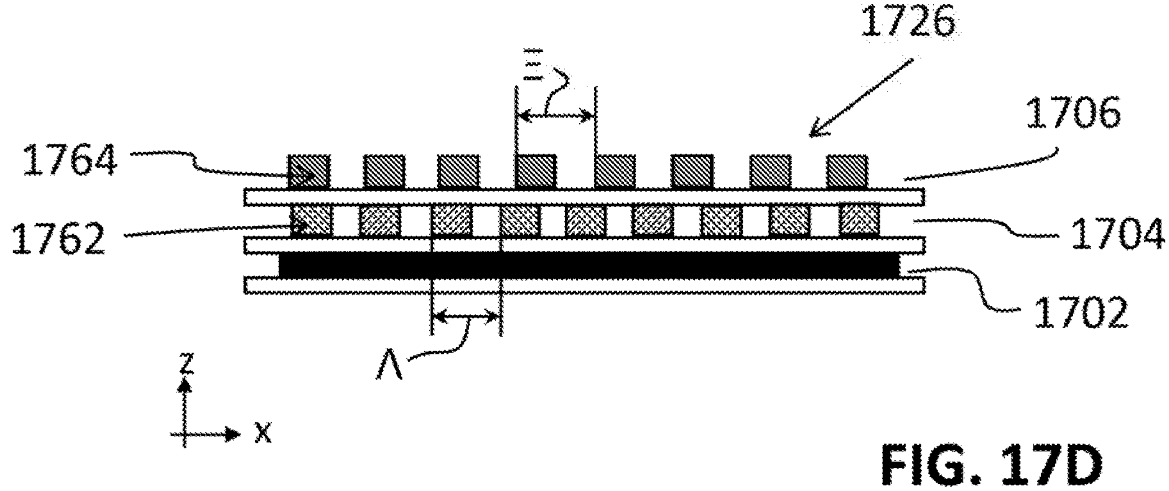

Reference is now made to FIGS. 17A-17D, which are simplified illustrations of another embodiment of a multi-layered moiré target 1700 of the present invention. FIGS. 17A-17D include illustrations in three different dimensions, indicated by x-, y- and z-axes, the three dimensions being referred to hereinafter as an x-y plane, an x-z plane and a y-z plane, respectively. It is noted that FIG. 17A generally illustrates the x-y plane, while FIGS. 17B, 17C and 17D illustrate planes parallel to the x-z plane.

It is noted that target 1700 is one example of an alternative layout of target 1600, described hereinabove with reference to FIG. 16, and that additional layouts are described hereinbelow with reference to FIGS. 34-39. Target 1700 is preferably formed on a semiconductor device wafer on which are preferably formed at least a first layer 1702, a second layer 1704 and a third layer 1706. It is appreciated that each of first layer 1702, second layer 1704 and third layer 1706 defines a generally planar surface parallel to the x-y plane. First, second and third layers 1702, 1704 and 1706 may be adjacent layers but need not be. Preferably, any material between first, second and third layers 1702, 1704 and 1706 is at least partially transparent to electromagnetic radiation. In the embodiment illustrated in FIGS. 17A-17D, first layer 1702 lies below second and third layers 1704 and

1706, and third layer 1706 lies above first and second layers 1702 and 1704. It is appreciated, however, that layers 1702, 1704 and 1706 may be arranged in any suitable order along the z-axis with respect to one another.

Additionally, in an embodiment of the present invention, structures shown as being formed together with first and second layers 1702 and 1704 may all be formed together with layer 1702. In such an embodiment, no portion of target 1700 is formed together with layer 1704. Such an embodiment is particularly useful for calibration, as described hereinbelow with reference to FIGS. 18A-18C. Additionally, in another embodiment of the present invention, structures shown as being formed together with first and third layers 1702 and 1706 may all be formed together with layer 1702. In such an embodiment, no portion of target 1700 is formed together with layer 1706. Such an embodiment is particularly useful for calibration, as described hereinbelow with reference to FIGS. 18A-18C.

As seen particularly in FIG. 17A, target 1700 includes four target quadrants 1712, 1714, 1716 and 1718. In the embodiment shown in FIG. 17A, the rotational orientation in the x-y plane of each of target quadrants 1712, 1714, 1716 and 1718 preferably differs from the rotational orientation in the x-y plane of each of the other target quadrants 1712, 1714, 1716 and 1718 by an integer multiple of 90°. Additionally, target 1700 preferably is characterized by rotational symmetry in either the x-direction or the y-direction or both. In a preferred embodiment of the present invention, target 1700 is designed such that when in a state of registration, the entirety of target 1700 is characterized by a single point of symmetry in the x-direction and a single point of symmetry in the y-direction. However, even in such an embodiment, when in a state of misregistration, various elements of target 1700 will be characterized by unique points of symmetry.

Each of target quadrants 1712, 1714, 1716 and 1718 includes a first stack 1722 of periodic structures, a second stack 1724 of periodic structures and a third stack 1726 of periodic structures. Each of first stack 1722, second stack 1724 and third stack 1726 includes one or more periodic structures, each periodic structure having a pitch. Preferably, none of first stack 1722, second stack 1724 and third stack 1726 overlap with one another. In FIGS. 17A-17D, first stack 1722 is illustrated as lying closer to the center of target 1700 than second stack 1724 and third stack 1726, and third stack 1726 is illustrated as lying closer to the edge of target 1700 than first stack 1722 and second stack 1724. However, first stack 1722, second stack 1724 and third stack 1726 may be arranged in any suitable arrangement relative to the x-y plane with respect to one another.

It is appreciated that although in the embodiment illustrated in FIGS. 17A-17D, each of the periodic structures of first stack 1722, second stack 1724 and third stack 1726 are illustrated as being formed of a plurality of lines and spaces, in other embodiments of the invention, the periodic structures of first stack 1722, second stack 1724 and third stack 1726 may be formed of any suitable periodic features. It is further appreciated that the periodic features forming the periodic structures included in first stack 1722, second stack 1724 and third stack 1726 may be formed of sub-structures. The pitches of each of the periodic structures of first stack 1722, second stack 1724 and third stack 1726 are preferably between 10 nm-3000 nm, and more preferably between 200 nm-800 nm.

As seen in FIG. 17A, in each of quadrants 1712, 1714, 1716 and 1718, a first plane 1731, intersecting first stack 1722 and including a plurality of first axes 1732 lying therein, a second plane 1733, intersecting second stack 1724 and including a plurality of second axes 1734 lying therein, and a third plane 1735, intersecting third stack 1726 and including a plurality of third axes 1736 lying therein, are defined. Each of first plane 1731, second plane 1733 and third plane 1735 are either an x-z plane or a y-z plane, and first axes 1732, second axes 1734 and third axes 1736 are parallel to the respective x-axis or y-axis, depending on the orientation of first stack 1722, second stack 1724 and third stack 1726 within each of quadrants 1712, 1714, 1716 and 1718. It is appreciated that in each of quadrants 1712, 1714, 1716 and 1718, first plane 1731, second plane 1733 and third plane 1735 are all parallel to one another.

As seen particularly in FIG. 17B, first stack 1722 includes a first stack first periodic structure (S1P1) 1742 formed together with second layer 1704 and having an S1P1 pitch, designated F, along one of first stack axes 1732. Preferably, first stack 1722 does not include periodic structures formed together with either of first layer 1702 or third layer 1706 which would, together with S1P1 1742, produce a moiré pattern upon imaging first stack 1722. However, first stack 1722 may include periodic structures formed together with first layer 1702 or third layer 1706 which do not produce a moiré pattern upon imaging first stack 1722, such as periodic structures which are periodic in a plane parallel to the x-y plane along an axis that is perpendicular to first stack axes 1732 or periodic structures having a pitch size that does not produce a moiré pattern upon imaging first stack 1722.

As seen particularly in FIG. 17C, second stack 1724 includes a second stack first periodic structure (S2P1) 1752 formed together with first layer 1702 and having an S2P1 pitch, designated Θ, along one of second stack axes 1734. Preferably, second stack 1724 does not include periodic structures formed together with either of second layer 1704 or third layer 1706 which would, together with S2P1 1752, produce a moiré pattern upon imaging second stack 1724. However, second stack 1724 may include periodic structures formed together with second layer 1704 or third layer 1706 which do not produce a moiré pattern upon imaging second stack 1724, such as periodic structures which are periodic in a plane parallel to the x-y plane along an axis that is perpendicular to second stack axes 1734 or periodic structures having a pitch size that does not produce a moiré pattern upon imaging second stack 1724.

As seen particularly in FIG. 17D, third stack 1726 includes a third stack first periodic structure (S3P1) 1762 formed together with second layer 1704 and having an S3P1 pitch, designated A, along one of third stack axes 1736. Third stack 1726 further includes a third stack second periodic structure (S3P2) 1764 formed together with third layer 1706 and having an S3P2 pitch, designated Ξ, along another of third stack axes 1736.

It is appreciated that S3P1 1762 and S3P2 1764 at least partially overlie one another, and thus a third stack moiré pattern 1770 is visible upon imaging third stack 1726. As is known in the art, third stack moiré pattern 1770 is characterized by a pitch 113, which is a function of pitch Λ and pitch Ξ, as shown in equation 39:

$$\Pi_3 = \frac{\Lambda \times \Xi}{|\Lambda - \Xi|} \tag{Eq. 39}$$

Preferably, third stack 1726 does not include periodic structures formed together with first layer 1702 which affect moiré pattern 1770. However, third stack 1726 may include periodic structures formed together with first layer 1702 which do not affect moiré pattern 1770, such as periodic structures which are periodic in a plane parallel to the x-y plane along an axis that is perpendicular to third stack axes 1736 or periodic structures having a pitch size that does not affect moiré pattern 1770.

Misregistration between any two of layers 1702, 1704 and 1706 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches A and E need not be optically resolvable by the misregistration metrology tool used to generate an image of target 1700. However, it is preferable that each of pitches Γ, Θ and $\Pi_3$ is optically resolvable by the misregistration metrology tool used to generate an image of target 1700.

Figure 18A:
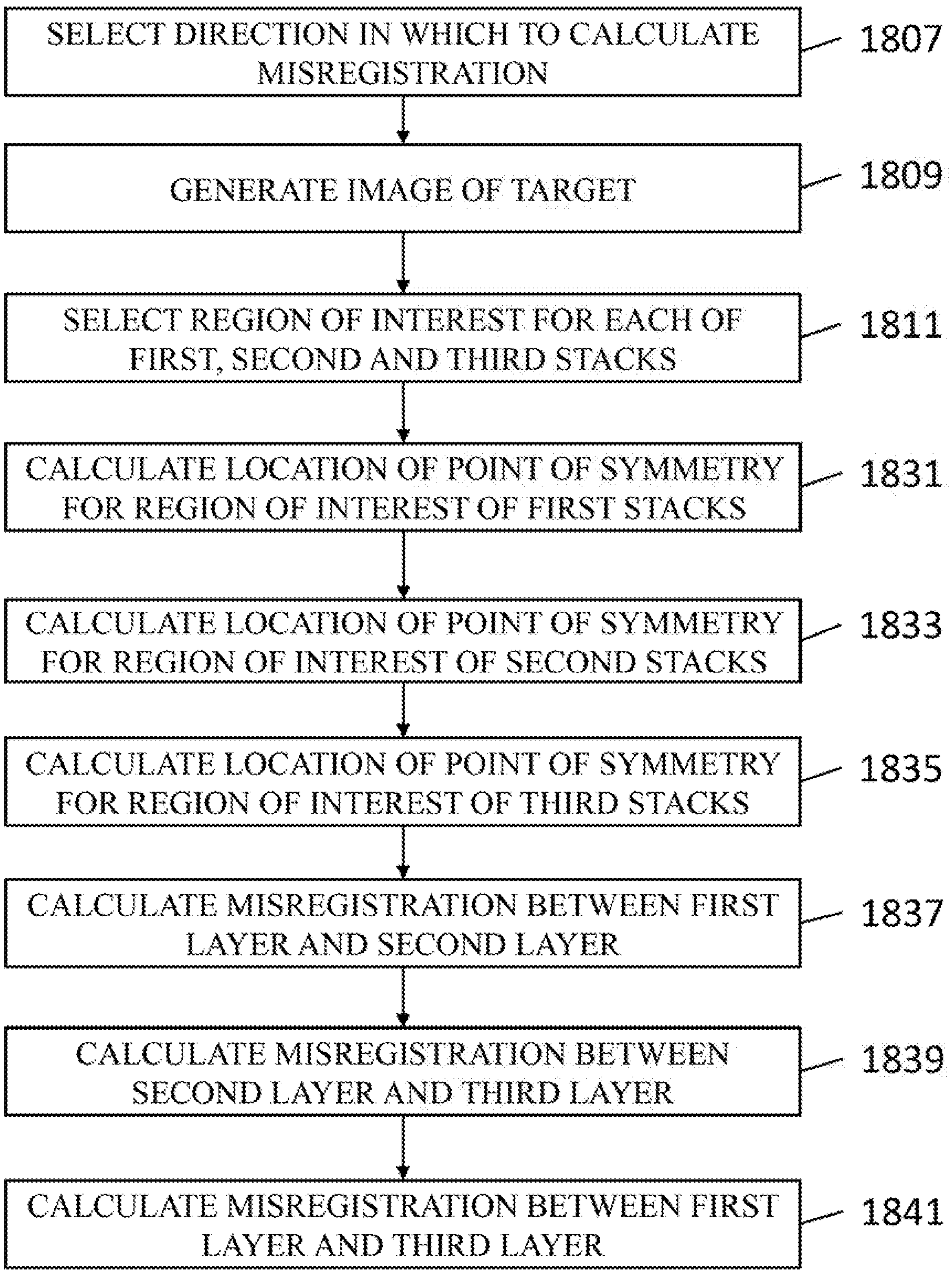
FIG. 18A is a simplified flowchart illustrating a preferred method of calculating misregistration between layers on which the multi-layered moiré target of FIG. 16 or of FIGS. 17A-17D is formed.
Figure 18B:
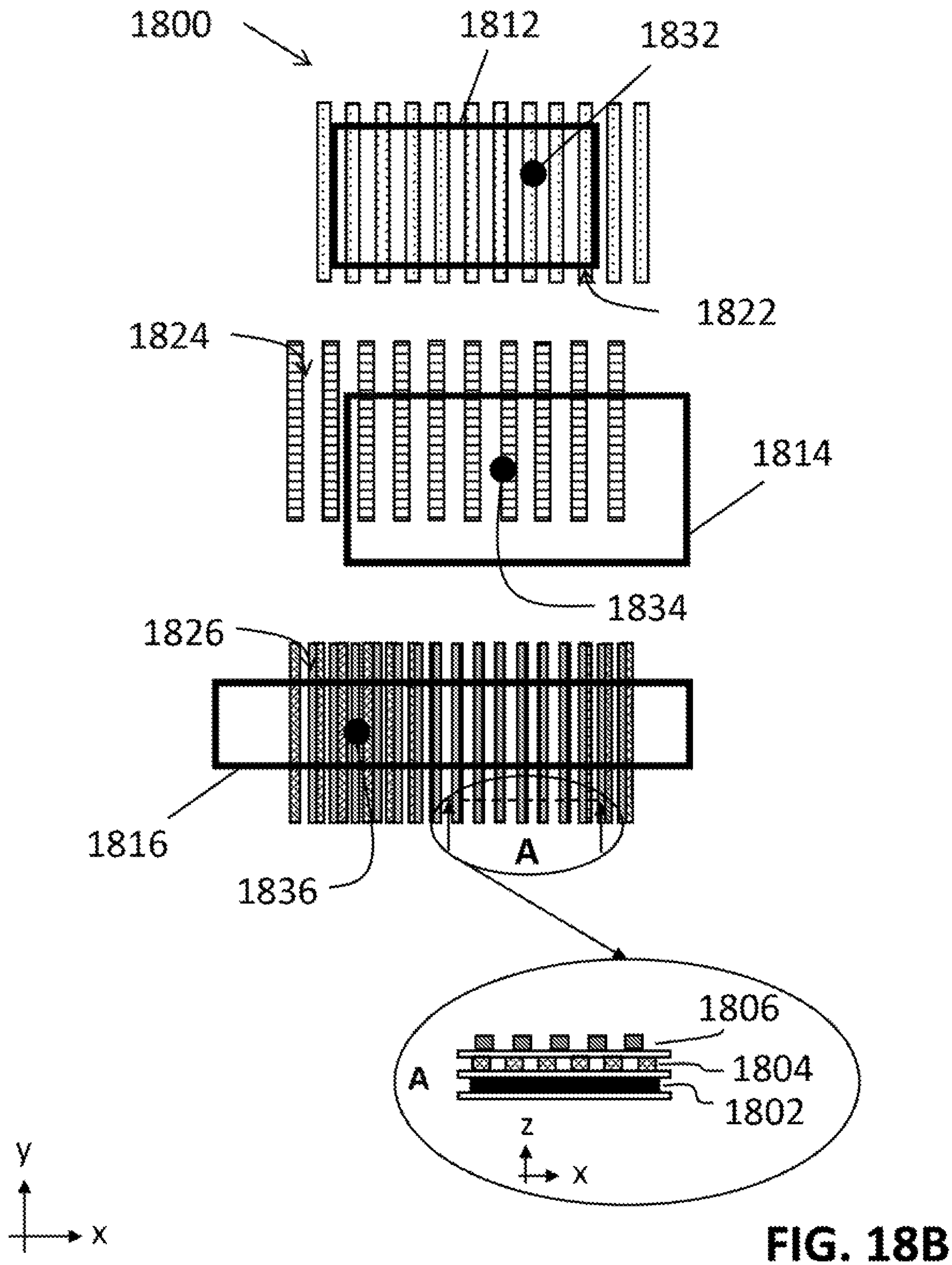
FIGS. 18B and 18C are simplified pictorial illustrations of first and second embodiments of a portion of the method of FIG. 18A, respectively.
Figure 18C:
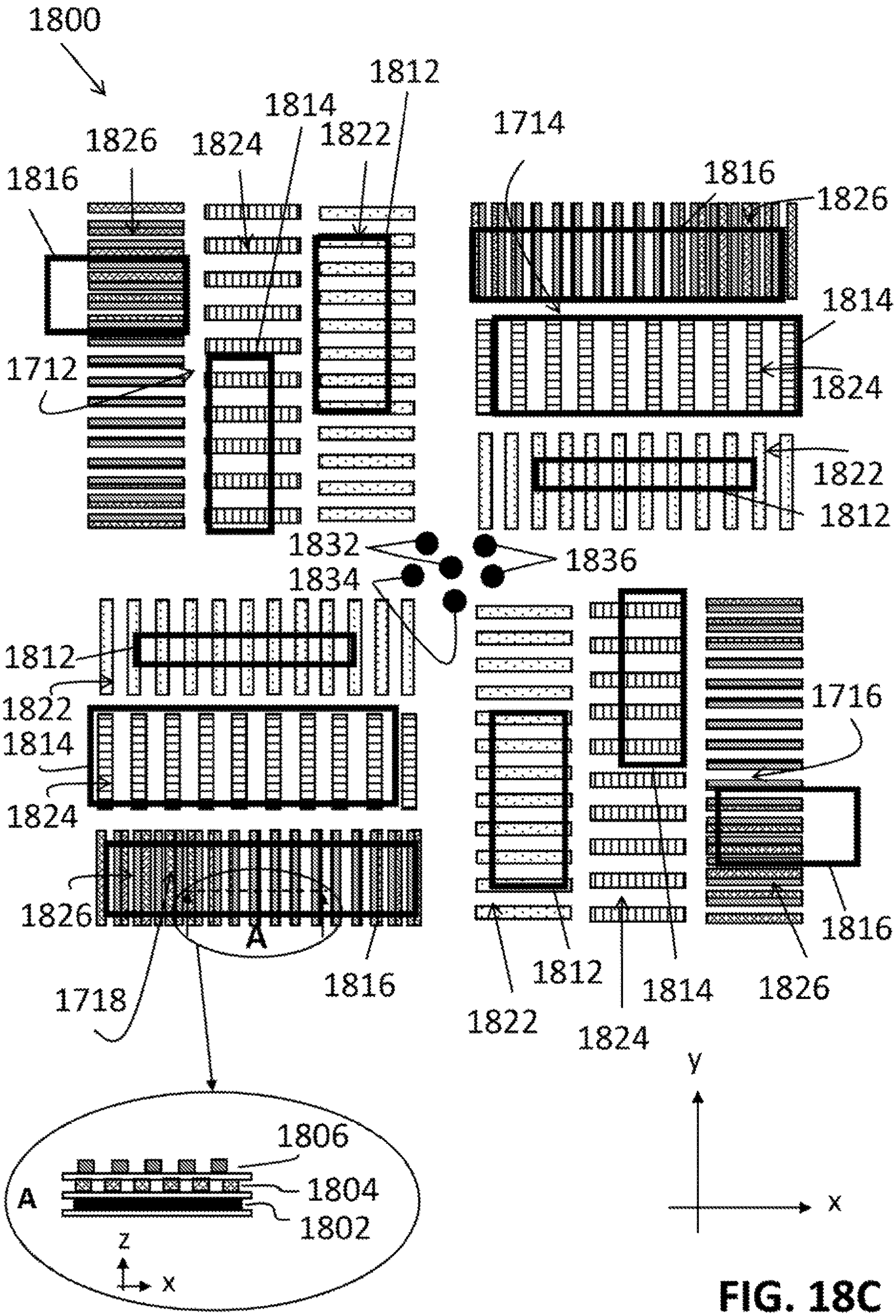

Reference is now made to FIG. 18A, which is a simplified flowchart illustrating a preferred method of calculating misregistration, using a multi-layered moiré target 1800, such as a target 1600 (FIG. 16) or target 1700 (FIGS. 17A-17D), in a direction parallel to either the x or the y direction between a first, a second and a third layer 1802, 1804 and 1806, such as layers 1602, 1604 and 1606 (FIG. 16) or 1702, 1704 and 1706 (FIGS. 17A-17D) of a multi-layered semiconductor device wafer formed with target 1800. Reference is further made to FIGS. 18B & 18C, which are simplified pictorial illustrations of first and second embodiments of a portion of the method of FIG. 18A, respectively.

While it is appreciated that when utilizing target 1700 (FIGS. 17A-17D) the method described with reference to FIGS. 18A-18C may be performed only once to calculate misregistration in either the x or the y direction, typically, the method described in FIGS. 18A-18C will be performed twice, to calculate misregistration in each of the x and y directions. It is also appreciated that when utilizing target 1600 (FIG. 16) misregistration may be calculated only in the one direction to which first, second and third stack axes 1632, 1634 and 1636 are parallel.

As seen at a first step 1807, a direction in which to measure misregistration is selected. When using target 1600 in the method of FIGS. 18A & 18B, the direction in which to measure misregistration is automatically selected to be the direction to which first, second and third stack axes 1632, 1634 and 1636 are parallel. When using target 1700 in the method of FIGS. 18A & 18B, the structures of quadrants 1714 and 1718 are utilized to measure misregistration in a direction parallel to the x-axis, and the structures of quadrants 1712 and 1716 to measure misregistration in a direction parallel to the y-axis.

Preferably, at a next step 1809, an image of target 1800 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches ψ, ω, Λ and Ξ need not be optically resolvable by the misregistration metrology tool used to generate the image of target 1800. However, it is preferable that each of pitches φ, χ, $\varsigma_3$, Γ, Θ and $\Pi_3$ is optically resolvable by the misregistration metrology tool used to generate the image of target 1800.

In a next step 1811, and as seen in FIGS. 18B & 18C, first, second and third regions of interest 1812, 1814 and 1816 are selected for each of respective first, second and third stacks 1822, 1824 and 1826, such as first, second and third stacks 1622, 1624 and 1626 (FIG. 16) or first, second and third stacks 1722, 1724 and 1726 (FIGS. 17A-17D), in the quadrants selected in step 1807. It is appreciated, as seen in the illustrated embodiments of FIGS. 18B & 18C, that while first, second and third regions of interest 1812, 1814 and 1816 preferably lie entirely within each of respective first, second and third stacks 1822, 1824 and 1826, as illustrated for first region of interest 1812, which lies completely within first stack 1822, first, second and third regions of interest 1812, 1814 and 1816 may extend beyond respective first, second and third stacks 1822, 1824 and 1826, as illustrated for regions of interest 1814 and 1816, which extend beyond respective second and third stacks 1824 and 1826. It is further appreciated that regions of interest 1812, 1814 and 1816 shown in FIGS. 18B & 18C are representative regions of interest, and that other suitable regions of interest may be chosen at step 1811.

In a next step 1831, and as seen in FIGS. 18B & 18C, a location of a point of symmetry 1832 between all instances of first region of interest 1812 selected in step 1811 is calculated. In a next step 1833, and as seen in FIGS. 18B & 18C, a location of a point of symmetry 1834 between all instances of second region of interest 1814 selected in step 1811 is calculated. In a next step 1835, and as seen in FIGS. 18B & 18C, a location of a point of symmetry 1836 between all instances of third region of interest 1816 selected in step 1811 is calculated.

At a next step 1837, a distance in the direction selected at step 1807 is calculated between the location of point of symmetry 1832 of first region or regions of interest 1812 identified at step 1831 and the location of point of symmetry 1834 of second region or regions of interest 1814 identified at step 1833. The distance found at step 1837 is reported as the misregistration between first and second layers 1802 and 1804 in the direction selected at step 1807. It is appreciated that in addition to the distance calculated at step 1837, the method further calculates an adjustment direction, such as right, left, up or down. The adjustment direction is a function of the locations of points of symmetry 1832 and 1834, as well as which of layers 1802 and 1806 is to be adjusted.

At a next step 1839, a distance in the direction selected at step 1807 is calculated between the location of point of symmetry 1832 of first region or regions of interest 1812 identified at step 1831 and the location of point of symmetry 1836 of third region or regions of interest 1816 identified at step 1835. The distance found at step 1839 is divided by a gain $\Omega_1$, which for target 1600 is a function of pitch W and pitch o, as shown in equation 40a:

$$\Omega_1 = \left(\frac{\psi}{|\psi - \omega|}\right) \quad \text{(Eq. 40a)}$$

and for target 1700 is a function of pitch Λ and pitch Ξ, as shown in equation 40b:

$$\Omega_1 = \left(\frac{\Lambda}{|\Lambda - \Xi|}\right) \quad \text{(Eq. 40b)}$$

and the result is reported as the misregistration between second and third layers 1804 and 1806 in the direction selected at step 1807. It is appreciated that in addition to the distance calculated at step 1839, the method further calculates an adjustment direction, such as right, left, up or down. The adjustment direction is a function of the relative values of pitch ψ and pitch ω or pitch Λ and pitch Ξ, as well as which of layers 1804 and 1806 is to be adjusted.

At a next step 1841, a difference is calculated between the misregistration value reported at step 1837 and the misregistration value reported at step 1839. The difference calculated at step 1841 is reported as the misregistration between first and third layers 1802 and 1806 in the direction selected at step 1807. It is appreciated that in addition to the distance calculated at step 1841, the method further calculates an adjustment direction, such as right, left, up or down. The adjustment direction is a function of the relative values of pitch ψ and pitch ω or pitch Λ and pitch Ξ, as well as which of layers 1802 and 1806 is to be adjusted.

Preferably, in the embodiment described hereinabove wherein structures shown as being formed together with first and second layers 1802 and 1804 are all formed together with layer 1802, the method described hereinabove with reference to FIGS. 18A-18C proceeds to calculate and report a difference between the misregistration value reported at step 1839 to the misregistration value reported at step 1841. The difference between the misregistration values reported at steps 1839 and 1841 is useful in the calibration of the misregistration metrology tool used in the method of FIGS. 18A-18C.

Preferably, in the embodiment described hereinabove wherein structures shown as being formed together with first and third layers 1802 and 1806 are all formed together with layer 1802, the method described hereinabove with reference to FIGS. 18A-18C proceeds to calculate and report a difference between the misregistration value reported at step 1837 to the misregistration value reported at step 1839. The difference between the misregistration values reported at steps 1837 and 1839 is useful in the calibration of the misregistration metrology tool used in the method of FIGS. 18A-18C.

It is appreciated that in an embodiment of the present invention, relevant portions of the method described hereinabove with reference to FIGS. 18A-18C may be performed using only layers 1802 and 1804, prior to the formation of layer 1806. Similarly, in an embodiment of the present invention wherein layer 1806 lies below layer 1802, relevant portions of the method described hereinabove with reference to FIGS. 18A-18C may be performed using only layers 1804 and 1806, prior to the formation of layer 1802.

Figure 19A:
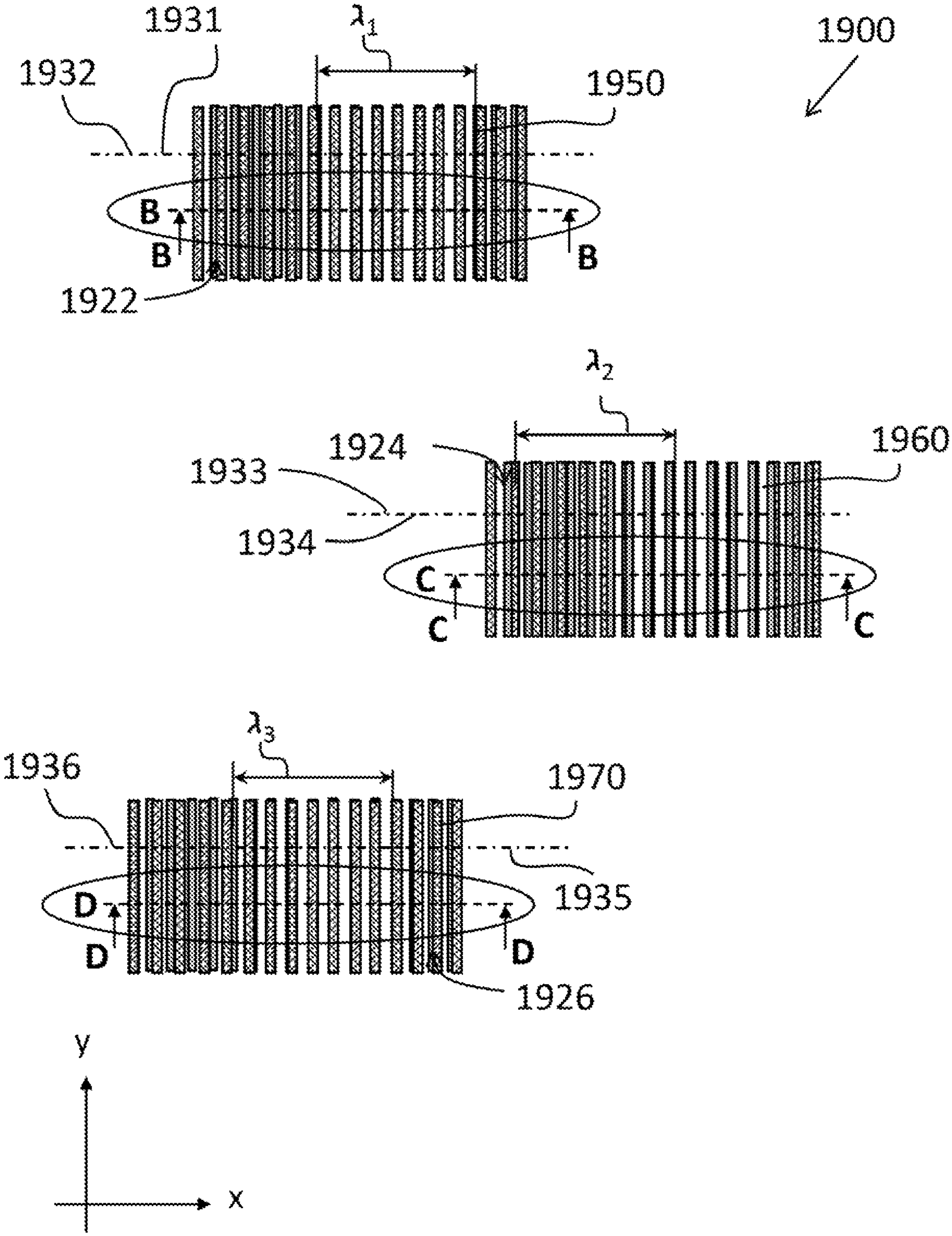
FIGS. 19A, 19B, 19C and 19D are simplified respective top view, first sectional side view, second sectional side view and third sectional side view illustrations of another embodiment of a multi-layered moiré target of the present invention, FIGS. 19B, 19C and 19D being taken along lines B-B, C-C and D-D in FIG. 19A, respectively.
Figure 19B:
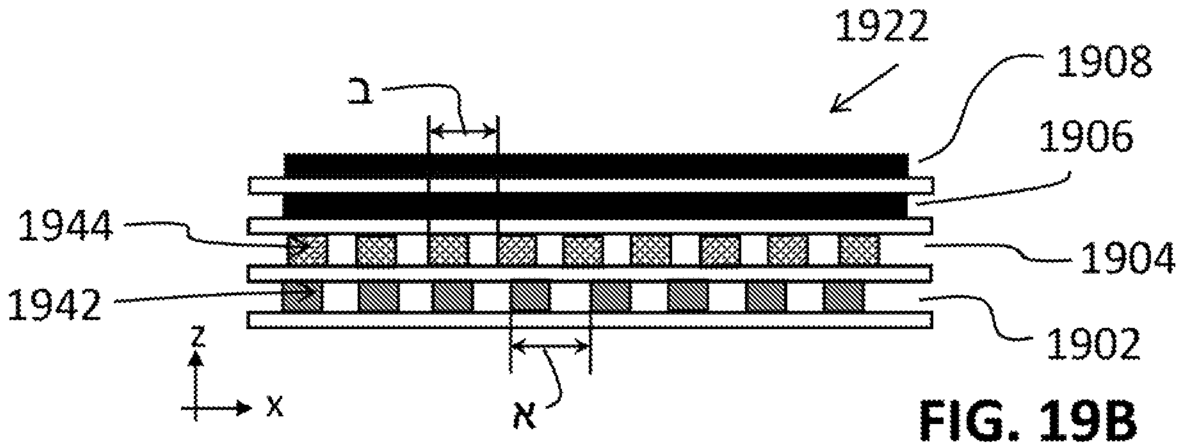
Figure 19C:
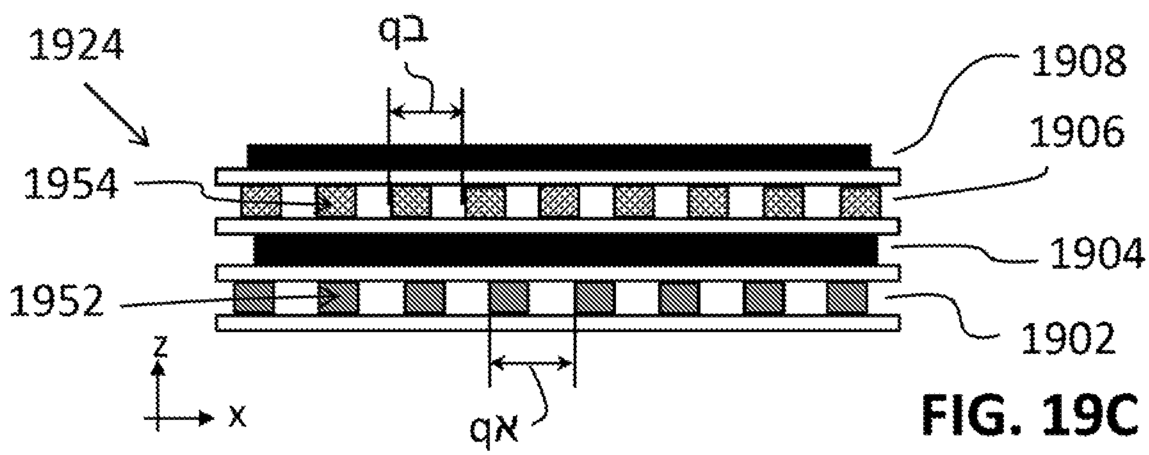
Figure 19D:
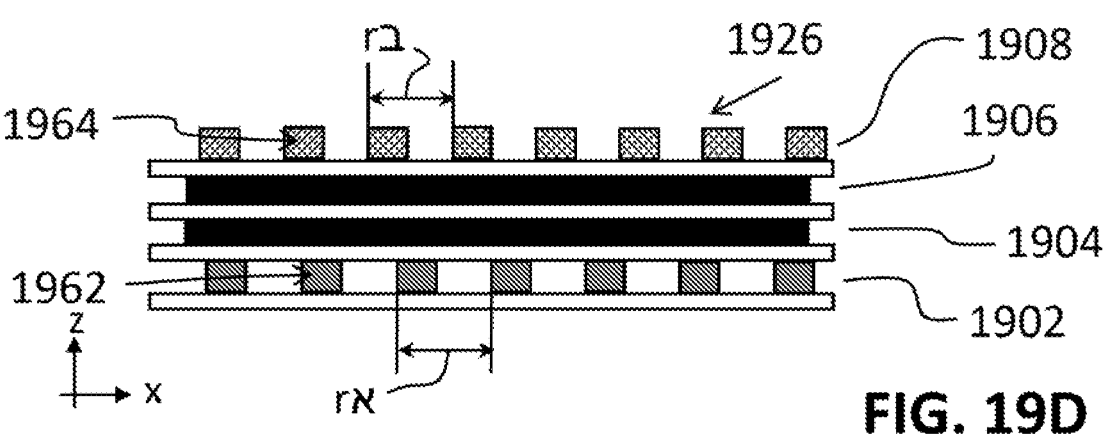

Reference is now made to FIGS. 19A-19D, which are simplified illustrations of another embodiment of a multi-layered moiré target 1900 of the present invention. FIGS. 19A-19D include illustrations in three different dimensions, indicated by x-, y- and z-axes, the three dimensions being referred to hereinafter as an x-y plane, an x-z plane and a y-z plane, respectively. It is noted that FIG. 19A generally illustrates the x-y plane, while FIGS. 19B, 19C and 19D illustrate planes parallel to the x-z plane.

Target 1900 is preferably formed on a semiconductor device wafer on which are preferably formed at least a first layer 1902, a second layer 1904, a third layer 1906 and a fourth layer 1908. It is appreciated that each of first layer 1902, second layer 1904, third layer 1906 and fourth layer 1908 defines a generally planar surface parallel to the x-y plane. First, second, third and fourth layers 1902, 1904, 1906 and 1908 may be adjacent layers but need not be. Preferably, any material between first, second, third and fourth layers 1902, 1904, 1906 and 1908 is at least partially transparent to electromagnetic radiation. In the embodiment illustrated in FIGS. 19A-19D, first layer 1902 lies below second, third and fourth layers 1904, 1906 and 1908, second layer 1904 lies below third and fourth layers 1906 and 1908, and fourth layer 1908 lies above first, second and third layers 1902, 1904 and 1906. It is appreciated, however, that layers 1902, 1904, 1906 and 1908 may be arranged in any suitable order along the z-axis with respect to one another.

Additionally, in an embodiment of the present invention, structures shown as being formed together with second and third layers 1904 and 1906 may all be formed together with layer 1904. In such an embodiment, no portion of target 1900 is formed together with layer 1906. Such an embodiment is particularly useful for calibration, as described hereinbelow with reference to FIGS. 21A-21C. Additionally, in another embodiment of the present invention, structures shown as being formed together with second and fourth layers 1904 and 1908 may all be formed together with layer 1904. In such an embodiment, no portion of target 1900 is formed together with layer 1908. Such an embodiment is particularly useful for calibration, as described hereinbelow with reference to FIGS. 21A-21C. Additionally, in another embodiment of the present invention, structures shown as being formed together with third and fourth layers 1906 and 1908 may all be formed together with layer 1906. In such an embodiment, no portion of target 1900 is formed together with layer 1908. Such an embodiment is particularly useful for calibration, as described hereinbelow with reference to FIGS. 21A-21C.

It is appreciated that FIGS. 19A-19D illustrate one possible layout of target 1900, and that in other embodiments of the present invention, target 1900 may include additional structures. For example, as described hereinbelow with reference to FIGS. 20A-20D & 34-39, a suitable target may include multiple instances of the structures shown in FIGS. 19A-19D, and those multiple instances may be arranged in various ways.

Preferably, target 1900 includes a first stack 1922 of periodic structures, a second stack 1924 of periodic structures and a third stack 1926 of periodic structures. Each of first stack 1922, second stack 1924 and third stack 1926 includes one or more periodic structures, each periodic structure having a pitch. Preferably, none of first stack 1922, second stack 1924 and third stack 1926 overlap with one another.

It is appreciated that although in FIGS. 19A-19D, each of the periodic structures of first stack 1922, second stack 1924 and third stack 1926 are shown as being formed of a plurality of lines and spaces, in other embodiments of the invention, the periodic structures of first stack 1922, second stack 1924 and third stack 1926 may be formed of any suitable periodic features. It is further appreciated that the periodic features forming the periodic structures included in first stack 1922, second stack 1924 and third stack 1926 may be formed of sub-structures. The pitches of each of the periodic structures of first stack 1922, second stack 1924 and third stack 1926 are preferably between 10 nm-3000 nm, and more preferably between 200 nm-800 nm.

A first x-z plane 1931 intersects first stack 1922. A plurality of first axes 1932 lie within first x-z plane 1931 and are parallel to the x-axis. A second x-z plane 1933 intersects second stack 1924. A plurality of second axes 1934 lie within second x-z plane 1933 and are parallel to the x-axis. A third x-z plane 1935 intersects third stack 1926. A plurality of third axes 1936 lie within third x-z plane 1935 and are parallel to the x-axis.

As seen particularly in FIG. 19B, first stack 1922 includes a first stack first periodic structure (S1P1) 1942 formed together with first layer 1902 and having an S1P1 pitch, designated ℵ, along one of first stack axes 1932. First stack 1922 further includes a first stack second periodic structure (S1P2) 1944 formed together with second layer 1904 and having an S1P2 pitch, designated $\beth$, along another of first stack axes 1932.

It is appreciated that S1P1 1942 and S1P2 1944 at least partially overlie one another, and thus a first stack moiré pattern 1950 is visible upon imaging first stack 1922. As is known in the art, first stack moiré pattern 1950 is characterized by a pitch $\gimel_1$, which is a function of pitches $\aleph$ and $\beth$, as shown in equation 41:

$$\gimel_1 = \frac{\aleph \times \beth}{|\aleph - \beth|} \quad \text{(Eq. 41)}$$

Preferably, first stack 1922 does not include periodic structures formed together with third layer 1906 or fourth layer 1908 which affect moiré pattern 1950. However, first stack 1922 may include periodic structures formed together with third layer 1906 or fourth layer 1908 which do not affect moiré pattern 1950, such as periodic structures which are periodic along an axis parallel to the y-axis or periodic structures having a pitch size that does not affect moiré pattern 1950.

As seen particularly in FIG. 19C, second stack 1924 includes a second stack first periodic structure (S2P1) 1952 formed together with first layer 1902 and having an S2P1 pitch, designated $q\aleph$, along one of second stack axes 1934. Preferably, S2P1 pitch $q\aleph$ is related to S1P1 pitch X by a second stack multiplicative factor, designated q. Second stack multiplicative factor q may be any positive number. Second stack 1924 further includes a second stack second periodic structure (S2P2) 1954 formed together with third layer 1906 and having an S2P2 pitch, designated q, along another of second stack axes 1934. Preferably, S2P2 pitch $q\beth$ is related to S1P2 pitch $\beth$ by second stack multiplicative factor q. It is appreciated that second stack multiplicative factor q relating S2P2 pitch $q\beth$ to S1P2 pitch $\beth$ has the same value as second stack multiplicative factor q relating S2P1 pitch $q\aleph$ to S1P1 pitch $\aleph$. In an embodiment of the present invention, the value of q is 1 and thus S2P1 pitch $q\aleph$ is identical to S1P1 pitch $\aleph$ and S2P2 pitch $q\beth$ is identical to S1P2 pitch $\beth$.

It is appreciated that S2P1 1952 and S2P2 1954 at least partially overlie one another, and thus a second stack moiré pattern 1960 is visible upon imaging second stack 1924. As is known in the art, second stack moiré pattern 1960 is characterized by a pitch $\gimel_2$, which is a function of second stack multiplicative factor q, pitch $\aleph$ and pitch $\beth$, as shown in equation 42:

$$\gimel_2 = q\left(\frac{\aleph \times \beth}{|\aleph - \beth|}\right) \quad \text{(Eq. 42)}$$

Preferably, second stack 1924 does not include periodic structures formed together with second layer 1904 or fourth layer 1908 which affect moiré pattern 1960. However, second stack 1924 may include periodic structures formed together with second layer 1904 or fourth layer 1908 which do not affect moiré pattern 1960, such as periodic structures which are periodic along an axis parallel to the y-axis or periodic structures having a pitch size that does not affect moiré pattern 1960.

As seen particularly in FIG. 19D, third stack 1926 includes a third stack first periodic structure (S3P1) 1962 formed together with first layer 1902 and having an S3P1 pitch, designated $r\aleph$, along one of third stack axes 1936. Preferably, S3P1 pitch $r\aleph$ is related to S1P1 pitch $\aleph$ by a third stack multiplicative factor, designated r. Third stack multiplicative factor r may be any positive number. Third stack 1926 further includes a third stack second periodic structure (S3P2) 1964 formed together with fourth layer 1908 and having an S3P2 pitch, designated $r\beth$, along another of third stack axes 1936. Preferably, S3P2 pitch $r\beth$ is related to S1P2 pitch $\beth$ by third stack multiplicative factor r. It is appreciated that third stack multiplicative factor r relating S3P2 pitch $r\beth$ to S1P2 pitch $\beth$ has the same value as third stack multiplicative factor r relating S3P1 pitch $r\aleph$ to S1P1 pitch $\aleph$. In an embodiment of the present invention, the value of r is 1 and thus S3P1 pitch $r\aleph$ is identical to S1P1 pitch $\aleph$ and S3P2 pitch $r\beth$ is identical to S1P2 pitch $\beth$.

It is appreciated that S3P1 1962 and S3P2 1964 at least partially overlie one another, and thus a third stack moiré pattern 1970 is visible upon imaging third stack 1926. As is known in the art, third stack moiré pattern 1970 is characterized by a pitch $\gimel_3$, which is a function of third stack multiplicative factor r, pitch $\aleph$ and pitch $\beth$, as shown in equation 43: $\aleph$ $$\gimel_3 = r\left(\frac{\aleph \times \beth}{|\aleph - \beth|}\right) \quad \text{(Eq. 43)}$$

Preferably, third stack 1926 does not include periodic structures formed together with second layer 1904 or third layer 1906 which affect moiré pattern 1970. However, third stack 1926 may include periodic structures formed together with second layer 1904 or third layer 1906 which do not affect moiré pattern 1970, such as periodic structures which are periodic along an axis parallel to the y-axis or periodic structures having a pitch size that does not affect moiré pattern 1970.

Misregistration between any two of layers 1904, 1906 and 1908 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches $\aleph$, $\beth$, $q\aleph$, $q\beth$, $r\aleph$ and $r\beth$ need not be optically resolvable by the misregistration metrology tool used to generate an image of target 1900. However, it is preferable that each of pitches $\lambda_1$, $\lambda_2$ and $\lambda_3$ is optically resolvable by the misregistration metrology tool used to generate an image of target 1900.

Figure 20A:
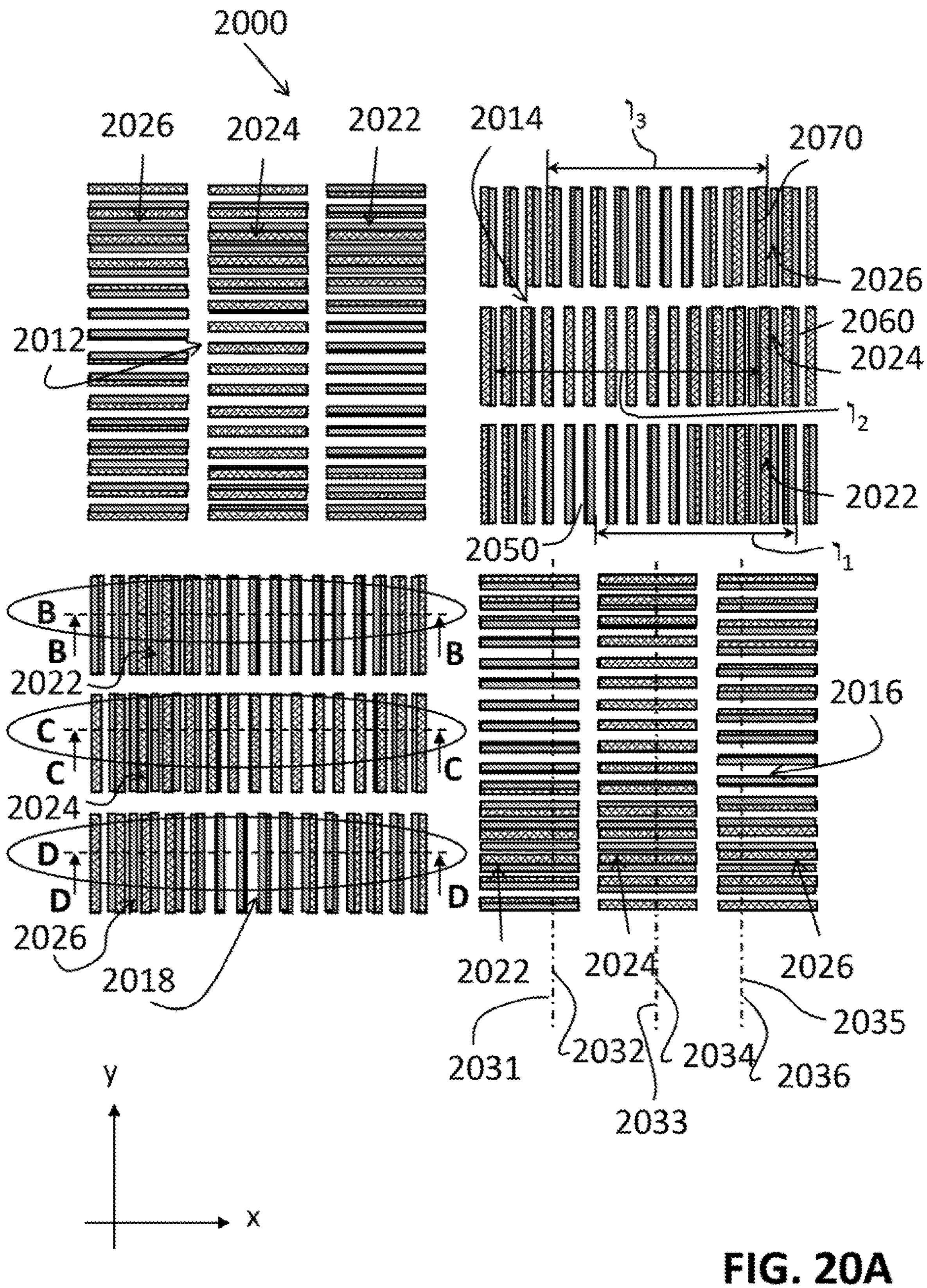
FIGS. 20A, 20B, 20C and 20D are simplified respective top view, first sectional side view, second sectional side view and third sectional side view illustrations of another embodiment of a multi-layered moiré target of the present invention, FIGS. 20B, 20C and 20D being taken along lines B-B, C-C and D-D in FIG. 20A, respectively.
Figure 20B:
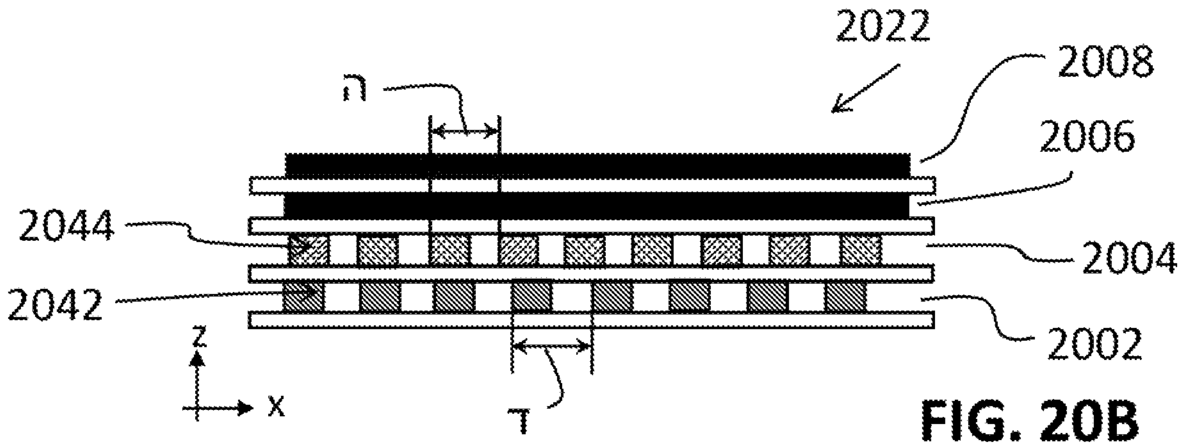
Figure 20C:
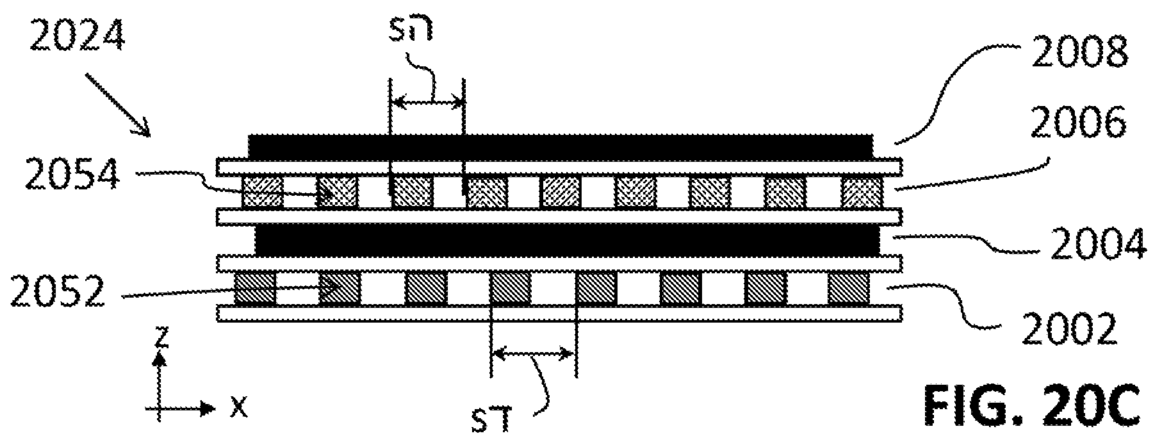
Figure 20D:
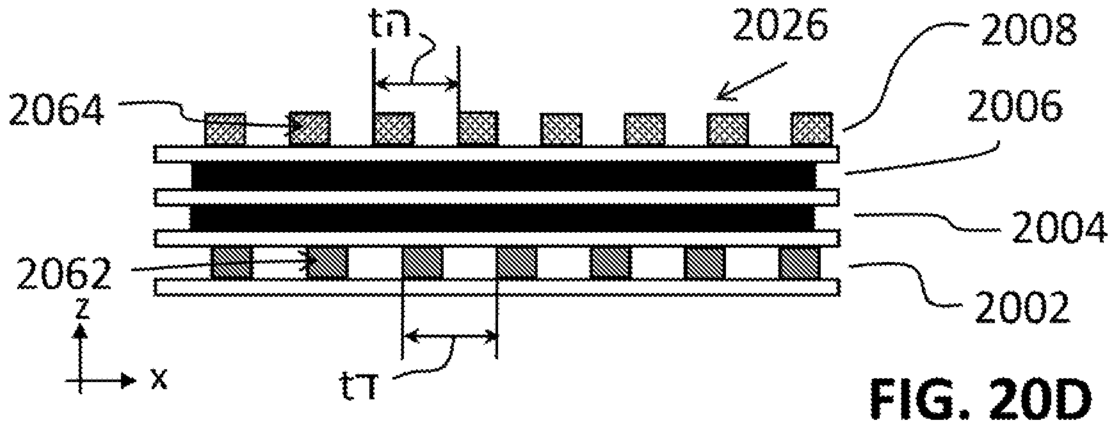

Reference is now made to FIGS. 20A-20D, which are simplified illustrations of another embodiment of a multi-layered moiré target 2000 of the present invention. FIGS. 20A-20D include illustrations in three different dimensions, indicated by x-, y- and z-axes, the three dimensions being referred to hereinafter as an x-y plane, an x-z plane and a y-z plane, respectively. It is noted that FIG. 20A generally illustrates the x-y plane, while FIGS. 20B, 20C and 20D illustrate planes parallel to the x-z plane.

It is noted that target 2000 is one example of an alternative layout of target 1900, described hereinabove with reference to FIGS. 19A-19D, and that additional layouts are described hereinbelow with reference to FIGS. 34-39. Target 2000 is preferably formed on a semiconductor device wafer on which are preferably formed at least a first layer 2002, a second layer 2004, a third layer 2006 and a fourth layer 2008. It is appreciated that each of first layer 2002, second layer 2004, third layer 2006 and fourth layer 2008 defines a generally planar surface parallel to the x-y plane. First, second, third and fourth layers 2002, 2004, 2006 and 2008 may be adjacent layers but need not be. Preferably, any material between first, second, third and fourth layers 2002, 2004, 2006 and 2008 is at least partially transparent to electromagnetic radiation. In the embodiment illustrated in FIGS. 20A-20D, first layer 2002 lies below second, third and fourth layers 2004, 2006 and 2008, second layer 2004 lies below third and fourth layers 2006 and 2008, and fourth layer 2008 lies above first, second and third layers 2002, 2004 and 2006. It is appreciated, however, that layers 2002, 2004, 2006 and 2008 may be arranged in any suitable order along the z-axis with respect to one another.

Additionally, in an embodiment of the present invention, structures shown as being formed together with second and third layers 2004 and 2006 may all be formed together with layer 2004. In such an embodiment, no portion of target 2000 is formed together with layer 2006. Such an embodiment is particularly useful for calibration, as described hereinbelow with reference to FIGS. 21A-21C. Additionally, in another embodiment of the present invention, structures shown as being formed together with second and fourth layers 2004 and 2008 may all be formed together with layer 2004. In such an embodiment, no portion of target 2000 is formed together with layer 2008. Such an embodiment is particularly useful for calibration, as described hereinbelow with reference to FIGS. 21A-21C. Additionally, in another embodiment of the present invention, structures shown as being formed together with third and fourth layers 2006 and 2008 may all be formed together with layer 2006. In such an embodiment, no portion of target 2000 is formed together with layer 2008. Such an embodiment is particularly useful for calibration, as described hereinbelow with reference to FIGS. 21A-21C.

As seen particularly in FIG. 20A, target 2000 includes four target quadrants 2012, 2014, 2016 and 2018. In the embodiment shown in FIG. 20A, the rotational orientation in the x-y plane of each of target quadrants 2012, 2014, 2016 and 2018 preferably differs from the rotational orientation in the x-y plane of each of the other target quadrants 2012, 2014, 2016 and 2018 by an integer multiple of 90°. Additionally, target 2000 preferably is characterized by rotational symmetry in either the x-direction or the y-direction or both. In a preferred embodiment of the present invention, target 2000 is designed such that when in a state of registration, the entirety of target 2000 is characterized by a single point of symmetry in the x-direction and a single point of symmetry in the y-direction. However, even in such an embodiment, when in a state of misregistration, various elements of target 2000 will be characterized by unique points of symmetry.

Each of target quadrants 2012, 2014, 2016 and 2018 includes a first stack 2022 of periodic structures, a second stack 2024 of periodic structures and a third stack 2026 of periodic structures. Each of first stack 2022, second stack 2024 and third stack 2026 includes one or more periodic structures, each periodic structure having a pitch. Preferably, none of first stack 2022, second stack 2024 and third stack 2026 overlap with one another. In FIGS. 20A-20D, first stack 2022 is illustrated as lying closer to the center of target 2000 than second stack 2024 and third stack 2026, and third stack 2026 is illustrated as lying closer to the edge of target 2000 than first stack 2022 and second stack 2024. However, first stack 2022, second stack 2024 and third stack 2026 may be arranged in any suitable arrangement relative to the x-y plane with respect to one another.

It is appreciated that although in the embodiment illustrated in FIGS. 20A-20D, each of the periodic structures of first stack 2022, second stack 2024 and third stack 2026 are illustrated as being formed of a plurality of lines and spaces, in other embodiments of the invention, the periodic structures of first stack 2022, second stack 2024 and third stack 2026 may be formed of any suitable periodic features. It is further appreciated that the periodic features forming the periodic structures included in first stack 2022, second stack 2024 and third stack 2026 may be formed of sub-structures. The pitches of each of the periodic structures of first stack 2022, second stack 2024 and third stack 2026 are preferably between 10 nm-3000 nm, and more preferably between 200 nm-800 nm.

As seen in FIG. 20A, in each of quadrants 2012, 2014, 2016 and 2018, a first plane 2031, intersecting first stack 2022 and including a plurality of first axes 2032 lying therein, a second plane 2033, intersecting second stack 2024 and including a plurality of second axes 2034 lying therein, and a third plane 2035, intersecting third stack 2026 and including a plurality of third axes 2036 lying therein, are defined. Each of first plane 2031, second plane 2033 and third plane 2035 are either an x-z plane or a y-z plane, and first axes 2032, second axes 2034 and third axes 2036 are parallel to the respective x-axis or y-axis, depending on the orientation of first stack 2022, second stack 2024 and third stack 2026 within each of quadrants 2012, 2014, 2016 and 2018. It is appreciated that in each of quadrants 2012, 2014, 2016 and 2018, first plane 2031, second plane 2033 and third plane 2035 are all parallel to one another.

As seen particularly in FIG. 20B, first stack 2022 includes a first stack first periodic structure (S1P1) 2042 formed together with first layer 2002 and having an S1P1 pitch, designated ד, along one of first stack axes 2032. First stack 2022 further includes a first stack second periodic structure (S1P2) 2044 formed together with second layer 2004 and having an S1P2 pitch, designated ה, along another of first stack axes 2032.

It is appreciated that S1P1 2042 and S1P2 2044 at least partially overlie one another, and thus a first stack moiré pattern 2050 is visible upon imaging first stack 2022. As is known in the art, first stack moiré pattern 2050 is characterized by a pitch $\text{ו}_1$, which is a function of pitches ד and ה, as shown in equation 44:

$$\text{ו}_1 = \frac{\text{ד} \times \text{ה}}{|\text{ד} - \text{ה}|} \quad \text{(Eq. 44)}$$

Preferably, first stack 2022 does not include periodic structures formed together with third layer 2006 or fourth layer 2008 which affect moiré pattern 2050. However, first stack 2022 may include periodic structures formed together with third layer 2006 or fourth layer 2008 which do not affect moiré pattern 2050, such as periodic structures which are periodic in a plane parallel to the x-y plane along an axis that is perpendicular to first stack axes 2032 or periodic structures having a pitch size that does not affect moiré pattern 2050.

As seen particularly in FIG. 20C, second stack 2024 includes a second stack first periodic structure (S2P1) 2052 formed together with first layer 2002 and having an S2P1 pitch, designated sד, along one of second stack axes 2034. Preferably, S2P1 pitch sד is related to S1P1 pitch ד by a second stack multiplicative factor, designated s. Second stack multiplicative factor s may be any positive number.

Second stack 2024 further includes a second stack second periodic structure (S2P2) 2054 formed together with third layer 2006 and having an S2P2 pitch, designated sה, along another of second stack axes 2034. Preferably, S2P2 pitch s ה is related to S1P2 pitch ה by second stack multiplicative factor s. It is appreciated that second stack multiplicative factor s relating S2P2 pitch sה to S1P2 pitch ה has the same value as second stack multiplicative factor s relating S2P1 pitch sד to S1P1 pitch ד. In an embodiment of the present invention, the value of s is 1 and thus S2P1 pitch sד is identical to S1P1 pitch ד and S2P2 pitch sה is identical to S1P2 pitch ה.

It is appreciated that S2P1 2052 and S2P2 2054 at least partially overlie one another, and thus a second stack moiré pattern 2060 is visible upon imaging second stack 2024. As is known in the art, second stack moiré pattern 2060 is characterized by a pitch $ו_2$, which is a function of second stack multiplicative factor s, pitch ד and pitch ה, as shown in equation 45:

$$ו_2 = s\left(\frac{ד \times ה}{|ד - ה|}\right) \quad \text{(Eq. 45)}$$

Preferably, second stack 2024 does not include periodic structures formed together with second layer 2004 or fourth layer 2008 which affect moiré pattern 2060. However, second stack 2024 may include periodic structures formed together with second layer 2004 or fourth layer 2008 which do not affect moiré pattern 2060, such as periodic structures which are periodic in a plane parallel to the x-y plane along an axis that is perpendicular to second stack axes 2034 or periodic structures having a pitch size that does not affect moiré pattern 2060.

As seen particularly in FIG. 20D, third stack 2026 includes a third stack first periodic structure (S3P1) 2062 formed together with first layer 2002 and having an S3P1 pitch, designated tד, along one of third stack axes 2036. Preferably, S3P1 pitch tד is related to S1P1 pitch ד by a third stack multiplicative factor, designated t. Third stack multiplicative factor t may be any positive number. Third stack 2026 further includes a third stack second periodic structure (S3P2) 2064 formed together with fourth layer 2008 and having an S3P2 pitch, designated tה, along another of third stack axes 2036. Preferably, S3P2 pitch tה is related to S1P2 pitch ב by third stack multiplicative factor t. It is appreciated that third stack multiplicative factor t relating S3P2 pitch tה to S1P2 pitch ה has the same value as third stack multiplicative factor t relating S3P1 pitch tד to S1P1 pitch ד. In an embodiment of the present invention, the value of t is 1 and thus S3P1 pitch tד is identical to S1P1 pitch ד and S3P2 pitch tה is identical to S1P2 pitch ה.

It is appreciated that S3P1 2062 and S3P2 2064 at least partially overlie one another, and thus a third stack moiré pattern 2070 is visible upon imaging third stack 2026. As is known in the art, third stack moiré pattern 2070 is characterized by a pitch $ו_3$, which is a function of third stack multiplicative factor t, pitch ד and pitch ה, as shown in equation 46: ה

$$ו_3 = t\left(\frac{ד \times ה}{|ד - ה|}\right) \quad \text{(Eq. 46)}$$

Preferably, third stack 2026 does not include periodic structures formed together with second layer 2004 or third layer 2006 which affect moiré pattern 2070. However, third stack 2026 may include periodic structures formed together with second layer 2004 or third layer 2006 which do not affect moiré pattern 2070, such as periodic structures which are periodic in a plane parallel to the x-y plane along an axis that is perpendicular to third stack axes 2036 or periodic structures having a pitch size that does not affect moiré pattern 2070.

Misregistration between any two of layers 2004, 2006 and 2008 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches ד, ה, sד, sה, tד and t ה need not text use z, 100 be optically resolvable by the misregistration metrology tool used to generate an image of target 2000. However, it is preferable that each of pitches $ו_1$, $ו_2$ and $ו_3$ is optically resolvable by the misregistration metrology tool used to generate an image of target 2000.

Figure 21A:
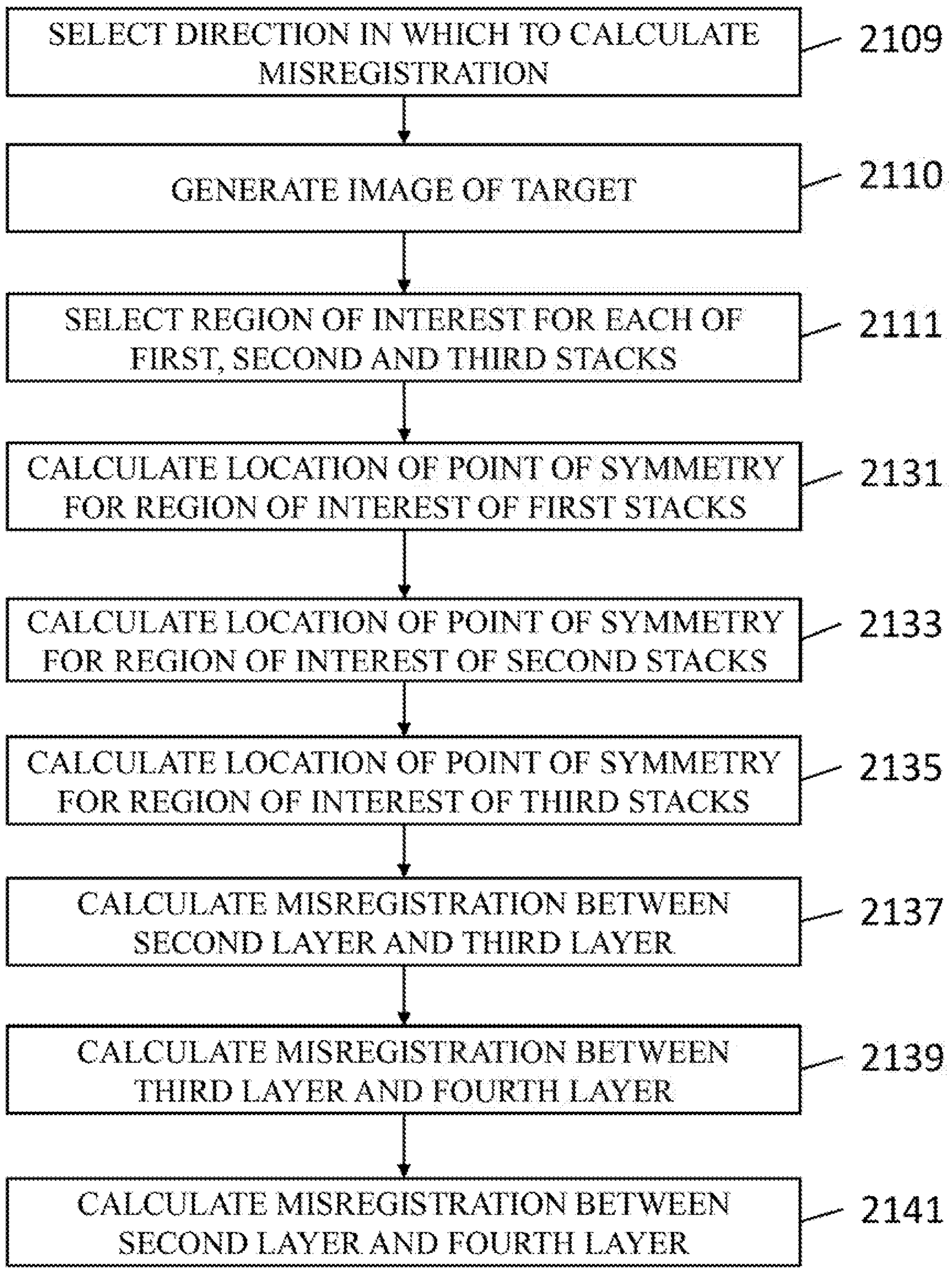
FIG. 21A is a simplified flowchart illustrating a preferred method of calculating misregistration between layers on which the multi-layered moiré target of FIGS. 19A-19D or of FIGS. 20A-20D is formed.
Figure 21B:
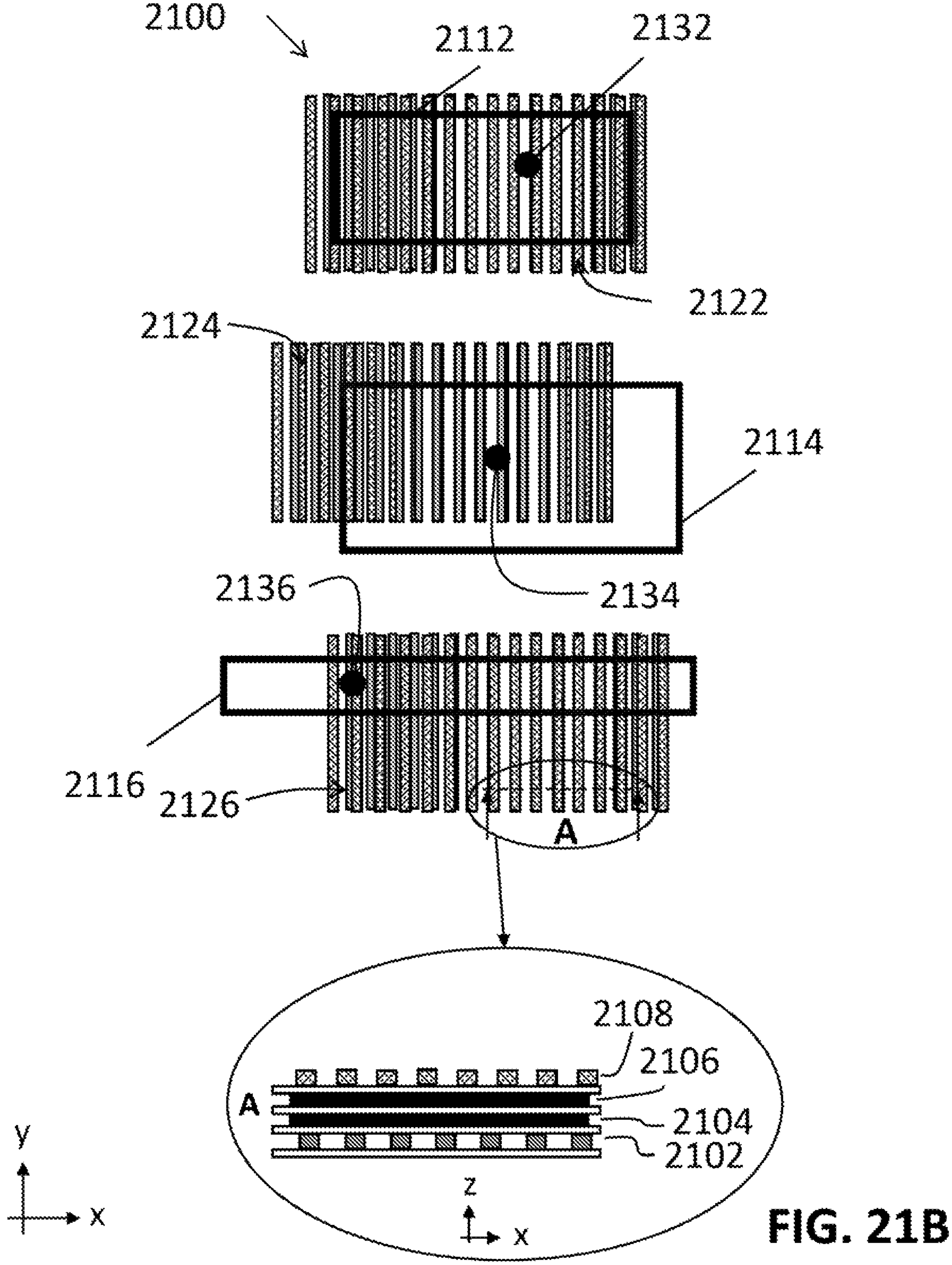
FIGS. 21B and 21C are simplified pictorial illustrations of first and second embodiments of a portion of the method of FIG. 21A, respectively.
Figure 21C:
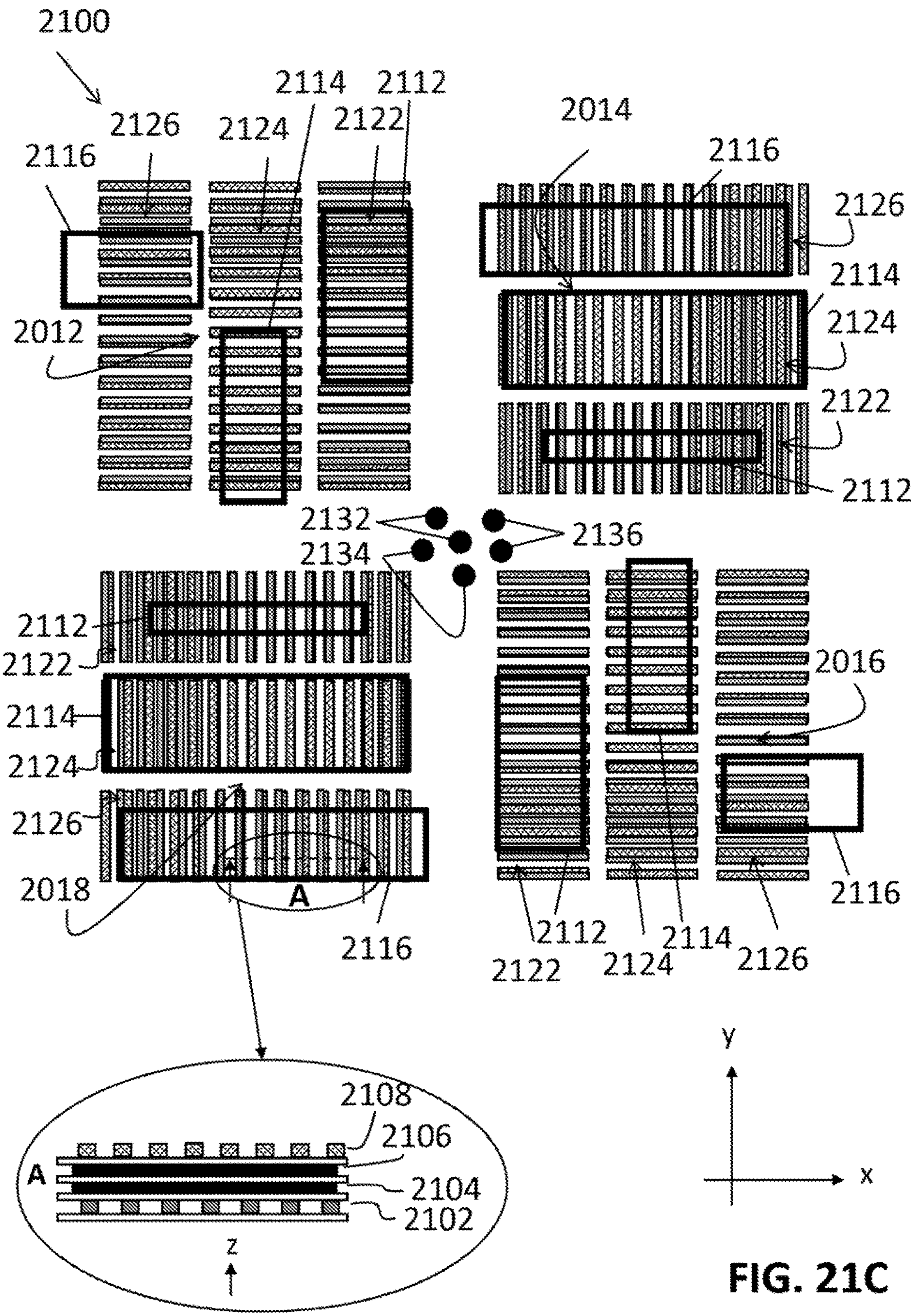

Reference is now made to FIG. 21A, which is a simplified flowchart illustrating a preferred method of calculating misregistration, using a multi-layered moiré target 2100 including a first layer 2102, such as a target 1900 (FIGS. 19A-19D) including first layer 1902 or target 2000 (FIGS. 20A-20D) including first layer 2002, in a direction parallel to either the x or the y direction between a second, a third and a fourth layer 2104, 2106 and 2108, such as layers 1904, 1906 and 1908 (FIGS. 19A-19D) or 2004, 2006 and 2008 (FIGS. 20A-20D) of a multilayered semiconductor device wafer formed with target 2100. Reference is further made to FIGS. 21B & 21C, which are simplified pictorial illustrations of first and second embodiments of a portion of the method of FIG. 21A, respectively.

While it is appreciated that when utilizing target 2000 (FIGS. 20A-20D) the method described with reference to FIGS. 21A-21C may be performed only once to calculate misregistration in either the x or the y direction, typically, the method described in FIGS. 21A-21C will be performed twice, to calculate misregistration in each of the x and y directions. It is also appreciated that when utilizing target 1900 (FIGS. 19A-19D) misregistration may be calculated only in the one direction to which first, second and third stack axes 1932, 1934 and 1936 are parallel.

As seen at a first step 2109, a direction in which to measure misregistration is selected. When using target 1900 in the method of FIGS. 21A & 21B, the direction in which to measure misregistration is automatically selected to be the direction to which first, second and third stack axes 1932, 1934 and 1936 are parallel. When using target 2000 in the method of FIGS. 21A & 21B, the structures of quadrants 2014 and 2018 are utilized to measure misregistration in a direction parallel to the x-axis, and the structures of quadrants 2012 and 2016 to measure misregistration in a direction parallel to the y-axis.

Preferably, at a next step 2110, an image of target 2100 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches א, ב, qא, qב, rא, rב, ד, ה, sד, sה, t ד and tה need not be optically resolvable by the misregistration metrology too use to generate the image of target 2100. However, it is preferable that each of pitches $ג_1$, $ג_2$, $\text{ג}_3$, $\text{ו}_1$, $\text{ו}_2$ and $\text{ו}_3$ is optically resolvable by the misregistration metrology tool used to generate the image of target 2100.

In a next step 2111, and as seen in FIGS. 21B & 21C, first, second and third regions of interest 2112, 2114 and 2116 are selected for each of respective first, second and third stacks 2122, 2124 and 2126, such as first, second and third stacks 1922, 1924 and 1926 (FIGS. 19A-19D) or first, second and third stacks 2022, 2024 and 2026 (FIGS. 20A-20D), in the quadrants selected in step 2109. It is appreciated, as seen in the illustrated embodiments of FIGS. 21B & 21C, that while first, second and third regions of interest 2112, 2114 and 2116 preferably lie entirely within each of respective first, second and third stacks 2122, 2124 and 2126, as illustrated for first region of interest 2112, which lies completely within first stack 2122, first, second and third regions of interest 2112, 2114 and 2116 may extend beyond respective first, second and third stacks 2122, 2124 and 2126, as illustrated for regions of interest 2114 and 2116, which extend beyond respective second and third stacks 2124 and 2126. It is further appreciated that regions of interest 2112, 2114 and 2116 shown in FIGS. 21B & 21C are representative regions of interest, and that other suitable regions of interest may be chosen at step 2111.

In a next step 2131, and as seen in FIGS. 21B & 21C, a location of a point of symmetry 2132 between all instances of first region of interest 2112 selected in step 2111 is calculated. In a next step 2133, and as seen in FIGS. 21B & 21C, a location of a point of symmetry 2134 between all instances of second region of interest 2114 selected in step 2111 is calculated. In a next step 2135, and as seen in FIGS. 21B & 21C, a location of a point of symmetry 2136 between all instances of third region of interest 2116 selected in step 2111 is calculated.

At a next step 2137, a distance in the direction selected at step 2109 is calculated between the location of point of symmetry 2132 of first region or regions of interest 2112 identified at step 2131 and the location of point of symmetry 2134 of second region or regions of interest 2114 identified at step 2133. The distance found at step 2137 is divided by a gain $\text{ז}_1$, which for target 1900 is a function of pitch X and pitch ב, as shown in equation 47a:

$$\text{ז}_1 = \left(\frac{\text{ב}}{|\text{א} - \text{ב}|}\right) \quad \text{(Eq. 47a)}$$

and for target 2000 is a function of pitch ד and pitch ה, as shown in equation 47b:

$$\text{ז}_1 = \left(\frac{\text{ה}}{|\text{ד} - \text{ה}|}\right) \quad \text{(Eq. 47b)}$$

and the result is reported as the misregistration between second and third layers 2104 and 2106 in the direction selected at step 2109. It is appreciated that in addition to the distance calculated at step 2137, the method further calculates an adjustment direction, such as right, left, up or down. The adjustment direction is a function of the relative values of pitch א and pitch ב or pitch ד and pitch ה, as well as which of layers 2104 and 2106 is to be adjusted.

At a next step 2139, a distance in the direction selected at step 2109 is calculated between the location of point of symmetry 2134 of second region or regions of interest 2114 identified at step 2133 and the location of point of symmetry 2136 of third region or regions of interest 2116 identified at step 2135. The distance found at step 2139 is divided by a gain $\text{ז}_2$, which for target 1900 is a function of pitch א and pitch ב, as shown in equation 48a:

$$\text{ז}_2 = \left(\frac{\text{ב}}{|\text{א} - \text{ב}|}\right) \quad \text{(Eq. 48a)}$$

and for target 2000 is a function of pitch ד and pitch ה, as shown in equation 48b:

$$\text{ז}_2 = \left(\frac{\text{ה}}{|\text{ד} - \text{ה}|}\right) \quad \text{(Eq. 48b)}$$

and the result is reported as the misregistration between third and fourth layers 2106 and 2108 in the direction selected at step 2109. It is appreciated that in addition to the distance calculated at step 2139, the method further calculates an adjustment direction, such as right, left, up or down. The adjustment direction is a function of the א relative values of pitch א and pitch בor pitch ד and pitch ה, as well as which of layers 2106 and 2108 is to be adjusted.

At a next step 2141, a distance in the direction selected at step 2109 is calculated between the location of point of symmetry 2132 of first region or regions of interest 2112 identified at step 2131 and the location of point of symmetry 2136 of third region or regions of interest 2116 identified at step 2135. The distance found at step 2141 is divided by a gain $\text{ז}_3$, which for target 1900 is a function of pitch X and pitch ב, as shown in equation 49a:

$$\text{ז}_3 = \left(\frac{\text{ב}}{|\text{א} - \text{ב}|}\right) \quad \text{(Eq. 49a)}$$

and for target 2000 is a function of pitch ד and pitch ה, as shown in equation 49b:

$$\text{ז}_3 = \left(\frac{\text{ה}}{|\text{ד} - \text{ה}|}\right) \quad \text{(Eq. 49b)}$$

and the result is reported as the misregistration between second and fourth layers 2104 and 2108 in the direction selected at step 2109. It is appreciated that in addition to the distance calculated at step 2141, the method further calculates an adjustment direction, such as right, left, up or down. The adjustment direction is a function of the relative values of pitch א and pitch ב or pitch ד and pitch ה, as well as which of layers 2104 and 2108 is to be adjusted.

Preferably, in the embodiment described hereinabove wherein structures shown as being formed together with second and third layers 2104 and 2106 are all formed together with layer 2104, the method described hereinabove with reference to FIGS. 21A-21D proceeds to calculate and report a difference between the misregistration value reported at step 2139 and the misregistration value reported at step 2141. The difference between the misregistration values reported at steps 2139 and 2141 is useful in the calibration of the misregistration metrology tool used in the method of FIGS. 21A-21D.

Additionally, in the embodiment described hereinabove wherein structures shown as being formed together with second and fourth layers 2104 and 2108 are all formed together with layer 2104, the method described hereinabove with reference to FIGS. 21A-21D proceeds to calculate and report a difference between the misregistration value reported at step 2137 and the misregistration value reported at step 2139. The difference between the misregistration values reported at steps 2137 and 2139 is useful in the calibration of the misregistration metrology tool used in the method of FIGS. 21A-21D.

Furthermore, in the embodiment described hereinabove wherein structures shown as being formed together with third and fourth layers 2106 and 2108 are all formed together with layer 2106, the method described hereinabove with reference to FIGS. 21A-21D proceeds to calculate and report a difference between the misregistration value reported at step 2137 and the misregistration value reported at step 2141. The difference between the misregistration values reported at steps 2137 and 2141 is useful in the calibration of the misregistration metrology tool used in the method of FIGS. 21A-21D.

It is appreciated that in an embodiment of the present invention wherein layer 2108 lies below layer 2106, relevant portions of the method described hereinabove with reference to FIGS. 21A-21C may be performed using only layers 2102, 2104 and 2108, prior to the formation of layer 2106.

Reference is now made to FIGS. 22A-22E, which are simplified illustrations of another embodiment of a multi-layered moiré target 2200 of the present invention. FIGS. 22A-22E include illustrations in three different dimensions, indicated by x-, y- and z-axes, the three dimensions being referred to hereinafter as an x-y plane, an x-z plane and a y-z plane, respectively. It is noted that FIG. 22A generally illustrates the x-y plane, while FIGS. 22B, 22C, 22D and 22E illustrate planes parallel to the x-z plane.

Target 2200 is preferably formed on a semiconductor device wafer on which are preferably formed at least a first layer 2202, a second layer 2204, a third layer 2206 and a fourth layer 2208. It is appreciated that each of first layer 2202, second layer 2204, third layer 2206 and fourth layer 2208 defines a generally planar surface parallel to the x-y plane. First, second, third and fourth layers 2202, 2204, 2206 and 2208 may be adjacent layers but need not be. Preferably, any material between first, second, third and fourth layers 2202, 2204, 2206 and 2208 is at least partially transparent to electromagnetic radiation. In the embodiment illustrated in FIGS. 22A-22E, first layer 2202 lies below second, third and fourth layers 2204, 2206 and 2208, second layer 2204 lies below third and fourth layers 2206 and 2208, and fourth layer 2208 lies above first, second and third layers 2202, 2204 and 2206. It is appreciated, however, that layers 2202, 2204, 2206 and 2208 may be arranged in any suitable order along the z-axis with respect to one another.

Additionally, in an embodiment of the present invention, structures shown as being formed together with first and third layers 2202 and 2206 may all be formed together with layer 2202. In such an embodiment, no portion of target 2200 is formed together with layer 2206. Such an embodiment is particularly useful for calibration, as described hereinbelow with reference to FIGS. 24A-24D. Additionally, in another embodiment of the present invention, structures shown as being formed together with first and fourth layers 2202 and 2208 may all be formed together with layer 2202. In such an embodiment, no portion of target 2200 is formed together with layer 2208. Such an embodiment is particularly useful for calibration, as described hereinbelow with reference to FIGS. 24A-24D. Additionally, in another embodiment of the present invention, structures shown as being formed together with second and fourth layers 2204 and 2208 may all be formed together with layer 2204. In such an embodiment, no portion of target 2200 is formed together with layer 2208. Such an embodiment is particularly useful for calibration, as described hereinbelow with reference to FIGS. 24A-24D.

It is appreciated that FIGS. 22A-22E illustrate one possible layout of target 2200, and that in other embodiments of the present invention, target 2200 may include additional structures. For example, as described hereinbelow with reference to FIGS. 23A-23E & 34-39, a suitable target may include multiple instances of the structures shown in FIGS. 22A-22E, and those multiple instances may be arranged in various ways.

Preferably, target 2200 includes a first stack 2222 of periodic structures, a second stack 2224 of periodic structures, a third stack 2226 of periodic structures and a fourth stack 2228 of periodic structures. Each of first stack 2222, second stack 2224, third stack 2226 and fourth stack 2228 includes one or more periodic structures, each periodic structure having a pitch. Preferably, none of first stack 2222, second stack 2224, third stack 2226 and fourth stack 2228 overlap with one another.

It is appreciated that although in FIGS. 22A-22E, each of the periodic structures of first stack 2222, second stack 2224, third stack 2226 and fourth stack 2228 are shown as being formed of a plurality of lines and spaces, in other embodiments of the invention, the periodic structures of first stack 2222, second stack 2224, third stack 2226 and fourth stack 2228 may be formed of any suitable periodic features. It is further appreciated that the periodic features forming the periodic structures included in first stack 2222, second stack 2224, third stack 2226 and fourth stack 2228 may be formed of sub-structures. The pitches of each of the periodic structures of first stack 2222, second stack 2224, third stack 2226 and fourth stack 2228 are preferably between 10 nm-3000 nm, and more preferably between 200 nm-800 nm.

A first x-z plane 2231 intersects first stack 2222. A plurality of first axes 2232 lie within first x-z plane 2231 and are parallel to the x-axis. A second x-z plane 2233 intersects second stack 2224. A plurality of second axes 2234 lie within second x-z plane 2233 and are parallel to the x-axis. A third x-z plane 2235 intersects third stack 2226. A plurality of third axes 2236 lie within third x-z plane 2235 and are parallel to the x-axis. A fourth x-z plane 2237 intersects fourth stack 2228. A plurality of fourth axes 2238 lie within fourth x-z plane 2237 and are parallel to the x-axis.

Figure 22A:
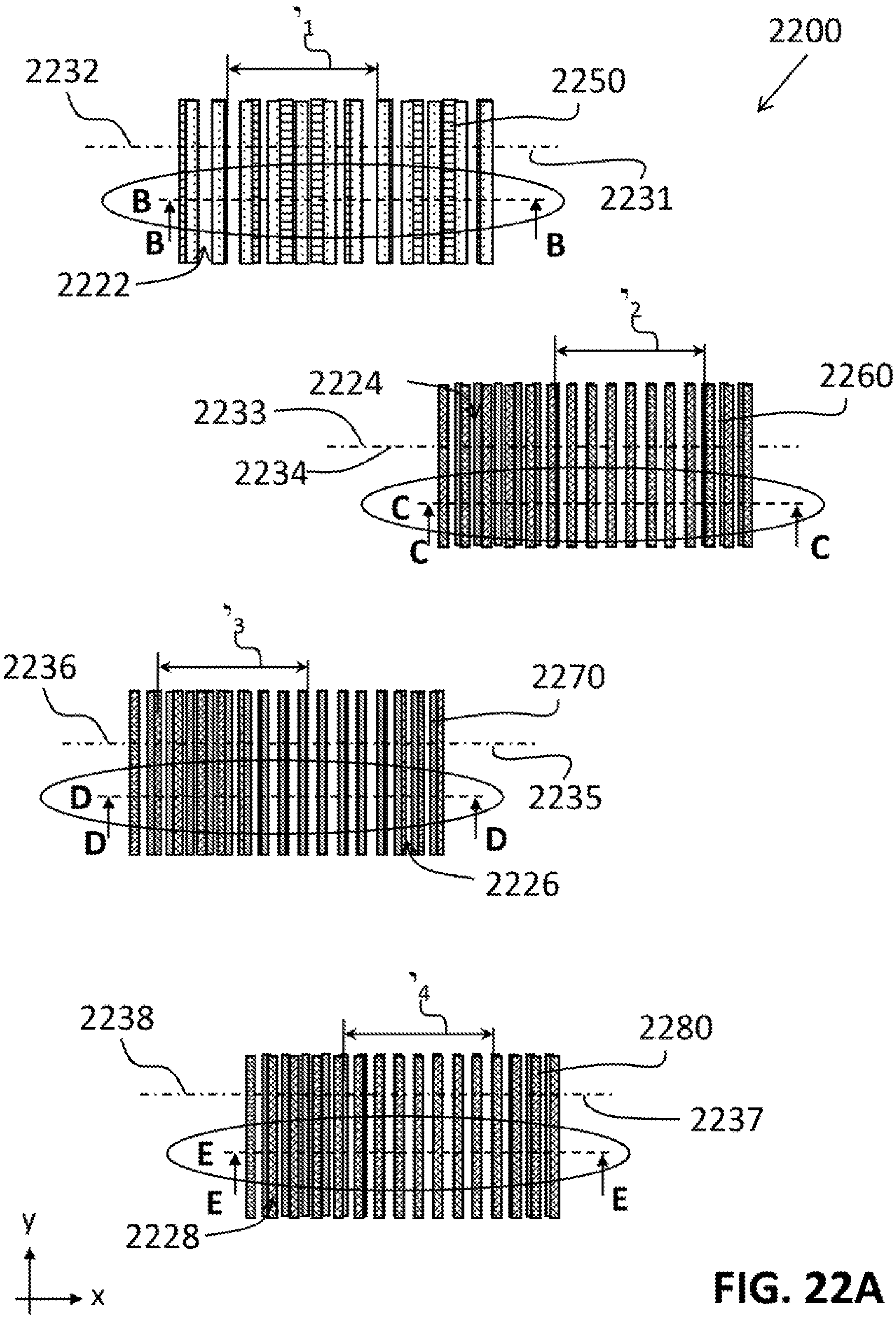
FIGS. 22A, 22B, 22C, 22D and 22E are simplified respective top view, first sectional side view, second sectional side view, third sectional side view and fourth sectional side view illustrations of another embodiment of a multi-layered moiré target of the present invention, FIGS. 22B, 22C, 22D and 22E being taken along lines B-B, C-C, D-D and E-E in FIG. 22A, respectively.
Figure 22B:
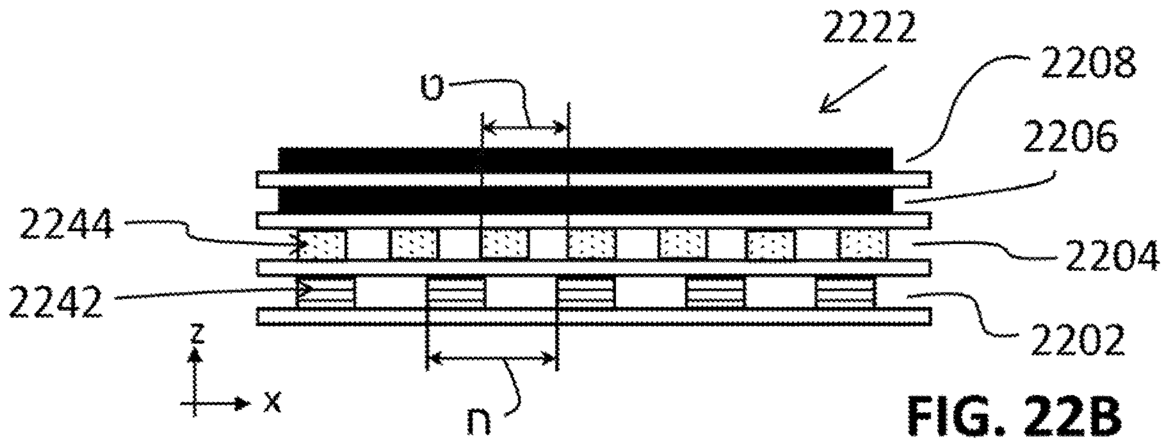

As seen particularly in FIG. 22B, in a preferred embodiment of the present invention, first stack 2222 includes a first stack first periodic structure (S1P1) 2242 formed together with first layer 2202 and having an S1P1 pitch, designated ח, along one of first stack axes 2232. Preferably, first stack 2222 further includes a first stack second periodic structure (S1P2) 2244 formed together with second layer 2204 and having an S1P2 pitch, designated ט, along another of first stack axes 2232.

It is appreciated that S1P1 2242 and S1P2 2244 at least partially overlie one another, and thus a first stack moiré pattern 2250 is visible upon imaging first stack 2222. As is known in the art, first stack moiré pattern 2250 is characterized by a pitch $ℸ_1$, which is a function of pitches ח and ט, as shown in equation 50:

$$ℸ_1 = \frac{ח \times ט}{|ח - ט|} \quad \text{(Eq. 50)}$$

Preferably, first stack 2222 does not include periodic structures formed together with third layer 2206 or fourth layer 2208 which affect moiré pattern 2250. However, first stack 2222 may include periodic structures formed together with third layer 2206 or fourth layer 2208 which do not affect moiré pattern 2250, such as periodic structures which are periodic along an axis parallel to the y-axis or periodic structures having a pitch size that does not affect moiré pattern 2250.

In another embodiment of the present invention, first stack 2222 includes only one of periodic structures 2242 and 2244, and no moiré pattern 2250 is visible upon imaging first stack 2222.

Figure 22C:
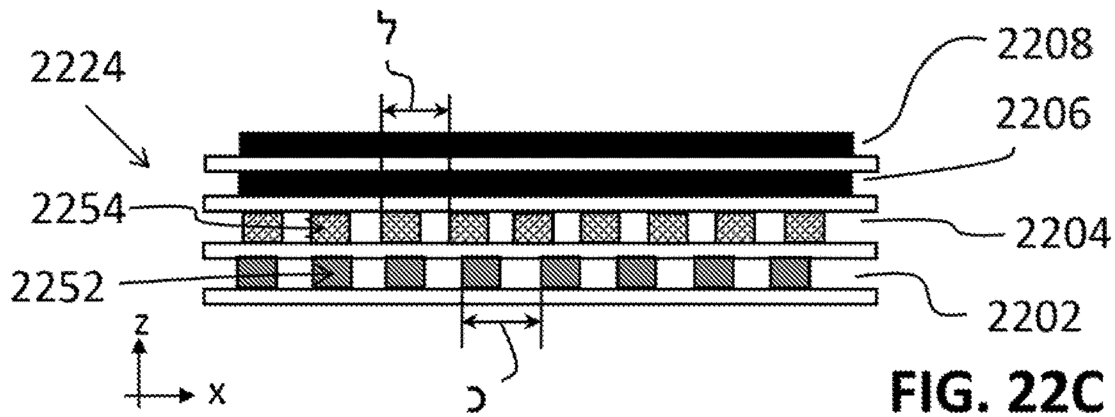

As seen particularly in FIG. 22C, in a preferred embodiment of the present invention, second stack 2224 includes a second stack first periodic structure (S2P1) 2252 formed together with first layer 2202 and having an S2P1 pitch, designated כ, along one of second stack axes 2234. Preferably, second stack 2224 further includes a second stack second periodic structure (S2P2) 2254 formed together with second layer 2204 and having an S2P2 pitch, designated ל, along another of second stack axes 2234.

It is appreciated that S2P1 2252 and S2P2 2254 at least partially overlie one another, and thus a second stack moiré pattern 2260 is visible upon imaging second stack 2224. As is known in the art, second stack moiré pattern 2260 is characterized by a pitch $ר_2$, which is a function of pitch כ and pitch ל, as shown in equation 51:

$$ר_2 = \frac{כ \times ל}{|ל - כ|} \quad \text{(Eq. 51)}$$

Preferably, second stack 2224 does not include periodic structures formed together with third layer 2206 or fourth layer 2208 which affect moiré pattern 2260. However, second stack 2224 may include periodic structures formed together with third layer 2206 or fourth layer 2208 which do not affect moiré pattern 2260, such as periodic structures which are periodic along an axis parallel to the y-axis or periodic structures having a pitch size that does not affect moiré pattern 2260.

Figure 22D:
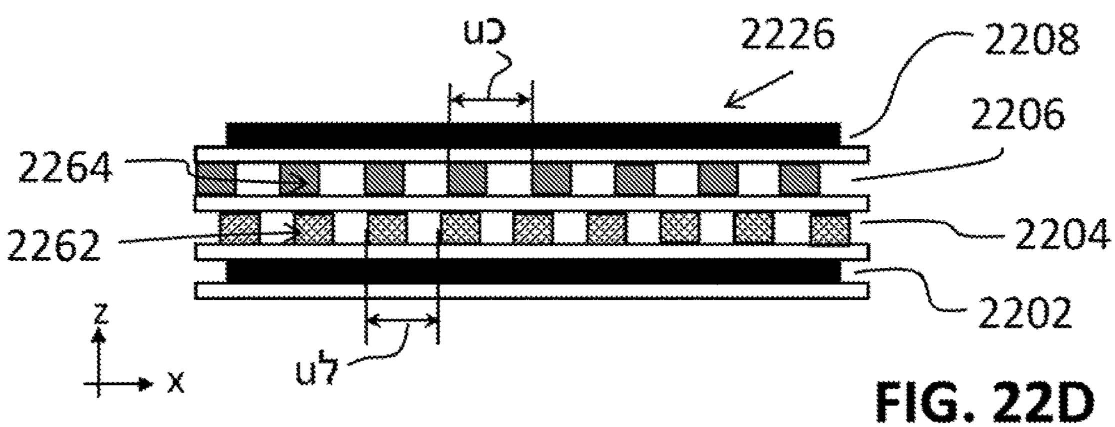

As seen particularly in FIG. 22D, in a preferred embodiment of the present invention, third stack 2226 includes a third stack first periodic structure (S3P1) 2262 formed together with second layer 2204 and having an S3P1 pitch, designated uל, along one of third stack axes 2236. Preferably, S3P1 pitch uל is related to S2P2 pitch ל by a third stack multiplicative factor, designated u. Third stack multiplicative factor u may be any positive number. Preferably, third stack 2226 further includes a third stack second periodic structure (S3P2) 2264 formed together with third layer 2206 and having an S3P2 pitch, designated uכ, along another of third stack axes 2236. Preferably, S3P2 pitch uכ is related to S2P1 pitch כ by third stack multiplicative factor u. It is appreciated that third stack multiplicative factor u relating S3P2 pitch uכ to S2P1 pitch כ has the same value as third stack multiplicative factor u relating S3P1 pitch uל to S2P2 pitch ל. In an embodiment of the present invention, the value of u is 1 and thus S3P1 pitch uל is identical to S2P2 pitch ל and S3P2 pitch uכ is identical to S2P1 pitch כ.

It is appreciated that S3P1 2262 and S3P2 2264 at least partially overlie one another, and thus a third stack moiré pattern 2270 is visible upon imaging third stack 2226. As is known in the art, third stack moiré pattern 2270 is characterized by a pitch $ר\mathbf{3}_3$, which is a function of third stack multiplicative factor u, pitch כ and pitch ל, as shown in equation 52:

$$ר_3 = u\left(\frac{כ \times ל}{|ל - כ|}\right) \quad \text{(Eq. 52)}$$

Preferably, third stack 2226 does not include periodic structures formed together with first layer 2202 or fourth layer 2208 which affect moiré pattern 2270. However, third stack 2226 may include periodic structures formed together with first layer 2202 or fourth layer 2208 which do not affect moiré pattern 2270, such as periodic structures which are periodic along an axis parallel to the y-axis or periodic structures having a pitch size that does not affect moiré pattern 2270.

Figure 22E:
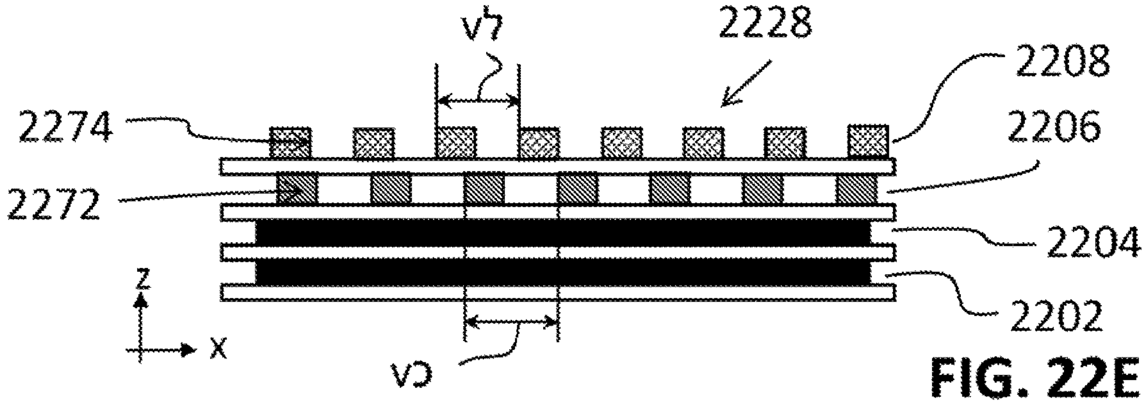

As seen particularly in FIG. 22E, in a preferred embodiment of the present invention, fourth stack 2228 includes a fourth stack first periodic structure (S4P1) 2272 formed together with third layer 2206 and having an S4P1 pitch, designated vכ, along one of fourth stack axes 2238. Preferably, S4P1 pitch vכ is related to S2P1 pitch כ by a fourth stack multiplicative factor, designated v. Fourth stack multiplicative factor v may be any positive number. Preferably, fourth stack 2228 further includes a fourth stack second periodic structure (S4P2) 2274 formed together with fourth layer 2208 and having an S4P2 pitch, designated vל, along another of fourth stack axes 2238. Preferably, S4P2 pitch vל is related to S2P2 pitch ל by fourth stack multiplicative factor v. It is appreciated that fourth stack multiplicative factor v relating S4P2 pitch vל to S2P2 pitch ל has the same value as fourth stack multiplicative factor v relating S4P1 pitch vכ to S2P1 pitch כ. In an embodiment of the present invention, the value of v is 1 and thus S4P1 pitch vכ is identical to S2P1 pitch כ and S4P2 pitch vל is identical to S2P2 pitch ל.

It is appreciated that S4P1 2272 and S4P2 2274 at least partially overlie one another, and thus a fourth stack moiré pattern 2280 is visible upon imaging fourth stack 2228. As is known in the art, fourth stack moiré pattern 2280 is characterized by a pitch $ר_4$, which is a function of fourth stack multiplicative factor v, pitch כ and pitch ל, as shown in equation 53:

$$ר_4 = v\left(\frac{כ \times ל}{|ל - כ|}\right) \quad \text{(Eq. 53)}$$

Preferably, fourth stack 2228 does not include periodic structures formed together with first layer 2202 or second layer 2204 which affect moiré pattern 2280. However, fourth stack 2228 may include periodic structures formed together with first layer 2202 or second layer 2204 which do not affect moiré pattern 2280, such as periodic structures which are periodic along an axis parallel to the y-axis or periodic structures having a pitch size that does not affect moiré pattern 2280

Misregistration between any two of layers 2202, 2204, 2206 and 2208 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches ה, ט, כ, ל, uכ, uל, vכ and vל need not be optically resolvable by the misregistration metrology tool used to generate an image of target 2200. However, it is preferable that each of pitches י$_1$, י$_2$, י$_3$ and י$_4$ is optically resolvable by the misregistration metrology tool used to generate an image of target 2200.

Reference is now made to FIGS. 23A-23E, which are simplified illustrations of another embodiment of a multi-layered moiré target 2300 of the present invention. FIGS. 23A-23E include illustrations in three different dimensions, indicated by x-, y- and z-axes, the three dimensions being referred to hereinafter as an x-y plane, an x-z plane and a y-z plane, respectively. It is noted that FIG. 23A generally illustrates the x-y plane, while FIGS. 23B, 23C, 23D and 23E illustrate planes parallel to the x-z plane.

It is noted that target 2300 is one example of an alternative layout of target 2200, described hereinabove with reference to FIGS. 22A-22E, and that additional layouts are described hereinbelow with reference to FIGS. 34-39. Target 2300 is preferably formed on a semiconductor device wafer on which are preferably formed at least a first layer 2302, a second layer 2304, a third layer 2306 and a fourth layer 2308. It is appreciated that each of first layer 2302, second layer 2304, third layer 2306 and fourth layer 2308 defines a generally planar surface parallel to the x-y plane. First, second, third and fourth layers 2302, 2304, 2306 and 2308 may be adjacent layers but need not be. Preferably, any material between first, second, third and fourth layers 2302, 2304, 2306 and 2308 is at least partially transparent to electromagnetic radiation. In the embodiment illustrated in FIGS. 23A-23E, first layer 2302 lies below second, third and fourth layers 2304, 2306 and 2308, second layer 2304 lies below third and fourth layers 2306 and 2308, and fourth layer 2308 lies above first, second and third layers 2302, 2304 and 2306. It is appreciated, however, that layers 2302, 2304, 2306 and 2308 may be arranged in any suitable order along the z-axis with respect to one another.

Additionally, in an embodiment of the present invention, structures shown as being formed together with first and third layers 2302 and 2306 may all be formed together with layer 2302. In such an embodiment, no portion of target 2300 is formed together with layer 2306. Such an embodiment is particularly useful for calibration, as described hereinbelow with reference to FIGS. 24A-24D. Additionally, in another embodiment of the present invention, structures shown as being formed together with first and fourth layers 2302 and 2308 may all be formed together with layer 2302. In such an embodiment, no portion of target 2300 is formed together with layer 2308. Such an embodiment is particularly useful for calibration, as described hereinbelow with reference to FIGS. 24A-24D. Additionally, in another embodiment of the present invention, structures shown as being formed together with second and fourth layers 2304 and 2308 may all be formed together with layer 2304. In such an embodiment, no portion of target 2300 is formed together with layer 2308. Such an embodiment is particularly useful for calibration, as described hereinbelow with reference to FIGS. 24A-24D.

Figure 23A:
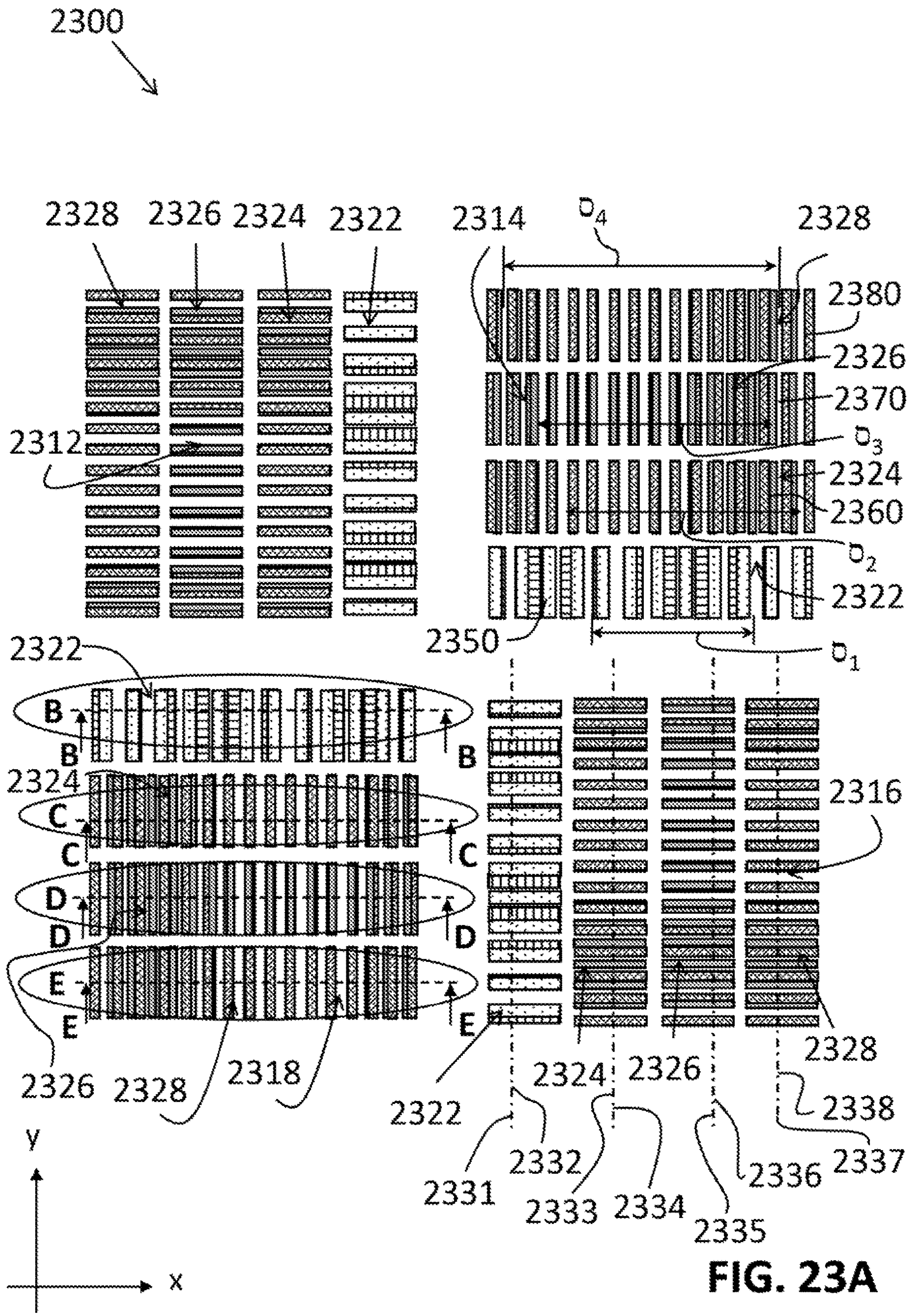
FIGS. 23A, 23B, 23C, 23D and 23E are simplified respective top view, first sectional side view, second sectional side view, third sectional side view and fourth sectional side view illustrations of another embodiment of a multi-layered moiré target of the present invention, FIGS. 23B, 23C, 23D and 23E being taken along lines B-B, C-C, D-D and E-E in FIG. 23A, respectively.

As seen particularly in FIG. 23A, target 2300 includes four target quadrants 2312, 2314, 2316 and 2318. In the embodiment shown in FIG. 23A, the rotational orientation in the x-y plane of each of target quadrants 2312, 2314, 2316 and 2318 preferably differs from the rotational orientation in the x-y plane of each of the other target quadrants 2312, 2314, 2316 and 2318 by an integer multiple of 90°. Additionally, target 2300 preferably is characterized by rotational symmetry in either the x-direction or the y-direction or both. In a preferred embodiment of the present invention, target 2300 is designed such that when in a state of registration, the entirety of target 2300 is characterized by a single point of symmetry in the x-direction and a single point of symmetry in the y-direction. However, even in such an embodiment, when in a state of misregistration, various elements of target 2300 will be characterized by unique points of symmetry.

Each of target quadrants 2312, 2314, 2316 and 2318 includes a first stack 2322 of periodic structures, a second stack 2324 of periodic structures, a third stack 2326 of periodic structures and a fourth stack 2328 of periodic structures. Each of first stack 2322, second stack 2324, third stack 2326 and fourth stack 2328 includes one or more periodic structures, each periodic structure having a pitch. Preferably, none of first stack 2322, second stack 2324, third stack 2326 and fourth stack 2328 overlap with one another. In FIGS. 23A-23E, first stack 2322 is illustrated as lying closer to the center of target 2300 than second stack 2324, third stack 2326 and fourth stack 2328, second stack 2324 is illustrated as lying closer to the center of target 2300 than third stack 2326 and fourth stack 2328, third stack 2326 is illustrated as lying closer to the edge of target 2300 than first stack 2322 and second stack 2324, and fourth stack 2328 is illustrated as lying closer to the edge of target 2300 than third stack 2326. However, first stack 2322, second stack 2324, third stack 2326 and fourth stack 2328 may be arranged in any suitable arrangement relative to the x-y plane with respect to one another.

It is appreciated that although in FIGS. 23A-23E, each of the periodic structures of first stack 2322, second stack 2324, third stack 2326 and fourth stack 2328 are shown as being formed of a plurality of lines and spaces, in other embodiments of the invention, the periodic structures of first stack 2322, second stack 2324, third stack 2326 and fourth stack 2328 may be formed of any suitable periodic features. It is further appreciated that the periodic features forming the periodic structures included in first stack 2322, second stack 2324, third stack 2326 and fourth stack 2328 may be formed of sub-structures. The pitches of each of the periodic structures of first stack 2322, second stack 2324, third stack 2326 and fourth stack 2328 are preferably between 10 nm-3000 nm, and more preferably between 200 nm-800 nm.

As seen in FIG. 23A, in each of quadrants 2312, 2314, 2316 and 2318, a first plane 2331, intersecting first stack 2322 and including a plurality of first axes 2332 lying therein, a second plane 2333, intersecting second stack 2324 and including a plurality of second axes 2334 lying therein, a third plane 2335, intersecting third stack 2326 and including a plurality of third axes 2336 lying therein, and a fourth plane 2337, intersecting fourth stack 2328 and including a plurality of fourth axes 2338 lying therein, are defined. Each of first plane 2331, second plane 2333, third plane 2335 and fourth plane 2337 are either an x-z plane or a y-z plane, and first axes 2332, second axes 2334, third axes 2336 and fourth axes 2338 are parallel to the respective x-axis or y-axis, depending on the orientation of first stack 2322, second stack 2324, third stack 2326 and fourth stack 2328 within each of quadrants 2312, 2314, 2316 and 2318. It is appreciated that in each of quadrants 2312, 2314, 2316 and 2318, first plane 2331, second plane 2333, third plane 2335 and fourth plane 2337 are all parallel to one another.

Figure 23B:
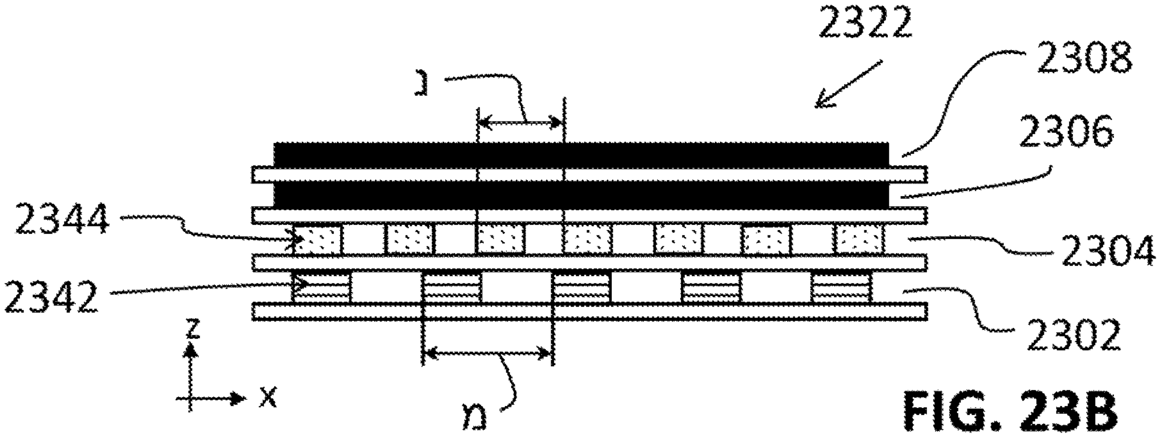

As seen particularly in FIG. 23B, in a preferred embodiment of the present invention, first stack 2322 includes a first stack first periodic structure (S1P1) 2342 formed together with first layer 2302 and having an S1P1 pitch, designated מ, along one of first stack axes 2332. Preferably, first stack 2322 further includes a first stack second periodic structure (S1P2) 2344 formed together with second layer 2304 and having an S1P2 pitch, designated נ, along another of first stack axes 2332.

It is appreciated that S1P1 2342 and S1P2 2344 at least partially overlie one another, and thus a first stack moiré pattern 2350 is visible upon imaging first stack 2322. As is known in the art, first stack moiré pattern 2350 is characterized by a pitch $\text{ס}_1$, which is a function of pitches מ and נ, as shown in equation 54:

$$\text{ס}_1 = \frac{\text{מ} \times \text{נ}}{|\text{מ} - \text{נ}|} \qquad \text{(Eq. 54)}$$

Preferably, first stack 2322 does not include periodic structures formed together with third layer 2306 or fourth layer 2308 which affect moiré pattern 2350. However, first stack 2322 may include periodic structures formed together with third layer 2306 or fourth layer 2308 which do not affect moiré pattern 2350, such as periodic structures which are periodic in a plane parallel to the x-y plane along an axis that is perpendicular to first stack axes 2332 or periodic structures having a pitch size that does not affect moiré pattern 2350.

In another embodiment of the present invention, first stack 2322 includes only one of periodic structures 2342 and 2344, and no moiré pattern 2350 is visible upon imaging first stack 2322.

Figure 23C:
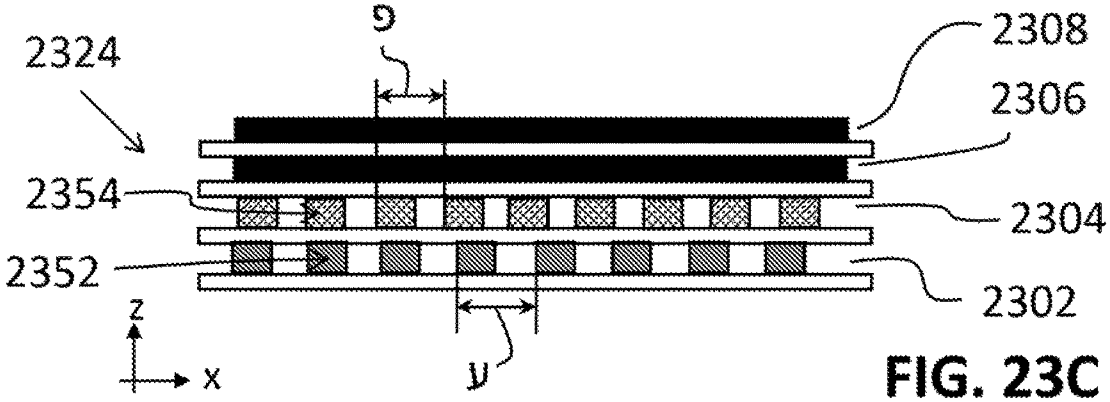

As seen particularly in FIG. 23C, in a preferred embodiment of the present invention, second stack 2324 includes a second stack first periodic structure (S2P1) 2352 formed together with first layer 2302 and having an S2P1 pitch, designated ע, along one of second stack axes 2334. Preferably, second stack 2324 further includes a second stack second periodic structure (S2P2) 2354 formed together with second layer 2304 and having an S2P2 pitch, designated פ, along another of second stack axes 2334.

It is appreciated that S2P1 2352 and S2P2 2354 at least partially overlie one another, and thus a second stack moiré pattern 2360 is visible upon imaging second stack 2324. As is known in the art, second stack moiré pattern 2360 is characterized by a pitch $\text{ס}_2$, which is a function of pitch ע and pitch פ, as shown in equation 55:

$$\text{ס}_2 = \frac{\text{ע} \times \text{פ}}{|\text{פ} - \text{ע}|} \qquad \text{(Eq. 55)}$$

Preferably, second stack 2324 does not include periodic structures formed together with third layer 2306 or fourth layer 2308 which affect moiré pattern 2360. However, second stack 2324 may include periodic structures formed together with third layer 2306 or fourth layer 2308 which do not affect moiré pattern 2360, such as periodic structures which are periodic in a plane parallel to the x-y plane along an axis that is perpendicular to second stack axes 2334 or periodic structures having a pitch size that does not affect moiré pattern 2360.

Figure 23D:
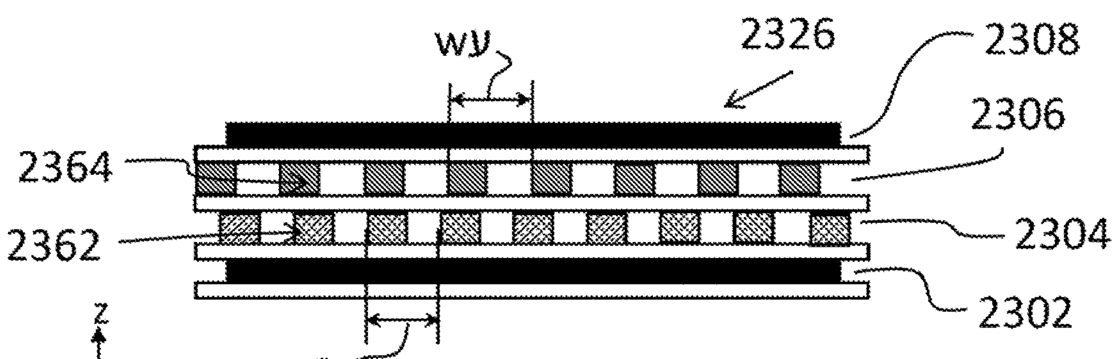

As seen particularly in FIG. 23D, in a preferred embodiment of the present invention, third stack 2326 includes a third stack first periodic structure (S3P1) 2362 formed together with second layer 2304 and having an S3P1 pitch, designated wפ, along one of third stack axes 2336. Preferably, S3P1 pitch wפ is related to S2P2 pitch פ by a third stack multiplicative factor, designated w. Third stack multiplicative factor w may be any positive number. Preferably, third stack 2326 further includes a third stack second periodic structure (S3P2) 2364 formed together with third layer 2306 and having an S3P2 pitch, designated wע, along another of third stack axes 2336. Preferably, S3P2 pitch wע is related to S2P1 pitch ע by third stack multiplicative factor w. It is appreciated that third stack multiplicative factor w relating S3P2 pitch wע to S2P1 pitch ע has the same value as third stack multiplicative factor w relating S3P1 pitch wפ to S2P2 pitch פ. In an embodiment of the present invention, the value of w is 1 and thus S3P1 pitch wפ is identical to S2P2 pitch פ and S3P2 pitch wע is identical to S2P1 pitch ע.

It is appreciated that S3P1 2362 and S3P2 2364 at least partially overlie one another, and thus a third stack moiré pattern 2370 is visible upon imaging third stack 2326. As is known in the art, third stack moiré pattern 2370 is characterized by a pitch $\text{ס}_3$, which is a function of third stack multiplicative factor w, pitch ע and pitch פ, as shown in equation 56:

$$\text{ס}_3 = w\left(\frac{\text{ע} \times \text{פ}}{|\text{פ} - \text{ע}|}\right) \qquad \text{(Eq. 56)}$$

Preferably, third stack 2326 does not include periodic structures formed together with first layer 2302 or fourth layer 2308 which affect moiré pattern 2370. However, third stack 2326 may include periodic structures formed together with first layer 2302 or fourth layer 2308 which do not affect moiré pattern 2370, such as periodic structures which are periodic in a plane parallel to the x-y plane along an axis that is perpendicular to third stack axes 2336 or periodic structures having a pitch size that does not affect moiré pattern 2370.

Figure 23E:
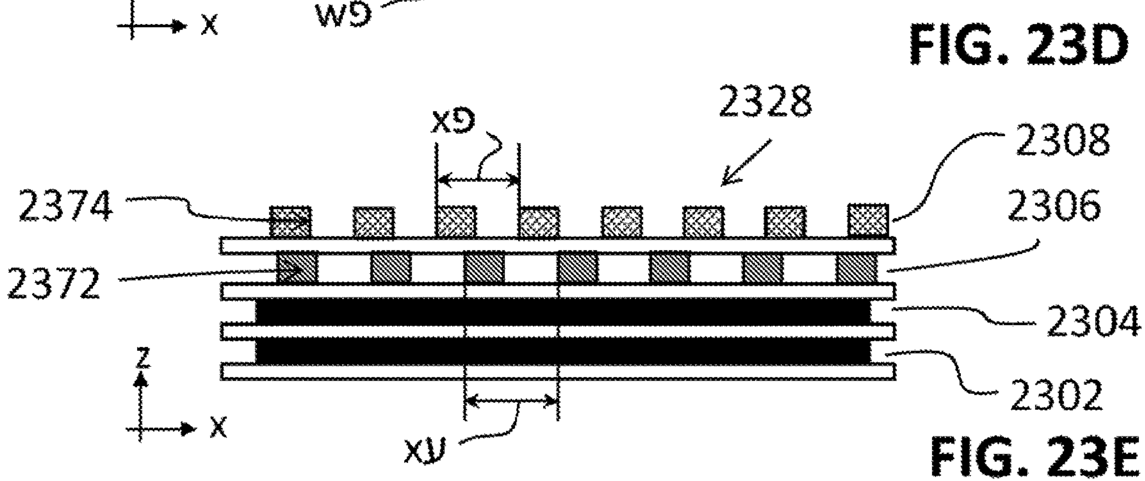

As seen particularly in FIG. 23E, in a preferred embodiment of the present invention, fourth stack 2328 includes a fourth stack first periodic structure (S4P1) 2372 formed together with third layer 2306 and having an S4P1 pitch, designated xע, along one of fourth stack axes 2338. Preferably, S4P1 pitch xע is related to S2P1 pitch ע by a fourth stack multiplicative factor, designated x. Fourth stack multiplicative factor x may be any positive number. Preferably, fourth stack 2328 further includes a fourth stack second periodic structure (S4P2) 2374 formed together with fourth layer 2308 and having an S4P2 pitch, designated xפ, along another of fourth stack axes 2338. Preferably, S4P2 pitch xפ is related to S2P2 pitch פby fourth stack multiplicative factor x. It is appreciated that fourth stack multiplicative factor x relating S4P2 pitch xפ to S2P2 pitch פ has the same value as fourth stack multiplicative factor x relating S4P1 pitch xע to S2P1 pitch ע. In an embodiment of the present invention, the value of x is 1 and thus S4P1 pitch xע is identical to S2P1 pitch ע and S4P2 pitch xע is identical to S2P2 pitch ע.

It is appreciated that S4P1 2372 and S4P2 2374 at least partially overlie one another, and thus a fourth stack moiré pattern 2380 is visible upon imaging fourth stack 2328. As is known in the art, fourth stack moiré pattern 2380 is characterized by a pitch $\text{ס}_4$, which is a function of fourth stack multiplicative factor x, pitch ע and pitch פ, as shown in equation 57:

$$\text{ס}_4 = x\left(\frac{\text{ע} \times \text{פ}}{|\text{פ} - \text{ע}|}\right) \qquad \text{(Eq. 57)}$$

Preferably, fourth stack 2328 does not include periodic structures formed together with first layer 2302 or second layer 2304 which affect moiré pattern 2380. However, fourth stack 2328 may include periodic structures formed together with first layer 2302 or second layer 2304 which do not affect moiré pattern 2380, such as periodic structures which are periodic in a plane parallel to the x-y plane along an axis that is perpendicular to fourth stack axes 2338 or periodic structures having a pitch size that does not affect moiré pattern 2380.

Misregistration between any two of layers 2302, 2304, 2306 and 2308 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches מ, נ, ע, פ, wע, wפ, xע and xפ need not be optically resolvable by the misregistration metrology tool used to generate an image of target 2300. However, it is preferable that each of pitches $\text{ס}_1$, $\text{ס}_2$, $\text{ס}_3$ and $\text{ס}_4$ is optically resolvable by the misregistration metrology tool used to generate an image of target 2300.

Figure 24A:
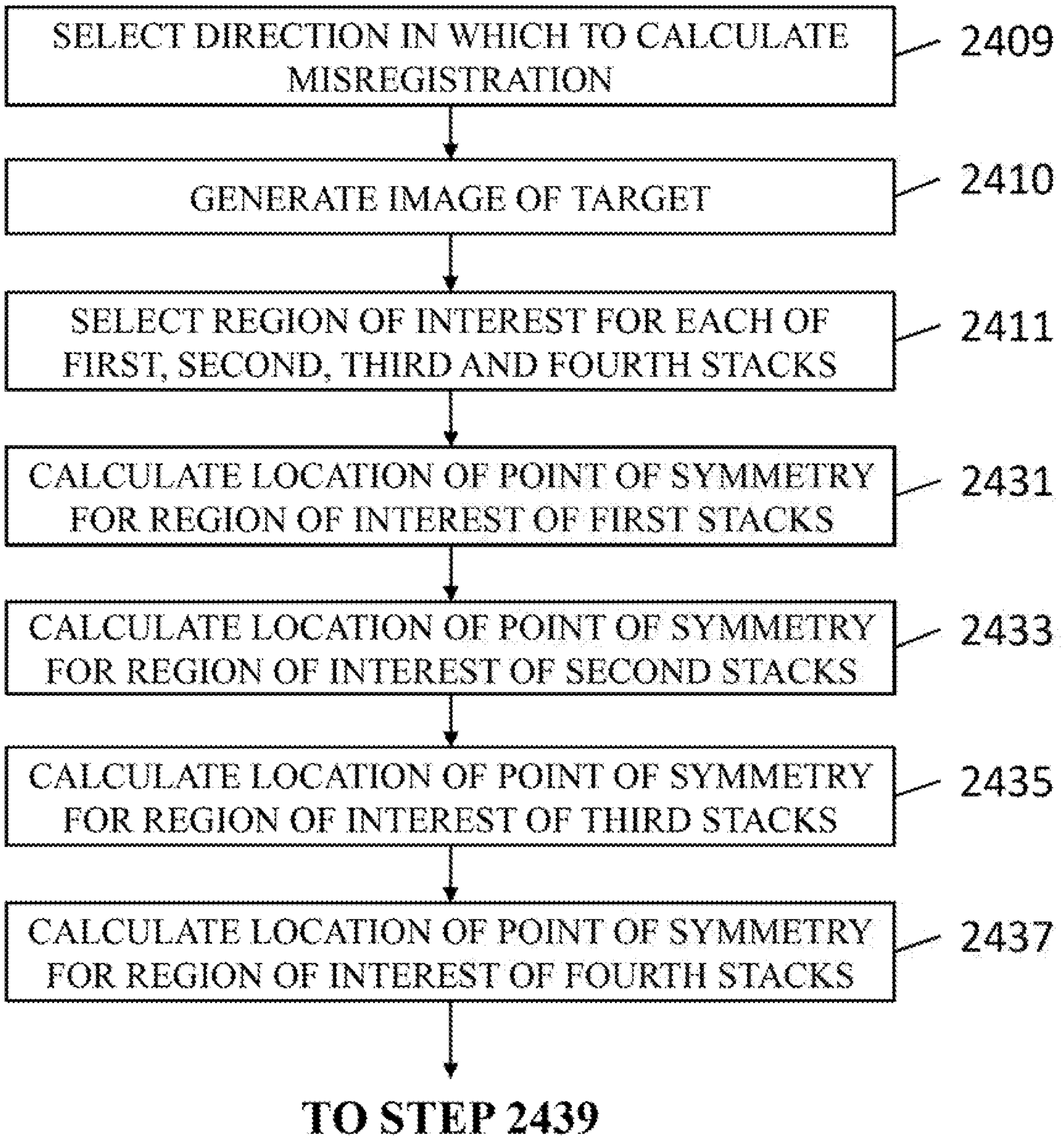
FIGS. 24A and 24B are together a simplified flowchart illustrating a preferred method of calculating misregistration between layers on which the multi-layered moiré target of FIGS. 22A-22E or of FIGS. 23A-23E is formed.
Figure 24B:
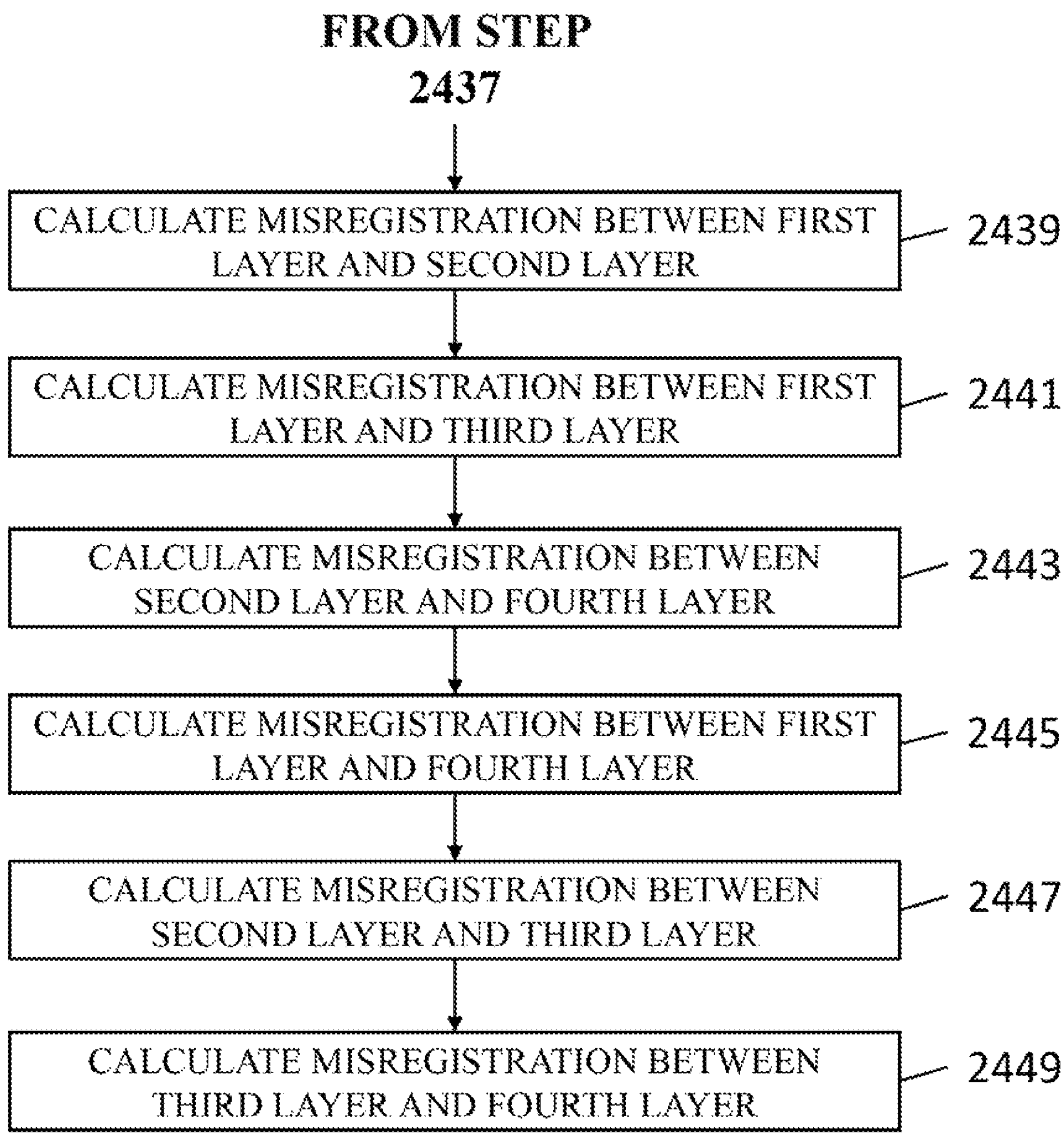
Figure 24C:
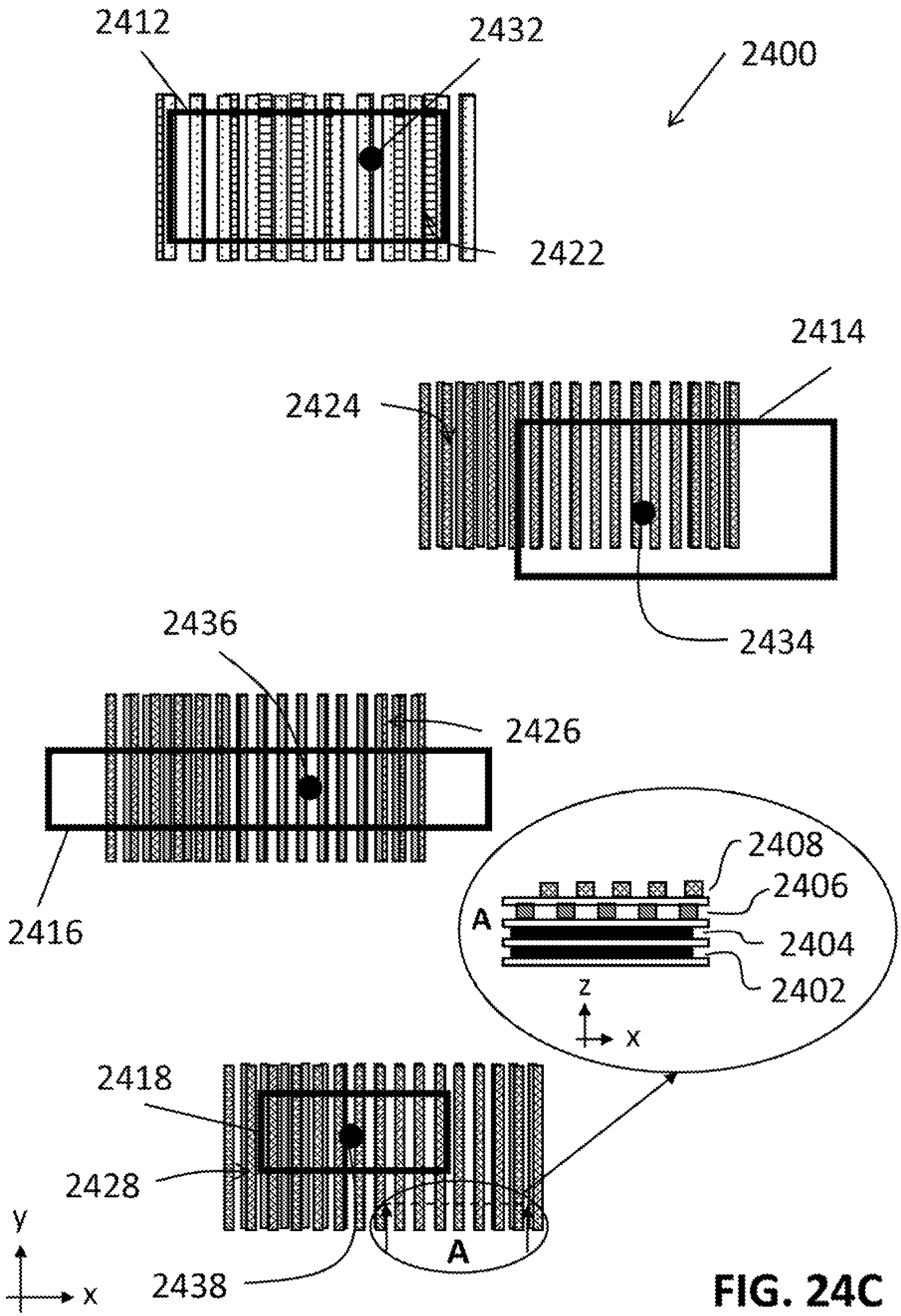
FIGS. 24C and 24D are simplified pictorial illustrations of first and second embodiments of a portion of the method of FIGS. 24A & 24B, respectively.
Figure 24D:
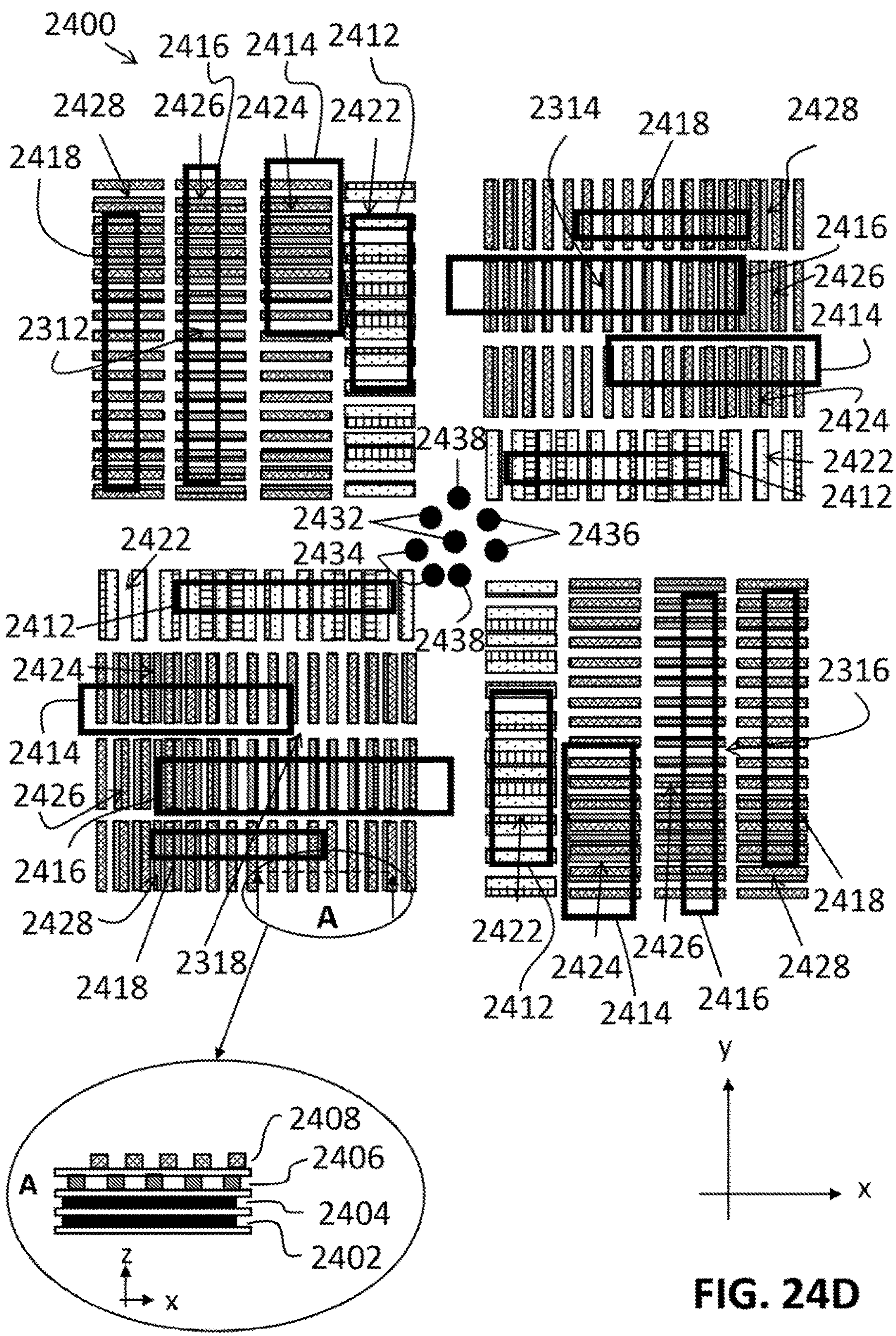

Reference is now made to FIGS. 24A & 24B, which together are a simplified flowchart illustrating a preferred method of calculating misregistration, using a multi-layered moiré target 2400, such as a target 2200 (FIGS. 22A-22E) or target 2300 (FIGS. 23A-23E), in a direction parallel to either the x or the y direction between a first, a second, a third and a fourth layer 2402, 2404, 2406 and 2408, such as layers 2202, 2204, 2206 and 2208 (FIGS. 22A-22E) or 2302, 2304, 2306 and 2308 (FIGS. 23A-23E) of a multilayered semiconductor device wafer formed with target 2400. Reference is further made to FIGS. 24C & 24D, which are simplified pictorial illustrations of first and second embodiments of a portion of the method of FIGS. 24A & 24B, respectively.

While it is appreciated that when utilizing target 2300 (FIGS. 23A-23E) the method described with reference to FIGS. 24A-24D may be performed only once to calculate misregistration in either the x or the y direction, typically, the method described in FIGS. 24A-24D will be performed twice, to calculate misregistration in each of the x and y directions. It is also appreciated that when utilizing target 2200 (FIGS. 22A-22E) misregistration may be calculated only in the one direction to which first, second, third stack and fourth stack axes 2232, 2234, 2236 and 2238 are parallel.

As seen at a first step 2409, a direction in which to measure misregistration is selected. When using target 2200 in the method of FIGS. 24A & 24B, the direction in which to measure misregistration is automatically selected to be the direction to which first, second, third and fourth stack axes 2232, 2234, 2236 and 2238 are parallel. When using target 2300 in the method of FIGS. 24A & 24B, the structures of quadrants 2314 and 2318 are utilized to measure misregistration in a direction parallel to the x-axis, and the structures of quadrants 2312 and 2316 to measure misregistration in a direction parallel to the y-axis.

Preferably, at a next step 2410, an image of target 2400 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches ח, ט, כ, ל, uכ, uל, vכ, vל, מ, נ, ע, פ, wע, wפ, xע and xפ need not be optically resolvable by the misregistration metrology tool used to generate the image of target 2400. However, it is preferable that each of pitches $\text{י}_1$, $\text{י}_2$, $\text{י}_3$, $\text{י}_4$, $\text{ס}_1$, $\text{ס}_2$, $\text{ס}_3$ and $\text{ס}_4$ is optically resolvable by the misregistration metrology tool used to generate the image of target 2400.

In a next step 2411, and as seen in FIGS. 24C & 24D, first, second, third and fourth regions of interest 2412, 2414, 2416 and 2418 are selected for each of respective first, second, third and fourth stacks 2422, 2424, 2426 and 2428, such as first, second, third and fourth stacks 2222, 2224, 2226 and 2228 (FIGS. 22A-22E) or first, second, third and fourth stacks 2322, 2324, 2326 and 2328 (FIGS. 23A-23E), in the quadrants selected in step 2409. It is appreciated, as seen in the illustrated embodiments of FIGS. 24C & 24D, that while first, second, third and fourth regions of interest 2412, 2414, 2416 and 2418 preferably lie entirely within each of respective first, second, third and fourth stacks 2422, 2424, 2426 and 2428, as illustrated for first and fourth regions of interest 2412 and 2418, which lie completely within respective first and fourth stacks 2422 and 2428, first, second, third and fourth regions of interest 2412, 2414, 2416 and 2418 may extend beyond respective first, second, third and fourth stacks 2422, 2424, 2426 and 2428, as illustrated for regions of interest 2414 and 2416, which extend beyond respective second and third stacks 2424 and 2426. It is further appreciated that regions of interest 2412, 2414, 2416 and 2418 shown in FIGS. 24C & 24D are representative regions of interest, and that other suitable regions of interest may be chosen at step 2411.

In a next step 2431, and as seen in FIGS. 24C & 24D, a location of a point of symmetry 2432 between all instances of first region of interest 2412 selected in step 2411 is calculated. In a next step 2433, and as seen in FIGS. 24C & 24D, a location of a point of symmetry 2434 between all instances of second region of interest 2414 selected in step 2411 is calculated. In a next step 2435, and as seen in FIGS. 24C & 24D, a location of a point of symmetry 2436 between all instances of third region of interest 2416 selected in step 2411 is calculated. In a next step 2437, and as seen in FIGS. 24C & 24D, a location of a point of symmetry 2438 between all instances of fourth region of interest 2418 selected in step 2411 is calculated.

At a next step 2439, a distance in the direction selected at step 2409 is calculated between the location of point of symmetry 2432 of first region or regions of interest 2412 identified at step 2431 and the location of point of symmetry 2434 of second region or regions of interest 2414 identified at step 2433. The distance found at step 2439 is divided by a gain $\text{צ}_1$, which for target 2200 is a function of pitches ח, ט, כ and ל, as shown in equation 58a:

$$\text{צ}_1 = \left|\frac{\text{ח}}{\text{ח}-\text{ט}} - \frac{\text{ל}}{\text{ל}-\text{כ}}\right| \quad \text{(Eq. 58a)}$$

and for target 2300 is a function of pitches מ, נ, ע and פ, as shown in equation 58b:

$$\text{צ}_1 = \left|\frac{\text{נ}}{\text{נ}-\text{מ}} - \frac{\text{פ}}{\text{פ}-\text{ע}}\right| \quad \text{(Eq. 58b)}$$

and the result is reported as the misregistration between first and second layers 2402 and 2404 in the direction selected at step 2409. It is appreciated that in addition to the distance calculated at step 2439, the method further calculates an adjustment direction, such as right, left, up or down. The adjustment direction is a function of the relative values of pitches ח, ט, כ and ל or pitches מ, נ, ע and פ, as well as which of layers 2402 and 2404 is to be adjusted.

At a next step 2441, a distance in the direction selected at step 2409 is calculated between the location of point of symmetry 2434 of second region or regions of interest 2414 identified at step 2433 and the location of point of symmetry 2436 of third region or regions of interest 2416 identified at step 2435. The distance found at step 2441 is divided by a gain $\text{צ}_2$, which for target 2200 is a function of pitch כ and pitch ל, as shown in equation 59a:

$$\text{צ}_2 = \left(\frac{\text{ל}}{|\text{ל} - \text{כ}|}\right) \quad \text{(Eq. 59a)}$$

and for target 2300 is a function of pitch ע and pitch פ, as shown in equation 59b:

$$\text{צ}_2 = \left(\frac{\text{פ}}{|\text{פ} - \text{צ}|}\right) \quad \text{(Eq. 59b)}$$

and the result is reported as the misregistration between first and third layers 2402 and 2406 in the direction selected at step 2409. It is appreciated that in addition to the distance calculated at step 2441, the method further calculates an adjustment direction, such as right, left, up or down. The adjustment direction is a function of the relative values of pitches כ and ל or pitches ע and פ, as well as which of layers 2402 and 2406 is to be adjusted.

At a next step 2443, a distance in the direction selected at step 2409 is calculated between the location of point of symmetry 2436 of third region or regions of interest 2416 identified at step 2435 and the location of point of symmetry 2438 of fourth region or regions of interest 2418 identified at step 2437. The distance found at step 2443 is divided by a gain $\text{צ}_3$, which for target 2200 is a function of pitch כ and pitch ל, as shown in equation 60a:

$$\text{צ}_3 = \left(\frac{\text{כ}}{|\text{ל} - \text{כ}|}\right) \quad \text{(Eq. 60a)}$$

and for target 2300 is a function of pitch ע and pitch פ, as shown in equation 60b:

$$\text{צ}_3 = \left(\frac{\text{צ}}{|\text{פ} - \text{צ}|}\right) \quad \text{(Eq. 60b)}$$

and the result is reported as the misregistration between second and fourth layers 2404 and 2408 in the direction selected at step 2409. It is appreciated that in addition to the distance calculated at step 2443, the method further calculates an adjustment direction, such as right, left, up or down. The adjustment direction is a function of the relative values of pitches כ and ל or pitches ע and פ, as well as which of layers 2404 and 2408 is to be adjusted.

At a next step 2445, a difference is calculated between the misregistration value reported at step 2439 and the misregistration value reported at step 2443. The difference calculated at step 2445 is reported as the misregistration between first and fourth layers 2402 and 2408 in the direction selected at step 2409. It is appreciated that in addition to the distance calculated at step 2445, the method further calculates an adjustment direction, such as right, left, up or down. The adjustment direction is a function of the relative values of pitches ח, ט, כ and ל or pitches מ, נ, ע and פ, as well as which of layers 2402 and 2408 is to be adjusted.

At a next step 2447, a difference is calculated between the misregistration value reported at step 2439 and the misregistration value reported at step 2441. The difference calculated at step 2447 is reported as the misregistration between second and third layers 2404 and 2406 in the direction selected at step 2409. It is appreciated that in addition to the distance calculated at step 2447, the method further calculates an adjustment direction, such as right, left, up or down. The adjustment direction is a function of the relative values of pitches ח, ט, כ and ל or function of pitches מ, נ, ע and פ, as well as which of layers 2404 and 2406 is to be adjusted.

At a next step 2449, a difference is calculated between the misregistration value reported at step 2441 and the misregistration value reported at step 2445. Alternatively, at next step 2449, a difference is calculated between the misregistration value reported at step 2447 and the misregistration value reported at step 2443. The difference calculated at step 2449 is reported as the misregistration between third and fourth layers 2406 and 2408 in the direction selected at step 2409. It is appreciated that in addition to the distance calculated at step 2449, the method further calculates an adjustment direction, such as right, left, up or down. The adjustment direction is a function of the relative values of pitches ח, ט, כ and ל or pitches מ, נ, ע and פ, as well as which of layers 2406 and 2408 is to be adjusted.

Preferably, in the embodiment described hereinabove wherein structures shown as being formed together with first and third layers 2402 and 2406 are all formed together with layer 2402, the method described hereinabove with reference to FIGS. 24A-24D proceeds to calculate and report a difference between the misregistration value reported at step 2439 and the misregistration value reported at step 2447. The difference between the misregistration values reported at steps 2439 and 2447 is useful in the calibration of the misregistration metrology tool used in the method of FIGS. 24A-24D.

Similarly, in the embodiment described hereinabove wherein structures shown as being formed together with first and third layers 2402 and 2406 are all formed together with layer 2402, the method described hereinabove with reference to FIGS. 24A-24D proceeds to calculate and report a difference between the misregistration value reported at step 2445 and the misregistration value reported at step 2449. The difference between the misregistration values reported at steps 2445 and 2449 is useful in the calibration of the misregistration metrology tool used in the method of FIGS. 24A-24D.

Preferably, in the embodiment described hereinabove wherein structures shown as being formed together with first and fourth layers 2402 and 2408 are all formed together with layer 2402, the method described hereinabove with reference to FIGS. 24A-24D proceeds to calculate and report a difference between the misregistration value reported at step 2439 and the misregistration value reported at step 2443. The difference between the misregistration values reported at steps 2439 and 2443 is useful in the calibration of the misregistration metrology tool used in the method of FIGS. 24A-24D.

Similarly, in the embodiment described hereinabove wherein structures shown as being formed together with first and fourth layers 2402 and 2408 are all formed together with layer 2402, the method described hereinabove with reference to FIGS. 24A-24D proceeds to calculate and report a difference between the misregistration value reported at step 2441 and the misregistration value reported at step 2449. The difference between the misregistration values reported at steps 2441 and 2449 is useful in the calibration of the misregistration metrology tool used in the method of FIGS. 24A-24D.

Preferably, in the embodiment described hereinabove wherein structures shown as being formed together with second and fourth layers 2404 and 2408 are all formed together with layer 2404, the method described hereinabove with reference to FIGS. 24A-24D proceeds to calculate and report a difference between the misregistration value reported at step 2439 and the misregistration value reported at step 2445. The difference between the misregistration values reported at steps 2439 and 2445 is useful in the calibration of the misregistration metrology tool used in the method of FIGS. 24A-24D.

Similarly, in the embodiment described hereinabove wherein structures shown as being formed together with second and fourth layers 2404 and 2408 are all formed together with layer 2404, the method described hereinabove with reference to FIGS. 24A-24D proceeds to calculate and report a difference between the misregistration value reported at step 2447 and the misregistration value reported at step 2449. The difference between the misregistration values reported at steps 2447 and 2449 is useful in the calibration of the misregistration metrology tool used in the method of FIGS. 24A-24D.

Reference is now made to FIGS. 25A-25E, which are simplified illustrations of another embodiment of a multi-layered moiré target 2500 of the present invention. FIGS. 25A-25E include illustrations in three different dimensions, indicated by x-, y- and z-axes, the three dimensions being referred to hereinafter as an x-y plane, an x-z plane and a y-z plane, respectively. It is noted that FIG. 25A generally illustrates the x-y plane, while FIGS. 25B, 25C, 25D and 25E illustrate planes parallel to the x-z plane.

Target 2500 is preferably formed on a semiconductor device wafer on which are preferably formed at least a first layer 2502, a second layer 2504, a third layer 2506 and a fourth layer 2508. It is appreciated that each of first layer 2502, second layer 2504, third layer 2506 and fourth layer 2508 defines a generally planar surface parallel to the x-y plane. First, second, third and fourth layers 2502, 2504, 2506 and 2508 may be adjacent layers but need not be. Preferably, any material between first, second, third and fourth layers 2502, 2504, 2506 and 2508 is at least partially transparent to electromagnetic radiation. In the embodiment illustrated in FIGS. 25A-25E, first layer 2502 lies below second, third and fourth layers 2504, 2506 and 2508, second layer 2504 lies below third and fourth layers 2506 and 2508, and fourth layer 2508 lies above first, second and third layers 2502, 2504 and 2506. It is appreciated, however, that layers 2502, 2504, 2506 and 2508 may be arranged in any suitable order along the z-axis with respect to one another.

Additionally, in an embodiment of the present invention, structures shown as being formed together with first and third layers 2502 and 2506 may all be formed together with layer 2502. In such an embodiment, no portion of target 2500 is formed together with layer 2506. Such an embodiment is particularly useful for calibration, as described hereinbelow with reference to FIGS. 27A-27D. Additionally, in another embodiment of the present invention, structures shown as being formed together with first and fourth layers 2502 and 2508 may all be formed together with layer 2502. In such an embodiment, no portion of target 2500 is formed together with layer 2508. Such an embodiment is particularly useful for calibration, as described hereinbelow with reference to FIGS. 27A-27D. Additionally, in another embodiment of the present invention, structures shown as being formed together with second and fourth layers 2504 and 2508 may all be formed together with layer 2504. In such an embodiment, no portion of target 2500 is formed together with layer 2508. Such an embodiment is particularly useful for calibration, as described hereinbelow with reference to FIGS. 27A-27D.

It is appreciated that FIGS. 25A-25E illustrate one possible layout of target 2500, and that in other embodiments of the present invention, target 2500 may include additional structures. For example, as described hereinbelow with reference to FIGS. 26A-26E & 34-39, a suitable target may include multiple instances of the structures shown in FIGS. 25A-25E, and those multiple instances may be arranged in various ways.

Preferably, target 2500 includes a first stack 2522 of periodic structures, a second stack 2524 of periodic structures, a third stack 2526 of periodic structures and a fourth stack 2528 of periodic structures. Each of first stack 2522, second stack 2524, third stack 2526 and fourth stack 2528 includes one or more periodic structures, each periodic structure having a pitch. Preferably, none of first stack 2522, second stack 2524, third stack 2526 and fourth stack 2528 overlap with one another.

It is appreciated that although in FIGS. 25A-25E, each of the periodic structures of first stack 2522, second stack 2524, third stack 2526 and fourth stack 2528 are shown as being formed of a plurality of lines and spaces, in other embodiments of the invention, the periodic structures of first stack 2522, second stack 2524, third stack 2526 and fourth stack 2528 may be formed of any suitable periodic features. It is further appreciated that the periodic features forming the periodic structures included in first stack 2522, second stack 2524, third stack 2526 and fourth stack 2528 may be formed of sub-structures. The pitches of each of the periodic structures of first stack 2522, second stack 2524, third stack 2526 and fourth stack 2528 are preferably between 10 nm-3000 nm, and more preferably between 200 nm-800 nm.

A first x-z plane 2531 intersects first stack 2522. A plurality of first axes 2532 lie within first x-z plane 2531 and are parallel to the x-axis. A second x-z plane 2533 intersects second stack 2524. A plurality of second axes 2534 lie within second x-z plane 2533 and are parallel to the x-axis. A third x-z plane 2535 intersects third stack 2526. A plurality of third axes 2536 lie within third x-z plane 2535 and are parallel to the x-axis. A fourth x-z plane 2537 intersects fourth stack 2528. A plurality of fourth axes 2538 lie within fourth x-z plane 2537 and are parallel to the x-axis.

Figure 25A:
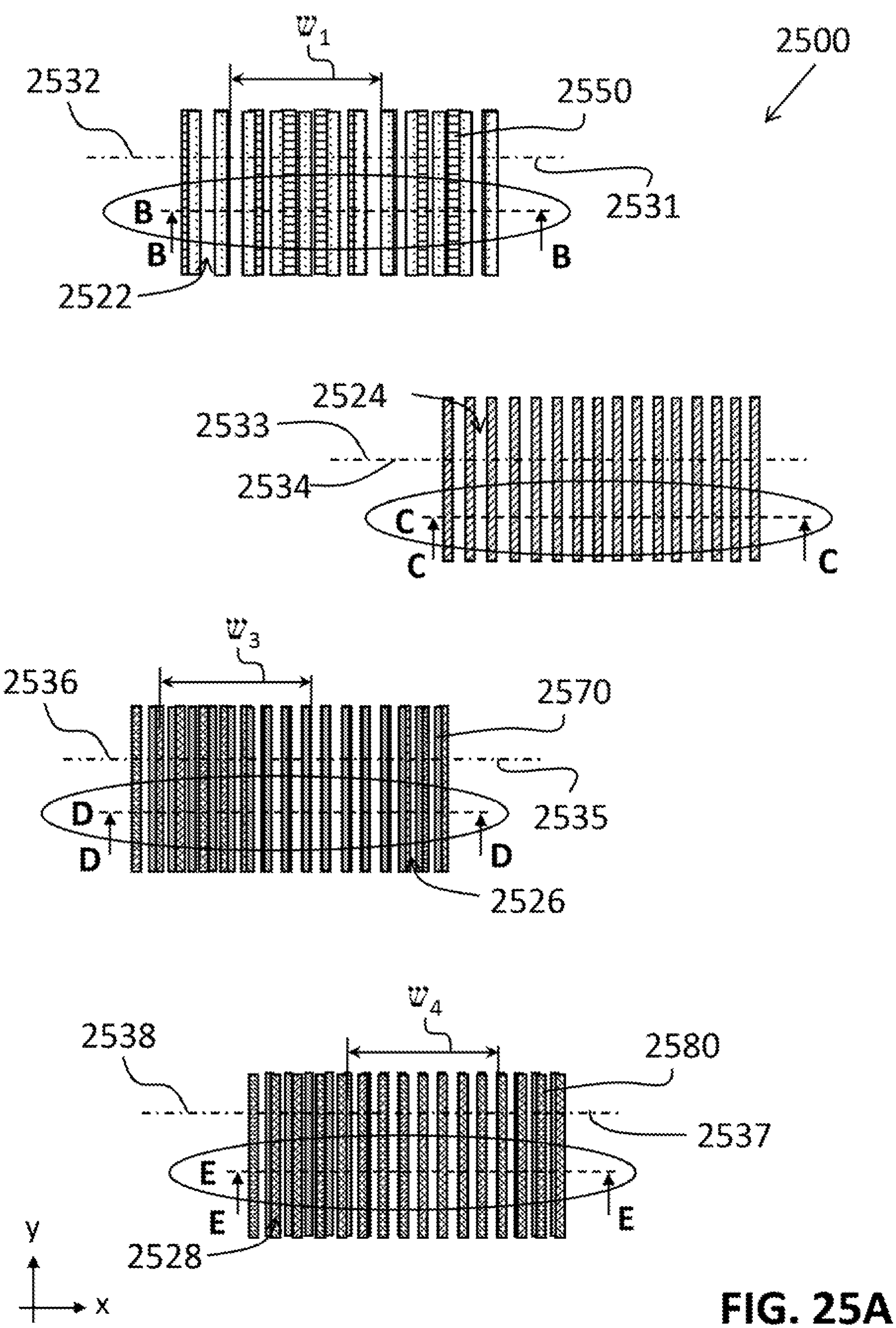
FIGS. 25A, 25B, 25C, 25D and 25E are simplified respective top view, first sectional side view, second sectional side view, third sectional side view and fourth sectional side view illustrations of another embodiment of a multi-layered moiré target of the present invention, FIGS. 25B, 25C, 25D and 25E being taken along lines B-B, C-C, D-D and E-E in FIG. 25A, respectively.
Figure 25B:
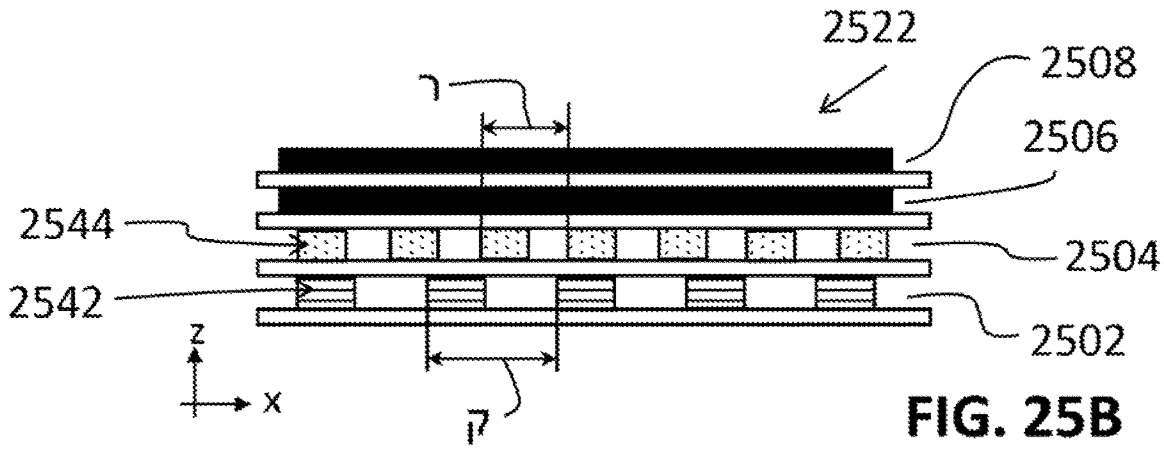

As seen particularly in FIG. 25B, in a preferred embodiment of the present invention, first stack 2522 includes a first stack first periodic structure (S1P1) 2542 formed together with first layer 2502 and having an S1P1 pitch, designated ק, along one of first stack axes 2532. Preferably, first stack 2522 further includes a first stack second periodic structure (S1P2) 2544 formed together with second layer 2504 and having an S1P2 pitch, designated ר, along another of first stack axes 2532.

It is appreciated that S1P1 2542 and S1P2 2544 at least partially overlie one another, and thus a first stack moiré pattern 2550 is visible upon imaging first stack 2522. As is known in the art, first stack moiré pattern 2550 is characterized by a pitch $\text{ש}_1$, which is a function of pitches ק and ר, as shown in equation 61:

$$\text{ש}_1 = \frac{\text{ק} \times \text{ר}}{|\text{ק} - \text{ר}|} \quad \text{(Eq. 61)}$$

Preferably, first stack 2522 does not include periodic structures formed together with third layer 2506 or fourth layer 2508 which affect moiré pattern 2550. However, first stack 2522 may include periodic structures formed together with third layer 2506 or fourth layer 2508 which do not affect moiré pattern 2250, such as periodic structures which are periodic along an axis parallel to the y-axis or periodic structures having a pitch size that does not affect moiré pattern 2250.

In another embodiment of the present invention, first stack 2522 includes only S1P1 2542 and not S1P2 2544, and no moiré pattern 2550 is visible upon imaging first stack 2522.

Figure 25C:
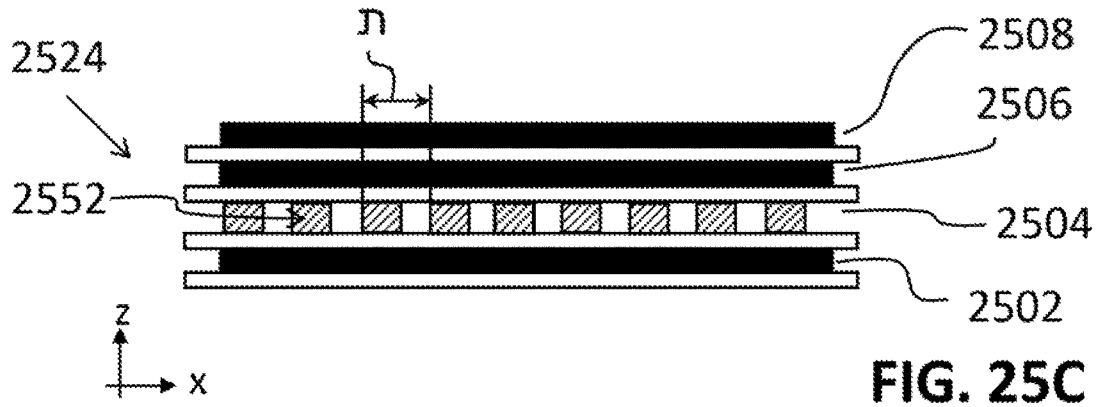

As seen particularly in FIG. 25C, in a preferred embodiment of the present invention, second stack 2524 includes a second stack first periodic structure (S2P1) 2552 formed together with first layer 2502 and having an S2P1 pitch, designated $\text{ת}$, along one of second stack axes 2534. Preferably, second stack 2524 does not include periodic structures formed together with any of first, third or fourth layers 2502, 2506 or 2508 which would, together with S2P1 2552, produce a moiré pattern upon imaging second stack 2524. However, second stack 2524 may include periodic structures formed together with first, third or fourth layers 2502, 2506 or 2508 which do not produce a moiré pattern upon imaging second stack 2524, such as periodic structures which are periodic along an axis parallel to the y-axis or periodic structures having a pitch size that does not produce a moiré pattern upon imaging second stack 2524.

Figure 25D:
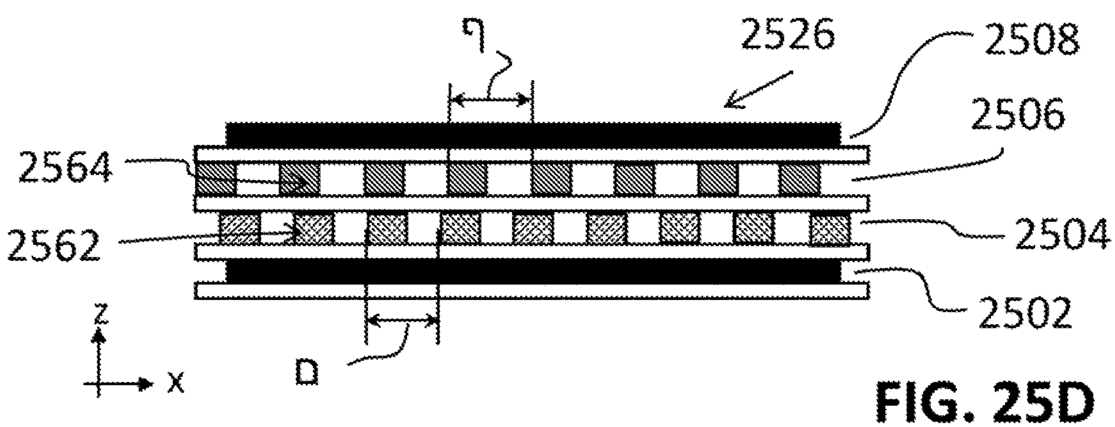

As seen particularly in FIG. 25D, in a preferred embodiment of the present invention, third stack 2526 includes a third stack first periodic structure (S3P1) 2562 formed together with second layer 2504 and having an S3P1 pitch, designated $\text{ם}$, along one of third stack axes 2536. Preferably, third stack 2526 further includes a third stack second periodic structure (S3P2) 2564 formed together with third layer 2506 and having an S3P2 pitch, designated $\text{ף}$, along another of third stack axes 2536.

It is appreciated that S3P1 2562 and S3P2 2564 at least partially overlie one another, and thus a third stack moiré pattern 2570 is visible upon imaging third stack 2526. As is known in the art, third stack moiré pattern 2570 is characterized by a pitch $\text{ש}_3$, which is a function of pitch $\text{ם}$ and pitch $\text{ף}$, as shown in equation 62:

$$\text{ש}_3 = \frac{\text{ב} \times \text{ף}}{|\text{ם} - \text{ף}|} \quad \text{(Eq. 62)}$$

Preferably, third stack 2526 does not include periodic structures formed together with first layer 2502 or fourth layer 2508 which affect moiré pattern 2570. However, third stack 2526 may include periodic structures formed together with first layer 2502 or fourth layer 2508 which do not affect moiré pattern 2570, such as periodic structures which are periodic along an axis parallel to the y-axis or periodic structures having a pitch size that does not affect moiré pattern 2570.

Figure 25E:
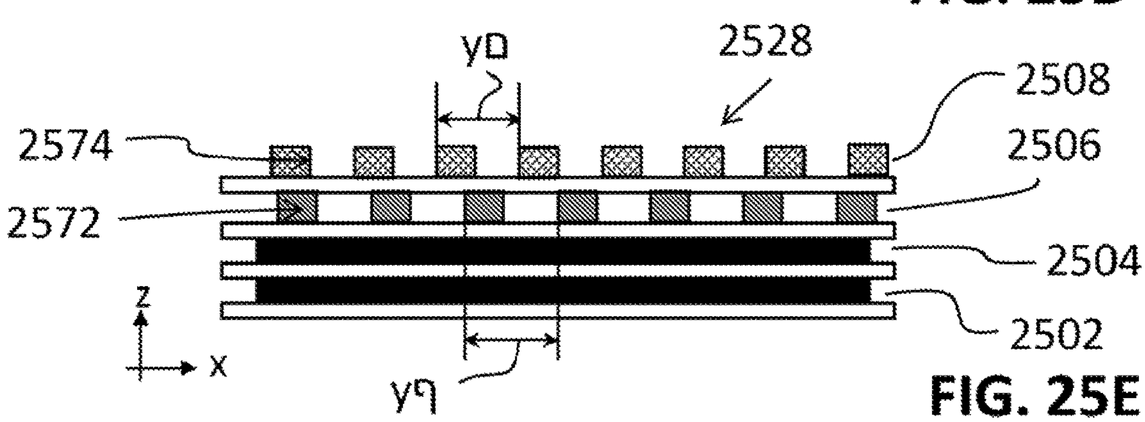

As seen particularly in FIG. 25E, in a preferred embodiment of the present invention, fourth stack 2528 includes a fourth stack first periodic structure (S4P1) 2572 formed together with third layer 2506 and having an S4P1 pitch, designated $y\text{ף}$, along one of fourth stack axes 2538. Preferably, S4P1 pitch $y\text{ף}$ is related to S3P2 pitch $\text{ף}$ by a fourth stack multiplicative factor, designated y. Fourth stack multiplicative factor y may be any positive number. Preferably, fourth stack 2528 further includes a fourth stack second periodic structure (S4P2) 2574 formed together with fourth layer 2508 and having an S4P2 pitch, designated $y\text{ם}$ along another of fourth stack axes 2538. Preferably, S4P2 pitch $y\text{ם}$ is related to S3P1 pitch $\text{ם}$ by fourth stack multiplicative factor y. It is appreciated that fourth stack multiplicative factor y relating S4P2 pitch $y\text{ם}$ to S3P1 pitch $\text{ם}$ has the same value as fourth stack multiplicative factor y relating S4P1 pitch $y\text{ף}$ to S3P2 pitch $\text{ף}$. In an embodiment of the present invention, the value of y is 1 and thus S4P1 pitch $y\text{ף}$ is identical to S3P2 pitch $\text{ף}$ and S4P2 pitch $y\text{ם}$ is identical to S3P1 pitch $\text{ף}$.

It is appreciated that S4P1 2572 and S4P2 2574 at least partially overlie one another, and thus a fourth stack moiré pattern 2580 is visible upon imaging fourth stack 2528. As is known in the art, fourth stack moiré pattern 2580 is characterized by a pitch $\text{ש}_4$, which is a function of fourth stack multiplicative factor y, pitch $\text{ם}$ and pitch $\text{ף}$, as shown in equation 63:

$$\text{ש}_4 = y\left(\frac{\text{ם} \times \text{ף}}{|\text{ב} - \text{ף}|}\right) \quad \text{(Eq. 63)}$$

Preferably, fourth stack 2528 does not include periodic structures formed together with first layer 2502 or second layer 2504 which affect moiré pattern 2580. However, fourth stack 2528 may include periodic structures formed together with first layer 2502 or second layer 2504 which do not affect moiré pattern 2580, such as periodic structures which are periodic along an axis parallel to the y-axis or periodic structures having a pitch size that does not affect moiré pattern 2580.

Misregistration between any two of layers 2502, 2504, 2506 and 2508 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches $\text{ק}$, $\text{ר}$, $\text{ם}$, $\text{ף}$, $y\text{ם}$ and $y\text{ף}$ need not be optically resolvable by the misregistration metrology tool used to generate an image of target 2500. However, it is preferable that each of pitches $\text{ת}$, $\text{ש}_1$, $\text{ש}_3$ and $\text{ש}_4$ is optically resolvable by the misregistration metrology tool used to generate an image of target 2500.

Reference is now made to FIGS. 26A-26E, which are simplified illustrations of another embodiment of a multi-layered moiré target 2600 of the present invention. FIGS. 26A-26E include illustrations in three different dimensions, indicated by x-, y- and z-axes, the three dimensions being referred to hereinafter as an x-y plane, an x-z plane and a y-z plane, respectively. It is noted that FIG. 26A generally illustrates the x-y plane, while FIGS. 26B, 26C, 26D and 26E illustrate planes parallel to the x-z plane.

It is noted that target 2600 is one example of an alternative layout of target 2500, described hereinabove with reference to FIGS. 25A-25E, and that additional layouts are described hereinbelow with reference to FIGS. 34-39. Target 2600 is preferably formed on a semiconductor device wafer on which are preferably formed at least a first layer 2602, a second layer 2604, a third layer 2606 and a fourth layer 2608. It is appreciated that each of first layer 2602, second layer 2604, third layer 2606 and fourth layer 2608 defines a generally planar surface parallel to the x-y plane. First, second, third and fourth layers 2602, 2604, 2606 and 2608 may be adjacent layers but need not be. Preferably, any material between first, second, third and fourth layers 2602, 2604, 2606 and 2608 is at least partially transparent to electromagnetic radiation. In the embodiment illustrated in FIGS. 26A-26E, first layer 2602 lies below second, third and fourth layers 2604, 2606 and 2608, second layer 2604 lies below third and fourth layers 2606 and 2608, and fourth layer 2608 lies above first, second and third layers 2602, 2604 and 2606. It is appreciated, however, that layers 2602, 2604, 2606 and 2608 may be arranged in any suitable order along the z-axis with respect to one another.

Additionally, in an embodiment of the present invention, structures shown as being formed together with first and third layers 2602 and 2606 may all be formed together with layer 2602. In such an embodiment, no portion of target 2600 is formed together with layer 2606. Such an embodiment is particularly useful for calibration, as described hereinbelow with reference to FIGS. 27A-27D. Additionally, in another embodiment of the present invention, structures shown as being formed together with first and fourth layers 2602 and 2608 may all be formed together with layer 2602. In such an embodiment, no portion of target 2600 is formed together with layer 2608. Such an embodiment is particularly useful for calibration, as described hereinbelow with reference to FIGS. 27A-27D. Additionally, in another embodiment of the present invention, structures shown as being formed together with second and fourth layers 2604 and 2608 may all be formed together with layer 2604. In such an embodiment, no portion of target 2600 is formed together with layer 2608. Such an embodiment is particularly useful for calibration, as described hereinbelow with reference to FIGS. 27A-27D.

Figure 26A:
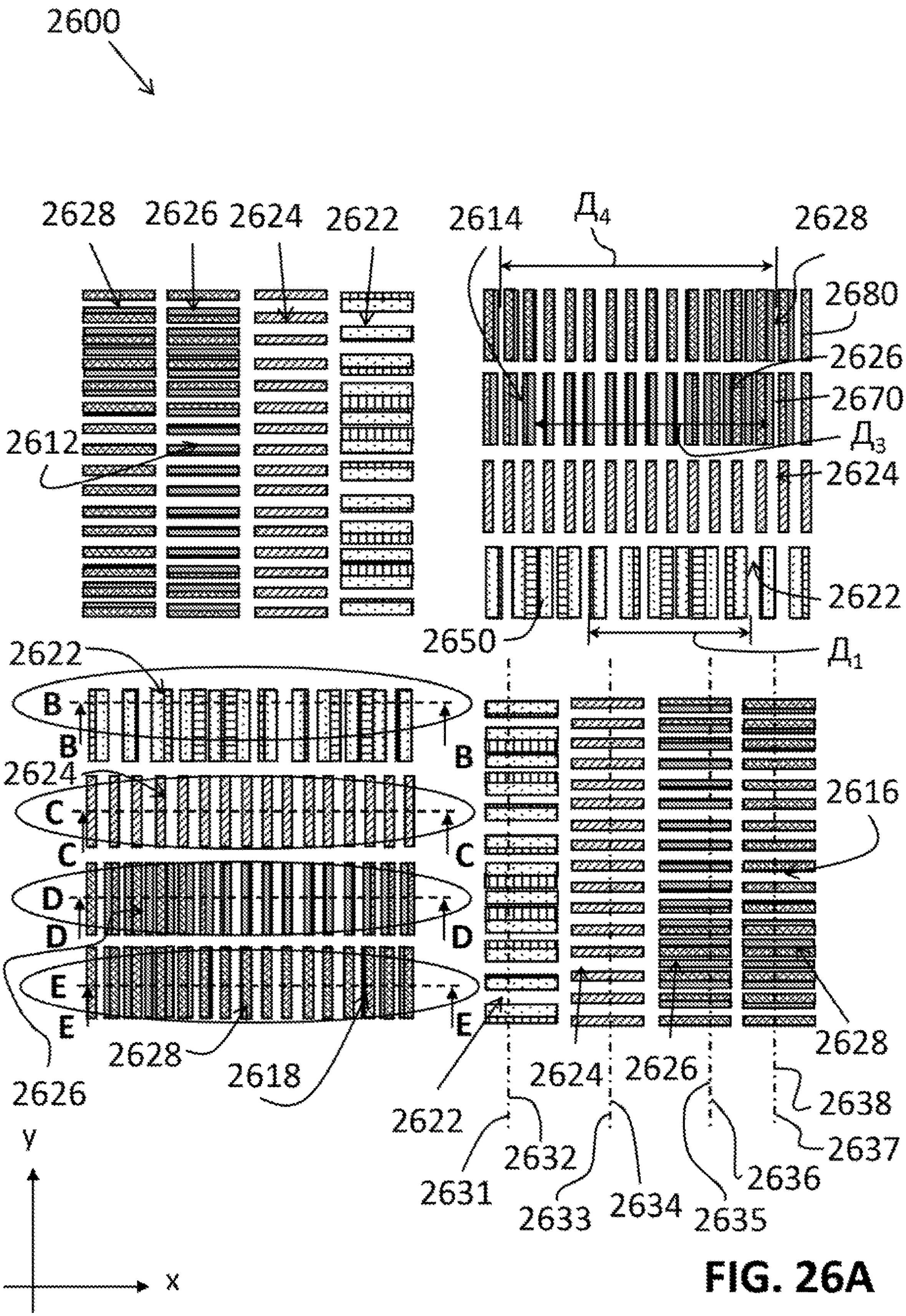
FIGS. 26A, 26B, 26C, 26D and 26E are simplified respective top view, first sectional side view, second sectional side view, third sectional side view and fourth sectional side view illustrations of another embodiment of a multi-layered moiré target of the present invention, FIGS. 26B, 26C, 26D and 26E being taken along lines B-B, C-C, D-D and E-E in FIG. 26A, respectively.

As seen particularly in FIG. 26A, target 2600 includes four target quadrants 2612, 2614, 2616 and 2618. In the embodiment shown in FIG. 26A, the rotational orientation in the x-y plane of each of target quadrants 2612, 2614, 2616 and 2618 preferably differs from the rotational orientation in the x-y plane of each of the other target quadrants 2612, 2614, 2616 and 2618 by an integer multiple of 90°. Additionally, target 2600 preferably is characterized by rotational symmetry in either the x-direction or the y-direction or both. In a preferred embodiment of the present invention, target 2600 is designed such that when in a state of registration, the entirety of target 2600 is characterized by a single point of symmetry in the x-direction and a single point of symmetry in the y-direction. However, even in such an embodiment, when in a state of misregistration, various elements of target 2600 will be characterized by unique points of symmetry.

Each of target quadrants 2612, 2614, 2616 and 2618 includes a first stack 2622 of periodic structures, a second stack 2624 of periodic structures, a third stack 2626 of periodic structures and a fourth stack 2628 of periodic structures. Each of first stack 2622, second stack 2624, third stack 2626 and fourth stack 2628 includes one or more periodic structures, each periodic structure having a pitch. Preferably, none of first stack 2622, second stack 2624, third stack 2626 and fourth stack 2628 overlap with one another. In FIGS. 26A-26E, first stack 2622 is illustrated as lying closer to the center of target 2600 than second stack 2624, third stack 2626 and fourth stack 2628, second stack 2624 is illustrated as lying closer to the center of target 2600 than third stack 2626 and fourth stack 2628, third stack 2626 is illustrated as lying closer to the edge of target 2600 than first stack 2622 and second stack 2624, and fourth stack 2628 is illustrated as lying closer to the edge of target 2600 than third stack 2626. However, first stack 2622, second stack 2624, third stack 2626 and fourth stack 2628 may be arranged in any suitable arrangement relative to the x-y plane with respect to one another.

It is appreciated that although in FIGS. 26A-26E, each of the periodic structures of first stack 2622, second stack 2624, third stack 2626 and fourth stack 2628 are shown as being formed of a plurality of lines and spaces, in other embodiments of the invention, the periodic structures of first stack 2622, second stack 2624, third stack 2626 and fourth stack 2628 may be formed of any suitable periodic features. It is further appreciated that the periodic features forming the periodic structures included in first stack 2622, second stack 2624, third stack 2626 and fourth stack 2628 may be formed of sub-structures. The pitches of each of the periodic structures of first stack 2622, second stack 2624, third stack 2626 and fourth stack 2628 are preferably between 10 nm-3000 nm, and more preferably between 200 nm-800 nm.

As seen in FIG. 26A, in each of quadrants 2612, 2614, 2616 and 2618, a first plane 2631, intersecting first stack 2622 and including a plurality of first axes 2632 lying therein, a second plane 2633, intersecting second stack 2624 and including a plurality of second axes 2634 lying therein, a third plane 2635, intersecting third stack 2626 and including a plurality of third axes 2636 lying therein, and a fourth plane 2637, intersecting fourth stack 2628 and including a plurality of fourth axes 2638 lying therein, are defined. Each of first plane 2631, second plane 2633, third plane 2635 and fourth plane 2637 are either an x-z plane or a y-z plane, and first axes 2632, second axes 2634, third axes 2636 and fourth axes 2638 are parallel to the respective x-axis or y-axis, depending on the orientation of first stack 2622, second stack 2624, third stack 2626 and fourth stack 2628 within each of quadrants 2612, 2614, 2616 and 2618. It is appreciated that in each of quadrants 2612, 2614, 2616 and 2618, first plane 2631, second plane 2633, third plane 2635 and fourth plane 2637 are all parallel to one another.

Figure 26B:
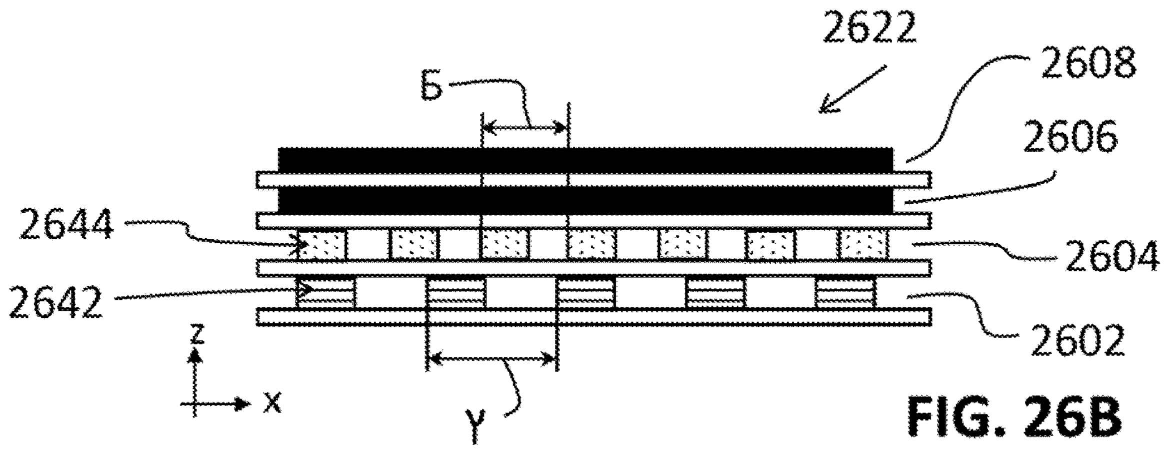

As seen particularly in FIG. 26B, in a preferred embodiment of the present invention, first stack 2622 includes a first stack first periodic structure (S1P1) 2642 formed together with first layer 2602 and having an S1P1 pitch, designated ϒ, along one of first stack axes 2632. Preferably, first stack 2622 further includes a first stack second periodic structure (S1P2) 2644 formed together with second layer 2604 and having an S1P2 pitch, designated Б, along another of first stack axes 2632.

It is appreciated that S1P1 2642 and S1P2 2644 at least partially overlie one another, and thus a first stack moiré pattern 2650 is visible upon imaging first stack 2622. As is known in the art, first stack moiré pattern 2650 is characterized by a pitch $\text{Д}_1$, which is a function of pitches ϒ and Б, as shown in equation 64:

$$\text{Д}_1 = \frac{\text{ϒ} \times \text{Б}}{|\text{ϒ} - \text{Б}|} \qquad \text{(Eq. 64)}$$

Preferably, first stack 2622 does not include periodic structures formed together with third layer 2606 or fourth layer 2608 which affect moiré pattern 2650. However, first stack 2622 may include periodic structures formed together with third layer 2606 or fourth layer 2608 which do not affect moiré pattern 2650, such as periodic structures which are periodic in a plane parallel to the x-y plane along an axis that is perpendicular to first stack axes 2632 or periodic structures having a pitch size that does not affect moiré pattern 2650.

In another embodiment of the present invention, first stack 2622 includes only S1P1 2642 and not S1P2 2644, and no moiré pattern 2650 is visible upon imaging first stack 2622.

Figure 26C:
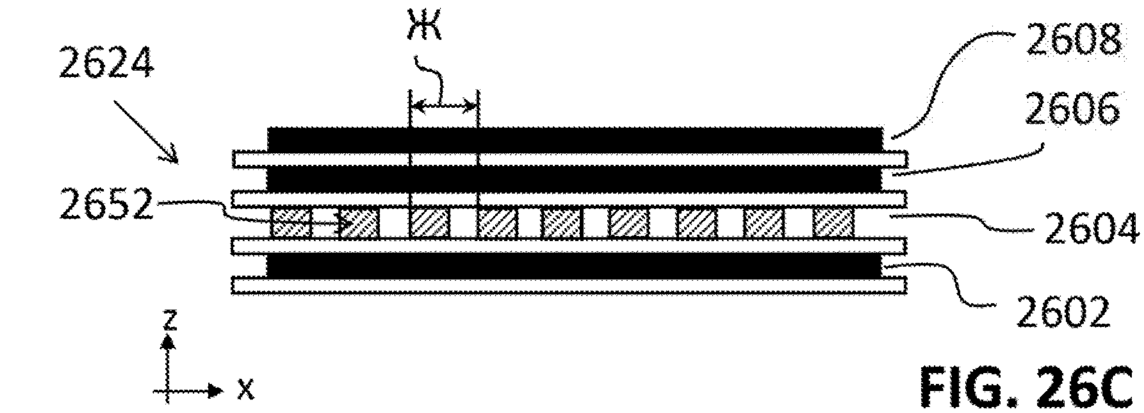

As seen particularly in FIG. 26C, in a preferred embodiment of the present invention, second stack 2624 includes a second stack first periodic structure (S2P1) 2652 formed together with first layer 2602 and having an S2P1 pitch, designated Ж, along one of second stack axes 2634. Preferably, second stack 2624 does not include periodic structures formed together with any of first, third or fourth layers 2602, 2606 or 2608 which would, together with S2P1 2652, produce a moiré pattern upon imaging second stack 2624. However, second stack 2624 may include periodic structures formed together with first, third or fourth layers 2602, 2606 or 2608 which do not produce a moiré pattern upon imaging second stack 2624, such as periodic structures which are periodic in a plane parallel to the x-y plane along an axis that is perpendicular to second stack axes 2634 or periodic structures having a pitch size that does not produce a moiré pattern upon imaging second stack 2624.

Figure 26D:
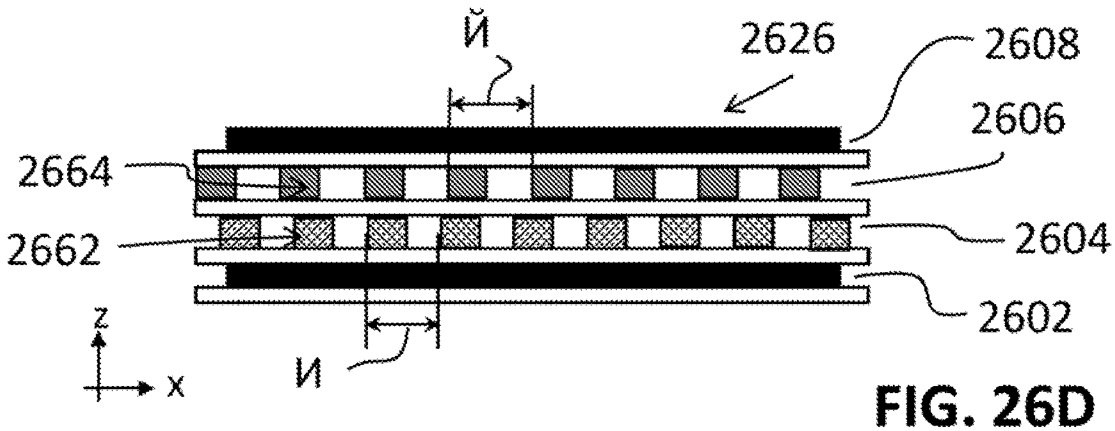

As seen particularly in FIG. 26D, in a preferred embodiment of the present invention, third stack 2626 includes a third stack first periodic structure (S3P1) 2662 formed together with second layer 2604 and having an S3P1 pitch, designated И, along one of third stack axes 2636. Preferably, third stack 2626 further includes a third stack second periodic structure (S3P2) 2664 formed together with third layer 2606 and having an S3P2 pitch, designated Й, along another of third stack axes 2636.

It is appreciated that S3P1 2662 and S3P2 2664 at least partially overlie one another, and thus a third stack moiré pattern 2670 is visible upon imaging third stack 2626. As is known in the art, third stack moiré pattern 2670 is characterized by a pitch $Д_3$, which is a function of pitch И and pitch Й, as shown in equation 65:

$$Д_3 = \frac{И \times Й}{|И - Й|} \quad \text{(Eq. 65)}$$

Preferably, third stack 2626 does not include periodic structures formed together with first layer 2602 or fourth layer 2608 which affect moiré pattern 2670. However, third stack 2626 may include periodic structures formed together with first layer 2606 or fourth layer 2608 which do not affect moiré pattern 2670, such as periodic structures which are periodic in a plane parallel to the x-y plane along an axis that is perpendicular to third stack axes 2636 or periodic structures having a pitch size that does not affect moiré pattern 2670.

Figure 26E:
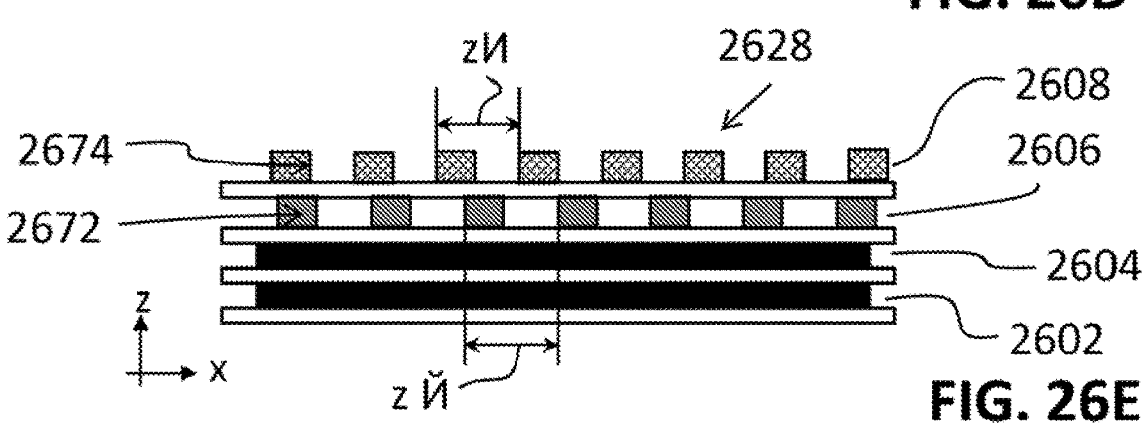

As seen particularly in FIG. 26E, in a preferred embodiment of the present invention, fourth stack 2628 includes a fourth stack first periodic structure (S4P1) 2672 formed together with third layer 2606 and having an S4P1 pitch, designated zin, along one of fourth stack axes 2638. Preferably, S4P1 pitch zЙ is related to S3P2 pitch Й by a fourth stack multiplicative factor, designated z. Fourth stack multiplicative factor z may be any positive number. Preferably, fourth stack 2628 further includes a fourth stack second periodic structure (S4P2) 2674 formed together with fourth layer 2608 and having an S4P2 pitch, designated zИ, along another of fourth stack axes 2638. Preferably, S4P2 pitch zH is related to S3P1 pitch И by fourth stack multiplicative factor z. It is appreciated that fourth stack multiplicative factor z relating S4P2 pitch zИ to S3P1 pitch И has the same value as fourth stack multiplicative factor z relating S4P1 pitch zЙ to S3P2 pitch Й. In an embodiment of the present invention, the value of z is 1 and thus S4P1 pitch zЙ is identical to S3P2 pitch Й and S4P2 pitch zИ is identical to S3P1 pitch И.

It is appreciated that S4P1 2672 and S4P2 2674 at least partially overlie one another, and thus a fourth stack moiré pattern 2680 is visible upon imaging fourth stack 2628. As is known in the art, fourth stack moiré pattern 2680 is characterized by a pitch $Д_4$, which is a function of fourth stack multiplicative factor z, pitch И and pitch Й, as shown in equation 66:

$$Д_4 = z\left(\frac{И \times Й}{|И - Й|}\right) \quad \text{(Eq. 66)}$$

Preferably, fourth stack 2628 does not include periodic structures formed together with first layer 2602 or second layer 2604 which affect moiré pattern 2680. However, fourth stack 2628 may include periodic structures formed together with first layer 2602 or second layer 2604 which do not affect moiré pattern 2680, such as periodic structures which are periodic in a plane parallel to the x-y plane along an axis that is perpendicular to fourth stack axes 2638 or periodic structures having a pitch size that does not affect moiré pattern 2680.

Misregistration between any two of layers 2602, 2604, 2606 and 2608 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches ү, Б, И, Й, zИ and zЙ need not be optically resolvable by the misregistration metrology tool used to generate an image of target 2600. However, it is preferable that each of pitches Ж, $Д_1$, $Д_3$ and $Д_4$ is optically resolvable by the misregistration metrology tool used to Д Дgenerate an image of target 2600.

Figure 27A:
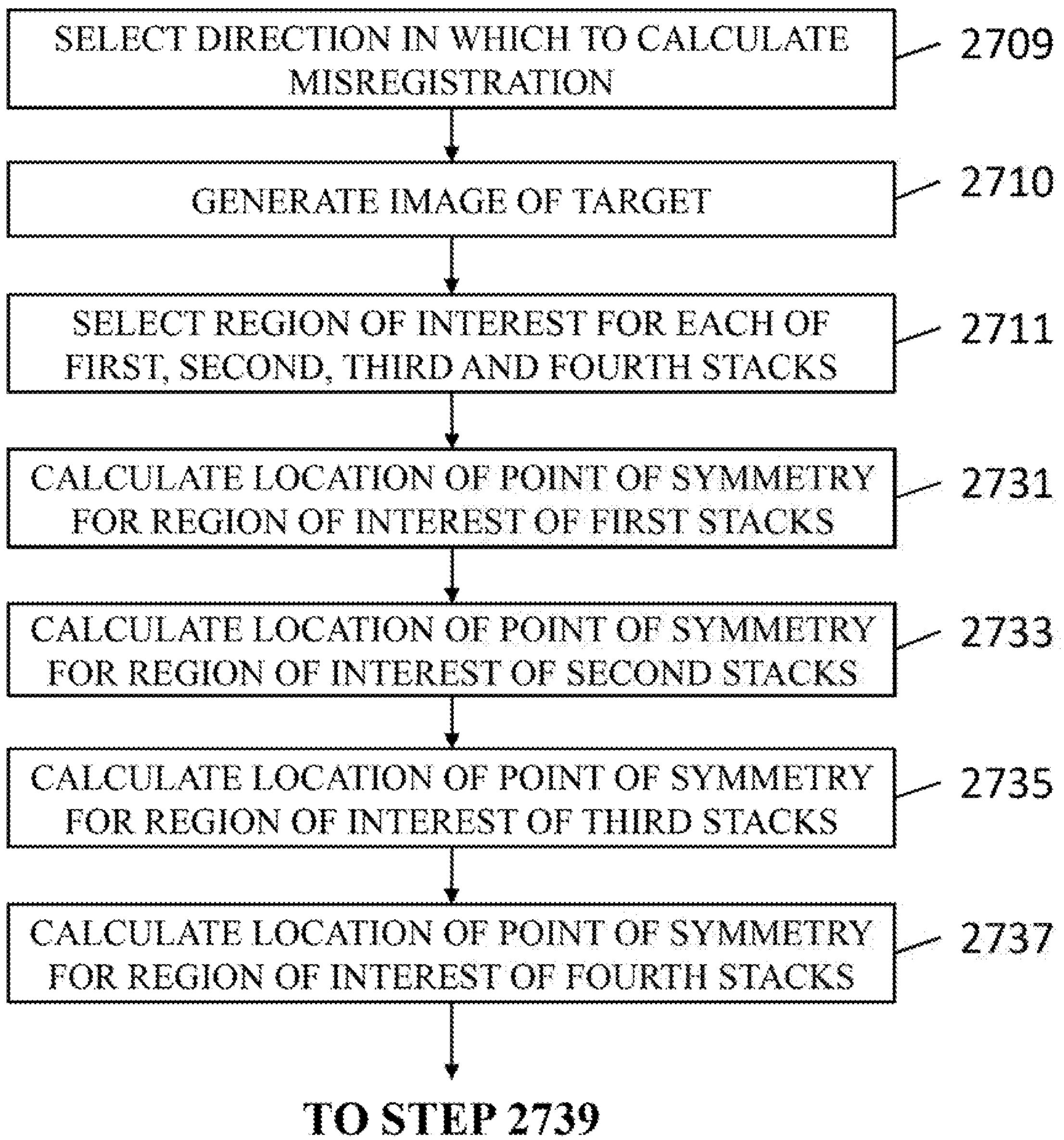
FIGS. 27A and 27B are together a simplified flowchart illustrating a preferred method of calculating misregistration between layers on which the multi-layered moiré target of FIGS. 25A-25E or of FIGS. 26A-26E is formed.
Figure 27B:
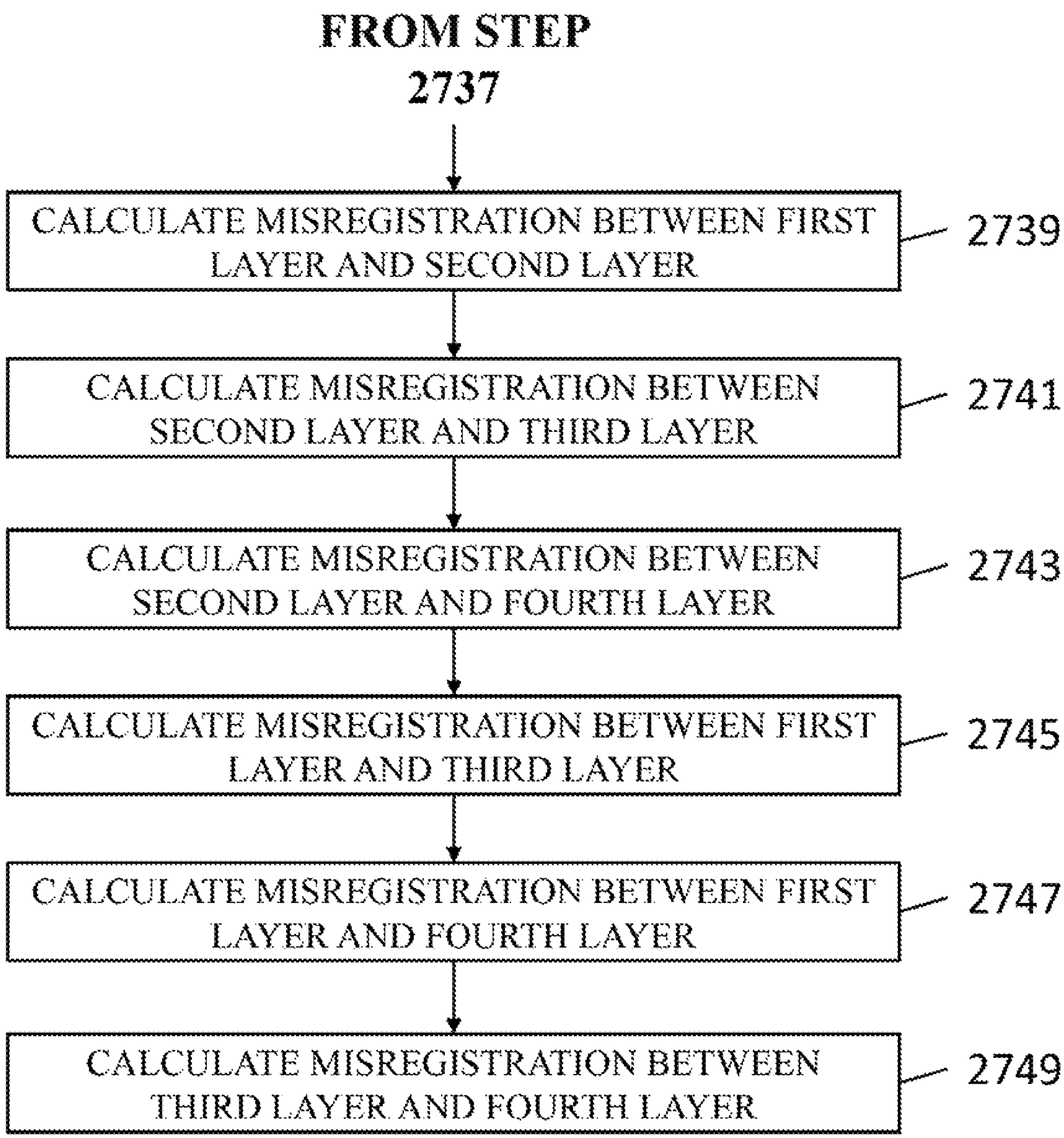
Figure 27C:
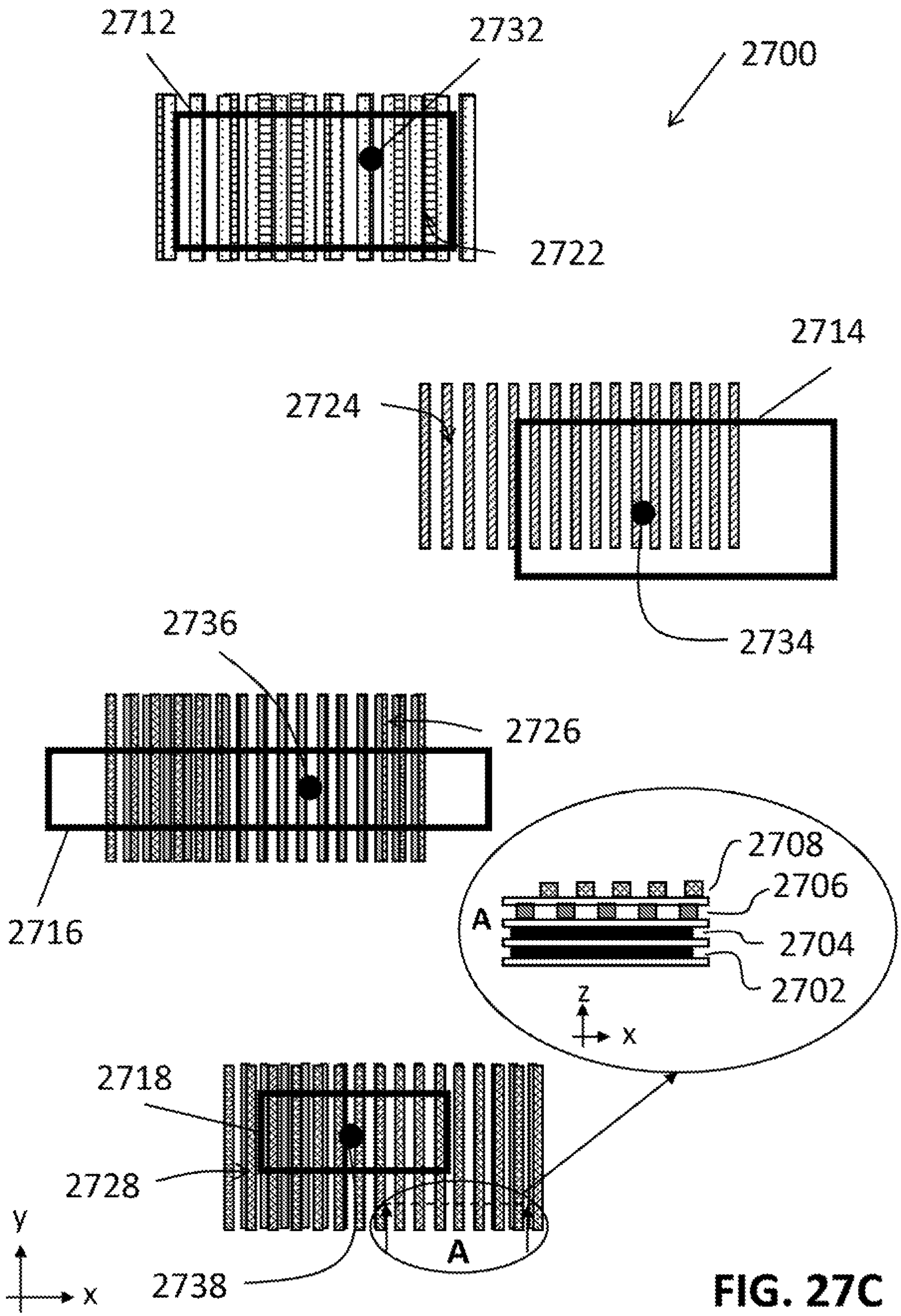
FIGS. 27C and 27D are simplified pictorial illustrations of first and second embodiments of a portion of the method of FIGS. 27A & 27B, respectively.
Figure 27D:
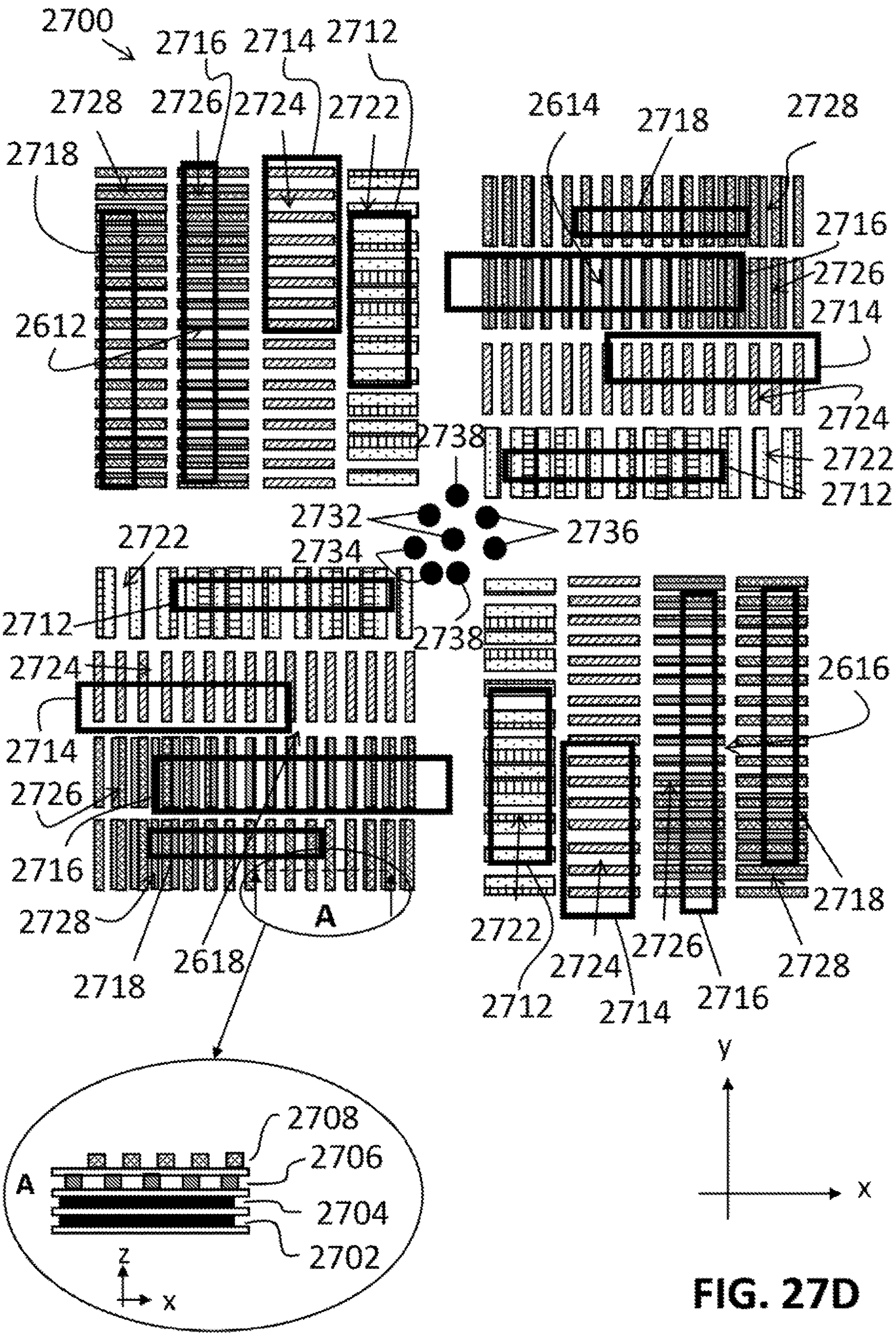

Reference is now made to FIGS. 27A & 27B, which together are a simplified flowchart illustrating a preferred method of calculating misregistration, using a multi-layered moiré target 2700, such as a target 2500 (FIGS. 25A-25E) or target 2600 (FIGS. 26A-26E), in a direction parallel to either the x or the y direction between a first, a second, a third and a fourth layer 2702, 2704, 2706 and 2708, such as layers 2502, 2504, 2506 and 2508 (FIGS. 25A-25E) or 2602, 2604, 2606 and 2608 (FIGS. 26A-26E) of a multilayered semiconductor device wafer formed with target 2700. Reference is further made to FIGS. 27C & 27D, which are simplified pictorial illustrations of first and second embodiments of a portion of the method of FIGS. 27A & 27B, respectively.

While it is appreciated that when utilizing target 2600 (FIGS. 26A-26E) the method described with reference to FIGS. 27A-27D may be performed only once to calculate misregistration in either the x or the y direction, typically, the method described in FIGS. 27A-27D will be performed twice, to calculate misregistration in each of the x and y directions. It is also appreciated that when utilizing target

2500 (FIGS. 25A-25E) misregistration may be calculated only in the one direction to which first, second, third stack and fourth stack axes 2532, 2534, 2536 and 2538 are parallel.

As seen at a first step 2709, a direction in which to measure misregistration is selected. When using target 2500 in the method of FIGS. 27A & 27B, the direction in which to measure misregistration is automatically selected to be the direction to which first, second, third and fourth stack axes 2532, 2534, 2536 and 2538 are parallel. When using target 2600 in the method of FIGS. 27A & 27B, the structures of quadrants 2614 and 2618 are utilized to measure misregistration in a direction parallel to the x-axis, and the structures of quadrants 2612 and 2616 to measure misregistration in a direction parallel to the y-axis.

Preferably, at a next step 2710, an image of target 2700 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches ק, ר, ם, ף, yם, yף, ץ, Б, И, Й, z И and z Й need not be optically resolvable by the misregistration metrology too used to generate the image of target 2700. However, it is preferable that each of pitches ת, $\text{ש}_1$, $\text{ש}_2$, $\text{ש}_3$, $\text{ש}_4$, Ж, $\text{Д}_1$, $\text{Д}_3$ and $\text{Д}_4$ is optically resolvable by the misregistration metrology tool used to generate the image of target 2700.

In a next step 2711, and as seen in FIGS. 27C & 27D, first, second, third and fourth regions of interest 2712, 2714, 2716 and 2718 are selected for each of respective first, second, third and fourth stacks 2722, 2724, 2726 and 2728, such as first, second, third and fourth stacks 2522, 2524, 2526 and 2528 (FIGS. 25A-25E) or first, second, third and fourth stacks 2622, 2624, 2626 and 2628 (FIGS. 26A-26E), in the quadrants selected in step 2709. It is appreciated, as seen in the illustrated embodiments of FIGS. 27C & 27D, that while first, second, third and fourth regions of interest 2712, 2714, 2716 and 2718 preferably lie entirely within each of respective first, second, third and fourth stacks 2722, 2724, 2726 and 2728, as illustrated for first and fourth regions of interest 2712 and 2718, which lie completely within respective first and fourth stacks 2722 and 2728, first, second, third and fourth regions of interest 2712, 2714, 2716 and 2718 may extend beyond respective first, second, third and fourth stacks 2722, 2724, 2726 and 2728, as illustrated for regions of interest 2714 and 2716, which extend beyond respective second and third stacks 2724 and 2726. It is further appreciated that regions of interest 2712, 2714, 2716 and 2718 shown in FIGS. 27C & 27D are representative regions of interest, and that other suitable regions of interest may be chosen at step 2711.

In a next step 2731, and as seen in FIGS. 27C & 27D, a location of a point of symmetry 2732 between all instances of first region of interest 2712 selected in step 2711 is calculated. In a next step 2733, and as seen in FIGS. 27C & 27D, a location of a point of symmetry 2734 between all instances of second region of interest 2714 selected in step 2711 is calculated. In a next step 2735, and as seen in FIGS. 27C & 27D, a location of a point of symmetry 2736 between all instances of third region of interest 2716 selected in step 2711 is calculated. In a next step 2737, and as seen in FIGS. 27C & 27D, a location of a point of symmetry 2738 between all instances of fourth region of interest 2718 selected in step 2711 is calculated.

At a next step 2739, a distance in the direction selected at step 2709 is calculated between the location of point of symmetry 2732 of first region or regions of interest 2712 identified at step 2731 and the location of point of symmetry 2734 of second region or regions of interest 2714 identified at step 2733. The distance found at step 2739 is divided by a gain $\text{Л}_1$, which for target 2500 is a function of pitches ק and ר, as shown in equation 67a:

$$\text{Л}_1 = \left|\frac{\text{ר}}{\text{Л} - \text{ר}} - 1\right| \quad \text{(Eq. 67a)}$$

and for target 2600 is a function of pitches ץ and Б, as shown in equation 67b:

$$\text{Л}_1 = \left|\frac{\text{Б}}{\text{ץ} - \text{Б}} - 1\right| \quad \text{(Eq. 67b)}$$

and the result is reported as the misregistration between first and second layers 2702 and 2704 in the direction selected at step 2709. It is appreciated that in addition to the distance calculated at step 2739, the method further calculates an adjustment direction, such as right, left, up or down. The adjustment direction is a function of the relative values of pitches ק and ר or pitches ץ and Б, as well as which of layers 2702 and 2704 is to be adjusted.

At a next step 2741, a distance in the direction selected at step 2709 is calculated between the location of point of symmetry 2734 of second region or regions of interest 2714 identified at step 2733 and the location of point of symmetry 2736 of third region or regions of interest 2716 identified at step 2735. The distance found at step 2741 is divided by a gain $\text{Л}_2$, which for target 2500 is a function of pitch ם and pitch ף, as shown in equation 68a:

$$\text{Л}_2 = \left(\frac{\text{ף}}{|\text{ם} - \text{ף}|}\right) \quad \text{(Eq. 68a)}$$

and for target 2600 is a function of pitch И and pitch Й, as shown in equation 68b:

$$\text{Л}_2 = \left(\frac{\text{Й}}{|\text{И} - \text{Й}|}\right) \quad \text{(Eq. 68b)}$$

and the result is reported as the misregistration between second and third layers 2704 and 2706 in the direction selected at step 2709. It is appreciated that in addition to the distance calculated at step 2741, the method further calculates an adjustment direction, such as right, left, up or down. The adjustment direction is a function of the relative values of pitches ם and ף or pitches И and Й, as well as which of layers 2704 and 2706 is to be adjusted.

At a next step 2743, a distance in the direction selected at step 2709 is calculated between the location of point of symmetry 2736 of third region or regions of interest 2716 identified at step 2735 and the location of point of symmetry 2738 of fourth region or regions of interest 2718 identified at step 2737. The distance found at step 2743 is divided by a gain $\text{Л}_3$, which for target 2500 is a function of pitch ם and pitch ף, as shown in equation 69a:

$$\text{Л}_3 = \left(\frac{\text{ם}}{|\text{ם} - \text{ך}|}\right) \quad \text{(Eq. 69a)}$$

and for target 2600 is a function of pitch И and pitch Й, as shown in equation 69b:

$$\text{Л}_3 = \left(\frac{\text{Й}}{|\text{И} - \text{Й}|}\right) \quad \text{(Eq. 69b)}$$

and the result is reported as the misregistration between second and fourth layers 2704 and 2708 in the direction selected at step 2709. It is appreciated that in addition to the distance calculated at step 2743, the method further calculates an adjustment direction, such as right, left, up or down. The adjustment direction is a function of the relative values of pitches ם and ך or pitches И and Й, as well as which of layers 2704 and 2708 is to be adjusted.

At a next step 2745, a difference is calculated between the misregistration value reported at step 2739 and the misregistration value reported at step 2741. The difference calculated at step 2745 is reported as the misregistration between first and third layers 2702 and 2706 in the direction selected at step 2709. It is appreciated that in addition to the distance calculated at step 2745, the method further calculates an adjustment direction, such as right, left, up or down. The adjustment direction is a function of the relative values of pitches ם and ך or pitches И and Й, as well as which of layers 2702 and 2706 is to be adjusted.

At a next step 2747, a difference is calculated between the misregistration value reported at step 2739 and the misregistration value reported at step 2743. The difference calculated at step 2747 is reported as the misregistration between first and fourth layers 2702 and 2708 in the direction selected at step 2709. It is appreciated that in addition to the distance calculated at step 2747, the method further calculates an adjustment direction, such as right, left, up or down. The adjustment direction is a function of the relative values of pitches ם and ך or pitches И and Й, as well as which of layers 2702 and 2708 is to be adjusted.

At a next step 2749, a difference is calculated between the misregistration value reported at step 2745 and the misregistration value reported at step 2747. Alternatively, at next step 2749, a difference is calculated between the misregistration value reported at step 2741 and the misregistration value reported at step 2743. The difference calculated at step 2749 is reported as the misregistration between third and fourth layers 2706 and 2708 in the direction selected at step 2709. It is appreciated that in addition to the distance calculated at step 2749, the method further calculates an adjustment direction, such as right, left, up or down. The adjustment direction is a function of the relative values of pitches ם and ך or pitches И and Й, as well as which of layers 2706 and 2708 is to be adjusted.

Preferably, in the embodiment described hereinabove wherein structures shown as being formed together with first and third layers 2702 and 2706 are all formed together with layer 2702, the method described hereinabove with reference to FIGS. 27A-27D proceeds to calculate and report a difference between the misregistration value reported at step 2739 and the misregistration value reported at step 2741. The difference between the misregistration values reported at steps 2739 and 2741 is useful in the calibration of the misregistration metrology tool used in the method of FIGS. 27A-27D.

Similarly, in the embodiment described hereinabove wherein structures shown as being formed together with first and third layers 2702 and 2706 are all formed together with layer 2702, the method described hereinabove with reference to FIGS. 27A-27D proceeds to calculate and report a difference between the misregistration value reported at step 2747 and the misregistration value reported at step 2749. The difference between the misregistration values reported at steps 2747 and 2749 is useful in the calibration of the misregistration metrology tool used in the method of FIGS. 27A-27D.

Preferably, in the embodiment described hereinabove wherein structures shown as being formed together with first and fourth layers 2702 and 2708 are all formed together with layer 2702, the method described hereinabove with reference to FIGS. 27A-27D proceeds to calculate and report a difference between the misregistration value reported at step 2739 and the misregistration value reported at step 2743. The difference between the misregistration values reported at steps 2739 and 2743 is useful in the calibration of the misregistration metrology tool used in the method of FIGS. 27A-27D.

Similarly, in the embodiment described hereinabove wherein structures shown as being formed together with first and fourth layers 2702 and 2708 are all formed together with layer 2702, the method described hereinabove with reference to FIGS. 27A-27D proceeds to calculate and report a difference between the misregistration value reported at step 2745 and the misregistration value reported at step 2749. The difference between the misregistration values reported at steps 2745 and 2749 is useful in the calibration of the misregistration metrology tool used in the method of FIGS. 27A-27D.

Preferably, in the embodiment described hereinabove wherein structures shown as being formed together with second and fourth layers 2704 and 2708 are all formed together with layer 2704, the method described hereinabove with reference to FIGS. 27A-27D proceeds to calculate and report a difference between the misregistration value reported at step 2739 and the misregistration value reported at step 2747. The difference between the misregistration values reported at steps 2739 and 2747 is useful in the calibration of the misregistration metrology tool used in the method of FIGS. 27A-27D.

Similarly, in the embodiment described hereinabove wherein structures shown as being formed together with second and fourth layers 2704 and 2708 are all formed together with layer 2704, the method described hereinabove with reference to FIGS. 27A-27D proceeds to calculate and report a difference between the misregistration value reported at step 2741 and the misregistration value reported at step 2749. The difference between the misregistration values reported at steps 2741 and 2749 is useful in the calibration of the misregistration metrology tool used in the method of FIGS. 27A-27D.

Reference is now made to FIGS. 28A-28E, which are simplified illustrations of another embodiment of a multi-layered moiré target 2800 of the present invention. FIGS. 28A-28E include illustrations in three different dimensions, indicated by x-, y- and z-axes, the three dimensions being referred to hereinafter as an x-y plane, an x-z plane and a y-z plane, respectively. It is noted that FIG. 28A generally illustrates the x-y plane, while FIGS. 28B, 28C, 28D and 28E illustrate planes parallel to the x-z plane.

Target 2800 is preferably formed on a semiconductor device wafer on which are preferably formed at least a first layer 2802, a second layer 2804, a third layer 2806 and a fourth layer 2808. It is appreciated that each of first layer 2802, second layer 2804, third layer 2806 and fourth layer 2808 defines a generally planar surface parallel to the x-y plane. First, second, third and fourth layers 2802, 2804, 2806 and 2808 may be adjacent layers but need not be. Preferably, any material between first, second, third and fourth layers 2802, 2804, 2806 and 2808 is at least partially transparent to electromagnetic radiation. In the embodiment illustrated in FIGS. 28A-28E, first layer 2802 lies below second, third and fourth layers 2804, 2806 and 2808, second layer 2804 lies below third and fourth layers 2806 and 2808, and fourth layer 2808 lies above first, second and third layers 2802, 2804 and 2806. It is appreciated, however, that layers 2802, 2804, 2806 and 2808 may be arranged in any suitable order along the z-axis with respect to one another.

Additionally, in an embodiment of the present invention, structures shown as being formed together with first and fourth layers 2802 and 2808 may all be formed together with layer 2802. In such an embodiment, no portion of target 2800 is formed together with layer 2808. Such an embodiment is particularly useful for calibration, as described hereinbelow with reference to FIGS. 30A-30D. Additionally, in another embodiment of the present invention, structures shown as being formed together with second and fourth layers 2804 and 2808 may all be formed together with layer 2804. In such an embodiment, no portion of target 2800 is formed together with layer 2808. Such an embodiment is particularly useful for calibration, as described hereinbelow with reference to FIGS. 30A-30D.

It is appreciated that FIGS. 28A-28E illustrate one possible layout of target 2800, and that in other embodiments of the present invention, target 2800 may include additional structures. For example, as described hereinbelow with reference to FIGS. 29A-29E & 34-39, a suitable target may include multiple instances of the structures shown in FIGS. 28A-28E, and those multiple instances may be arranged in various ways.

Preferably, target 2800 includes a first stack 2822 of periodic structures, a second stack 2824 of periodic structures, a third stack 2826 of periodic structures and a fourth stack 2828 of periodic structures. Each of first stack 2822, second stack 2824, third stack 2826 and fourth stack 2828 includes one or more periodic structures, each periodic structure having a pitch. Preferably, none of first stack 2822, second stack 2824, third stack 2826 and fourth stack 2828 overlap with one another.

It is appreciated that although in FIGS. 28A-28E, each of the periodic structures of first stack 2822, second stack 2824, third stack 2826 and fourth stack 2828 are shown as being formed of a plurality of lines and spaces, in other embodiments of the invention, the periodic structures of first stack 2822, second stack 2824, third stack 2826 and fourth stack 2828 may be formed of any suitable periodic features. It is further appreciated that the periodic features forming the periodic structures included in first stack 2822, second stack 2824, third stack 2826 and fourth stack 2828 may be formed of sub-structures. The pitches of each of the periodic structures of first stack 2822, second stack 2824, third stack 2826 and fourth stack 2828 are preferably between 10 nm-3000 nm, and more preferably between 200 nm-800 nm.

A first x-z plane 2831 intersects first stack 2822. A plurality of first axes 2832 lie within first x-z plane 2831 and are parallel to the x-axis. A second x-z plane 2833 intersects second stack 2824. A plurality of second axes 2834 lie within second x-z plane 2833 and are parallel to the x-axis. A third x-z plane 2835 intersects third stack 2826. A plurality of third axes 2836 lie within third x-z plane 2835 and are parallel to the x-axis. A fourth x-z plane 2837 intersects fourth stack 2828. A plurality of fourth axes 2638 lie within fourth x-z plane 2837 and are parallel to the x-axis.

Figure 28A:
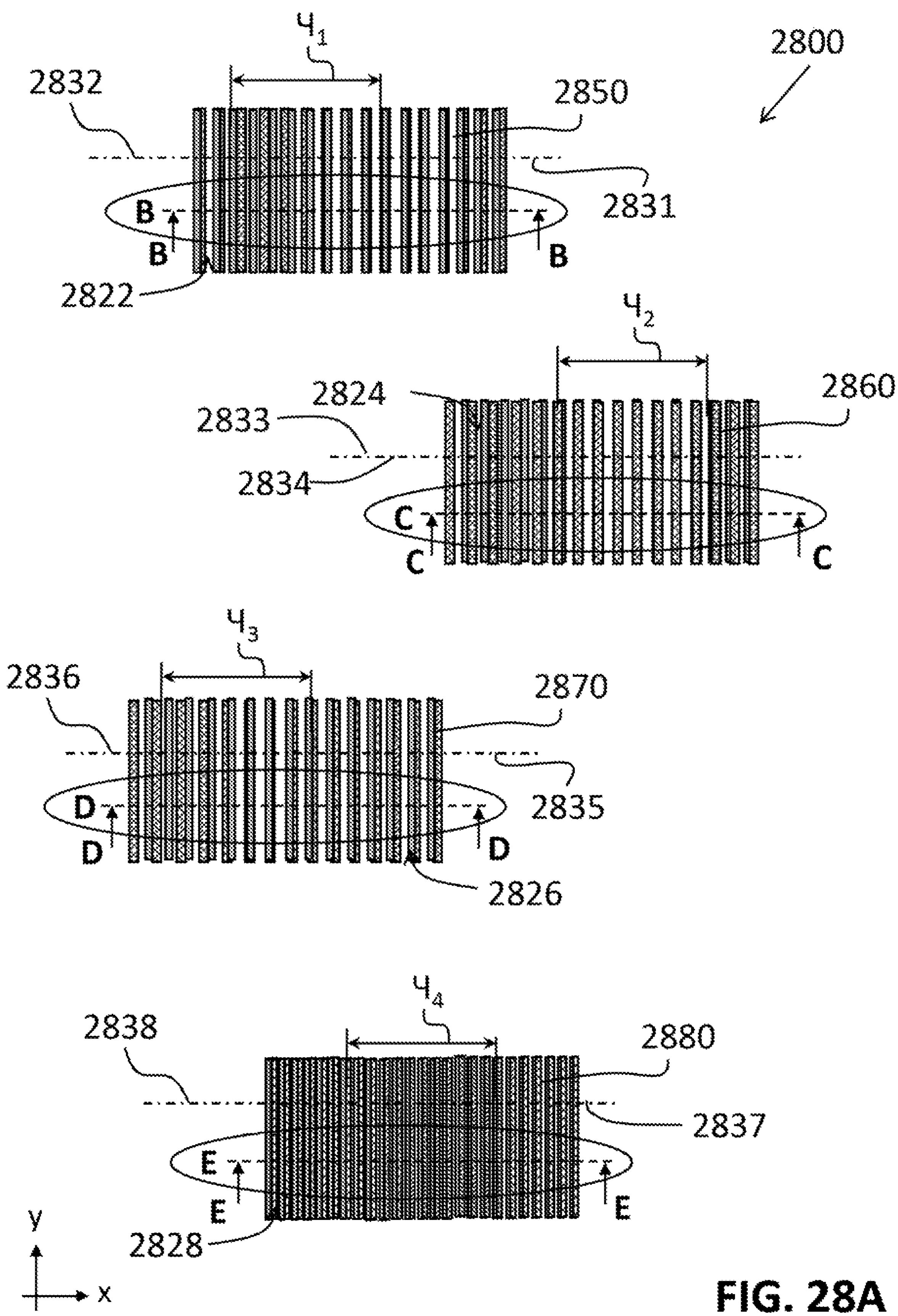
FIGS. 28A, 28B, 28C, 28D and 28E are simplified respective top view, first sectional side view, second sectional side view, third sectional side view and fourth sectional side view illustrations of another embodiment of a multi-layered moiré target of the present invention, FIGS. 28B, 28C, 28D and 28E being taken along lines B-B, C-C, D-D and E-E in FIG. 28A, respectively.
Figure 28B:
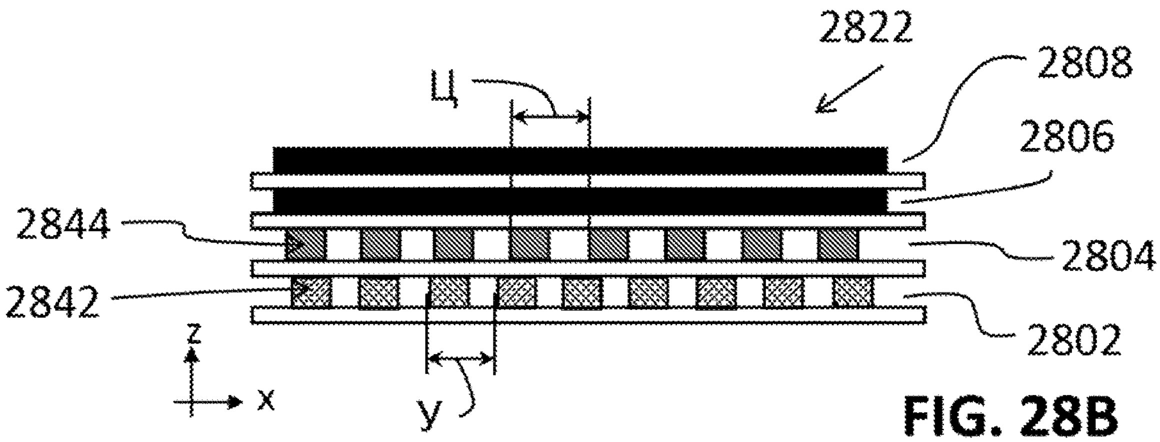

As seen particularly in FIG. 28B, in a preferred embodiment of the present invention, first stack 2822 includes a first stack first periodic structure (S1P1) 2842 formed together with first layer 2802 and having an S1P1 pitch, designated Y, along one of first stack axes 2832. Preferably, first stack 2822 further includes a first stack second periodic structure (S1P2) 2844 formed together with second layer 2804 and having an S1P2 pitch, designated Ц, along another of first stack axes 2832.

It is appreciated that S1P1 2842 and S1P2 2844 at least partially overlie one another, and thus a first stack moiré pattern 2850 is visible upon imaging first stack 2822. As is known in the art, first stack moiré pattern 2850 is characterized by a pitch $Ч_1$, which is a function of pitches У and Ц, as shown in equation 70:

$$Ч_1 = \frac{У \times Ц}{|У - Ц|} \quad \text{(Eq. 70)}$$

Preferably, first stack 2822 does not include periodic structures formed together with third layer 2806 or fourth layer 2808 which affect moiré pattern 2850. However, first stack 2822 may include periodic structures formed together with third layer 2806 or fourth layer 2808 which do not affect moiré pattern 2850, such as periodic structures which are periodic along an axis parallel to the y-axis or periodic structures having a pitch size that does not affect moiré pattern 2850.

Figure 28C:
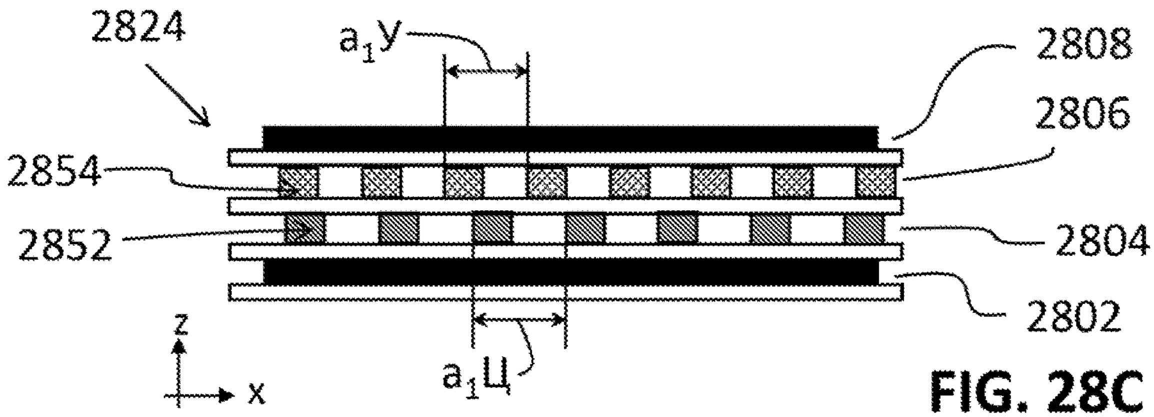

As seen particularly in FIG. 28C, in a preferred embodiment of the present text use z, 406 invention, second stack 2824 includes a second stack first periodic structure (S2P1) 2852 formed together with second layer 2804 and having an S2P1 pitch, designated $a_1$ Ц, along one of second stack axes 2834. Preferably, S2P1 pitch $a_1$ Ц is related to S1P2 pitch Ц by a second stack multiplicative factor, designated $a_1$. Second stack multiplicative factor $a_1$ may be any positive number. Preferably, second stack 2824 further includes a second stack second periodic structure (S2P2) 2854 formed together with third layer 2806 and having an S2P2 pitch, designated $a_1$ У, along another of second stack axes 2834. Preferably, S2P2 pitch $a_1$ У is related to S1P1 pitch У by second stack multiplicative factor $a_1$. It is appreciated that second stack multiplicative factor $a_1$ relating S2P2 pitch $a_1$ У to S1P2 pitch У has the same value as second stack multiplicative factor $a_1$ relating S2P1 pitch $a_1$ Ц to S1P2 pitch Ц. In an embodiment of the present invention, the value of $a_1$ is 1 and thus S2P1 pitch $a_1$ Ц is identical to S1P2 pitch Ц and S2P2 pitch $a_1$ У is identical to S1P1 pitch У.

It is appreciated that S2P1 2852 and S2P2 2854 at least partially overlie one another, and thus a second stack moiré pattern 2860 is visible upon imaging second stack 2824. As is known in the art, second stack moiré pattern 2860 is characterized by a pitch $Ч_2$, which is a function of second stack multiplicative factor $a_1$, pitch У and pitch Ц, as shown in equation 71:

$$Ч_2 = a_1\left(\frac{У \times Ц}{|У - Ц|}\right) \quad \text{(Eq. 71)}$$

Preferably, second stack 2824 does not include periodic structures formed together with first layer 2802 or fourth layer 2808 which affect moiré pattern 2860. However, second stack 2824 may include periodic structures formed together with first layer 2802 or fourth layer 2808 which do not affect moiré pattern 2860, such as periodic structures which are periodic along an axis parallel to the y-axis or periodic structures having a pitch size that does not affect moiré pattern 2860.

Figure 28D:
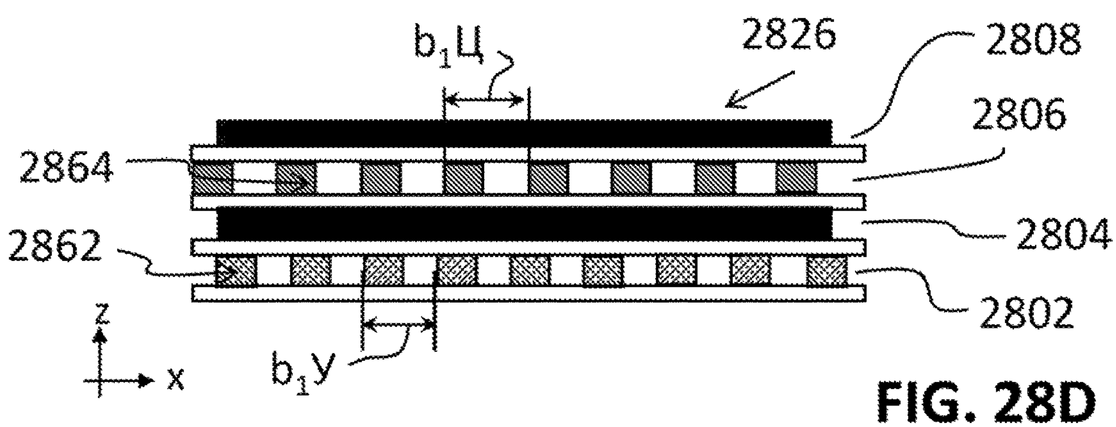

As seen particularly in FIG. 28D, in a preferred embodiment of the present invention, third stack 2826 includes a third stack first periodic structure (S3P1) 2862 formed together with first layer 2802 and having an S3P1 pitch, designated $b_1$ У, along one of third stack axes 2836. Preferably, S3P1 pitch $b_1$ У is related to S1P1 pitch У by a third stack multiplicative factor, designated $b_1$. Third stack multiplicative factor $b_1$ may be any positive number. Preferably, third stack 2826 further includes a third stack second periodic structure (S3P2) 2864 formed together with third layer 2806 and having an S3P2 pitch, designated $b_1$ Ц, along another of third stack axes 2836. Preferably, S3P2 pitch $b_1$ Ц is related to S1P2 pitch Ц by third stack multiplicative factor $b_1$. It is appreciated that third stack multiplicative factor $b_1$ relating S3P2 pitch $b_1$ Ц to S1P2 pitch Ц has the same value as third stack multiplicative factor $b_1$ relating S3P1 pitch $b_1$ У to S1P1 pitch У. In an embodiment of the present invention, the value of $b_1$ is 1 and thus S3P1 pitch $b_1$ У is identical to S1P1 pitch У and S3P2 pitch $b_1$ Ц is identical to S1P2 pitch Ц.

It is appreciated that S3P1 2862 and S3P2 2864 at least partially overlie one another, and thus a third stack moiré pattern 2870 is visible upon imaging third stack 2826. As is known in the art, third stack moiré pattern 2870 is characterized by a pitch $Ч_3$, third stack multiplicative factor $b_1$, pitch У and pitch Ц, as shown in equation 72:

$$Ч_3 = b_1\left(\frac{У \times Ц}{|У - Ц|}\right) \quad \text{(Eq. 72)}$$

Preferably, third stack 2826 does not include periodic structures formed together with second layer 2804 or fourth layer 2808 which affect moiré pattern 2870. However, third stack 2826 may include periodic structures formed together with second layer 2804 or fourth layer 2808 which do not affect moiré pattern 2870, such as periodic structures which are periodic along an axis parallel to the y-axis or periodic structures having a pitch size that does not affect moiré pattern 2870.

Figure 28E:
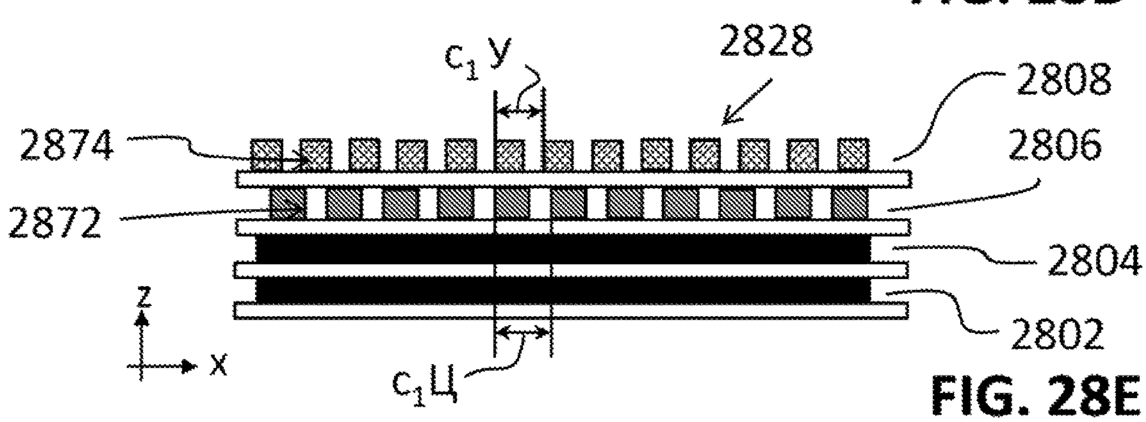

As seen particularly in FIG. 28E, in a preferred embodiment of the present invention, fourth stack 2828 includes a fourth stack first periodic structure (S4P1) 2872 formed together with third layer 2806 and having an S4P1 pitch, designated $c_1$ Ц, along one of fourth stack axes 2838. Preferably, S4P1 pitch $c_1$ Ц is related to S1P2 pitch Ц by a fourth stack multiplicative factor, designated $c_1$. Fourth stack multiplicative factor $c_1$ may be any positive number. Preferably, fourth stack 2828 further includes a fourth stack second periodic structure (S4P2) 2874 formed together with fourth layer 2808 and having an S4P2 pitch, designated $c_1$ У, along another of fourth stack axes 2838. Preferably, S4P2 pitch $c_1$ У is related to S1P1 pitch У by fourth stack multiplicative factor $c_1$. It is appreciated that fourth stack multiplicative factor $c_1$ relating S4P2 pitch $c_1$ У to S1P1 pitch У has the same value as fourth stack multiplicative factor $c_1$ relating S4P1 pitch $c_1$ У to S1P2 pitch У. In an embodiment of the present invention, the value of $c_1$ is 1 and thus S4P1 pitch $c_1$ У is identical to S1P2 pitch У and S4P2 pitch $c_1$ У is identical to S1P1 pitch У.

It is appreciated that S4P1 2872 and S4P2 2874 at least partially overlie one another, and thus a fourth stack moiré pattern 2880 is visible upon imaging fourth stack 2828. As is known in the art, fourth stack moiré pattern 2880 is characterized by a pitch $Ч_4$, which is a function of fourth stack multiplicative factor $c_1$, pitch У and pitch Ц, as shown in equation 73:

$$Ч_4 = c_1\left(\frac{У \times Ц}{|У - Ц|}\right) \quad \text{(Eq. 73)}$$

Preferably, fourth stack 2828 does not include periodic structures formed together with first layer 2802 or second layer 2804 which affect moiré pattern 2880. However, fourth stack 2828 may include periodic structures formed together with first layer 2802 or second layer 2804 which do not affect moiré pattern 2880, such as periodic structures which are periodic along an axis parallel to the y-axis or periodic structures having a pitch size that does not affect moiré pattern 2880

Misregistration between any two of layers 2802, 2804, 2806 and 2808 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches У, Ц, $a_1$ У, $a_1$ Ц, $b_1$ У, $b_1$ Ц, $c_1$ Ц and $c_1$ Ц need not be optically resolvable by the misregistration metrology tool used to generate an image of target 2800. However, it is preferable that each of pitches $Ч_1$, $Ч_2$, $Ч_3$ and $Ч_4$ is optically resolvable by the misregistration metrology tool used to generate an image of target 2800.

Reference is now made to FIGS. 29A-29E, which are simplified illustrations of another embodiment of a multi-layered moiré target 2900 of the present invention. FIGS. 29A-29E include illustrations in three different dimensions, indicated by x-, y- and z-axes, the three dimensions being referred to hereinafter as an x-y plane, an x-z plane and a y-z plane, respectively. It is noted that FIG. 29A generally illustrates the x-y plane, while FIGS. 29B, 29C, 29D and 29E illustrate planes parallel to the x-z plane.

It is noted that target 2900 is one example of an alternative layout of target 2800, described hereinabove with reference to FIGS. 28A-28E, and that additional layouts are described hereinbelow with reference to FIGS. 34-39. Target 2900 is preferably formed on a semiconductor device wafer on which are preferably formed at least a first layer 2902, a second layer 2904, a third layer 2906 and a fourth layer 2908. It is appreciated that each of first layer 2902, second layer 2904, third layer 2906 and fourth layer 2908 defines a generally planar surface parallel to the x-y plane. First, second, third and fourth layers 2902, 2904, 2906 and 2908 may be adjacent layers but need not be. Preferably, any material between first, second, third and fourth layers 2902, 2904, 2906 and 2908 is at least partially transparent to electromagnetic radiation. In the embodiment illustrated in FIGS. 29A-29E, first layer 2902 lies below second, third and fourth layers 2904, 2906 and 2908, second layer 2904 lies below third and fourth layers 2906 and 2908, and fourth layer 2908 lies above first, second and third layers 2902, 2904 and 2906. It is appreciated, however, that layers 2902,

2904, 2906 and 2908 may be arranged in any suitable order along the z-axis with respect to one another.

Additionally, in an embodiment of the present invention, structures shown as being formed together with first and fourth layers 2902 and 2908 may all be formed together with layer 2902. In such an embodiment, no portion of target 2900 is formed together with layer 2908. Such an embodiment is particularly useful for calibration, as described hereinbelow with reference to FIGS. 30A-30D. Additionally, in another embodiment of the present invention, structures shown as being formed together with second and fourth layers 2904 and 2908 may all be formed together with layer 2904. In such an embodiment, no portion of target 2900 is formed together with layer 2908. Such an embodiment is particularly useful for calibration, as described hereinbelow with reference to FIGS. 30A-30D.

Figure 29A:
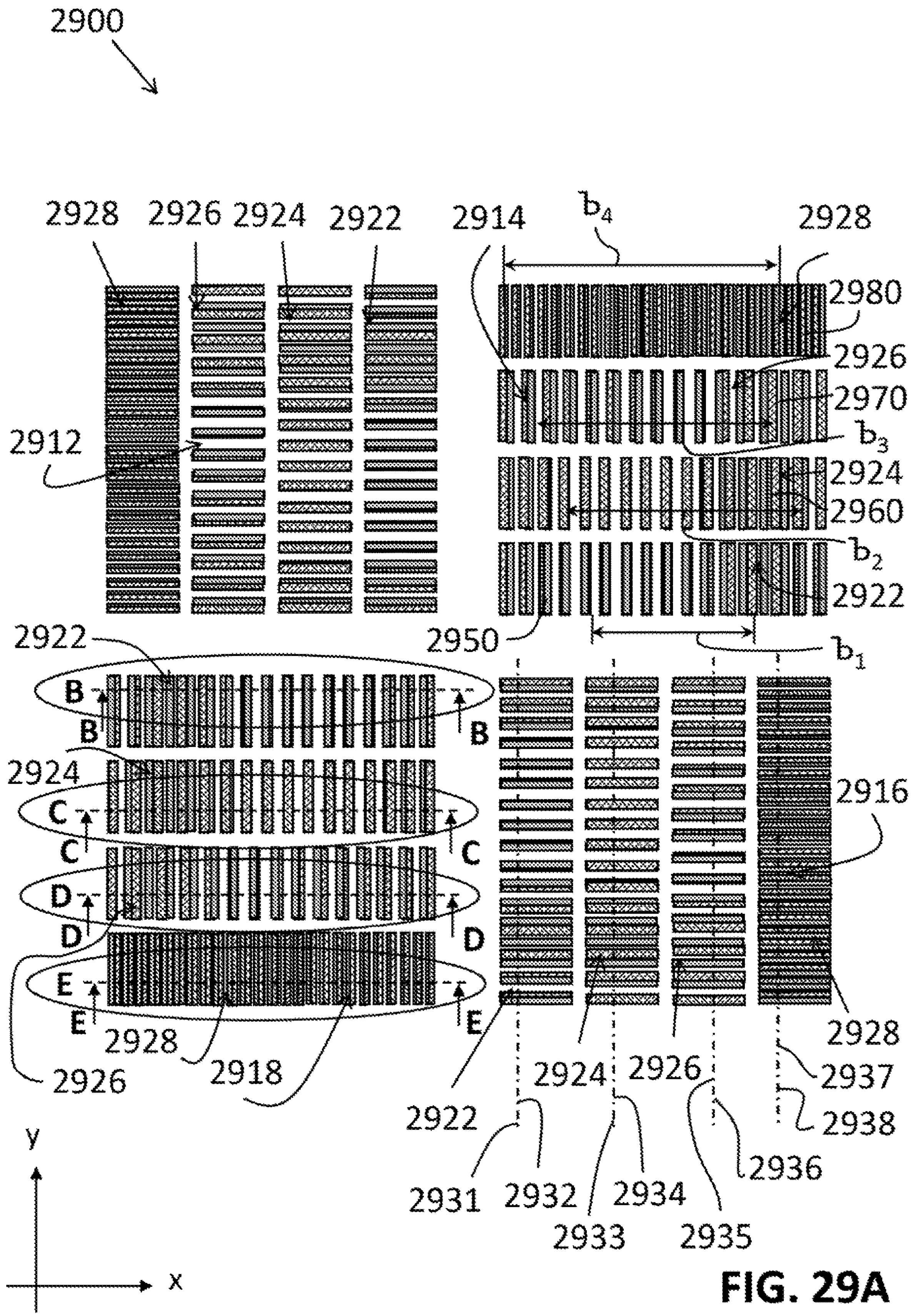
FIGS. 29A, 29B, 29C, 29D and 29E are simplified respective top view, first sectional side view, second sectional side view, third sectional side view and fourth sectional side view illustrations of another embodiment of a multi-layered moiré target of the present invention, FIGS. 29B, 29C, 29D and 29E being taken along lines B-B, C-C, D-D and E-E in FIG. 29A, respectively.

As seen particularly in FIG. 29A, target 2900 includes four target quadrants 2912, 2914, 2916 and 2918. In the embodiment shown in FIG. 29A, the rotational orientation in the x-y plane of each of target quadrants 2912, 2914, 2916 and 2918 preferably differs from the rotational orientation in the x-y plane of each of the other target quadrants 2912, 2914, 2916 and 2918 by an integer multiple of 90°. Additionally, target 2900 preferably is characterized by rotational symmetry in either the x-direction or the y-direction or both. In a preferred embodiment of the present invention, target 2900 is designed such that when in a state of registration, the entirety of target 2900 is characterized by a single point of symmetry in the x-direction and a single point of symmetry in the y-direction. However, even in such an embodiment, when in a state of misregistration, various elements of target 2900 will be characterized by unique points of symmetry.

Each of target quadrants 2912, 2914, 2916 and 2918 includes a first stack 2922 of periodic structures, a second stack 2924 of periodic structures, a third stack 2926 of periodic structures and a fourth stack 2928 of periodic structures. Each of first stack 2922, second stack 2924, third stack 2926 and fourth stack 2928 includes one or more periodic structures, each periodic structure having a pitch. Preferably, none of first stack 2922, second stack 2924, third stack 2926 and fourth stack 2928 overlap with one another. In FIGS. 29A-29E, first stack 2922 is illustrated as lying closer to the center of target 2900 than second stack 2924, third stack 2926 and fourth stack 2928, second stack 2924 is illustrated as lying closer to the center of target 2900 than third stack 2926 and fourth stack 2928, third stack 2926 is illustrated as lying closer to the edge of target 2900 than first stack 2922 and second stack 2924, and fourth stack 2928 is illustrated as lying closer to the edge of target 2900 than third stack 2926. However, first stack 2922, second stack 2924, third stack 2926 and fourth stack 2928 may be arranged in any suitable arrangement relative to the x-y plane with respect to one another.

It is appreciated that although in FIGS. 29A-29E, each of the periodic structures of first stack 2922, second stack 2924, third stack 2926 and fourth stack 2928 are shown as being formed of a plurality of lines and spaces, in other embodiments of the invention, the periodic structures of first stack 2922, second stack 2924, third stack 2926 and fourth stack 2928 may be formed of any suitable periodic features. It is further appreciated that the periodic features forming the periodic structures included in first stack 2922, second stack 2924, third stack 2926 and fourth stack 2928 may be formed of sub-structures. The pitches of each of the periodic structures of first stack 2922, second stack 2924, third stack 2926 and fourth stack 2928 are preferably between 10 nm-3000 nm, and more preferably between 200 nm-800 nm.

As seen in FIG. 29A, in each of quadrants 2912, 2914, 2916 and 2918, a first plane 2931, intersecting first stack 2922 and including a plurality of first axes 2932 lying therein, a second plane 2933, intersecting second stack 2924 and including a plurality of second axes 2934 lying therein, a third plane 2935, intersecting third stack 2926 and including a plurality of third axes 2936 lying therein, and a fourth plane 2937, intersecting fourth stack 2928 and including a plurality of fourth axes 2938 lying therein, are defined. Each of first plane 2931, second plane 2933, third plane 2935 and fourth plane 2937 are either an x-z plane or a y-z plane, and first axes 2932, second axes 2934, third axes 2936 and fourth axes 2938 are parallel to the respective x-axis or y-axis, depending on the orientation of first stack 2922, second stack 2924, third stack 2926 and fourth stack 2928 within each of quadrants 2912, 2914, 2916 and 2918. It is appreciated that in each of quadrants 2912, 2914, 2916 and 2918, first plane 2931, second plane 2933, third plane 2935 and fourth plane 2937 are all parallel to one another.

Figure 29B:
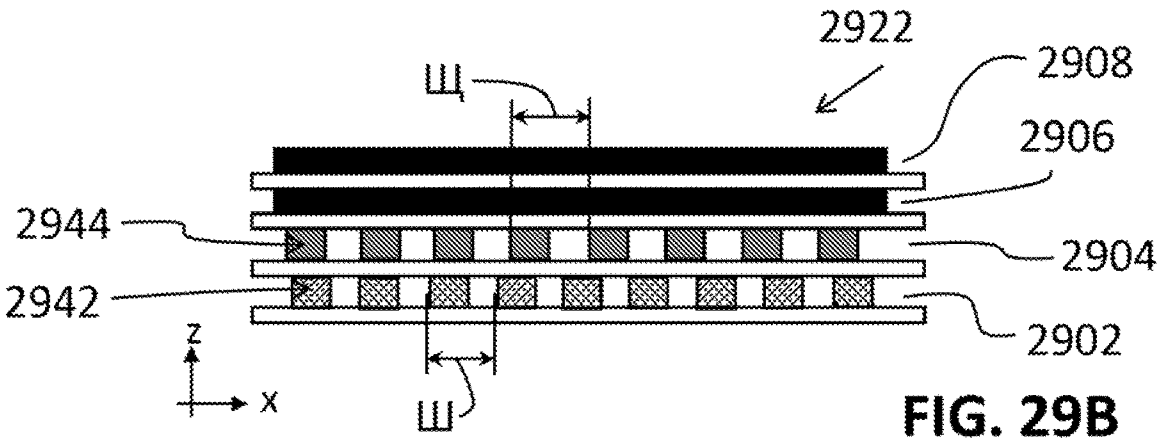

As seen particularly in FIG. 29B, in a preferred embodiment of the present invention, first stack 2922 includes a first stack first periodic structure (S1P1) 2942 formed together with first layer 2902 and having an S1P1 pitch, designated Ш, along one of first stack axes 2932. Preferably, first stack 2922 further includes a first stack second periodic structure (S1P2) 2944 formed together with second layer 2904 and having an S1P2 pitch, designated Щ, along another of first stack axes 2932.

It is appreciated that S1P1 2942 and S1P2 2944 at least partially overlie one another, and thus a first stack moiré pattern 2950 is visible upon imaging first stack 2922. As is known in the art, first stack moiré pattern 2950 is characterized by a pitch $Ъ_1$, which is a function of pitches Ш and Щ, as shown in equation 74:

$$Ъ_1 = \frac{Ш \times Щ}{|Ш - Щ|} \quad \text{(Eq. 74)}$$

Preferably, first stack 2922 does not include periodic structures formed together with third layer 2906 or fourth layer 2908 which affect moiré pattern 2950. However, first stack 2922 may include periodic structures formed together with third layer 2906 or fourth layer 2908 which do not affect moiré pattern 2950, such as periodic structures which are periodic in a plane parallel to the x-y plane along an axis that is perpendicular to first stack axes 2932 or periodic structures having a pitch size that does not affect moiré pattern 2950.

Figure 29C:
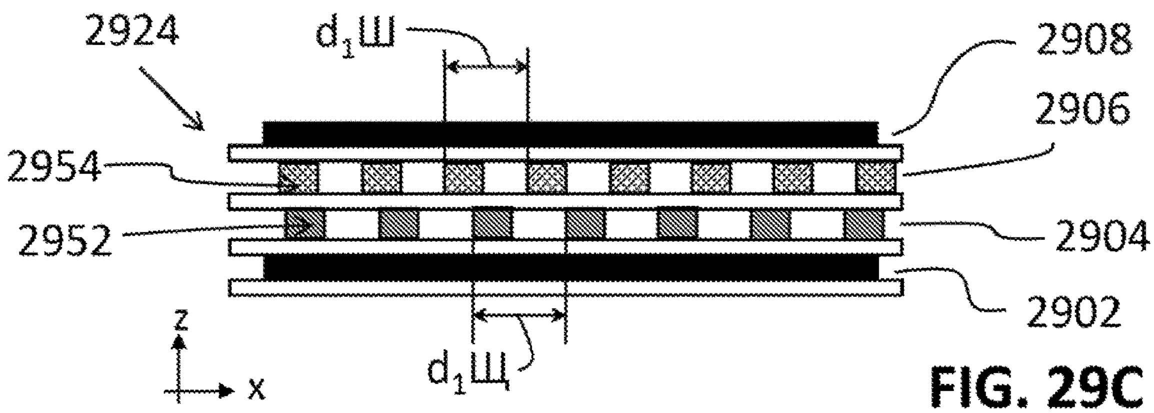

As seen particularly in FIG. 29C, in a preferred embodiment of the present invention, second stack 2924 includes a second stack first periodic structure (S2P1) 2952 formed together with second layer 2904 and having an S2P1 pitch, designated $d_1$Щ, along one of second stack axes 2934. Preferably, S2P1 pitch $d_1$Щ is related to S1P2 pitch Щ by a second stack multiplicative factor, designated $d_1$. Second stack multiplicative factor $d_1$ may be any positive number. Preferably, second stack 2924 further includes a second stack second periodic structure (S2P2) 2954 formed together with third layer 2906 and having an S2P2 pitch, designated $d_1$Ш, along another of second stack axes 2934. Preferably, S2P2 pitch $d_1$Ш is related to S1P1 pitch Ш by second stack multiplicative factor $d_1$. It is appreciated that second stack multiplicative factor $d_1$ relating S2P2 pitch $d_1$Ш to S1P2 pitch Ш has the same value as second stack multiplicative factor $d_1$ relating S2P1 pitch $d_1$Щ to S1P2 pitch Щ. In an embodiment of the present invention, the value of $d_1$ is 1 and thus S2P1 pitch $d_1$Щ is identical to S1P2 pitch Щ and S2P2 pitch $d_1$Ш is identical to S1P1 pitch Ш.

It is appreciated that S2P1 2952 and S2P2 2954 at least partially overlie one another, and thus a second stack moiré pattern 2960 is visible upon imaging second stack 2924. As is known in the art, second stack moiré pattern 2960 is characterized by a pitch $Ъ_2$, which is a function of second stack multiplicative factor $d_1$, pitch Ш and pitch Щ, as shown in equation 75:

$$\text{Ъ}_2 = d_1\left(\frac{\text{Ш} \times \text{Щ}}{|\text{Ш} - \text{Щ}|}\right) \quad \text{(Eq. 75)}$$

Preferably, second stack 2924 does not include periodic structures formed together with first layer 2902 or fourth layer 2908 which affect moiré pattern 2960. However, second stack 2924 may include periodic structures formed together with first layer 2902 or fourth layer 2908 which do not affect moiré pattern 2960, such as periodic structures which are periodic in a plane parallel to the x-y plane along an axis that is perpendicular to second stack axes 2934 or periodic structures having a pitch size that does not affect moiré pattern 2960.

Figure 29D:
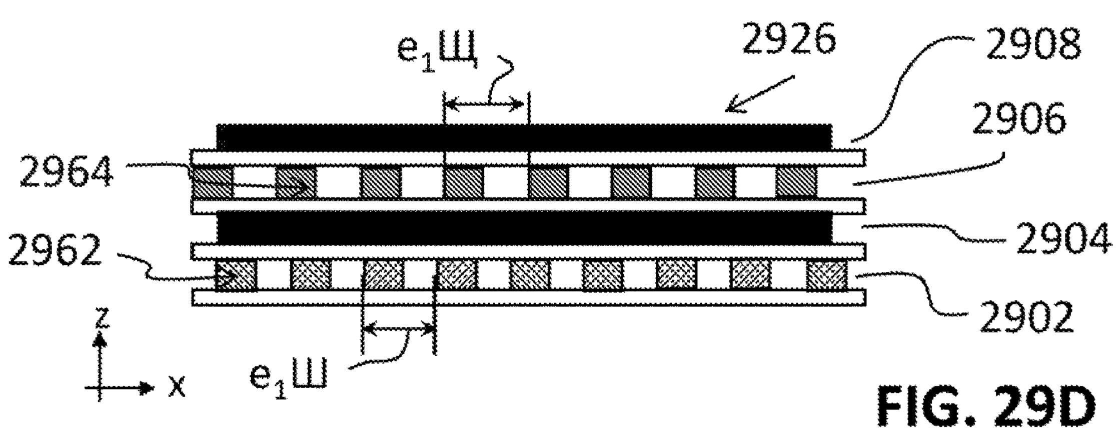

As seen particularly in FIG. 29D, in a preferred embodiment of the present invention, third stack 2926 includes a third stack first periodic structure (S3P1) 2962 formed together with first layer 2902 and having an S3P1 pitch, designated $e_1$Ш, along one of third stack axes 2936. Preferably, S3P1 pitch $e_1$Ш is related to S1P1 pitch Ш by a third stack multiplicative factor, designated $e_1$. Third stack multiplicative factor $e_1$ may be any positive number. Preferably, third stack 2926 further includes a third stack second periodic structure (S3P2) 2964 formed together with third layer 2906 and having an S3P2 pitch, designated $e_1$Щ, along another of third stack axes 2936. Preferably, S3P2 pitch $e_1$Щ is related to S1P2 pitch Щ by third stack multiplicative factor $e_1$. It is appreciated that third stack multiplicative factor $e_1$ relating S3P2 pitch $e_1$Щ to S1P2 pitch Щ has the same value as third stack multiplicative factor $e_1$ relating S3P1 pitch $e_1$Ш to S1P1 pitch Ш. In an embodiment of the present invention, the value of $e_1$ is 1 and thus S3P1 pitch $e_1$Ш is identical to S1P1 pitch Ш and S3P2 pitch $e_1$Щ is identical to S1P2 pitch Щ.

It is appreciated that S3P1 2962 and S3P2 2964 at least partially overlie one another, and thus a third stack moiré pattern 2970 is visible upon imaging third stack 2926. As is known in the art, third stack moiré pattern 2970 is characterized by a pitch $Ъ_3$, third stack multiplicative factor $e_1$, pitch Ш and pitch Щ, as shown in equation 76:

$$\text{Ъ}_3 = e_1\left(\frac{\text{Ш} \times \text{Щ}}{|\text{Ш} - \text{Щ}|}\right) \quad \text{(Eq. 76)}$$

Preferably, third stack 2926 does not include periodic structures formed together with second layer 2904 or fourth layer 2908 which affect moiré pattern 2970. However, third stack 2926 may include periodic structures formed together with second layer 2904 or fourth layer 2908 which do not affect moiré pattern 2970, such as periodic structures which are periodic in a plane parallel to the x-y plane along an axis that is perpendicular to third stack axes 2936 or periodic structures having a pitch size that does not affect moiré pattern 2970.

Figure 29E:
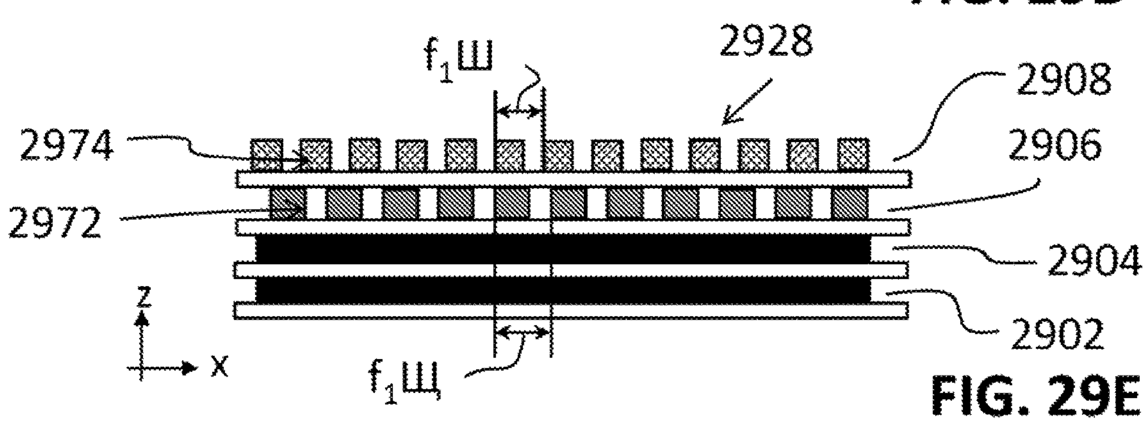

As seen particularly in FIG. 29E, in a preferred embodiment of the present invention, fourth stack 2928 includes a fourth stack first periodic structure (S4P1) 2972 formed together with third layer 2906 and having an S4P1 pitch, designated $f_1$Щ, along one of fourth stack axes 2938. Preferably, S4P1 pitch $f_1$Щ is related to S1P2 pitch Щ by a fourth stack multiplicative factor, designated $f_1$. Fourth stack multiplicative factor $f_1$ may be any positive number. Preferably, fourth stack 2928 further includes a fourth stack second periodic structure (S4P2) 2974 formed together with fourth layer 2908 and having an S4P2 pitch, designated $f_1$Ш, along another of fourth stack axes 2938. Preferably, S4P2 pitch $f_1$Ш is related to S1P1 pitch Ш by fourth stack multiplicative factor $f_1$. It is appreciated that fourth stack multiplicative factor $f_1$ relating S4P2 pitch $f_1$Ш to S1P1 pitch Ш has the same value as fourth stack multiplicative factor $f_1$ relating S4P1 pitch $f_1$Щ to S1P2 pitch Щ. In an embodiment of the present invention, the value of $f_1$ is 1 and thus S4P1 pitch $f_1$Щ is identical to S1P2 pitch Щ and S4P2 pitch $f_1$Ш is identical to S1P1 pitch Ш.

It is appreciated that S4P1 2972 and S4P2 2974 at least partially overlie one another, and thus a fourth stack moiré pattern 2980 is visible upon imaging fourth stack 2928. As is known in the art, fourth stack moiré pattern 2980 is characterized by a pitch $Ъ_4$, which is a function of fourth stack multiplicative factor $f_1$, pitch Ш and pitch Щ, as shown in equation 77:

$$\text{Ъ}_4 = f_1\left(\frac{\text{Ш} \times \text{Щ}}{|\text{Ш} - \text{Щ}|}\right) \quad \text{(Eq. 77)}$$

Preferably, fourth stack 2928 does not include periodic structures formed together with first layer 2902 or second layer 2904 which affect moiré pattern 2980. However, fourth stack 2928 may include periodic structures formed together with first layer 2902 or second layer 2904 which do not affect moiré pattern 2980, such as periodic structures which are periodic in a plane parallel to the x-y plane along an axis that is perpendicular to fourth stack axes 2938 or periodic structures having a pitch size that does not affect moiré pattern 2980.

Misregistration between any two of layers 2902, 2904, 2906 and 2908 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches Ш, Щ, $d_1$Ш, $d_1$Щ, $e_1$Ш, $e_1$Щ, $f_1$Ш and $f_1$Щ need not be optically resolvable by the misregistration metrology tool used to generate an image of target 2900. However, it is preferable that each of pitches $Ъ_1$, $Ъ_2$, $Ъ_3$ and $Ъ_4$ is optically resolvable by the misregistration metrology tool used to generate an image of target 2900.

Figure 30A:
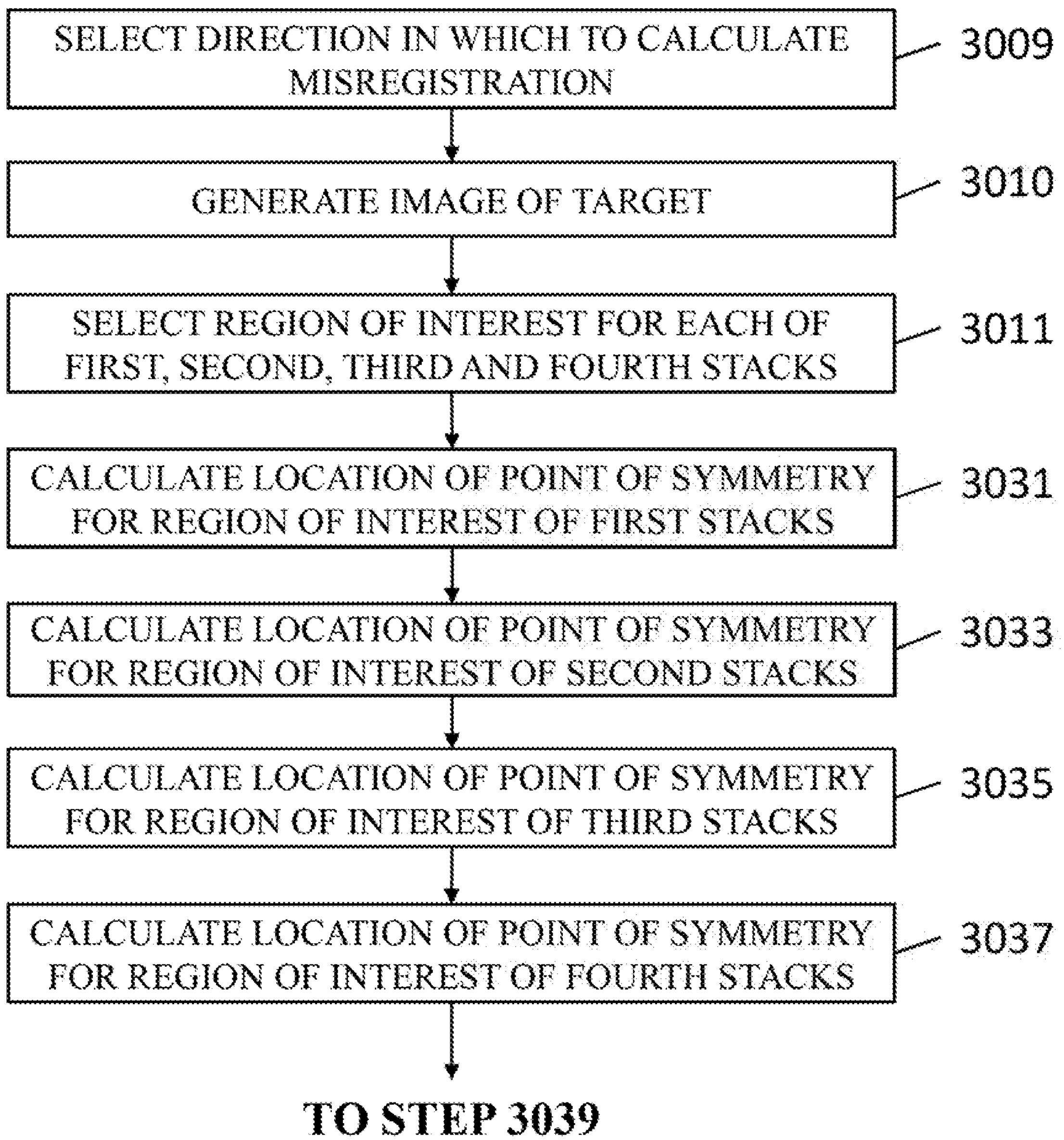
FIGS. 30A and 30B are together a simplified flowchart illustrating a preferred method of calculating misregistration between layers on which the multi-layered moiré target of FIGS. 28A-28E or of FIGS. 29A-29E is formed.
Figure 30B:
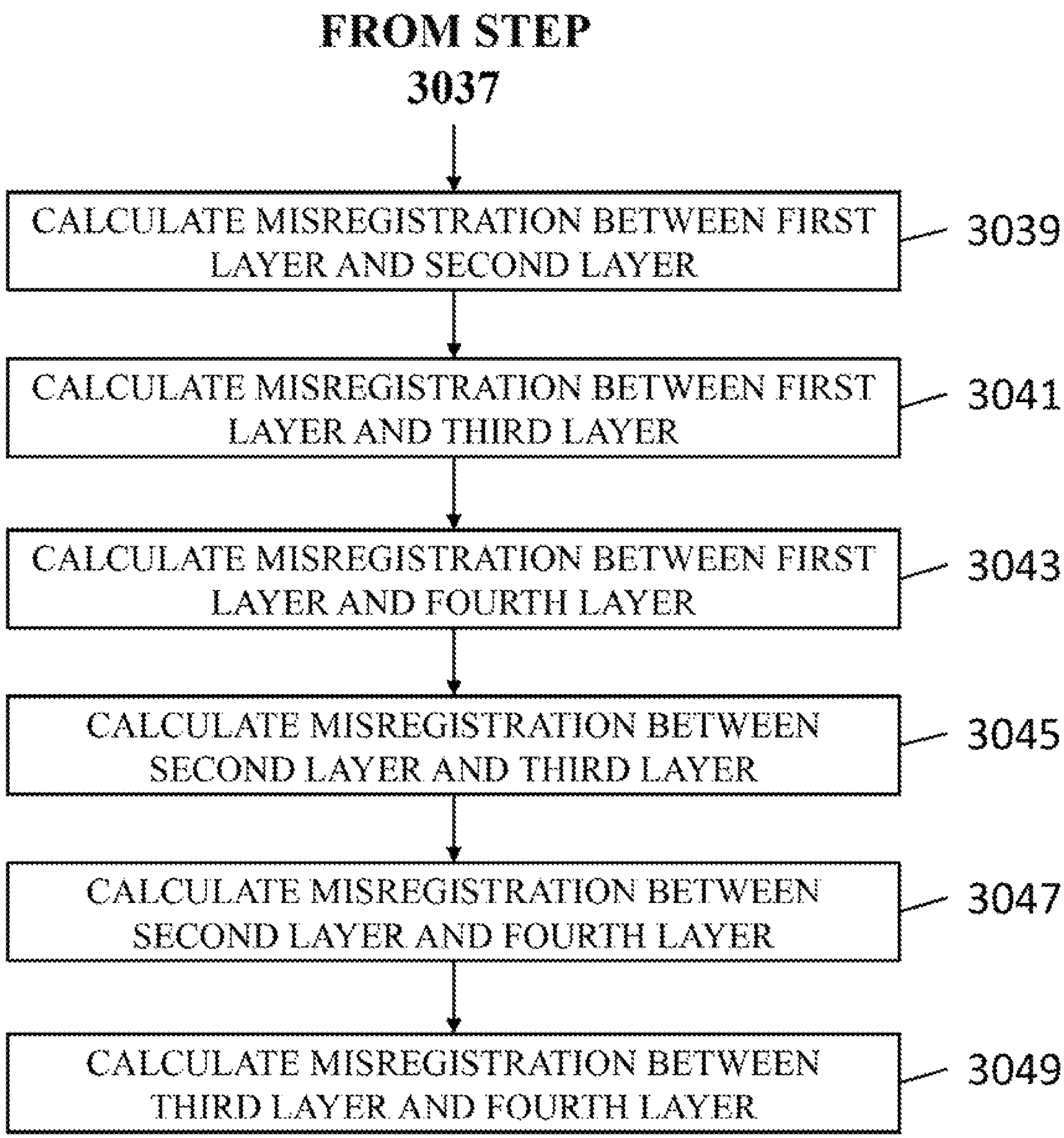
Figure 30C:
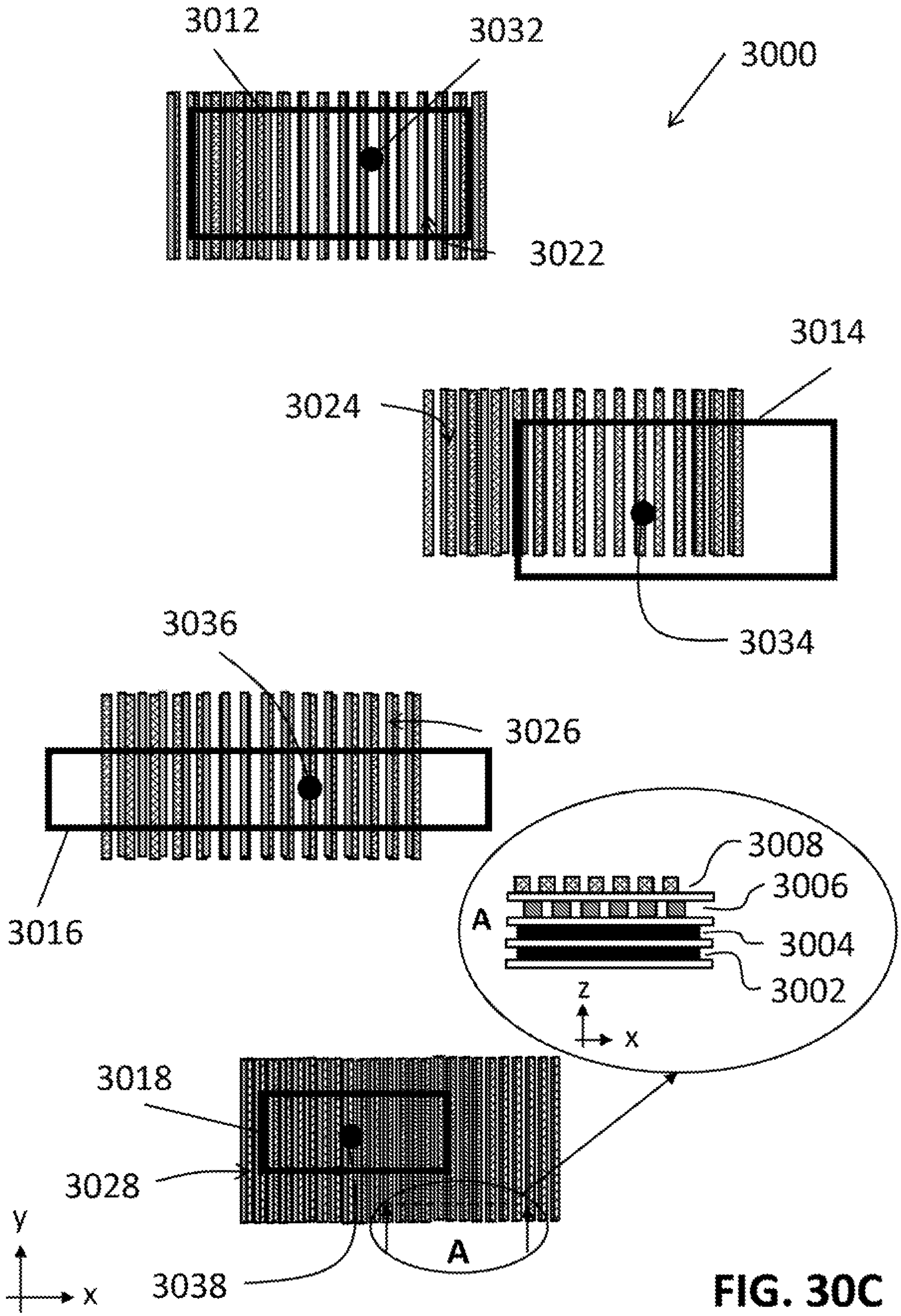
FIGS. 30C and 30D are simplified pictorial illustrations of first and second embodiments of a portion of the method of FIGS. 30A & 30B, respectively.
Figure 30D:
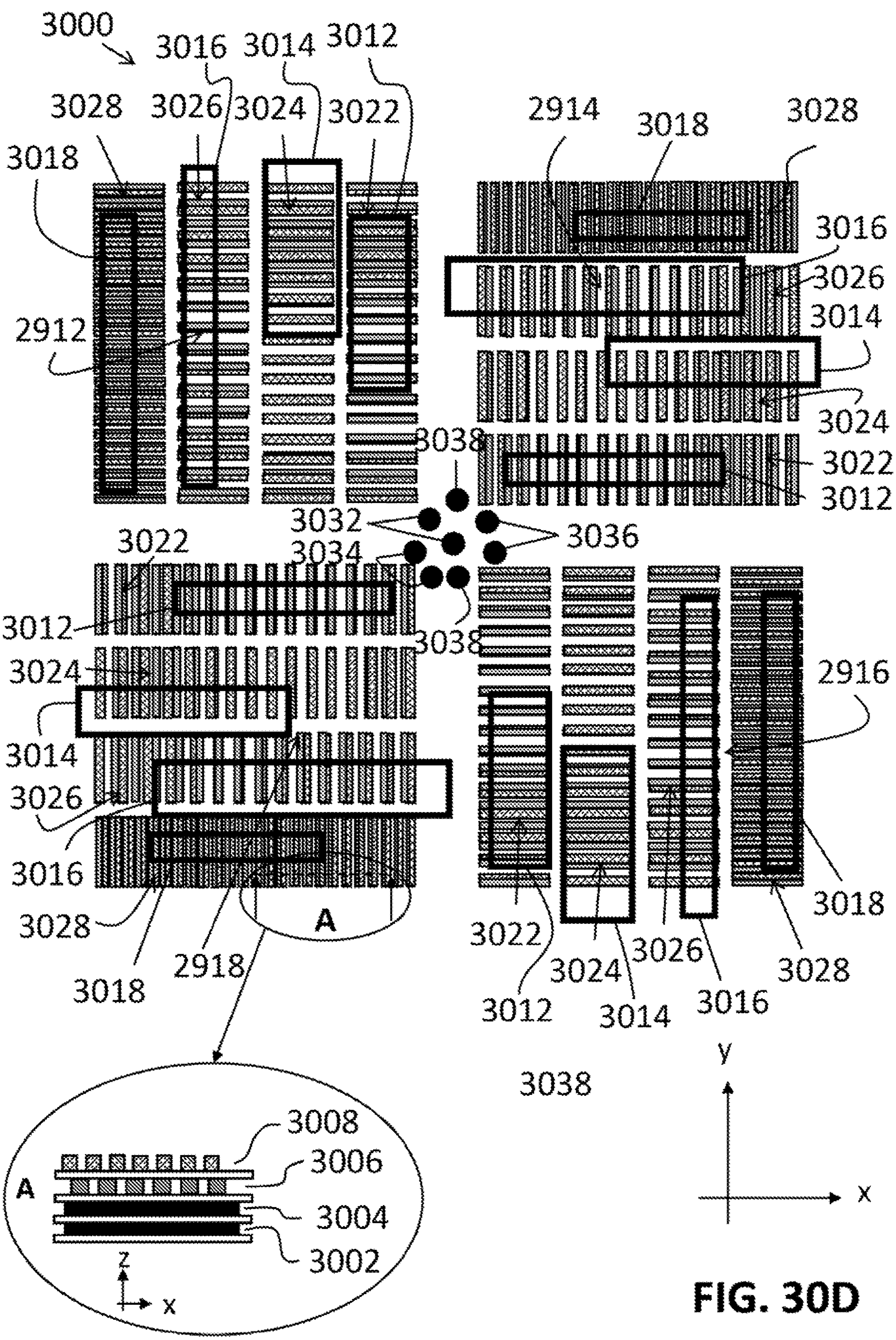

Reference is now made to FIGS. 30A & 30B, which together are a simplified flowchart illustrating a preferred method of calculating misregistration, using a multi-layered moiré target 3000, such as a target 2800 (FIGS. 28A-28E) or target 2900 (FIGS. 29A-29E), in a direction parallel to either the x or the y direction between a first, a second, a third and a fourth layer 3002, 3004, 3006 and 3008, such as layers 2802, 2804, 2806 and 2808 (FIGS. 28A-28E) or 2902, 2904, 2906 and 2908 (FIGS. 29A-29E) of a multilayered semiconductor device wafer formed with target 3000. Reference is further made to FIGS. 30C & 30D, which are simplified pictorial illustrations of first and second embodiments of a portion of the method of FIGS. 30A & 30B, respectively.

While it is appreciated that when utilizing target 2900 (FIGS. 29A-29E) the method described with reference to FIGS. 30A-30D may be performed only once to calculate misregistration in either the x or the y direction, typically, the method described in FIGS. 30A-30D will be performed twice, to calculate misregistration in each of the x and y directions. It is also appreciated that when utilizing target 2800 (FIGS. 28A-28E) misregistration may be calculated only in the one direction to which first, second, third stack and fourth stack axes 2832, 2834, 2836 and 2838 are parallel.

As seen at a first step 3009, a direction in which to measure misregistration is selected. When using target 2800 in the method of FIGS. 30A & 30B, the direction in which to measure misregistration is automatically selected to be the direction to which first, second, third and fourth stack axes 2832, 2834, 2836 and 2838 are parallel. When using target 2900 in the method of FIGS. 30A & 30B, the structures of quadrants 2914 and 2918 are utilized to measure misregistration in a direction parallel to the x-axis, and the structures of quadrants 2912 and 2916 to measure misregistration in a direction parallel to the y-axis.

Preferably, at a next step 3010, an image of target 3000 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches У, Ц, $a_1$ У, $a_1$ Ц, $b_1$ У, $b_1$ Ц, $c_1$ У, $c_1$ Ц, Ш, Щ, $d_1$ Ш, $d_1$ Щ, $e_1$ Ш, $e_1$ Щ, $f_1$ Ш and $f_1$ Щ need not be optically resolvable by the misregistration metrology tool used to generate the image of target 3000. However, it is preferable that each of pitches $Ч_1$, $Ч_2$, $Ч_3$, $Ч_4$, $Ъ_1$, $Ъ_2$, $Ъ_3$ and $Ъ_4$ is optically resolvable by the misregistration metrology tool used to generate the image of target 3000.

In a next step 3011, and as seen in FIGS. 30C & 30D, first, second, third and fourth regions of interest 3012, 3014, 3016 and 3018 are selected for each of respective first, second, third and fourth stacks 3022, 3024, 3026 and 3028, such as first, second, third and fourth stacks 2822, 2824, 2826 and 2828 (FIGS. 28A-28E) or first, second, third and fourth stacks 2922, 2924, 2926 and 2928 (FIGS. 29A-29E), in the quadrants selected in step 3009. It is appreciated, as seen in the illustrated embodiments of FIGS. 30C & 30D, that while first, second, third and fourth regions of interest 3012, 3014, 3016 and 3018 preferably lie entirely within each of respective first, second, third and fourth stacks 3022, 3024, 3026 and 3028, as illustrated for first and fourth regions of interest 3012 and 3018, which lie completely within respective first and fourth stacks 3022 and 3028, first, second, third and fourth regions of interest 3012, 3014, 3016 and 3018 may extend beyond respective first, second, third and fourth stacks 3022, 3024, 3026 and 3028, as illustrated for regions of interest 3014 and 3016, which extend beyond respective second and third stacks 3024 and 3026. It is further appreciated that regions of interest 3012, 3014, 3016 and 3018 shown in FIGS. 30C & 30D are representative regions of interest, and that other suitable regions of interest may be chosen at step 3011.

In a next step 3031, and as seen in FIGS. 30C & 30D, a location of a point of symmetry 3032 between all instances of first region of interest 3012 selected in step 3011 is calculated. In a next step 3033, and as seen in FIGS. 30C & 30D, a location of a point of symmetry 3034 between all instances of second region of interest 3014 selected in step 3011 is calculated. In a next step 3035, and as seen in FIGS. 30C & 30D, a location of a point of symmetry 3036 between all instances of third region of interest 3016 selected in step 3011 is calculated. In a next step 3037, and as seen in FIGS. 30C & 30D, a location of a point of symmetry 3038 between all instances of fourth region of interest 3018 selected in step 3011 is calculated.

At a next step 3039, a distance in the direction selected at step 3009 is calculated between the location of point of symmetry 3032 of first region or regions of interest 3012 identified at step 3031 and the location of point of symmetry 3034 of second region or regions of interest 3014 identified at step 3033. The distance found at step 3039 is divided by a gain $Э_1$, which for target 2800 is a function of pitch У and pitch Ц, as shown in equation 78a:

$$Э_1 = \frac{Ц}{|Ц - У|} \quad \text{(Eq. 78a)}$$

and for target 2900 is a function of pitch Ш and pitch Щ, as shown in equation 78b:

$$Э_1 = \frac{Щ}{|Щ - Ш|} \quad \text{(Eq. 78b)}$$

and the result is reported as the misregistration between first and second layers 3002 and 3004 in the direction selected at step 3009. It is appreciated that in addition to the distance calculated at step 3039, the method further calculates an adjustment direction, such as right, left, up or down. The adjustment direction is a function of the relative values of pitch У and pitch Ц or pitch Ш and pitch Щ, as well as which of layers 3002 and 3004 is to be adjusted.

At a next step 3041, a distance in the direction selected at step 3009 is calculated between the location of point of symmetry 3032 of first region or regions of interest 3012 identified at step 3031 and the location of point of symmetry 3036 of third region or regions of interest 3016 identified at step 3035. The distance found at step 3041 is divided by a gain $Э_2$, which for target 2800 is a function of pitch У and pitch Ц as shown in equation 79a:

$$Э_2 = \left(\frac{У}{|Ц - У|}\right) \quad \text{(Eq. 79a)}$$

and for target 2900 is a function of pitch Ш and pitch Щ, as shown in equation 79b:

$$Э_2 = \frac{Ш}{|Щ - Ш|} \quad \text{(Eq. 79b)}$$

and the result is reported as the misregistration between first and third layers 3002 and 3006 in the direction selected at step 3009. It is appreciated that in addition to the distance calculated at step 3041, the method further calculates an adjustment direction, such as right, left, up or down. The adjustment direction is a function of the relative values of pitch У and pitch Ц or pitch Ш and pitch Щ, as well as which of layers 3002 and 3006 is to be adjusted.

At a next step 3043, a distance in the direction selected at step 3009 is calculated between the location of point of symmetry 3036 of third region or regions of interest 3016 identified at step 3035 and the location of point of symmetry 3038 of fourth region or regions of interest 3018 identified at step 3037. The distance found at step 3043 is divided by a gain $Э_3$, which for target 2800 is a function of pitch У and pitch Ц, as shown in equation 80a:

$$Э_3 = \left(\frac{Ц}{|Ц - У|}\right) \quad \text{(Eq. 80a)}$$

and for target 2900 is a function of pitch Ш and pitch Щ, as shown in equation 80b:

$$Э_3 = \frac{Щ}{|Щ - Ш|} \quad \text{(Eq. 80b)}$$

and the result is reported as the misregistration between first and fourth layers 3002 and 3008 in the direction selected at step 3009. It is appreciated that in addition to the distance calculated at step 3043, the method further calculates an adjustment direction, such as right, left, up or down. The adjustment direction is a function of the relative values of pitch У and pitch Ц or pitch Ш and pitch Щ, as well as which of layers 3002 and 3008 is to be adjusted.

At a next step 3045, a difference is calculated between the misregistration value reported at step 3039 and the misregistration value reported at step 3041. The difference calculated at step 3045 is reported as the misregistration between second and third layers 3004 and 3006 in the direction selected at step 3009. It is appreciated that in addition to the distance calculated at step 3045, the method further calculates an adjustment direction, such as right, left, up or down. The adjustment direction is a function of the relative values of pitch У and pitch Ц or pitch Ш and pitch Щ, as well as which of layers 3004 and 3006 is to be adjusted.

At a next step 3047, a difference is calculated between the misregistration value reported at step 3039 and the misregistration value reported at step 3043. The difference calculated at step 3047 is reported as the misregistration between second and fourth layers 3004 and 3008 in the direction selected at step 3009. It is appreciated that in addition to the distance calculated at step 3047, the method further calculates an adjustment direction, such as right, left, up or down. The adjustment direction is a function of the relative values of pitch У and pitch Ц or pitch Ш and pitch Щ, as well as which of layers 3004 and 3008 is to be adjusted.

At a next step 3049, a difference is calculated between the misregistration value reported at step 3041 and the misregistration value reported at step 3043. Alternatively, at next step 3049, a difference is calculated between the misregistration value reported at step 3045 and the misregistration value reported at step 3047. The difference calculated at step 3049 is reported as the misregistration between third and fourth layers 3006 and 3008 in the direction selected at step 3009. It is appreciated that in addition to the distance calculated at step 3049, the method further calculates an adjustment direction, such as right, left, up or down. The adjustment direction is a function of the relative values of pitch У and pitch Ц or pitch Ш and pitch Щ, as well as which of layers 3006 and 3008 is to be adjusted.

Preferably, in the embodiment described hereinabove wherein structures shown as being formed together with first and fourth layers 3002 and 3008 are all formed together with layer 3002, the method described hereinabove with reference to FIGS. 30A-30D proceeds to calculate and report a difference between the misregistration value reported at step 3039 and the misregistration value reported at step 3047. The difference between the misregistration values reported at steps 3039 and 3047 is useful in the calibration of the misregistration metrology tool used in the method of FIGS. 30A-30D.

Similarly, in the embodiment described hereinabove wherein structures shown as being formed together with first and fourth layers 3002 and 3008 are all formed together with layer 3002, the method described hereinabove with reference to FIGS. 30A-30D proceeds to calculate and report a difference between the misregistration value reported at step 3041 and the misregistration value reported at step 3049. The difference between the misregistration values reported at steps 3041 and 3049 is useful in the calibration of the misregistration metrology tool used in the method of FIGS. 30A-30D.

Preferably, in the embodiment described hereinabove wherein structures shown as being formed together with second and fourth layers 3004 and 3008 are all formed together with layer 3004, the method described hereinabove with reference to FIGS. 30A-30D proceeds to calculate and report a difference between the misregistration value reported at step 3039 and the misregistration value reported at step 3043. The difference between the misregistration values reported at steps 3039 and 3043 is useful in the calibration of the misregistration metrology tool used in the method of FIGS. 30A-30D.

Similarly, in the embodiment described hereinabove wherein structures shown as being formed together with second and fourth layers 3004 and 3008 are all formed together with layer 3004, the method described hereinabove with reference to FIGS. 30A-30D proceeds to calculate and report a difference between the misregistration value reported at step 3045 and the misregistration value reported at step 3049. The difference between the misregistration values reported at steps 3045 and 3049 is useful in the calibration of the misregistration metrology tool used in the method of FIGS. 30A-30D.

Reference is now made to FIGS. 31A-31E, which are simplified illustrations of another embodiment of a multi-layered moiré target 3100 of the present invention. FIGS. 31A-31E include illustrations in three different dimensions, indicated by x-, y- and z-axes, the three dimensions being referred to hereinafter as an x-y plane, an x-z plane and a y-z plane, respectively. It is noted that FIG. 31A generally illustrates the x-y plane, while FIGS. 31B, 31C, 31D and 31E illustrate planes parallel to the x-z plane.

Target 3100 is preferably formed on a semiconductor device wafer on which are preferably formed at least a first layer 3102, a second layer 3104, a third layer 3106 and a fourth layer 3108. It is appreciated that each of first layer 3102, second layer 3104, third layer 3106 and fourth layer 3108 defines a generally planar surface parallel to the x-y plane. First, second, third and fourth layers 3102, 3104, 3106 and 3108 may be adjacent layers but need not be. Preferably, any material between first, second, third and fourth layers 3102, 3104, 3106 and 3108 is at least partially transparent to electromagnetic radiation. In the embodiment illustrated in FIGS. 31A-31E, first layer 3102 lies below second, third and fourth layers 3104, 3106 and 3108, second layer 3104 lies below third and fourth layers 3106 and 3108, and fourth layer 3108 lies above first, second and third layers 3102, 3104 and 3106. It is appreciated, however, that layers 3102,

3104, 3106 and 3108 may be arranged in any suitable order along the z-axis with respect to one another.

Additionally, in an embodiment of the present invention, structures shown as being formed together with first and third layers 3102 and 3106 may all be formed together with layer 3102. In such an embodiment, no portion of target 3100 is formed together with layer 3106. Such an embodiment is particularly useful for calibration, as described hereinbelow with reference to FIGS. 33A-33D. Additionally, in another embodiment of the present invention, structures shown as being formed together with first and fourth layers 3102 and 3108 may all be formed together with layer 3102. In such an embodiment, no portion of target 3100 is formed together with layer 3108. Such an embodiment is particularly useful for calibration, as described hereinbelow with reference to FIGS. 33A-33D. Additionally, in another embodiment of the present invention, structures shown as being formed together with second and third layers 3104 and 3106 may all be formed together with layer 3104. In such an embodiment, no portion of target 3100 is formed together with layer 3106. Such an embodiment is particularly useful for calibration, as described hereinbelow with reference to FIGS. 33A-33D. Additionally, in another embodiment of the present invention, structures shown as being formed together with second and fourth layers 3104 and 3108 may all be formed together with layer 3104. In such an embodiment, no portion of target 3100 is formed together with layer 3108. Such an embodiment is particularly useful for calibration, as described hereinbelow with reference to FIGS. 33A-33D. Additionally, in another embodiment of the present invention, structures shown as being formed together with third and fourth layers 3106 and 3108 may all be formed together with layer 3106. In such an embodiment, no portion of target 3100 is formed together with layer 3108. Such an embodiment is particularly useful for calibration, as described hereinbelow with reference to FIGS. 33A-33D.

It is appreciated that FIGS. 31A-31E illustrate one possible layout of target 3100, and that in other embodiments of the present invention, target 3100 may include additional structures. For example, as described hereinbelow with reference to FIGS. 32A-32E & 34-39, a suitable target may include multiple instances of the structures shown in FIGS. 31A-31E, and those multiple instances may be arranged in various ways.

Preferably, target 3100 includes a first stack 3122 of periodic structures, a second stack 3124 of periodic structures, a third stack 3126 of periodic structures and a fourth stack 3128 of periodic structures. Each of first stack 3122, second stack 3124, third stack 3126 and fourth stack 3128 includes one or more periodic structures, each periodic structure having a pitch. Preferably, none of first stack 3122, second stack 3124, third stack 3126 and fourth stack 3128 overlap with one another.

It is appreciated that although in FIGS. 31A-31E, each of the periodic structures of first stack 3122, second stack 3124, third stack 3126 and fourth stack 3128 are shown as being formed of a plurality of lines and spaces, in other embodiments of the invention, the periodic structures of first stack 3122, second stack 3124, third stack 3126 and fourth stack 3128 may be formed of any suitable periodic features. It is further appreciated that the periodic features forming the periodic structures included in first stack 3122, second stack 3124, third stack 3126 and fourth stack 3128 may be formed of sub-structures. The pitches of each of the periodic structures of first stack 3122, second stack 3124, third stack 3126 and fourth stack 3128 are preferably between 10 nm-3000 nm, and more preferably between 200 nm-800 nm.

A first x-z plane 3131 intersects first stack 3122. A plurality of first axes 3132 lie within first x-z plane 3131 and are parallel to the x-axis. A second x-z plane 3133 intersects second stack 3124. A plurality of second axes 3134 lie within second x-z plane 3133 and are parallel to the x-axis. A third x-z plane 3135 intersects third stack 3126. A plurality of third axes 3136 lie within third x-z plane 3135 and are parallel to the x-axis. A fourth x-z plane 3137 intersects fourth stack 3128. A plurality of fourth axes 3138 lie within fourth x-z plane 3137 and are parallel to the x-axis.

Figure 31A:
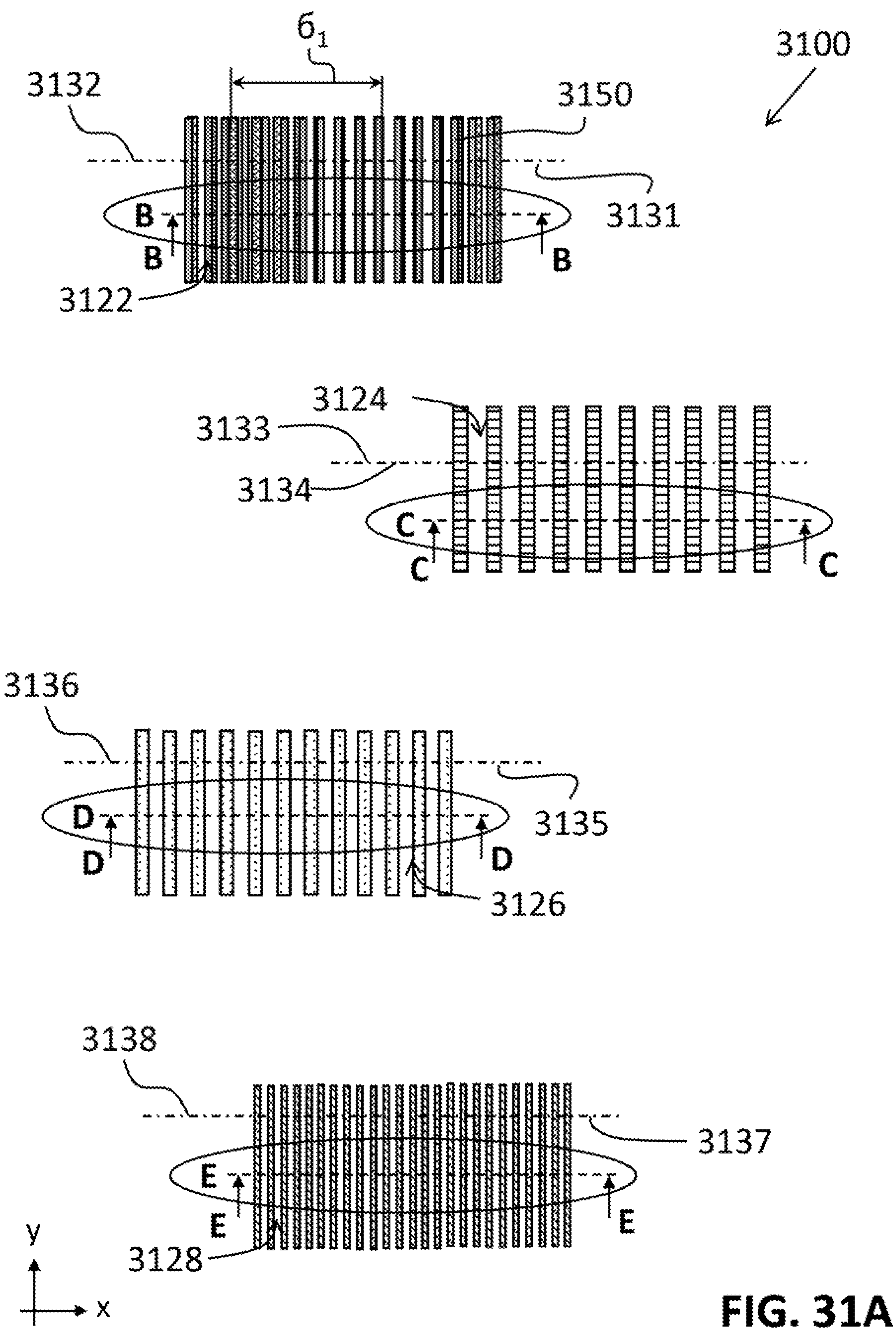
FIGS. 31A, 31B, 31C, 31D and 31E are simplified respective top view, first sectional side view, second sectional side view, third sectional side view and fourth sectional side view illustrations of another embodiment of a multi-layered moiré target of the present invention, FIGS. 31B, 31C, 31D and 31E being taken along lines B-B, C-C, D-D and E-E in FIG. 31A, respectively.
Figure 31B:
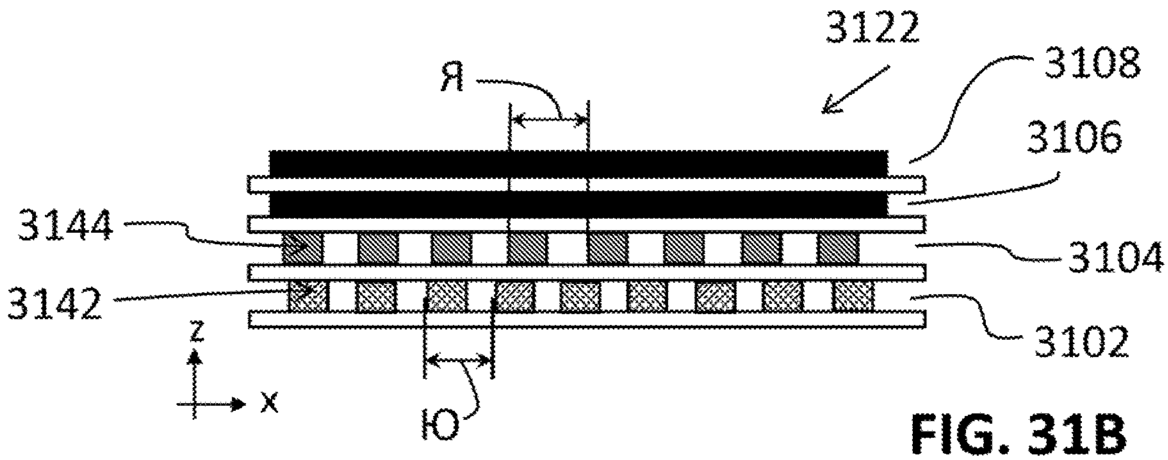

As seen particularly in FIG. 31B, in a preferred embodiment of the present invention, first stack 3122 includes a first stack first periodic structure (S1P1) 3142 formed together with first layer 3102 and having an S1P1 pitch, designated Ю, along one of first stack axes 3132. Preferably, first stack 3122 further includes a first stack second periodic structure (S1P2) 3144 formed together with second layer 3104 and having an S1P2 pitch, designated Я, along another of first stack axes 3132.

It is appreciated that S1P1 3142 and S1P2 3144 at least partially overlie one another, and thus a first stack moiré pattern 3150 is visible upon imaging first stack 3122. As is known in the art, first stack moiré pattern 3150 is characterized by a pitch $\text{б}_1$, which is a function of pitches Ю and Я, as shown in equation 81:

$$\text{б}_1 = \frac{\text{Ю} \times \text{Я}}{|\text{Ю} - \text{Я}|} \qquad \text{(Eq. 81)}$$

Preferably, first stack 3122 does not include periodic structures formed together with third layer 3106 or fourth layer 3108 which affect moiré pattern 3150. However, first stack 3122 may include periodic structures formed together with third layer 3106 or fourth layer 3108 which do not affect moiré pattern 3150, such as periodic structures which are periodic along an axis parallel to the y-axis or periodic structures having a pitch size that does not affect moiré pattern 3150

Figure 31C:
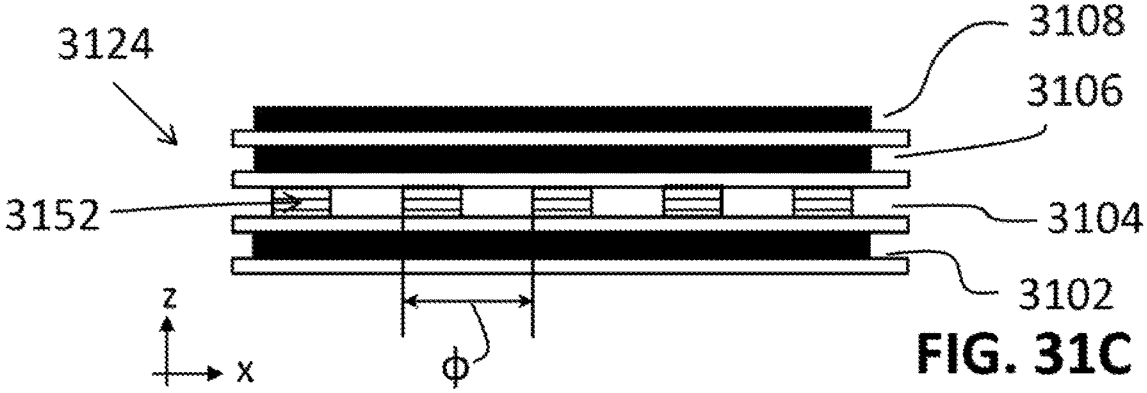

As seen particularly in FIG. 31C, in a preferred embodiment of the present invention, second stack 3124 includes a second stack first periodic structure (S2P1) 3152 formed together with second layer 3104 and having an S2P1 pitch, designated ϕ, along one of second stack axes 3134. Preferably, second stack 3124 does not include periodic structures formed together with any of first, third or fourth layers 3102, 3106 or 3108 which would, together with S2P1 3152, produce a moiré pattern upon imaging second stack 3124. However, second stack 3124 may include periodic structures formed together with first, third or fourth layers 3102, 3106 or 3108 which do not produce a moiré pattern upon imaging second stack 3124, such as periodic structures which are periodic along an axis parallel to the y-axis or periodic structures having a pitch size that does not produce a moiré pattern upon imaging second stack 3124.

Figure 31D:
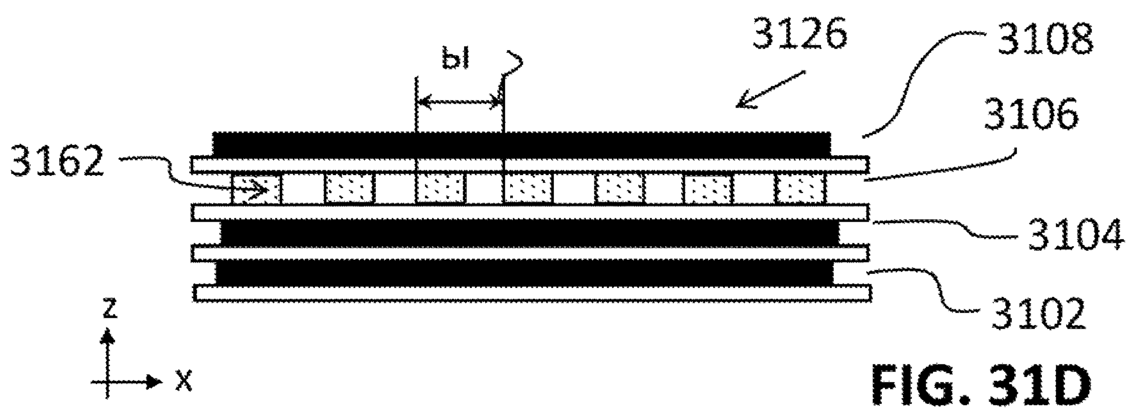

As seen particularly in FIG. 31D, in a preferred embodiment of the present invention, third stack 3126 includes a third stack first periodic structure (S3P1) 3162 formed together with third layer 3106 and having an S3P1 pitch, designated ы, along one of third stack axes 3136. Preferably, third stack 3126 does not include periodic structures formed together with any of first, second or fourth layers 3102, 3104 or 3108 which would, together with S3P1 3162, produce a moiré pattern upon imaging third stack 3126. However, third stack 3126 may include periodic structures formed together with first, second or fourth layers 3102, 3104 or 3108 which do not produce a moiré pattern upon imaging third stack 3126, such as periodic structures which are periodic along an axis parallel to the y-axis or periodic structures having a pitch size that does not produce a moiré pattern upon imaging third stack 3126.

Figure 31E:
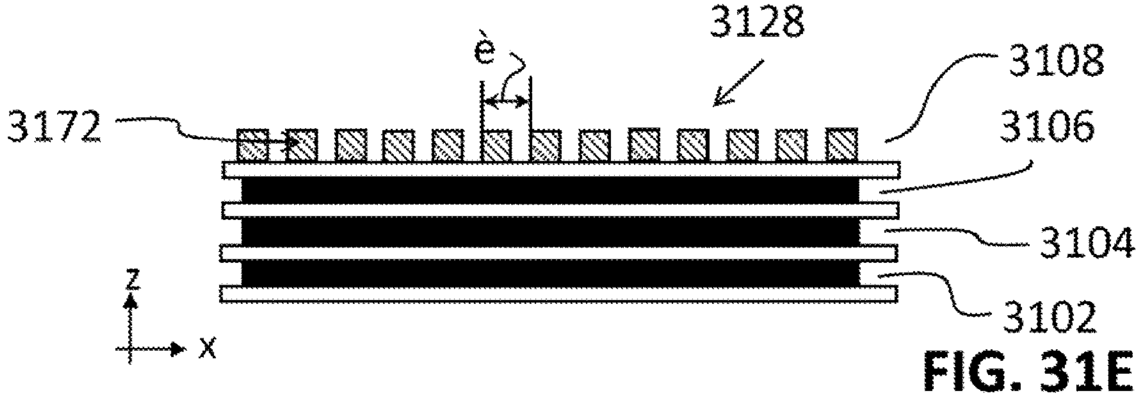

As seen particularly in FIG. 31E, in a preferred embodiment of the present invention, fourth stack 3128 includes a fourth stack first periodic structure (S4P1) 3172 formed together with third layer 3106 and having an S4P1 pitch, designated è, along one of fourth stack axes 3138. Preferably, fourth stack 3128 does not include periodic structures formed together with any of first, second or third layers 3102, 3104 or 3106 which would, together with S4P1 3172, produce a moiré pattern upon imaging fourth stack 3128. However, fourth stack 3128 may include periodic structures formed together with first, second or third layers 3102, 3104 or 3106 which do not produce a moiré pattern upon imaging fourth stack 3128, such as periodic structures which are periodic along an axis parallel to the y-axis or periodic structures having a pitch size that does not produce a moiré pattern upon imaging fourth stack 3128.

Misregistration between any two of layers 3102, 3104, 3106 and 3108 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA Pitches Ю and Я need not be optically resolvable by the misregistration metrology tool used to generate an image of target 3100. However, it is preferable that each of pitches б$_1$, ф, ы and è is optically resolvable by the misregistration metrology tool used to generate an image of target 3100.

Reference is now made to FIGS. 32A-32E, which are simplified illustrations of another embodiment of a multi-layered moiré target 3200 of the present invention. FIGS. 32A-32E include illustrations in three different dimensions, indicated by x-, y- and z-axes, the three dimensions being referred to hereinafter as an x-y plane, an x-z plane and a y-z plane, respectively. It is noted that FIG. 32A generally illustrates the x-y plane, while FIGS. 32B, 32C, 32D and 32E illustrate planes parallel to the x-z plane.

It is noted that target 3200 is one example of an alternative layout of target 3100, described hereinabove with reference to FIGS. 31A-31E, and that additional layouts are described hereinbelow with reference to FIGS. 34-39. Target 3200 is preferably formed on a semiconductor device wafer on which are preferably formed at least a first layer 3202, a second layer 3204, a third layer 3206 and a fourth layer 3208. It is appreciated that each of first layer 3202, second layer 3204, third layer 3206 and fourth layer 3208 defines a generally planar surface parallel to the x-y plane. First, second, third and fourth layers 3202, 3204, 3206 and 3208 may be adjacent layers but need not be. Preferably, any material between first, second, third and fourth layers 3202, 3204, 3206 and 3208 is at least partially transparent to electromagnetic radiation. In the embodiment illustrated in FIGS. 32A-32E, first layer 3202 lies below second, third and fourth layers 3204, 3206 and 3208, second layer 3204 lies below third and fourth layers 3206 and 3208, and fourth layer 3208 lies above first, second and third layers 3202, 3204 and 3206. It is appreciated, however, that layers 3202, 3204, 3206 and 3208 may be arranged in any suitable order along the z-axis with respect to one another.

Additionally, in an embodiment of the present invention, structures shown as being formed together with first and third layers 3202 and 3206 may all be formed together with layer 3202. In such an embodiment, no portion of target 3200 is formed together with layer 3206. Such an embodiment is particularly useful for calibration, as described hereinbelow with reference to FIGS. 33A-33D. Additionally, in another embodiment of the present invention, structures shown as being formed together with first and fourth layers 3202 and 3208 may all be formed together with layer 3202. In such an embodiment, no portion of target 3200 is formed together with layer 3208. Such an embodiment is particularly useful for calibration, as described hereinbelow with reference to FIGS. 33A-33D. Additionally, in another embodiment of the present invention, structures shown as being formed together with second and third layers 3204 and 3206 may all be formed together with layer 3204. In such an embodiment, no portion of target 3200 is formed together with layer 3206. Such an embodiment is particularly useful for calibration, as described hereinbelow with reference to FIGS. 33A-33D. Additionally, in another embodiment of the present invention, structures shown as being formed together with second and fourth layers 3204 and 3208 may all be formed together with layer 3204. In such an embodiment, no portion of target 3200 is formed together with layer 3208. Such an embodiment is particularly useful for calibration, as described hereinbelow with reference to FIGS. 33A-33D. Additionally, in another embodiment of the present invention, structures shown as being formed together with third and fourth layers 3206 and 3208 may all be formed together with layer 3206. In such an embodiment, no portion of target 3200 is formed together with layer 3208. Such an embodiment is particularly useful for calibration, as described hereinbelow with reference to FIGS. 33A-33D.

Figure 32A:
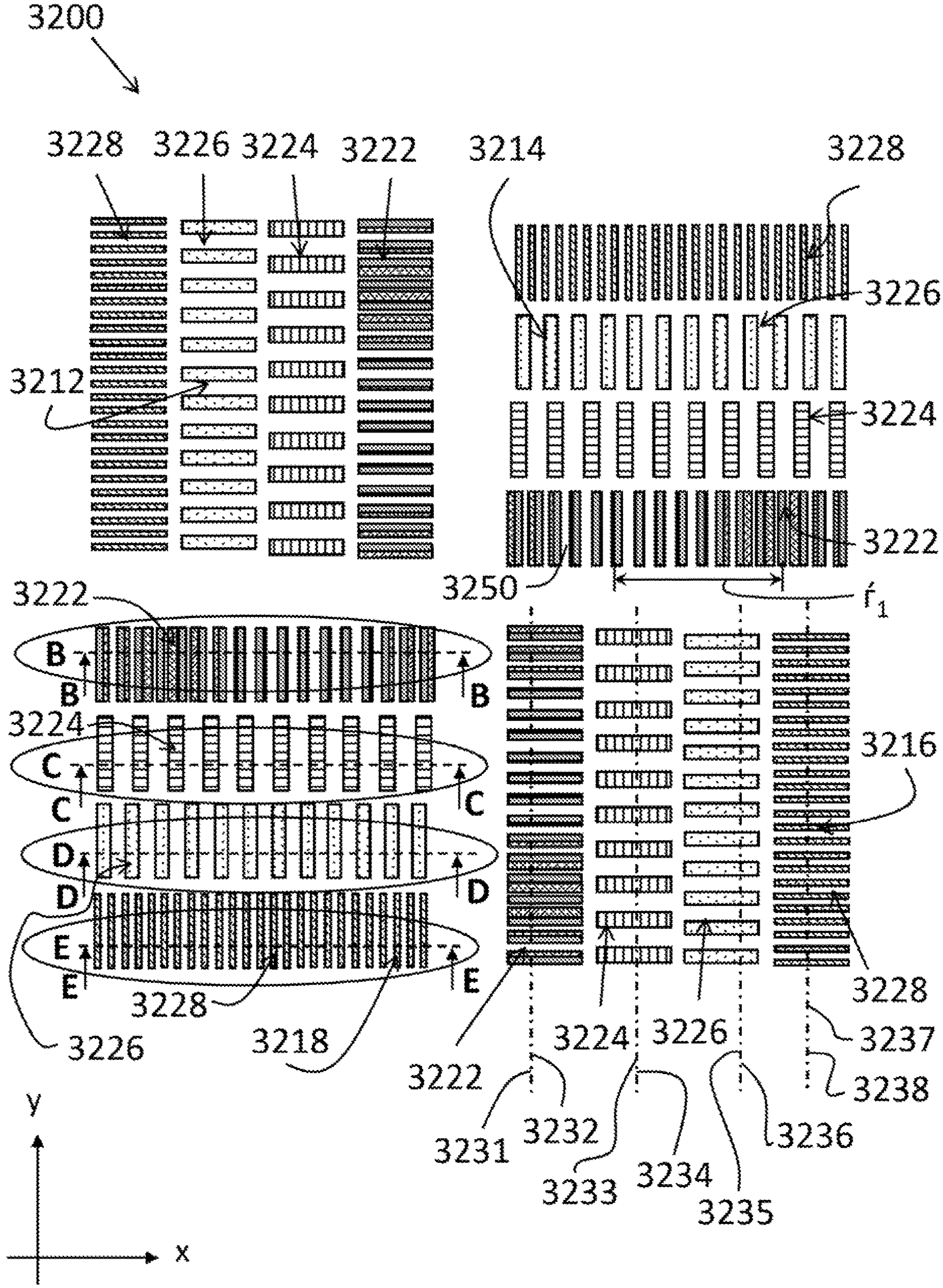
FIGS. 32A, 32B, 32C, 32D and 32E are simplified respective top view, first sectional side view, second sectional side view, third sectional side view and fourth sectional side view illustrations of another embodiment of a multi-layered moiré target of the present invention, FIGS. 32B, 32C, 32D and 32E being taken along lines B-B, C-C, D-D and E-E in FIG. 32A, respectively.

As seen particularly in FIG. 32A, target 3200 includes four target quadrants 3212, 3214, 3216 and 3218. In the embodiment shown in FIG. 32A, the rotational orientation in the x-y plane of each of target quadrants 3212, 3214, 3216 and 3218 preferably differs from the rotational orientation in the x-y plane of each of the other target quadrants 3212, 3214, 3216 and 3218 by an integer multiple of 90°. Additionally, target 3200 preferably is characterized by rotational symmetry in either the x-direction or the y-direction or both. In a preferred embodiment of the present invention, target 3200 is designed such that when in a state of registration, the entirety of target 3200 is characterized by a single point of symmetry in the x-direction and a single point of symmetry in the y-direction. However, even in such an embodiment, when in a state of misregistration, various elements of target 3200 will be characterized by unique points of symmetry.

Each of target quadrants 3212, 3214, 3216 and 3218 includes a first stack 3222 of periodic structures, a second stack 3224 of periodic structures, a third stack 3226 of periodic structures and a fourth stack 3228 of periodic structures. Each of first stack 3222, second stack 3224, third stack 3226 and fourth stack 3228 includes one or more periodic structures, each periodic structure having a pitch. Preferably, none of first stack 3222, second stack 3224, third stack 3226 and fourth stack 3228 overlap with one another. In FIGS. 32A-32E, first stack 3222 is illustrated as lying closer to the center of target 3200 than second stack 3224, third stack 3226 and fourth stack 3228, second stack 3224 is illustrated as lying closer to the center of target 3200 than third stack 3226 and fourth stack 3228, third stack 3226 is illustrated as lying closer to the edge of target 3200 than first stack 3222 and second stack 3224, and fourth stack 3228 is illustrated as lying closer to the edge of target 3200 than third stack 3226. However, first stack 3222, second stack 3224, third stack 3226 and fourth stack 3228 may be arranged in any suitable arrangement relative to the x-y plane with respect to one another.

It is appreciated that although in FIGS. 32A-32E, each of the periodic structures of first stack 3222, second stack 3224, third stack 3226 and fourth stack 3228 are shown as being formed of a plurality of lines and spaces, in other embodiments of the invention, the periodic structures of first stack 3222, second stack 3224, third stack 3226 and fourth stack 3228 may be formed of any suitable periodic features. It is further appreciated that the periodic features forming the periodic structures included in first stack 3222, second stack 3224, third stack 3226 and fourth stack 3228 may be formed of sub-structures. The pitches of each of the periodic structures of first stack 3222, second stack 3224, third stack 3226 and fourth stack 3228 are preferably between 10 nm-3000 nm, and more preferably between 200 nm-800 nm.

As seen in FIG. 32A, in each of quadrants 3212, 3214, 3216 and 3218, a first plane 3231, intersecting first stack 3222 and including a plurality of first axes 3232 lying therein, a second plane 3233, intersecting second stack 3224 and including a plurality of second axes 3234 lying therein, a third plane 3235, intersecting third stack 3226 and including a plurality of third axes 3236 lying therein, and a fourth plane 3237, intersecting fourth stack 3228 and including a plurality of fourth axes 3238 lying therein, are defined. Each of first plane 3231, second plane 3233, third plane 3235 and fourth plane 3237 are either an x-z plane or a y-z plane, and first axes 3232, second axes 3234, third axes 3236 and fourth axes 3238 are parallel to the respective x-axis or y-axis, depending on the orientation of first stack 3222, second stack 3224, third stack 3226 and fourth stack 3228 within each of quadrants 3212, 3214, 3216 and 3218. It is appreciated that in each of quadrants 3212, 3214, 3216 and 3218, first plane 3231, second plane 3233, third plane 3235 and fourth plane 3237 are all parallel to one another.

Figure 32B:
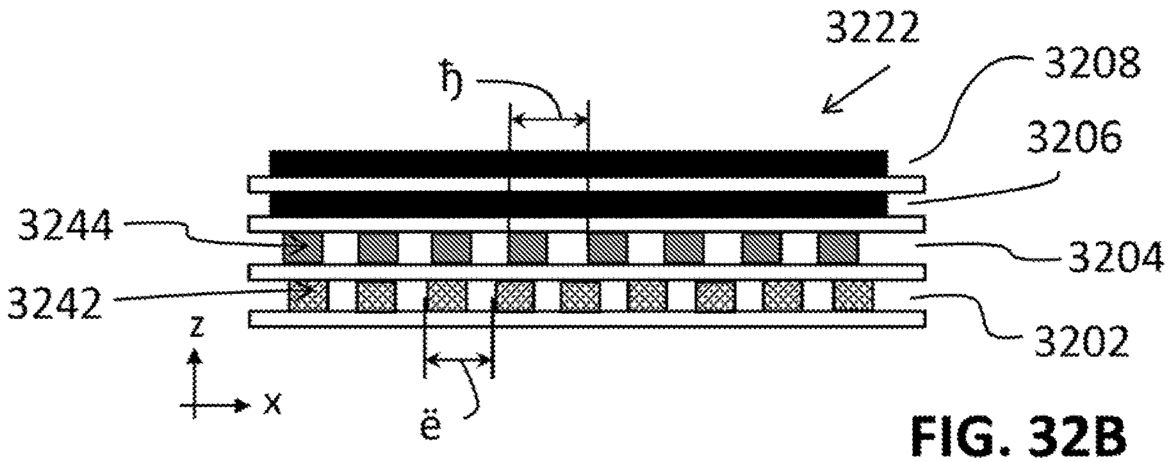

As seen particularly in FIG. 32B, in a preferred embodiment of the present invention, first stack 3222 includes a first stack first periodic structure (S1P1) 3242 formed together with first layer 3202 and having an S1P1 pitch, designated ë, along one of first stack axes 3232. Preferably, first stack 3222 further includes a first stack second periodic structure (S1P2) 3244 formed together with second layer 3204 and having an S1P2 pitch, designated ђ, along another of first stack axes 3232.

It is appreciated that S1P1 3242 and S1P2 3244 at least partially overlie one another, and thus a first stack moiré pattern 3250 is visible upon imaging first stack 3222. As is known in the art, first stack moiré pattern 3250 is characterized by a pitch ŕ $_1$, which is a function of pitches ë and ђ, as shown in equation 82:

$$ŕ_1 = \frac{ë \times ђ}{|ë - ђ|} \quad \text{(Eq. 82)}$$

Preferably, first stack 3222 does not include periodic structures formed together with third layer 3206 or fourth layer 3208 which affect moiré pattern 3250. However, first stack 3222 may include periodic structures formed together with third layer 3206 or fourth layer 3208 which do not affect moiré pattern 3250, such as periodic structures which are periodic in a plane parallel to the x-y plane along an axis that is perpendicular to first stack axes 3232 or periodic structures having a pitch size that does not affect moiré pattern 3250.

Figure 32C:
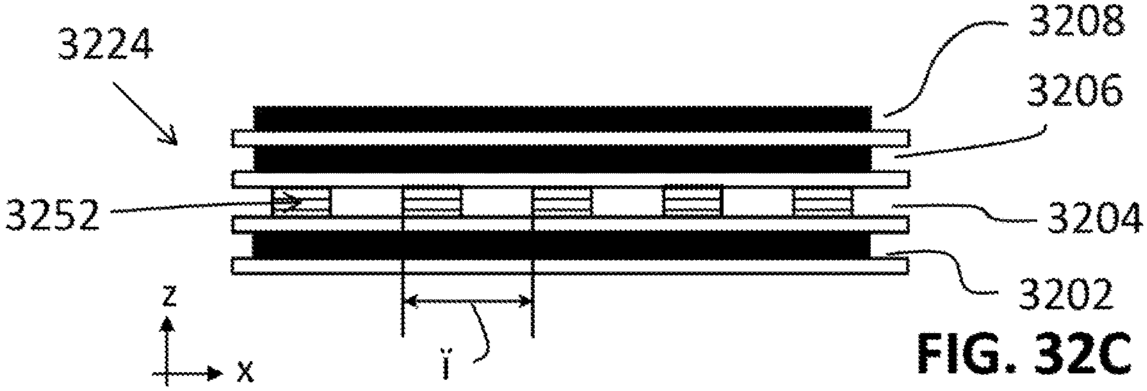

As seen particularly in FIG. 32C, in a preferred embodiment of the present invention, second stack 3224 includes a second stack first periodic structure (S2P1) 3252 formed together with second layer 3204 and having an S2P1 pitch, designated ï, along one of second stack axes 3234. Preferably, second stack 3224 does not include periodic structures formed together with any of first, third or fourth layers 3202, 3206 or 3208 which would, together with S2P1 3252, produce a moiré pattern upon imaging second stack 3224. However, second stack 3224 may include periodic structures formed together with first, third or fourth layers 3202, 3206 or 3208 which do not produce a moiré pattern upon imaging second stack 3224, such as periodic structures which are periodic in a plane parallel to the x-y plane along an axis that is perpendicular to second stack axes 3234 or periodic structures having a pitch size that does not produce a moiré pattern upon imaging second stack 3224.

Figure 32D:
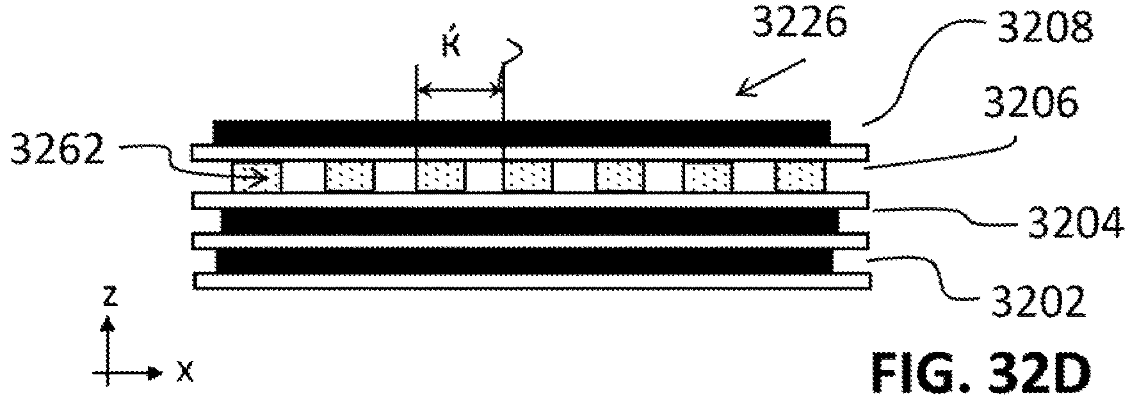

As seen particularly in FIG. 32D, in a preferred embodiment of the present invention, third stack 3226 includes a third stack first periodic structure (S3P1) 3262 formed together with third layer 3206 and having an S3P1 pitch, designated ќ, along one of third stack axes 3236. Preferably, third stack 3226 does not include periodic structures formed together with any of first, second or fourth layers 3202, 3204 or 3208 which would, together with S3P1 3262, produce a moiré pattern upon imaging third stack 3226. However, third stack 3226 may include periodic structures formed together with first, second or fourth layers 3202, 3204 or 3208 which do not produce a moiré pattern upon imaging third stack 3226, such as periodic structures which are periodic in a plane parallel to the x-y plane along an axis that is perpendicular to third stack axes 3236 or periodic structures having a pitch size that does not produce a moiré pattern upon imaging third stack 3226.

Figure 32E:
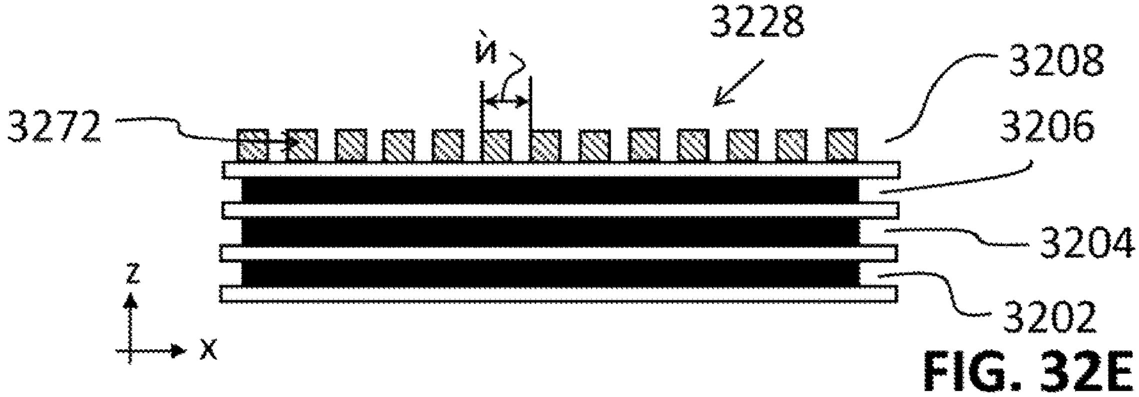

As seen particularly in FIG. 32E, in a preferred embodiment of the present invention, fourth stack 3228 includes a fourth stack first periodic structure (S4P1) 3272 formed together with third layer 3206 and having an S4P1 pitch, designated ѝ, along one of fourth stack axes 3238. Preferably, fourth stack 3228 does not include periodic structures formed together with any of first, second or fourth layers 3202, 3204 or 3208 which would, together with S4P1 3272, produce a moiré pattern upon imaging fourth stack 3228. However, fourth stack 3228 may include periodic structures formed together with first, second or fourth layers 3202, 3204 or 3208 which do not produce a moiré pattern upon imaging fourth stack 3228, such as periodic structures which are periodic in a plane parallel to the x-y plane along an axis that is perpendicular to fourth stack axes 3238 or periodic structures having a pitch size that does not produce a moiré pattern upon imaging fourth stack 3228.

Misregistration between any two of layers 3202, 3204, 3206 and 3208 is preferably measured using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. Pitches ë and ђ need not be optically resolvable by the misregistration metrology tool used to generate an image of target 3200. However, it is preferable that each of pitches ŕ $_1$, ï, ќ and ѝ is optically resolvable by the misregistration metrology tool used to generate an image of target 3200.

Figure 33A:
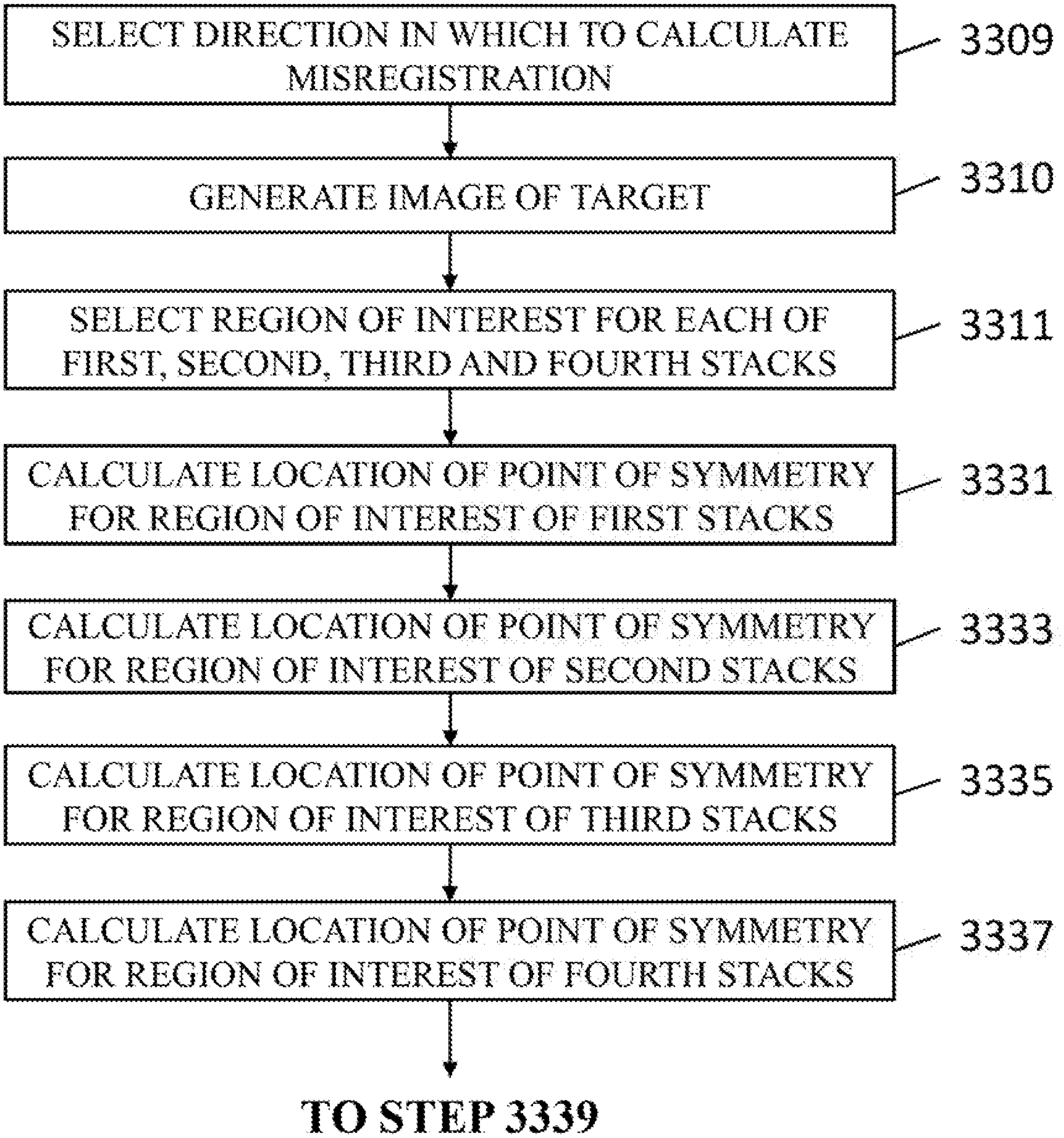
FIGS. 33A and 33B are together a simplified flowchart illustrating a preferred method of calculating misregistration between layers on which the multi-layered moiré target of FIGS. 31A-31E or of FIGS. 32A-32E is formed.
Figure 33B:
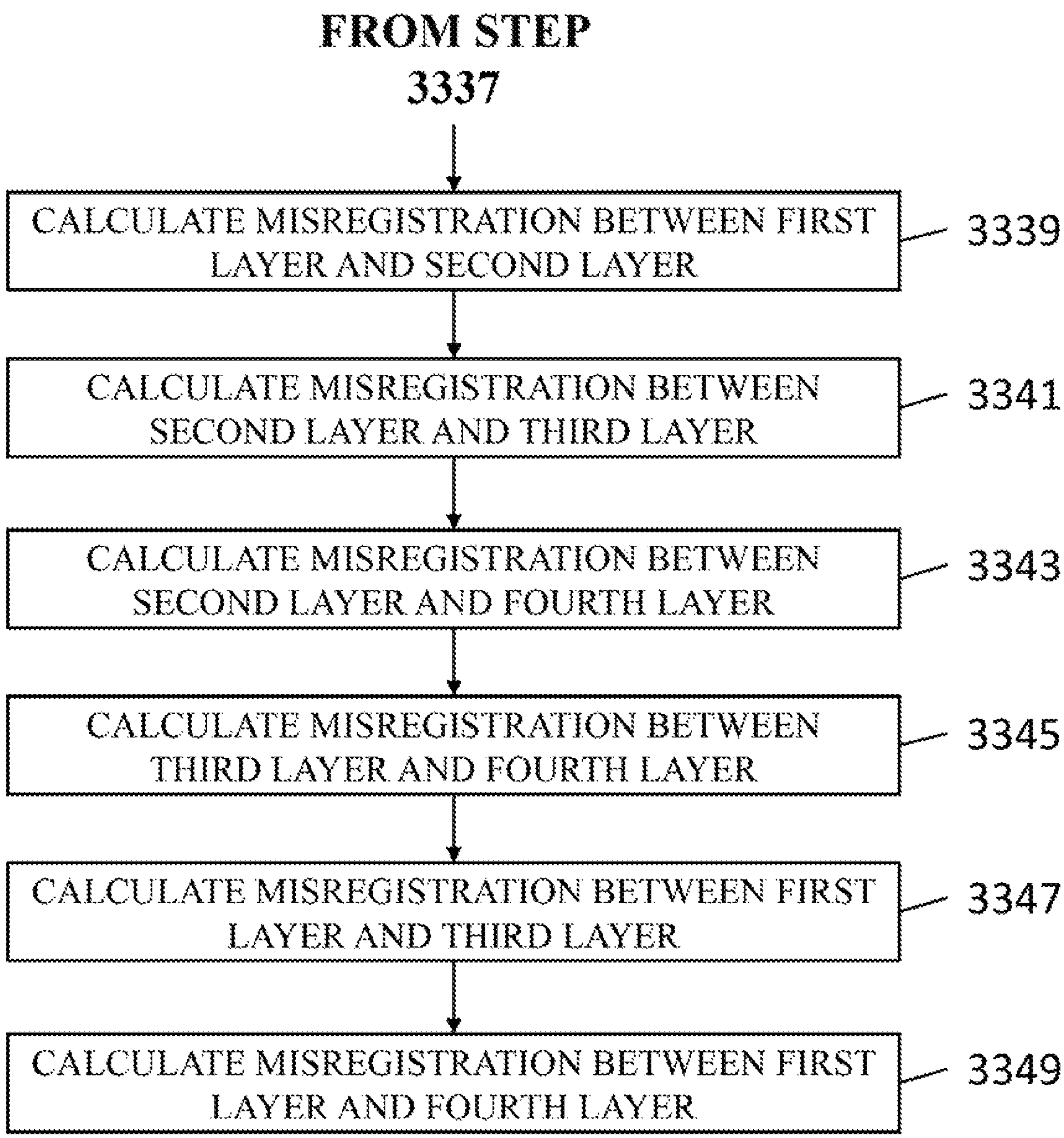
Figure 33C:
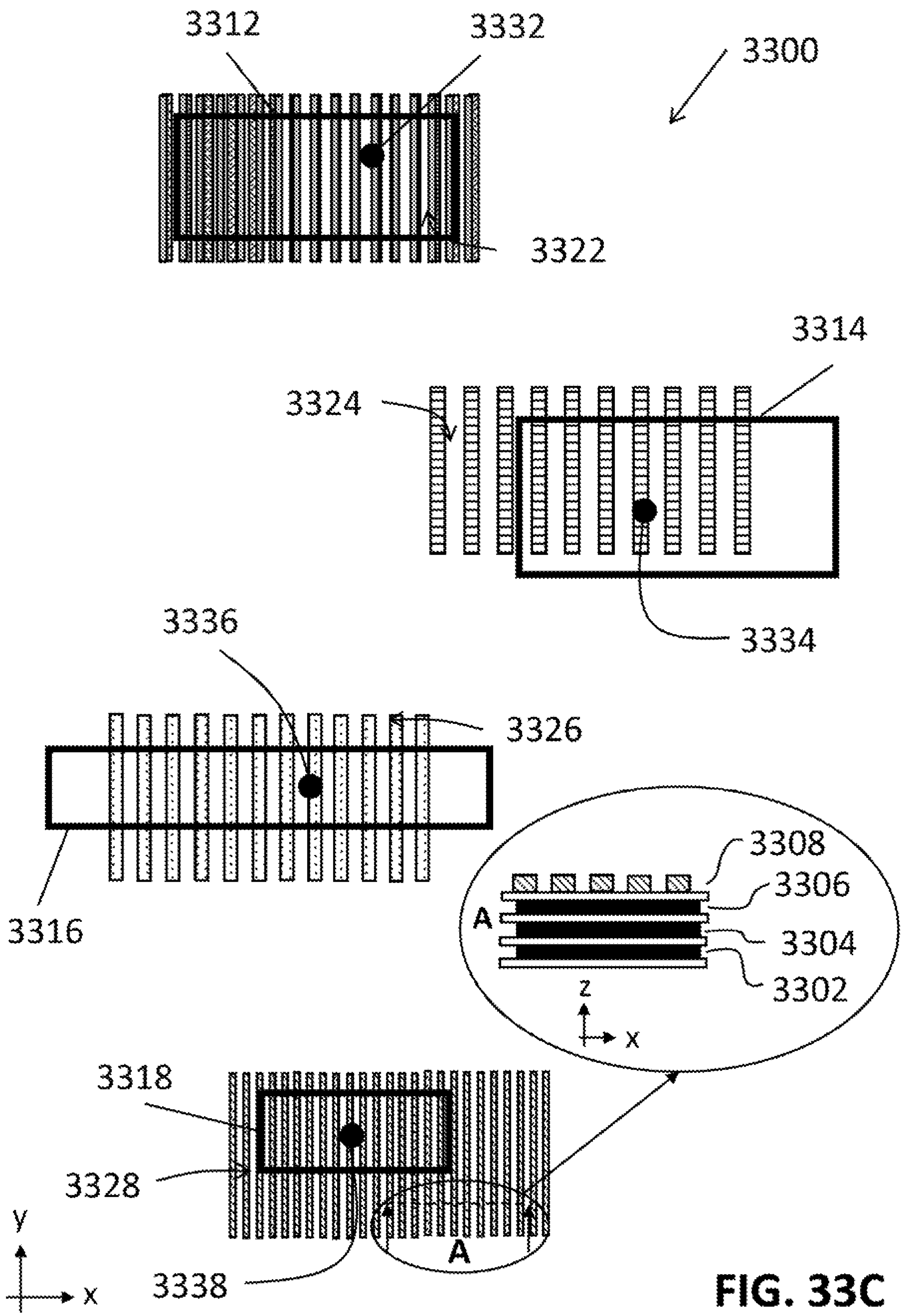
FIGS. 33C and 33D are simplified pictorial illustrations of first and second embodiments of a portion of the method of FIGS. 33A & 33B, respectively.
Figure 33D:
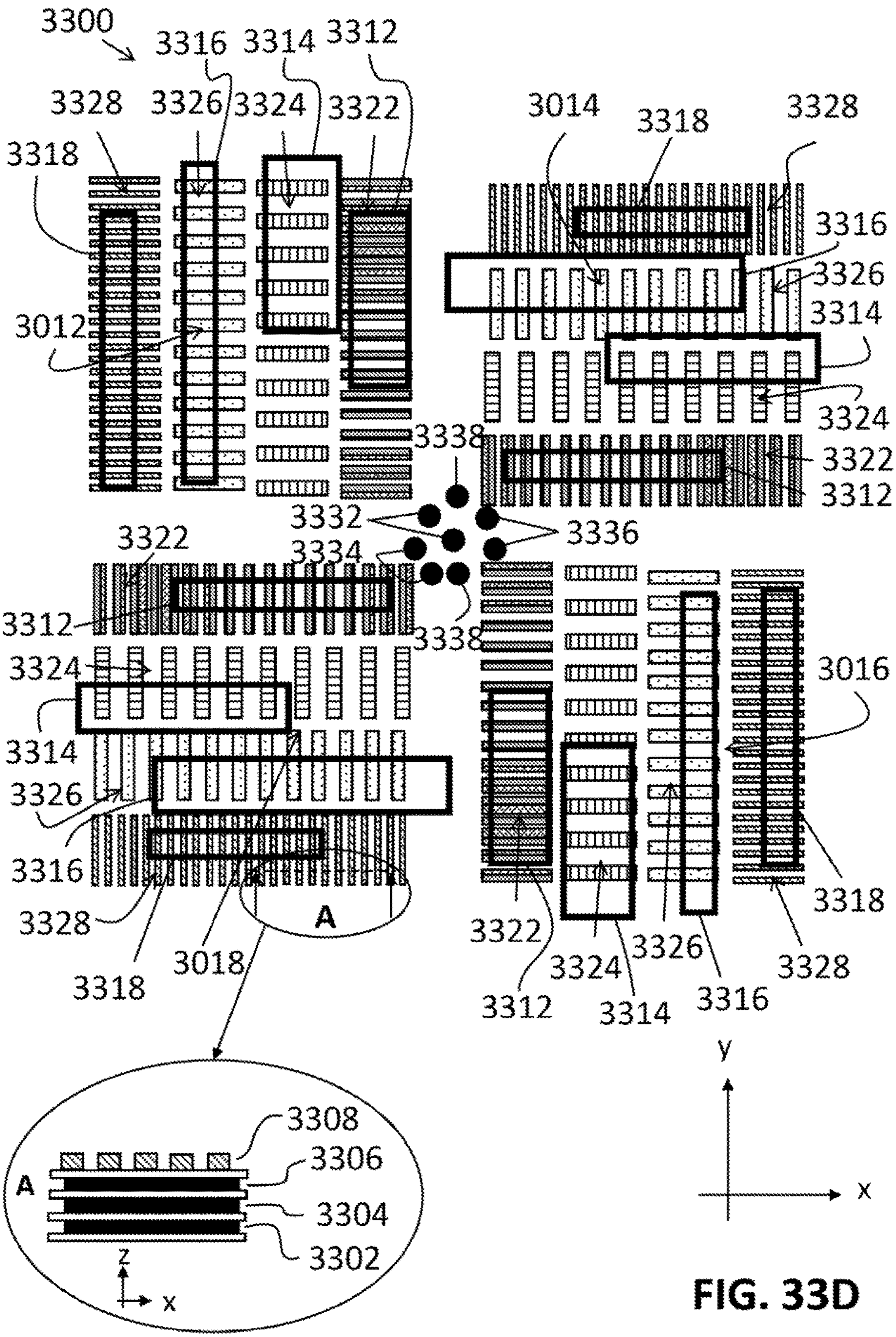

Reference is now made to FIGS. 33A & 33B, which together are a simplified flowchart illustrating a preferred method of calculating misregistration, using a multi-layered moiré target 3300, such as a target 3100 (FIGS. 31A-31E) or target 3200 (FIGS. 32A-32E), in a direction parallel to either the x or the y direction between a first, a second, a third and a fourth layer 3302, 3304, 3306 and 3308, such as layers 3102, 3104, 3106 and 3108 (FIGS. 31A-31E) or 3202, 3204, 3206 and 3208 (FIGS. 32A-32E) of a multilayered semiconductor device wafer formed with target 3300. Reference is further made to FIGS. 33C & 33D, which are simplified pictorial illustrations of first and second embodiments of a portion of the method of FIGS. 33A & 33B, respectively.

While it is appreciated that when utilizing target 3200 (FIGS. 32A-32E) the method described with reference to FIGS. 33A-33D may be performed only once to calculate misregistration in either the x or the y direction, typically, the method described in FIGS. 33A-33D will be performed twice, to calculate misregistration in each of the x and y directions. It is also appreciated that when utilizing target 3100 (FIGS. 31A-31E) misregistration may be calculated only in the one direction to which first, second, third stack and fourth stack axes 3132, 3134, 3136 and 3138 are parallel.

As seen at a first step 3309, a direction in which to measure misregistration is selected. When using target 3100 in the method of FIGS. 33A & 33B, the direction in which to measure misregistration is automatically selected to be the direction to which first, second, third and fourth stack axes 3132, 3134, 3136 and 3138 are parallel. When using target 3200 in the method of FIGS. 33A & 33B, the structures of quadrants 3214 and 3218 are utilized to measure misregistration in a direction parallel to the x-axis, and the structures of quadrants 3212 and 3216 to measure misregistration in a direction parallel to the y-axis.

Preferably, at a next step 3310, an image of target 3300 is generated using an imaging misregistration metrology tool having adjustable polarization, wavelength and numerical aperture settings. An example of a suitable imaging misregistration metrology tool is an Archer™ 700, commercially available from KLA Corporation, of Milpitas, CA, USA. It is noted that pitches Ю, Я, ё and ђ need not be optically resolvable by the misregistration metrology tool used to generate the image of target 3300. However, it is preferable that each of pitches $б_1$, ф, ы, è, $ѓ_1$, ї, ќ and ѝ is optically resolvable by the misregistration metrology tool used to generate the image of target 3300.

In a next step 3311, and as seen in FIGS. 33C & 33D, first, second, third and fourth regions of interest 3312, 3314, 3316 and 3318 are selected for each of respective first, second, third and fourth stacks 3322, 3324, 3326 and 3328, such as first, second, third and fourth stacks 3122, 3124, 3126 and 3128 (FIGS. 31A-31E) or first, second, third and fourth stacks 3222, 3224, 3226 and 3228 (FIGS. 32A-32E), in the quadrants selected in step 3309. It is appreciated, as seen in the illustrated embodiments of FIGS. 33C & 33D, that while first, second, third and fourth regions of interest 3312, 3314, 3316 and 3318 preferably lie entirely within each of respective first, second, third and fourth stacks 3322, 3324, 3326 and 3328, as illustrated for first and fourth regions of interest 3312 and 3318, which lie completely within respective first and fourth stacks 3322 and 3328, first, second, third and fourth regions of interest 3312, 3314, 3316 and 3318 may extend beyond respective first, second, third and fourth stacks 3322, 3324, 3326 and 3328, as illustrated for regions of interest 3314 and 3316, which extend beyond respective second and third stacks 3324 and 3326. It is further appreciated that regions of interest 3312, 3314, 3316 and 3318 shown in FIGS. 33C & 33D are representative regions of interest, and that other suitable regions of interest may be chosen at step 3311.

In a next step 3331, and as seen in FIGS. 33C & 33D, a location of a point of symmetry 3332 between all instances of first region of interest 3312 selected in step 3311 is calculated. In a next step 3333, and as seen in FIGS. 33C & 33D, a location of a point of symmetry 3334 between all instances of second region of interest 3314 selected in step 3311 is calculated. In a next step 3335, and as seen in FIGS. 33C & 33D, a location of a point of symmetry 3336 between all instances of third region of interest 3316 selected in step 3311 is calculated. In a next step 3337, and as seen in FIGS. 33C & 33D, a location of a point of symmetry 3338 between all instances of fourth region of interest 3318 selected in step 3311 is calculated.

At a next step 3339, a distance in the direction selected at step 3309 is calculated between the location of point of symmetry 3332 of first region or regions of interest 3312 identified at step 3331 and the location of point of symmetry 3334 of second region or regions of interest 3314 identified at step 3333. The distance found at step 3339 is divided by a gain $\ddot{y}_1$, which for target 3100 is a function of pitch Ю and pitch Я, as shown in equation 83a:

$$\ddot{y}_1 = \frac{\text{Я}}{|\text{Я} - \text{Ю}|} \tag{Eq. 83a}$$

and for target 3200 is a function of pitch ё and pitch ђ, as shown in equation 83b:

$$\ddot{y}_1 = \frac{\text{ђ}}{|\text{ђ} - \text{ё}|} \tag{Eq. 83b}$$

and the result is reported as the misregistration between first and second layers 3302 and 3304 in the direction selected at step 3309. It is appreciated that in addition to the distance calculated at step 3339, the method further calculates an adjustment direction, such as right, left, up or down. The adjustment direction is a function of the relative values of pitch Ю and pitch Я or pitch ё and pitch ђ, as well as which of layers 3302 and 3304 is to be adjusted.

At a next step 3341, a distance in the direction selected at step 3309 is calculated between the location of point of symmetry 3334 of second region or regions of interest 3314 identified at step 3333 and the location of point of symmetry 3336 of third region or regions of interest 3316 identified at step 3335. The distance found at step 3341 is reported as the misregistration between second and third layers 3304 and 3306 in the direction selected at step 3309. It is appreciated that in addition to the distance calculated at step 3341, the method further calculates an adjustment direction, such as right, left, up or down. The adjustment direction is a function of the relative values of pitch Ю and pitch Я or pitch ё and pitch ђ, as well as which of layers 3304 and 3306 is to be adjusted.

At a next step 3343, a distance in the direction selected at step 3309 is calculated between the location of point of symmetry 3334 of second region or regions of interest 3314 identified at step 3333 and the location of point of symmetry 3338 of fourth region or regions of interest 3318 identified at step 3337. The distance found at step 3343 is reported as the misregistration between second and fourth layers 3304 and 3308 in the direction selected at step 3309. It is appreciated that in addition to the distance calculated at step 3343, the method further calculates an adjustment direction, such as right, left, up or down. The adjustment direction is a function of the relative values of pitch Ю and pitch Я or pitch ë and pitch ђ, as well as which of layers 3304 and 3308 is to be adjusted.

At a next step 3345, a distance in the direction selected at step 3309 is calculated between the location of point of symmetry 3336 of third region or regions of interest 3316 identified at step 3335 and the location of point of symmetry 3338 of fourth region or regions of interest 3318 identified at step 3337. The distance found at step 3345 is reported as the misregistration between third and fourth layers 3306 and 3308 in the direction selected at step 3309. It is appreciated that in addition to the distance calculated at step 3345, the method further calculates an adjustment direction, such as right, left, up or down. The adjustment direction is a function of the relative values of pitch Ю and pitch Я or pitch ë and pitch ђ, as well as which of layers 3306 and 3308 is to be adjusted.

At a next step 3347, a difference is calculated between the misregistration value reported at step 3339 and the misregistration value reported at step 3341. The difference calculated at step 3347 is reported as the misregistration between first and third layers 3302 and 3306 in the direction selected at step 3309. It is appreciated that in addition to the distance calculated at step 3347, the method further calculates an adjustment direction, such as right, left, up or down. The adjustment direction is a function of the relative values of pitch Ю and pitch Я or pitch ë and pitch ђ, as well as which of layers 3302 and 3306 is to be adjusted.

At a next step 3349, a difference is calculated between the misregistration value reported at step 3339 and the misregistration value reported at step 3343. Alternatively, at next step 3349, a difference is calculated between the misregistration value reported at step 3347 and the misregistration value reported at step 3345. The difference calculated at step 3349 is reported as the misregistration between first and fourth layers 3302 and 3308 in the direction selected at step 3309. It is appreciated that in addition to the distance calculated at step 3349, the method further calculates an adjustment direction, such as right, left, up or down. The adjustment direction is a function of the relative values of pitch Ю and pitch Я or pitch ë and pitch ђ, as well as which of layers 3302 and 3308 is to be adjusted.

Preferably, in the embodiment described hereinabove wherein structures shown as being formed together with first and third layers 3302 and 3306 are all formed together with layer 3302, the method described hereinabove with reference to FIGS. 33A-33D proceeds to calculate and report a difference between the misregistration value reported at step 3339 and the misregistration value reported at step 3341. The difference between the misregistration values reported at steps 3339 and 3341 is useful in the calibration of the misregistration metrology tool used in the method of FIGS. 33A-33D.

Similarly, in the embodiment described hereinabove wherein structures shown as being formed together with first and third layers 3302 and 3306 are all formed together with layer 3302, the method described hereinabove with reference to FIGS. 33A-33D proceeds to calculate and report a difference between the misregistration value reported at step 3349 and the misregistration value reported at step 3345. The difference between the misregistration values reported at steps 3349 and 3345 is useful in the calibration of the misregistration metrology tool used in the method of FIGS. 33A-33D.

Preferably, in the embodiment described hereinabove wherein structures shown as being formed together with first and fourth layers 3302 and 3308 are all formed together with layer 3302, the method described hereinabove with reference to FIGS. 33A-33D proceeds to calculate and report a difference between the misregistration value reported at step 3339 and the misregistration value reported at step 3343. The difference between the misregistration values reported at steps 3339 and 3343 is useful in the calibration of the misregistration metrology tool used in the method of FIGS. 33A-33D.

Similarly, in the embodiment described hereinabove wherein structures shown as being formed together with first and fourth layers 3302 and 3308 are all formed together with layer 3302, the method described hereinabove with reference to FIGS. 33A-33D proceeds to calculate and report a difference between the misregistration value reported at step 3347 and the misregistration value reported at step 3345. The difference between the misregistration values reported at steps 3347 and 3345 is useful in the calibration of the misregistration metrology tool used in the method of FIGS. 33A-33D.

Preferably, in the embodiment described hereinabove wherein structures shown as being formed together with second and third layers 3304 and 3306 are all formed together with layer 3304, the method described hereinabove with reference to FIGS. 33A-33D proceeds to calculate and report a difference between the misregistration value reported at step 3339 and the misregistration value reported at step 3347. The difference between the misregistration values reported at steps 3339 and 3347 is useful in the calibration of the misregistration metrology tool used in the method of FIGS. 33A-33D.

Similarly, in the embodiment described hereinabove wherein structures shown as being formed together with second and third layers 3304 and 3306 are all formed together with layer 3304, the method described hereinabove with reference to FIGS. 33A-33D proceeds to calculate and report a difference between the misregistration value reported at step 3343 and the misregistration value reported at step 3345. The difference between the misregistration values reported at steps 3343 and 3345 is useful in the calibration of the misregistration metrology tool used in the method of FIGS. 33A-33D.

Preferably, in the embodiment described hereinabove wherein structures shown as being formed together with second and fourth layers 3304 and 3308 are all formed together with layer 3304, the method described hereinabove with reference to FIGS. 33A-33D proceeds to calculate and report a difference between the misregistration value reported at step 3339 and the misregistration value reported at step 3349. The difference between the misregistration values reported at steps 3339 and 3349 is useful in the calibration of the misregistration metrology tool used in the method of FIGS. 33A-33D.

Similarly, in the embodiment described hereinabove wherein structures shown as being formed together with second and fourth layers 3304 and 3308 are all formed together with layer 3304, the method described hereinabove with reference to FIGS. 33A-33D proceeds to calculate and report a difference between the misregistration value reported at step 3341 and the misregistration value reported at step 3345. The difference between the misregistration values reported at steps 3341 and 3345 is useful in the calibration of the misregistration metrology tool used in the method of FIGS. 33A-33D.

Preferably, in the embodiment described hereinabove wherein structures shown as being formed together with third and fourth layers 3306 and 3308 are all formed together with layer 3306, the method described hereinabove with reference to FIGS. 33A-33D proceeds to calculate and report a difference between the misregistration value reported at step 3347 and the misregistration value reported at step 3349. The difference between the misregistration values reported at steps 3347 and 3349 is useful in the calibration of the misregistration metrology tool used in the method of FIGS. 33A-33D.

Similarly, in the embodiment described hereinabove wherein structures shown as being formed together with third and fourth layers 3306 and 3308 are all formed together with layer 3306, the method described hereinabove with reference to FIGS. 33A-33D proceeds to calculate and report a difference between the misregistration value reported at step 3341 and the misregistration value reported at step 3343. The difference between the misregistration values reported at steps 3341 and 3343 is useful in the calibration of the misregistration metrology tool used in the method of FIGS. 33A-33D.

Figure 34:
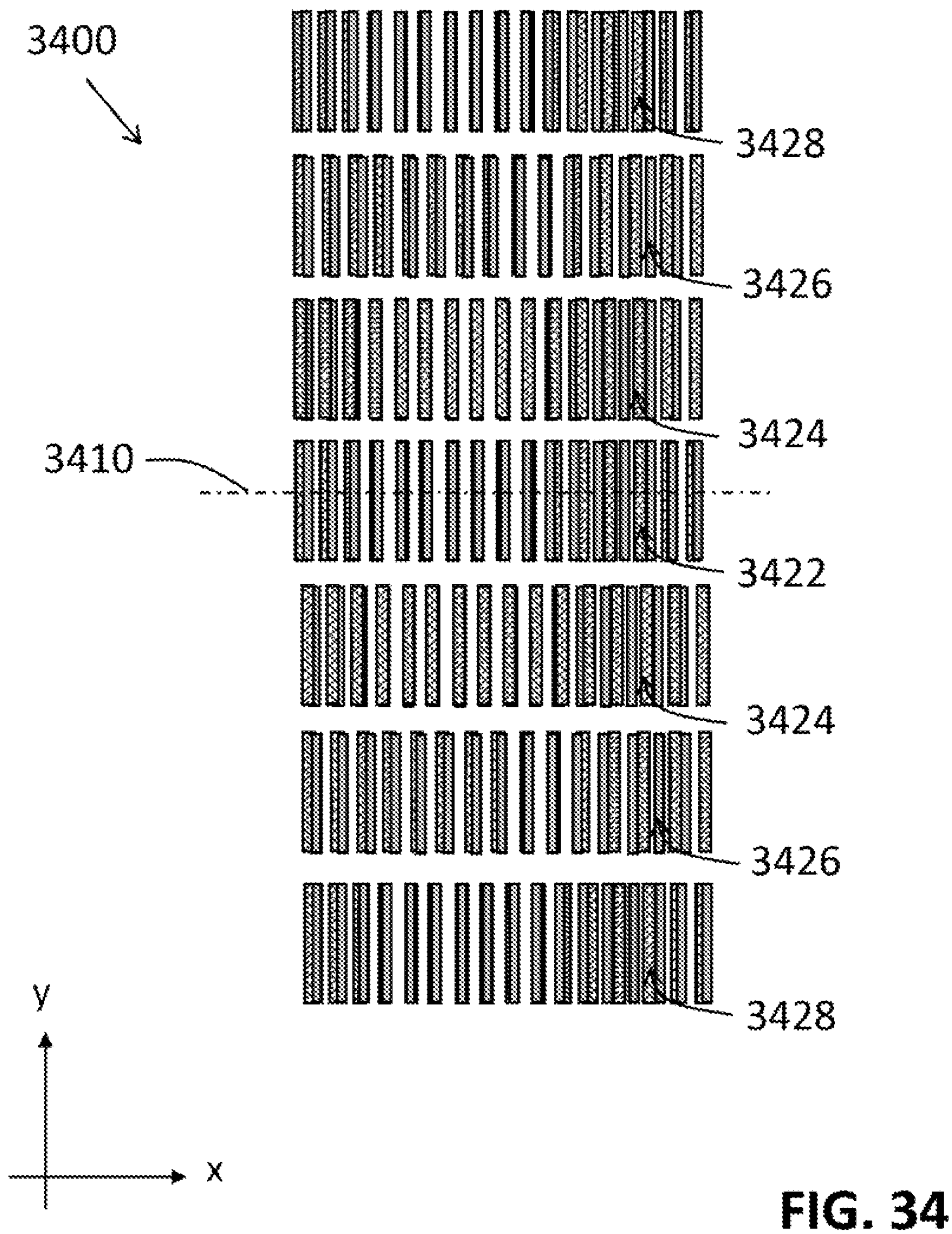
FIG. 34 is a simplified illustration of another embodiment of a multi-layered moiré target of the present invention.

Reference is now made to FIGS. 34, which is simplified illustration showing an alternate layout of a multi-layered moiré target 3400, such as target 100 (FIG. 1), 200 (FIGS. 2A-2D), 400 (FIG. 4), 500 (FIGS. 5A-5D), 700 (FIG. 7), 800 (FIGS. 8A-8D), 1000 (FIG. 10), 1100 (FIGS. 11A-11D), 1300 (FIG. 13), 1400 (FIGS. 14A-14D), 1600 (FIG. 16), 1700 (FIGS. 17A-17D), 1900 (FIGS. 19A-19D), 2000 (FIGS. 20A-20D), 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 34, target 3400 includes a central axis 3410 along which is preferably arranged a first stack 3422 of periodic structures, such as first stack 122, 222, 422, 522, 722, 822, 1022, 1122, 1322, 1422, 1622, 1722, 1922, 2022, 2222, 2322, 2522, 2622, 2822, 2922, 3122 or 3222, whose structures are periodic along central axis 3410. Preferably, on either side of central axis 3410 are symmetrically arranged a pair of second stacks 3424 of periodic structures, such as second stack 124, 224, 424, 524, 724, 824, 1024, 1124, 1324, 1424, 1624, 1724, 1924, 2024, 2224, 2324, 2524, 2624, 2824, 2924, 3124 or 3224, and a pair of third stacks 3426 of periodic structures, such as third stack 126, 226, 426, 526, 726, 826, 1026, 1126, 1326, 1426, 1626, 1726, 1926, 2026, 2226, 2326, 2526, 2626, 2826, 2926, 3126 or 3226. In some embodiments of the present invention, target 3400 further includes a pair of fourth stacks 3428 of periodic structures, such as fourth stack 2228, 2328, 2528, 2628, 2828, 2928, 3128 or 3228, symmetrically arranged on either side of central axis 3410.

Preferably, none of first stack 3422, second stacks 3424, third stacks 3426 and fourth stacks 3428 overlap with one another. In FIG. 34, first stack 3422 is illustrated as lying closer to the center of target 3400 than second stacks 3424, third stacks 3426 and fourth stacks 3428, second stacks 3424 are illustrated as lying closer to the center of target 3400 than third stacks 3426 and fourth stacks 3428, third stacks 3426 are illustrated as lying closer to the edge of target 3400 than first stack 3422 and second stacks 3424, and fourth stacks 3428 are illustrated as lying closer to the edge of target 3400 than third stacks 3426. However, first stack 3422, second stacks 3424, third stacks 3426 and fourth stacks 3428 may be arranged in any suitable arrangement along the y-axis with respect to one another.

Figure 35:
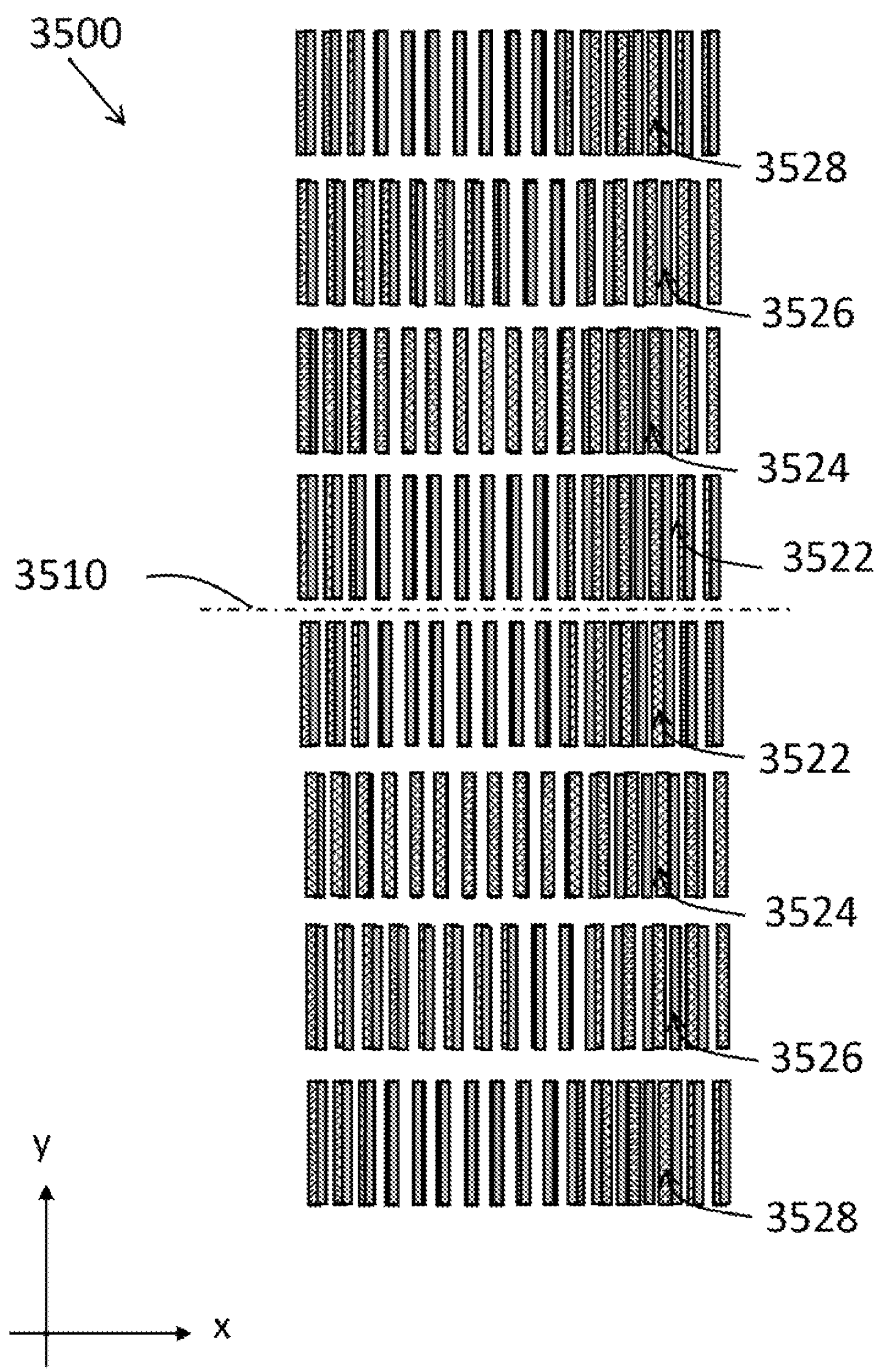
FIG. 35 is a simplified illustration of another embodiment of a multi-layered moiré target of the present invention.

Reference is now made to FIGS. 35, which is simplified illustration showing an alternate layout of a multi-layered moiré target 3500, such as target 100 (FIG. 1), 200 (FIGS. 2A-2D), 400 (FIG. 4), 500 (FIGS. 5A-5D), 700 (FIG. 7), 800 (FIGS. 8A-8D), 1000 (FIG. 10), 1100 (FIGS. 11A-11D), 1300 (FIG. 13), 1400 (FIGS. 14A-14D), 1600 (FIG. 16), 1700 (FIGS. 17A-17D), 1900 (FIGS. 19A-19D), 2000 (FIGS. 20A-20D), 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 35, target 3500 includes a central axis 3510 on either side of which are preferably symmetrically arranged a pair of first stacks 3522 of periodic structures, such as first stack 122, 222, 422, 522, 722, 822, 1022, 1122, 1322, 1422, 1622, 1722, 1922, 2022, 2222, 2322, 2522, 2622, 2822, 2922, 3122 or 3222, whose structures are periodic along central axis 3510. Preferably, on either side of central axis 3510 are also symmetrically arranged a pair of second stacks 3524 of periodic structures, such as second stack 124, 224, 424, 524, 724, 824, 1024, 1124, 1324, 1424, 1624, 1724, 1924, 2024, 2224, 2324, 2524, 2624, 2824, 2924, 3124 or 3224, and a pair of third stacks 3526 of periodic structures, such as third stack 126, 226, 426, 526, 726, 826, 1026, 1126, 1326, 1426, 1626, 1726, 1926, 2026, 2226, 2326, 2526, 2626, 2826, 2926, 3126 or 3226. In some embodiments of the present invention, target 3500 further includes a pair of fourth stacks 3528 of periodic structures, such as fourth stack 2228, 2328, 2528, 2628, 2826, 2928, 3128 or 3228, symmetrically arranged on either side of central axis 3510.

Preferably, none of first stacks 3522, second stacks 3524, third stacks 3526 and fourth stacks 3528 overlap with one another. In FIG. 35, first stacks 3522 are illustrated as lying closer to the center of target 3500 than second stacks 3524, third stacks 3526 and fourth stacks 3528, second stacks 3524 are illustrated as lying closer to the center of target 3500 than third stacks 3526 and fourth stacks 3528, third stacks 3526 are illustrated as lying closer to the edge of target 3500 than first stacks 3522 and second stacks 3524, and fourth stacks 3528 are illustrated as lying closer to the edge of target 3500 than third stacks 3526. However, first stacks 3522, second stacks 3524, third stacks 3526 and fourth stacks 3528 may be arranged in any suitable arrangement along the y-axis with respect to one another.

Figure 36:
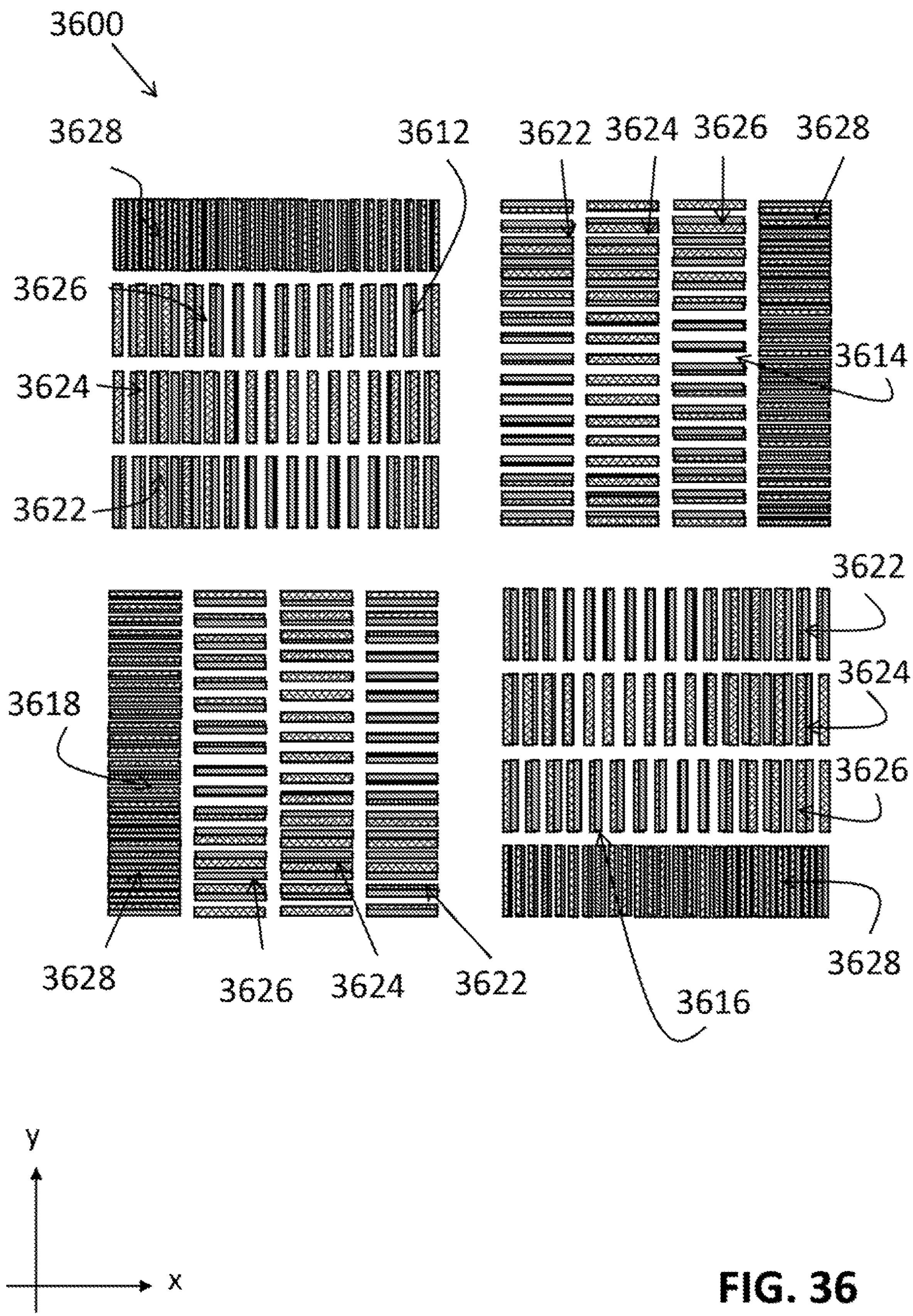
FIG. 36 is a simplified illustration of another embodiment of a multi-layered moiré target of the present invention.

Reference is now made to FIGS. 36, which is simplified illustration showing an alternate layout of a multi-layered moiré target 3600, such as target 100 (FIG. 1), 200 (FIGS. 2A-2D), 400 (FIG. 4), 500 (FIGS. 5A-5D), 700 (FIG. 7), 800 (FIGS. 8A-8D), 1000 (FIG. 10), 1100 (FIGS. 11A-11D), 1300 (FIG. 13), 1400 (FIGS. 14A-14D), 1600 (FIG. 16), 1700 (FIGS. 17A-17D), 1900 (FIGS. 19A-19D), 2000 (FIGS. 20A-20D), 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 36, target 3600 includes four target quadrants 3612, 3614, 3616 and 3618. In the embodiment shown in FIG. 36, the rotational orientation in the x-y plane of each of target quadrants 3612, 3614, 3616 and 3618 preferably differs from the rotational orientation in the x-y plane of each of the other target quadrants 3612, 3614, 3616 and 3618 by an integer multiple of 90°. Additionally, target 3600 preferably is characterized by rotational symmetry in either the x-direction or the y-direction or both. In a preferred embodiment of the present invention, target 3600 is designed such that when in a state of registration, the entirety of target 3600 is characterized by a single point of symmetry in the x-direction and a single point of symmetry in the y-direction. However, even in such an embodiment, when in a state of misregistration, various elements of target 3600 will be characterized by unique points of symmetry.

Each of target quadrants 3612, 3614, 3616 and 3618 includes a first stack 3622 of periodic structures, such as first stack 122, 222, 422, 522, 722, 822, 1022, 1122, 1322, 1422, 1622, 1722, 1922, 2022, 2222, 2322, 2522, 2622, 2822, 2922, 3122 or 3222; a second stack 3624 of periodic structures, such as second stack 124, 224, 424, 524, 724, 824, 1024, 1124, 1324, 1424, 1624, 1724, 1924, 2024, 2224, 2324, 2524, 2624, 2824, 2924, 3124 or 3224; and a third stack 3626 of periodic structures, such as third stack 126, 226, 426, 526, 726, 826, 1026, 1126, 1326, 1426, 1626, 1726, 1926, 2026, 2226, 2326, 2526, 2626, 2826, 2926, 3126 or 3226. In some embodiments of the present invention, each of target quadrants 3612, 3614, 3616 and 3618 further includes a fourth stack 3628 of periodic structures, such as fourth stack 2228, 2328, 2528, 2628, 2826, 2928, 3128 or 3228.

Preferably, none of first stack 3622, second stack 3624, third stack 3626 and fourth stack 3628 overlap with one another. In FIG. 36, first stack 3622 is illustrated as lying closer to the center of target 3600 than second stack 3624, third stack 3626 and fourth stack 3628, second stack 3624 is illustrated as lying closer to the center of target 3600 than third stack 3626 and fourth stack 3628, third stack 3626 is illustrated as lying closer to the edge of target 3600 than first stack 3622 and second stack 3624, and fourth stack 3628 is illustrated as lying closer to the edge of target 3600 than third stack 3626. However, first stack 3622, second stack 3624, third stack 3626 and fourth stack 3628 may be arranged in any suitable arrangement relative to the x-y plane with respect to one another.

Figure 37:
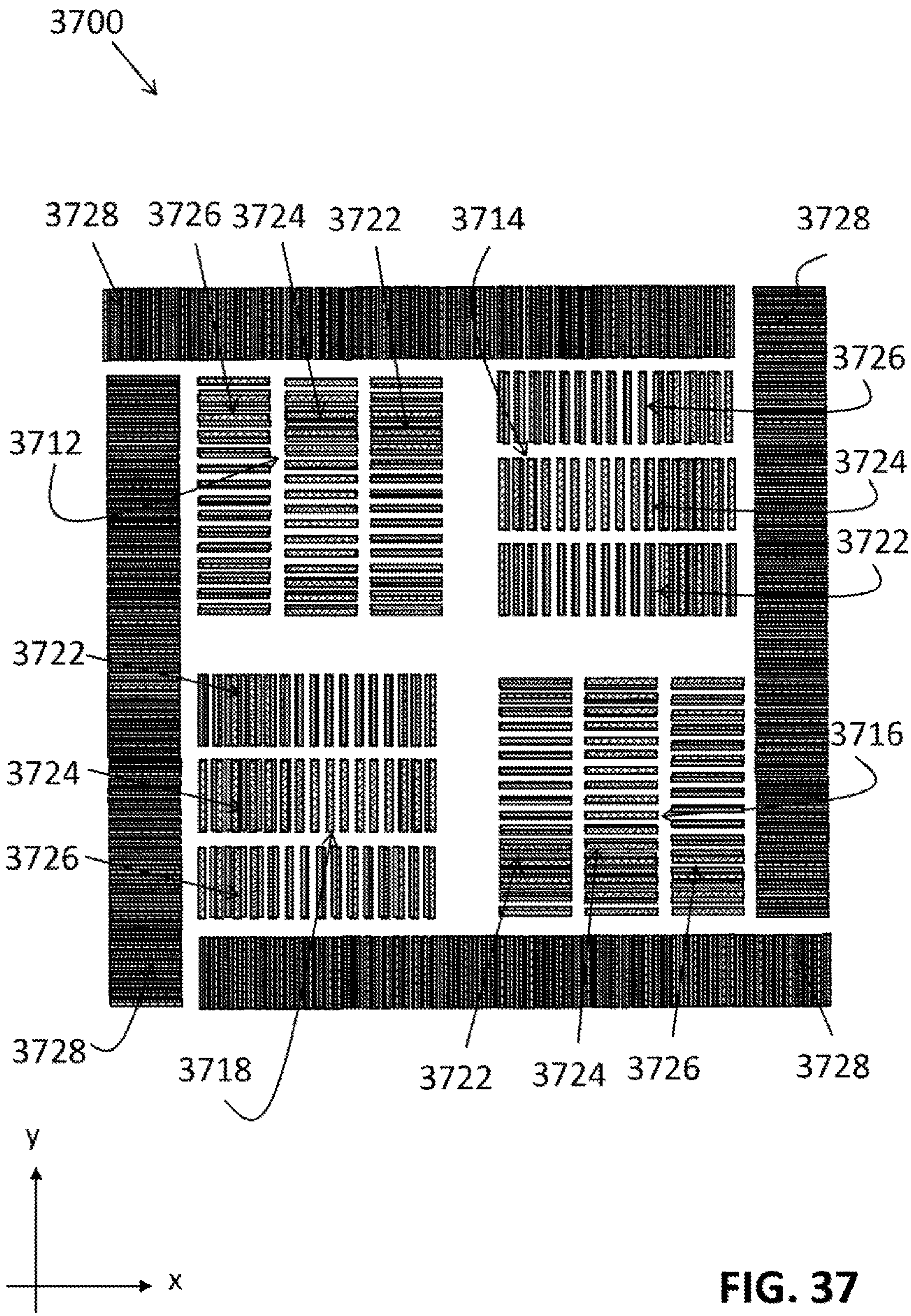
FIG. 37 is a simplified illustration of another embodiment of a multi-layered moiré target of the present invention.

Reference is now made to FIGS. 37, which is simplified illustration showing an alternate layout of a multi-layered moiré target 3700, such as target 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 37, target 3700 includes four target quadrants 3712, 3714, 3716 and 3718. In the embodiment shown in FIG. 37, the rotational orientation in the x-y plane of each of target quadrants 3712, 3714, 3716 and 3718 preferably differs from the rotational orientation in the x-y plane of each of the other target quadrants 3712, 3714, 3716 and 3718 by an integer multiple of 90°. Additionally, target 3700 preferably is characterized by rotational symmetry in either the x-direction or the y-direction or both. In a preferred embodiment of the present invention, target 3700 is designed such that when in a state of registration, the entirety of target 3700 is characterized by a single point of symmetry in the x-direction and a single point of symmetry in the y-direction. However, even in such an embodiment, when in a state of misregistration, various elements of target 3700 will be characterized by unique points of symmetry.

Each of target quadrants 3712, 3714, 3716 and 3718 includes a first stack 3722 of periodic structures, such as first stack 2222, 2322, 2522, 2622, 2822, 2922, 3122 or 3222; a second stack 3724 of periodic structures, such as second stack 2224, 2324, 2524, 2624, 2824, 2924, 3124 or 3224; and a third stack 3726 of periodic structures, such as third stack 2226, 2326, 2526, 2626, 2826, 2926, 3126 or 3226.

Preferably, target 3700 further includes a plurality of fourth stacks 3728 of periodic structures, such as fourth stack 2228, 2328, 2528, 2628, 2826, 2928, 3128 or 3228. In a preferred embodiment of the present invention, each of fourth stacks 3728 is parallel to first, second, and third stacks 3722, 3724 and 3726 of one of target quadrants 3712, 3714, 3716 and 3718. Additionally, fourth stacks 3728 preferably extend further than each of first, second, and third stacks 3722, 3724 and 3726.

Preferably, none of first stack 3722, second stack 3724, third stack 3726 and fourth stack 3728 overlap with one another. In FIG. 37, first stack 3722 is illustrated as lying closer to the center of target 3700 than second stack 3724, third stack 3726 and fourth stack 3728, second stack 3724 is illustrated as lying closer to the center of target 3700 than third stack 3726 and fourth stack 3728, third stack 3726 is illustrated as lying closer to the edge of target 3700 than first stack 3722 and second stack 3724, and fourth stack 3728 is illustrated as lying closer to the edge of target 3700 than third stack 3726. However, first stack 3722, second stack 3724, third stack 3726 and fourth stack 3728 may be arranged in any suitable arrangement relative to the x-y plane with respect to one another.

Figure 38:
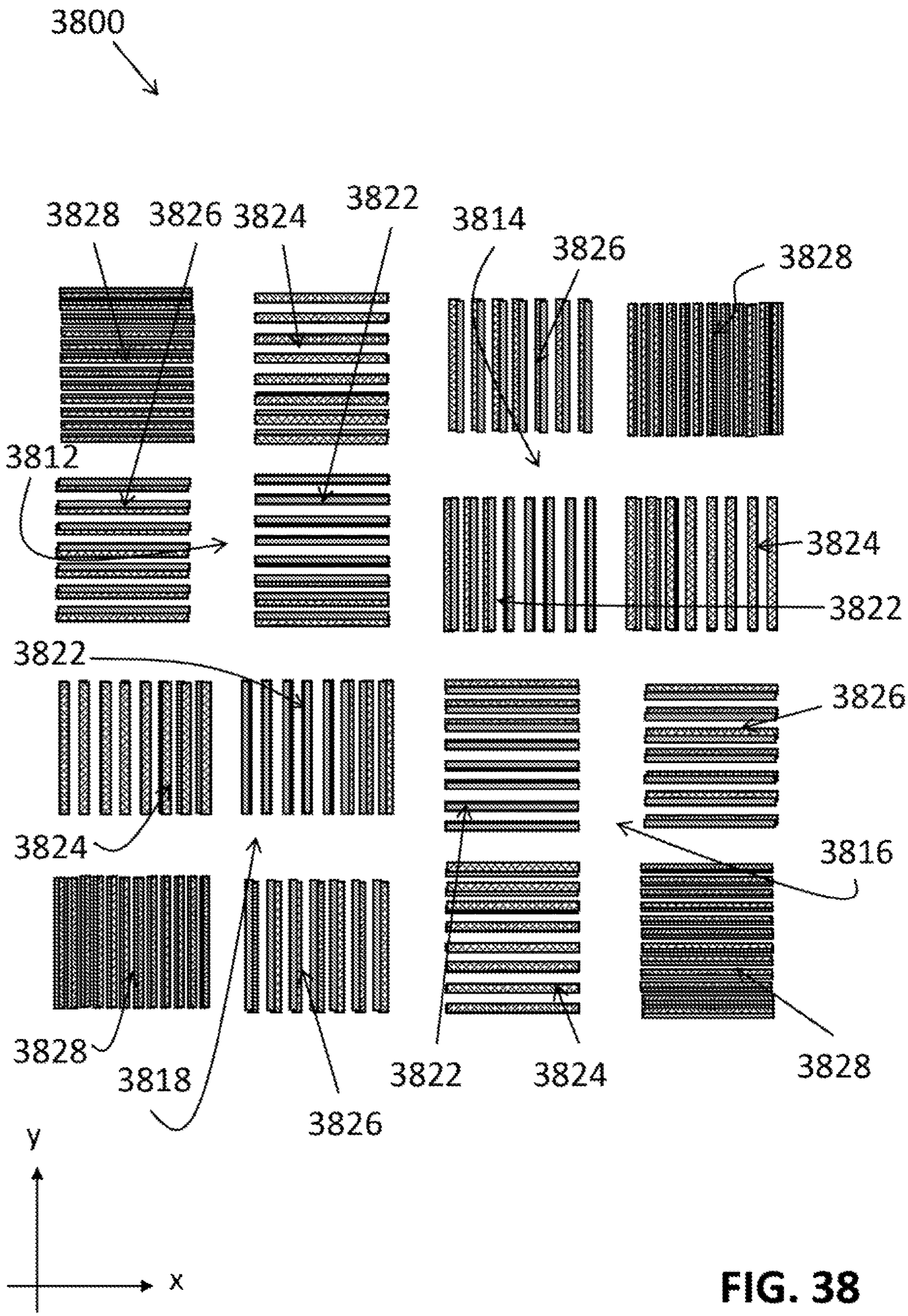
FIG. 38 is a simplified illustration of another embodiment of a multi-layered moiré target of the present invention.

Reference is now made to FIGS. 38, which is simplified illustration showing an alternate layout of a multi-layered moiré target 3800, such as target 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 38, target 3800 includes four target quadrants 3812, 3814, 3816 and 3818. In the embodiment shown in FIG. 38, the rotational orientation in the x-y plane of each of target quadrants 3812, 3814, 3816 and 3818 preferably differs from the rotational orientation in the x-y plane of each of the other target quadrants 3812, 3814, 3816 and 3818 by an integer multiple of 90°. Additionally, target 3800 preferably is characterized by rotational symmetry in either the x-direction or the y-direction or both. In a preferred embodiment of the present invention, target 3800 is designed such that when in a state of registration, the entirety of target 3800 is characterized by a single point of symmetry in the x-direction and a single point of symmetry in the y-direction. However, even in such an embodiment, when in a state of misregistration, various elements of target 3800 will be characterized by unique points of symmetry.

Each of target quadrants 3812, 3814, 3816 and 3818 includes a first stack 3822 of periodic structures, such as first stack 2222, 2322, 2522, 2622, 2822, 2922, 3122 or 3222; a second stack 3824 of periodic structures, such as second stack 2224, 2324, 2524, 2624, 2824, 2924, 3124 or 3224; a third stack 3826 of periodic structures, such as third stack 2226, 2326, 2526, 2626, 2826, 2926, 3126 or 3226; and a fourth stack 3828 of periodic structures, such as fourth stack 2228, 2328, 2528, 2628, 2826, 2928, 3128 or 3228.

Preferably, none of first stack 3822, second stack 3824, third stack 3826 and fourth stack 3828 overlap with one another. In FIG. 38, first and second stacks 3822 and 3824 are illustrated as lying closer to the center of target 3800 than third and fourth stacks 3826 and 3828, and second and fourth stacks 3824 and 3828 are illustrated as lying closer to the edge of target 3800 than first and third stacks 3822 and 3826. However, first stack 3822, second stack 3824, third stack 3826 and fourth stack 3828 may be arranged in any suitable arrangement relative to the x-y plane with respect to one another.

Figure 39:
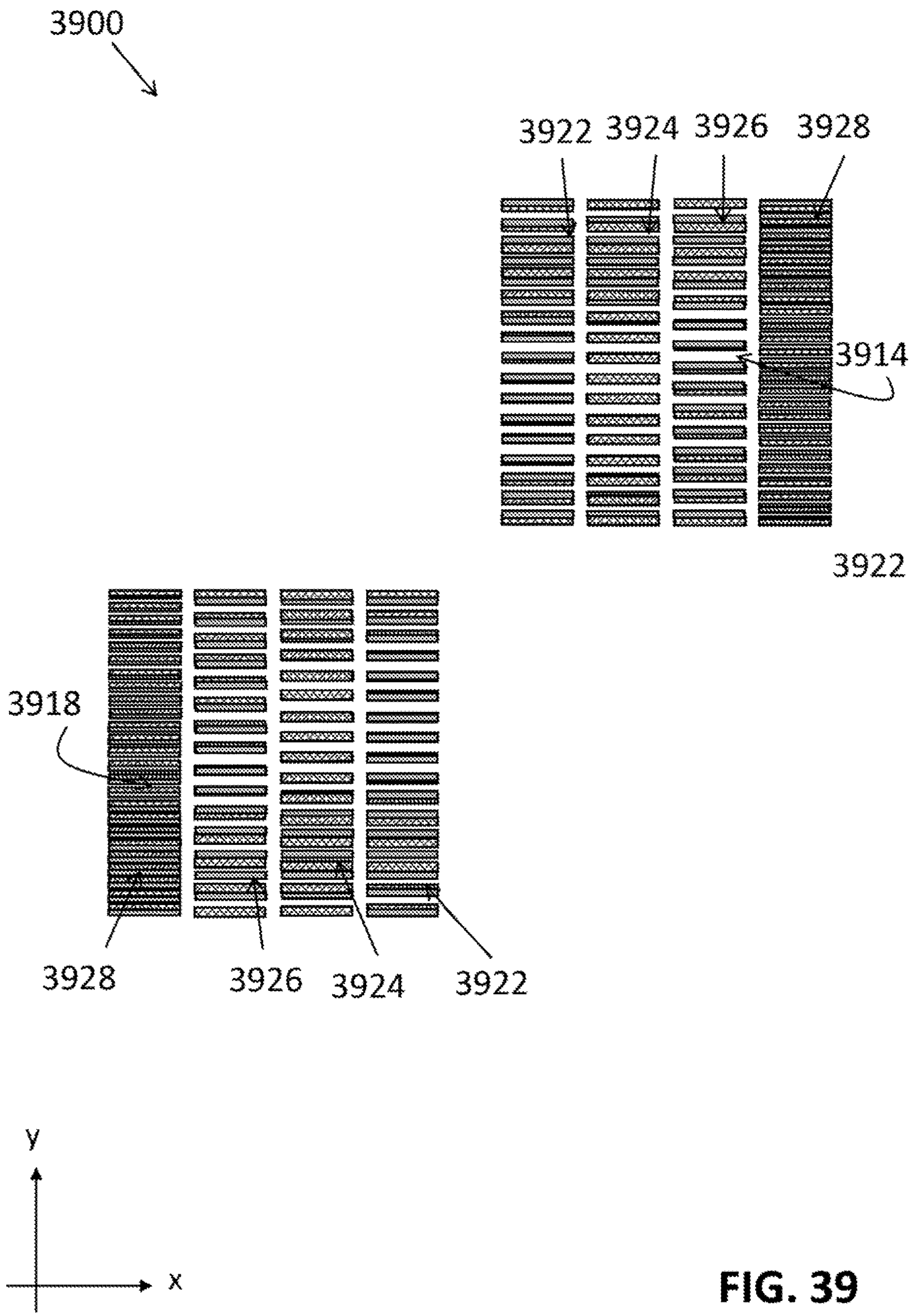
FIG. 39 is a simplified illustration of another embodiment of a multi-layered moiré target of the present invention.

Reference is now made to FIGS. 39, which is simplified illustration showing an alternate layout of a multi-layered moiré target 3900, such as target 100 (FIG. 1), 200 (FIGS. 2A-2D), 400 (FIG. 4), 500 (FIGS. 5A-5D), 700 (FIG. 7), 800 (FIGS. 8A-8D), 1000 (FIG. 10), 1100 (FIGS. 11A-11D), 1300 (FIG. 13), 1400 (FIGS. 14A-14D), 1600 (FIG. 16), 1700 (FIGS. 17A-17D), 1900 (FIGS. 19A-19D), 2000

(FIGS. 20A-20D), 2200 (FIGS. 22A-22E), 2300 (FIGS. 23A-23E), 2500 (FIGS. 25A-25E), 2600 (FIGS. 26A-26E), 2800 (FIGS. 28A-28E), 2900 (FIGS. 29A-29E), 3100 (FIGS. 31A-31E) or 3200 (FIGS. 32A-32E).

As seen in FIG. 39, target 3900 includes two target portions 3914 and 3918. In the embodiment shown in FIG. 39, the rotational orientation in the x-y plane of target portions 3914 preferably differs from the rotational orientation in the x-y plane of each of target portion 3918 by 180°. Additionally, target 3900 preferably is characterized by rotational symmetry in the x-direction. In a preferred embodiment of the present invention, target 3900 is designed such that when in a state of registration, the entirety of target 3900 is characterized by a single point of symmetry in the x-direction. However, even in such an embodiment, when in a state of misregistration, various elements of target 3900 will be characterized by unique points of symmetry.

Each of target portions 3914 and 3918 includes a first stack 3922 of periodic structures, such as first stack 122, 222, 422, 522, 722, 822, 1022, 1122, 1322, 1422, 1622, 1722, 1922, 2022, 2222, 2322, 2522, 2622, 2822, 2922, 3122 or 3222; a second stack 3924 of periodic structures, such as second stack 124, 224, 424, 524, 724, 824, 1024, 1124, 1324, 1424, 1624, 1724, 1924, 2024, 2224, 2324, 2524, 2624, 2824, 2924, 3124 or 3224; and a third stack 3926 of periodic structures, such as third stack 126, 226, 426, 526, 726, 826, 1026, 1126, 1326, 1426, 1626, 1726, 1926, 2026, 2226, 2326, 2526, 2626, 2826, 2926, 3126 or 3226. In some embodiments of the present invention, each of target portions 3914 and 3918 further includes a fourth stack 3928 of periodic structures, such as fourth stack 2228, 2328, 2528, 2628, 2826, 2928, 3128 or 3228.

Preferably, none of first stack 3922, second stack 3924, third stack 3926 and fourth stack 3928 overlap with one another. In FIG. 39, first stack 3922 is illustrated as lying closer to the center of target 3900 than second stack 3924, third stack 3926 and fourth stack 3928, second stack 3924 is illustrated as lying closer to the center of target 3900 than third stack 3926 and fourth stack 3928, third stack 3926 is illustrated as lying closer to the edge of target 3900 than first stack 3922 and second stack 3924, and fourth stack 3928 is illustrated as lying closer to the edge of target 3900 than third stack 3926. However, first stack 3922, second stack 3924, third stack 3926 and fourth stack 3928 may be arranged in any suitable arrangement relative to the x-y plane with respect to one another.

In an additional embodiment of the present invention, target 3900 may include additional target portions having additional structures, which preferably enable the measurement of misregistration along a direction parallel to the y-axis. Such additional structures may or may not be related to structures in target portions 3914 and 3918.

It will be appreciated by persons skilled in the art that the present invention is not limited to what has been particularly shown and described hereinabove. The scope of the present invention includes both combinations and sub combinations of various features described hereinabove as well as modifications thereof, all of which are not in the prior art.

The invention claimed is:

1. A multi-layered moiré target useful in the calculation of the misregistration between at least a first layer, a second layer and a third layer, the first layer, second layer and third layer being formed on a semiconductor device wafer, the semiconductor device wafer defining an x-y plane, the multi-layered moiré target comprising:

at least one group of periodic structure stacks, each of said at least one group comprising:

a first stack of periodic structures, comprising at least a first stack first periodic structure (S1P1) formed together with at least one of said first layer, said second layer and said third layer, said S1P1 having an S1P1 pitch along a first axis;

a second stack of periodic structures, comprising at least a second stack first periodic structure (S2P1) formed together with at least one of said first layer, said second layer and said third layer, said S2P1 having an S2P1 pitch along a second axis; and a third stack of periodic structures, comprising at least a third stack first periodic structure (S3P1) formed together with at least one of said first layer, said second layer and said third layer, said S3P1 having an S3P1 pitch along a third axis, within said first stack of periodic structures, said second stack of periodic structures, and said third stack of periodic structures, one of said S1P1, said S2P1, and said S3P1 is disposed at a different one of said first layer, said second layer or said third layer from the other two of said S1P1, said S2P1, and said S3P1 that are disposed at a same one of said first layer, said second layer or said third layer, said first axis being parallel to either an x-axis or a y-axis when said target is imaged in said x-y plane;

said second axis and said third axis being parallel to said first axis when said target is imaged in said x-y plane, and at least one of said first, second and third stacks comprising a second periodic structure having a second periodic structure pitch along at least one fourth axis parallel to said first axis and co-axial with one of said first axis, said second axis and said third axis when said target is imaged in said x-y plane.

2. The multi-layered moiré target according to claim 1 and wherein:

said first layer defines a first generally planar surface parallel to said x-y plane;

said second layer defines a second generally planar surface parallel to said x-y plane;

said third layer defines a third generally planar surface parallel to said x-y plane;

said first axis lies in a first plane parallel to one of an x-z plane or a y-z plane, said one of an x-z plane or a y-z plane, together with said x-y plane, defining a three-dimensional x-y-z coordinate system;

said second axis lies in a second plane parallel to said first plane;

said third axis lies in a third plane parallel to said first plane; and said at least one fourth axis lies in a respective one of said first plane, said second plane and said third plane and is parallel to a respective one of said first axis, said second axis or said third axis.

3. The multi-layered moiré target according to claim 1 and wherein:

said first stack of periodic structures comprises said S1P1 formed together with said first layer and a first stack second periodic structure (S1P2) formed together with said second layer, said S1P2 having an S1P2 pitch along a first one of said at least one fourth axis being co-axial with said first axis when said target is imaged in said x-y plane;

said second stack of periodic structures comprises said S2P1 formed together with said second layer and a second stack second periodic structure (S2P2) formed together with said third layer, said S2P2 having an S2P2 pitch along a second one of said at least one fourth axis being co-axial with said second axis when said target is imaged in said x-y plane; and said third stack of periodic structures comprises said S3P1 formed together with said first layer and a third stack second periodic structure (S3P2) formed together with said third layer, said S3P2 having an S3P2 pitch along a third one of said at least one fourth axis when said target is imaged in said x-y plane.

4. The multi-layered moiré target according to claim 3 and wherein:

said S2P1 pitch is related to said S1P2 pitch by a second stack multiplicative factor;

said S2P2 pitch is related to said S1P1 pitch by said second stack multiplicative factor;

said S3P1 pitch is related to said S1P1 pitch by a third stack multiplicative factor; and said S3P2 pitch is related to said S1P2 pitch by said third stack multiplicative factor, wherein said second stack multiplicative factor is equal to one and said third stack multiplicative factor is equal to one.

5. The multi-layered moiré target according to claim 1 and wherein:

said first stack of periodic structures comprises said S1P1 formed together with said first layer and a first stack second periodic structure (S1P2) formed together with said second layer, said S1P2 having an S1P2 pitch along a first one of said at least one fourth axis;

said second stack of periodic structures comprises said S2P1 formed together with said first layer and a second stack second periodic structure (S2P2) formed together with said second layer, said S2P2 having an S2P2 pitch along a second one of said at least one fourth axis; and said third stack of periodic structures comprises said S3P1 formed together with said second layer and a third stack second periodic structure (S3P2) formed together with said third layer, said S3P2 having an S3P2 pitch along a third one of said at least one fourth axis.

6. The multi-layered moiré target according to claim 5 and wherein said S3P1 pitch is related to said S2P2 pitch by a third stack multiplicative factor; and said S3P2 pitch is related to said S2P1 pitch by said third stack multiplicative factor, wherein said third stack multiplicative factor is equal to one, said S1P1 pitch is the same as said S2P2 pitch, and said S1P2 pitch is the same as said S2P1 pitch.

7. The multi-layered moiré target according to claim 5 and wherein said S1P1 pitch is the same as said S2P1 pitch;

said S1P2 pitch differs from said S1P1 pitch by an additive term;

said S2P2 pitch differs from said S1P1 pitch by said additive term;

said S3P1 pitch differs from said S1P1 pitch by said additive term; and said S3P2 pitch is the same as said S1P1 pitch.

8. The multi-layered moiré target according to claim 1 and wherein:

said first stack of periodic structures comprises said S1P1 formed together with said first layer and a first stack second periodic structure (S1P2) formed together with said second layer, said S1P2 having an S1P2 pitch along a first one of said at least one fourth axis;

said second stack of periodic structures comprises said S2P1 formed together with said first layer and a second stack second periodic structure (S2P2) formed together with said second layer, said S2P2 having an S2P2 pitch along a second one of said at least one fourth axis; and said third stack of periodic structures comprises said S3P1 formed together with said second layer and a third stack second periodic structure (S3P2) formed together with said first layer, said S3P2 having an S3P2 pitch along a third one of said at least one fourth axis.

9. The multi-layered moiré target according to claim 1 and wherein:

said first stack of periodic structures comprises said S1P1 formed together with said second layer;

said second stack of periodic structures comprises said S2P1 formed together with said first layer and a second stack second periodic structure (S2P2) formed together with said second layer, said S2P2 having an S2P2 pitch along a second one of said at least one fourth axis; and said third stack of periodic structures comprises said S3P1 formed together with said second layer and a third stack second periodic structure (S3P2) formed together with said third layer, said S3P2 having an S3P2 pitch along a third one of said at least one fourth axis.

10. The multi-layered moiré target according to claim 9 and wherein said S2P1 pitch is the same as said S3P2 pitch; and said S2P2 pitch is the same as said S3P1 pitch.

11. The multi-layered moiré target according to claim 1 and wherein:

said first stack of periodic structures comprises said S1P1 formed together with said second layer;

said second stack of periodic structures comprising said S2P1 formed together with said first layer; and said third stack of periodic structures comprises said S3P1 formed together with said second layer and a third stack second periodic structure (S3P2) formed together with said third layer, said S3P2 having an S3P2 pitch along said at least one fourth axis.

12. The multi-layered moiré target according to claim 1 and wherein:

said first stack of periodic structures comprises said S1P1 formed together with said first layer;

said second stack of periodic structures comprising said S2P1 formed together with said first layer; and said third stack of periodic structures comprises said S3P1 formed together with said first layer and a third stack second periodic structure (S3P2) formed together with said third layer, said S3P2 having an S3P2 pitch along said at least one fourth axis.

13. The multi-layered moiré target according to claim 1 and wherein:

said first stack of periodic structures comprises said S1P1 formed together with said second layer;

said second stack of periodic structures comprising said S2P1 formed together with said first layer; and said third stack of periodic structures comprises said S3P1 formed together with said second layer and a third stack second periodic structure (S3P2) formed together with said first layer, said S3P2 having an S3P2 pitch along said at least one fourth axis.

14. The multi-layered moiré target according to claim 1 and wherein:

said first stack of periodic structures comprises said S1P1 formed together with said first layer;

said second stack of periodic structures comprises said S2P1 formed together with said first layer and a second stack second periodic structure (S2P2) formed together with said second layer, said S2P2 having an S2P2 pitch along a first one of said at least one fourth axis; and said third stack of periodic structures comprises said S3P1 formed together with said second layer and a third stack second periodic structure (S3P2) formed together with said third layer, said S3P2 having an S3P2 pitch along a second one of said at least one fourth axis.

15. The multi-layered moiré target according to claim 1 and wherein:

said at least one group of periodic structure stacks includes:

at least one first group of periodic stacks in which said first axis is parallel to said x-axis when said target is imaged in said x-y plane; and at least one second group of periodic stacks in which said first axis is parallel to said y-axis when said target is imaged in said x-y plane.

16. The multi-layered moiré target according to claim 15 and wherein said at least one first group of periodic stacks and said at least one second group of periodic stacks are identical except for their orientation.

17. The multi-layered moiré target according to claim 15 and wherein said target is characterized by mirror symmetry or said target is characterized by rotational symmetry.

* * * * *